US012101996B2

(12) United States Patent
Lee et al.

(10) Patent No.: US 12,101,996 B2
(45) Date of Patent: Sep. 24, 2024

(54) ORGANOMETALLIC COMPOUND, LIGHT-EMITTING DEVICE INCLUDING THE SAME, AND ELECTRONIC APPARATUS

(71) Applicant: SAMSUNG DISPLAY CO., LTD., Yongin-Si (KR)

(72) Inventors: Eunyoung Lee, Yongin-si (KR); Soobyung Ko, Yongin-si (KR); Haejin Kim, Yongin-si (KR); Sujin Shin, Yongin-si (KR); Eunsoo Ahn, Yongin-si (KR); Junghoon Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 676 days.

(21) Appl. No.: 17/384,623

(22) Filed: Jul. 23, 2021

(65) Prior Publication Data
US 2022/0045286 A1    Feb. 10, 2022

(30) Foreign Application Priority Data

Jul. 31, 2020    (KR) .................. 10-2020-0096111

(51) Int. Cl.
*H01L 51/00*    (2006.01)
*C07F 15/00*    (2006.01)
(Continued)

(52) U.S. Cl.
CPC ....... *H10K 85/346* (2023.02); *C07F 15/0086* (2013.01); *C09K 11/06* (2013.01);
(Continued)

(58) Field of Classification Search
CPC .............. H10K 85/346; C07F 15/0086; C09K 2211/185
See application file for complete search history.

(56) References Cited

U.S. PATENT DOCUMENTS 7,442,797 B2    10/2008    Itoh et al.
8,092,925 B2    1/2012    Igarashi et al.
(Continued)

FOREIGN PATENT DOCUMENTS

KR    10-2014-0144152 A    12/2014

OTHER PUBLICATIONS

Chidananda, et al., "Benzimidazolyl based Schiff base palladium complex in an ionic liquid: an effective combination for Suzuki coupling," Journal of Coordination Chemistry, Apr. 8, 2017, p. 1573-1584, vol. 70, Taylor & Francis Group.

*Primary Examiner* — Alexander C Kollias
(74) *Attorney, Agent, or Firm* — Lewis Roca Rothgerber Christie LLP

(57) ABSTRACT

An organometallic compound represented by Formula 1, a light-emitting device including the same, and an electronic
(Continued)

apparatus including the light-emitting device are disclosed. In Formula 1, the substituents are as described in more detail in the specification.

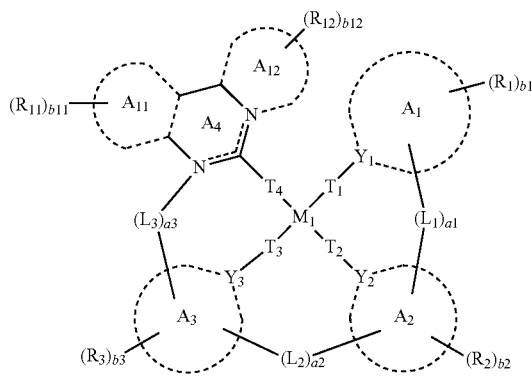

Formula 1

20 Claims, 3 Drawing Sheets

(51) Int. Cl.
*C09K 11/06* (2006.01)
*H10K 85/30* (2023.01)
*H10K 50/11* (2023.01)
*H10K 50/15* (2023.01)
*H10K 50/16* (2023.01)
*H10K 50/17* (2023.01)
*H10K 50/18* (2023.01)
*H10K 50/858* (2023.01)
*H10K 59/123* (2023.01)
*H10K 101/10* (2023.01)

(52) U.S. Cl.
CPC .. *C07B 2200/05* (2013.01); *C09K 2211/1062* (2013.01); *C09K 2211/185* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02); *H10K 50/858* (2023.02); *H10K 59/123* (2023.02); *H10K 2101/10* (2023.02)

(56) References Cited

U.S. PATENT DOCUMENTS

| | | | |
|---|---|---|---|
| 8,871,361 | B2 | 10/2014 | Xia et al. |
| 9,318,725 | B2 | 4/2016 | Li |
| 9,673,409 | B2 | 6/2017 | Li et al. |
| 9,748,502 | B2 | 8/2017 | Anemian et al. |
| 10,211,414 | B2 | 2/2019 | Li et al. |
| 2008/0036373 | A1 | 2/2008 | Itoh et al. |
| 2014/0371825 | A1 | 12/2014 | Anemian et al. |
| 2019/0067601 | A1 | 2/2019 | Ji et al. |
| 2019/0081252 | A1* | 3/2019 | Kim .............. H10K 50/81 |
| 2019/0194234 | A1 | 6/2019 | Xia |
| 2020/0358009 | A1* | 11/2020 | Ahn .............. H10K 85/342 |
| 2020/0369699 | A1* | 11/2020 | Shih .............. H10K 85/341 |

* cited by examiner

ORGANOMETALLIC COMPOUND, LIGHT-EMITTING DEVICE INCLUDING THE SAME, AND ELECTRONIC APPARATUS

CROSS-REFERENCE TO RELATED APPLICATION

This application claims priority to and the benefit of Korean Patent Application No. 10-2020-0096111, filed on Jul. 31, 2020, in the Korean Intellectual Property Office, the disclosure of which is incorporated by reference herein in its entirety.

BACKGROUND

1. Field

One or more embodiments relate to an organometallic compound, a light-emitting device including the same, and an electronic apparatus including the light-emitting device.

2. Description of Related Art

Organic light-emitting devices (OLEDs) are self-emission devices that, as compared with related art devices, have wide viewing angles, high contrast ratios, short response times, and/or desired (e.g., excellent) characteristics in terms of luminance, driving voltage, and/or response speed, and/or produce full-color images.

OLEDs may include a first electrode located on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state to thereby generate light.

SUMMARY

Aspects according to one or more embodiments are directed toward a novel organometallic compound, a light-emitting device including the same, and an electronic apparatus including the light-emitting device.

Additional aspects will be set forth in part in the description which follows and, in part, will be apparent from the description, or may be learned by practice of the presented embodiments of the disclosure.

According to embodiments of the present disclosure, an organometallic compound is represented by Formula 1:

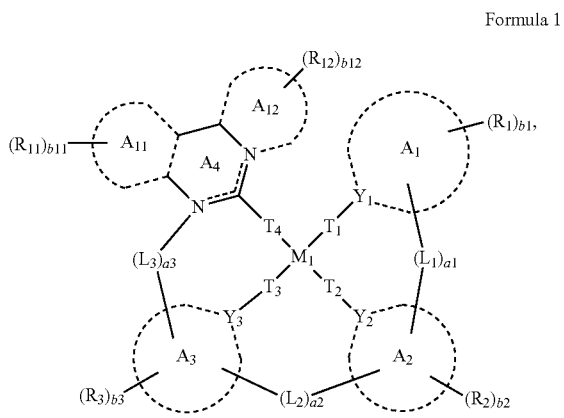

Formula 1 wherein, in Formula 1, $M_1$ is selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm);

$Y_1$ to $Y_3$ may each independently be selected from a carbon atom (C) and a nitrogen atom (N), $T_1$ to $T_4$ may each independently be a chemical bond, O, S, B(R'), N(R'), P(R'), C(R')(R''), Si(R')(R''), Ge(R')(R''), or C(=O), when $T_1$ is a chemical bond, $Y_1$ and $M_1$ may be directly bonded to each other, when $T_2$ is a chemical bond, $Y_2$ and $M_1$ may be directly bonded to each other, when $T_3$ is a chemical bond, $Y_3$ and $M_1$ may be directly bonded to each other, and when $T_4$ is a chemical bond, C in ring $A_4$ may be directly bonded to $M_1$, and two bonds selected from a bond between $M_1$ and $Y_1$ or $T_1$, a bond between $M_1$ and $Y_2$ or $T_2$, a bond between $M_1$ and $Y_3$ or $T_3$, and a bond between $M_1$ and C in ring $A_4$ or $T_4$ are each a coordinate bond, and the other two bonds (e.g., the remaining two bonds) may each be a covalent bond, ring $A_1$ to ring $A_3$, ring $A_{11}$ and ring $A_{12}$ may each independently be selected from a $C_5$-$C_{60}$ carbocyclic group and a $C_1$-$C_{60}$ heterocyclic group, $L_1$ to $L_3$ may each independently be selected from a single bond, a double bond, *—N($R_4$)—*', *—B($R_4$)—*', *—P($R_4$)—*', *—C($R_4$)($R_5$)—*', *—Si($R_4$)($R_5$)—*', *—Ge($R_4$)($R_5$)—*', *—S—*', *—Se—*', *—C(=O)—*', *—S(=O)—*', *—S(=O)$_2$—*', *—C($R_4$)=*', *=C($R_4$)—*', *—C($R_4$)=C($R_5$)—*', *—C(=S)—*', and *—C≡C—*', a1 to a3 may each independently be an integer from 0 to 3, and, when a1 is 0, ring $A_1$ and ring $A_2$ may not be linked to each other, when a2 is 0, ring $A_2$ and ring $A_3$ may not be linked to each other, and when a3 is 0, ring $A_3$ and ring $A_4$ may not be linked to each other, R', R'', $R_1$ to $R_5$, $R_{11}$ and $R_{12}$ may each independently be selected from hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —B($Q_1$)($Q_2$), —N($Q_1$)($Q_2$), —P(Q$_1$)(Q$_2$), —C(=O)(Qi), —S(=O)(Qi), —S(=O)$_2$(Q$_1$), —P(=O)(Q$_1$)(Q$_2$), and —P(=S)(Q$_1$)(Q$_2$), b1 to b3, b11 and b12 may each independently be an integer from 1 to 20, two or more neighboring groups from among R$_1$ to R$_5$, R$_{11}$ and R$_{12}$ may be optionally bonded to form a C$_5$-C$_{60}$ carbocyclic group unsubstituted or substituted with at least one R$_{10a}$ or a C$_1$-C$_{60}$ heterocyclic group unsubstituted or substituted with at least one R$_{10a}$,

* and *' may each indicate a binding site to a neighboring atom, and

R$_{10a}$ may be:
deuterium (-D), —F, —Cl, —Br, —I, a hydroxyl group, a cyano group, or a nitro group;

a C$_1$-C$_{60}$ alkyl group, a C$_2$-C$_{60}$ alkenyl group, a C$_2$-C$_{60}$ alkynyl group, or a C$_1$-C$_{60}$ alkoxy group, each unsubstituted or substituted with deuterium, —F, —Cl, —Br, —I, a hydroxyl group, a cyano group, a nitro group, a C$_3$-C$_{60}$ carbocyclic group, a C$_1$-C$_{60}$ heterocyclic group, a C$_6$-C$_{60}$ aryloxy group, a C$_6$-C$_{60}$ arylthio group, —Si(Q$_{11}$)(Q$_{12}$)(Q$_{13}$), —N(Q$_{11}$)(Q$_{12}$), —B(Q$_{11}$)(Q$_{12}$), —C(=O)(Q$_{11}$), —S(=O)$_2$(Q$_{11}$), —P(=O)(Q$_{11}$)(Q$_{12}$), or any combination thereof;

a C$_3$-C$_{60}$ carbocyclic group, a C$_1$-C$_{60}$ heterocyclic group, a C$_6$-C$_{60}$ aryloxy group, or a C$_6$-C$_{60}$ arylthio group, each unsubstituted or substituted with deuterium, —F, —Cl, —Br, —I, a hydroxyl group, a cyano group, a nitro group, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{60}$ carbocyclic group, a C$_1$-C$_{60}$ heterocyclic group, a C$_6$-C$_{60}$ aryloxy group, a C$_6$-C$_{60}$ arylthio group, —Si(Q$_{21}$)(Q$_{22}$)(Q$_{23}$), —N(Q$_{21}$)(Q$_{22}$), —B(Q$_{21}$)(Q$_{22}$), —C(=O)(Q$_{21}$), —S(=O)$_2$(Q$_{21}$), —P(=O)(Q$_{21}$)(Q$_{22}$), or any combination thereof; or —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), or —P(=O)(Q$_{31}$)(Q$_{32}$), wherein Q$_1$ to Q$_3$, Q$_{11}$ to Q$_{13}$, Q$_{21}$ to Q$_{23}$ and Q$_{31}$ to Q$_{33}$ may each independently be: hydrogen; deuterium; —F; —Cl; —Br; —I; a hydroxyl group; a cyano group; a nitro group; a C$_1$-C$_{60}$ alkyl group; a C$_2$-C$_{60}$ alkenyl group; a C$_2$-C$_{60}$ alkynyl group; a C$_1$-C$_{60}$ alkoxy group; or a C$_3$-C$_{60}$ carbocyclic group or a C$_1$-C$_{60}$ heterocyclic group, each unsubstituted or substituted with deuterium, —F, a cyano group, a C$_1$-C$_{60}$ alkyl group, a C$_1$-C$_{60}$ alkoxy group, a phenyl group, a biphenyl group, or any combination thereof.

According to another embodiment, a light-emitting device includes: a first electrode; a second electrode facing the first electrode; an interlayer between the first electrode and the second electrode and includes the emission layer, and the interlayer includes at least one organometallic compound represented by Formula 1.

According to another embodiment of the present disclosure, an electronic apparatus includes the light-emitting device.

BRIEF DESCRIPTION OF THE DRAWINGS

The above and other aspects, features, and enhancements of certain embodiments of the disclosure will be more apparent from the following description taken in conjunction with the accompanying drawings, in which.

DETAILED DESCRIPTION

Figure 1:
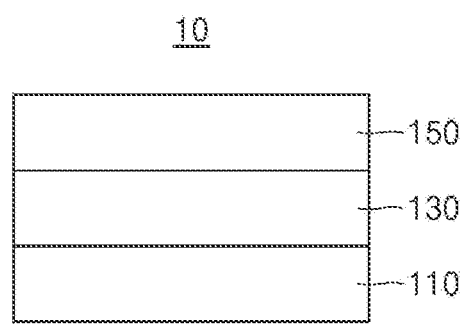
FIG. 1 is a schematic cross-sectional view of a light-emitting device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b and c" or "at least one selected from a, b, and c" indicates only a, only b, only c, both a and b, both a and c, both b and c, all of a, b, and c, or variations thereof.

According to an embodiment of the present disclosure, an organometallic compound is represented by Formula 1 below:

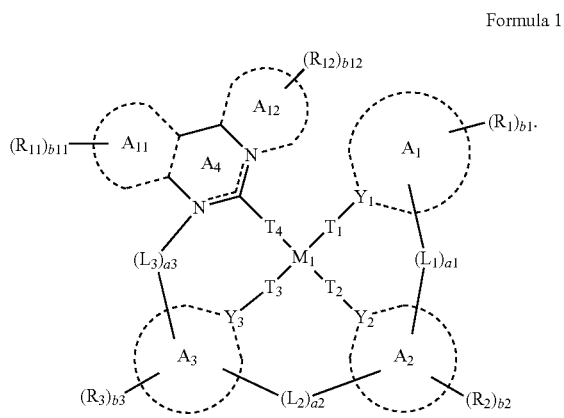

Formula 1

M$_1$ in Formula 1 may be selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm).

In an embodiment, M$_1$ may be selected from Pt, Pd, Cu, Ag, Au, Rh, Ir, Ru, and Os.

In an embodiment, M$_1$ may be Pt, but embodiments of the present disclosure are not limited thereto.

Y$_1$ to Y$_3$ in Formula 1 may each independently be selected from a carbon atom (C) and a nitrogen atom (N), T$_1$ to T$_4$ may each independently be a chemical bond, O, S, B(R'), N(R'), P(R'), C(R')(R"), Si(R')(R"), Ge(R')(R"), or C(=O), when T$_1$ is a chemical bond, Y$_1$ and M$_1$ may be directly bonded to each other, when T$_2$ is a chemical bond, Y$_2$ and M$_1$ may be directly bonded to each other, when T$_3$ is a chemical bond, Y$_3$ and M$_1$ may be directly bonded to each other, and when T$_4$ is a chemical bond, C (i.e., the carbon atom between the two nitrogen atoms) in ring A$_4$ may be directly bonded to M$_1$, and two bonds selected from a bond between M$_1$ and Y$_1$ or T$_1$ (e.g., a bond between M$_1$ and Y$_1$ or a bond between M$_1$ and T$_1$), a bond between M$_1$ and Y$_2$ or T$_2$ (e.g., a bond between M$_1$ and Y$_2$ or a bond between M$_1$ and T$_2$), a bond between M$_1$ and Y$_3$ or T$_3$ (e.g., a bond between M$_1$ and Y$_3$ or a bond between $M_1$ and $T_3$), and a bond between $M_1$ and C in ring $A_4$ or $T_4$ (e.g., a bond between $M_1$ and C in ring $A_4$ or a bond between $M_1$ and $T_4$) may each be a coordinate bond, and the remaining two bonds may each be a covalent bond.

In an embodiment, $T_1$ to $T_4$ may each be a chemical bond, and at least one of a bond between $Y_1$ and $M_1$ and a bond between $Y_2$ and $M_1$ may each be a coordinate bond.

In an embodiment, $Y_1$ may be N, and $Y_2$ and $Y_3$ may each be C.

Ring $A_1$ to ring $A_3$, ring $A_{11}$ and ring $A_{12}$ in Formula 1 may each independently be selected from a $C_5$-$C_{60}$ carbocyclic group and a $C_1$-$C_{60}$ heterocyclic group.

In an embodiment, ring $A_1$ to ring $A_3$, ring $A_{11}$ and ring $A_{12}$ may each independently be selected from:

a benzene group, a naphthalene group, an anthracene group, a phenanthrene group, a triphenylene group, a pyrene group, a chrysene group, a cyclopentane group, a cyclopentadiene group, a cyclohexane group, a cyclohexene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 1,2,4-triazole group, a tetrazole group, a 2,3-dihydrotriazole group, an azasilole group, a diazasilole group, a triazasilole group, an oxazole group, an isooxazole group, a thiazole group, an isothiazole group, an oxadiazole group, a thiadiazole group, a benzopyrazole group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

In an embodiment, ring $A_1$ to ring $A_3$ may each independently be selected from:

a benzene group, a naphthalene group, an anthracene group, a phenanthrene group, a triphenylene group, a pyrene group, a chrysene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, and an indolopyrimidine group, and ring $A_{11}$ and ring $A_{12}$ may each independently be selected from:

a pyrrole group, a pyrazole group, an imidazole group, a 2,3-dihydroimidazole group, a triazole group, 1,2,4-triazole group, a tetrazole group, a 2,3-dihydrotriazole group, an azasilole group, a diazasilole group, a triazasilole group, an oxazole group, an isooxazole group, a thiazole group, an isothiazole group, an oxadiazole group, a thiadiazole group, a benzopyrazole group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

In an embodiment, at least one of ring $A_1$ to ring $A_3$ may be a 6-membered ring having one or more N(s) or a condensed cyclic group including the 6-membered ring having one or more N(s).

In an embodiment, ring $A_1$ may be selected from a pyridine group, a pyrimidine group, a pyrazine group, a pyridazine group, and a triazine group.

For example, ring $A_2$ may be selected from an indole group, a carbazole group, an indolopyridine group, and an indolopyrimidine group.

For example, ring $A_3$ may be selected from a benzene group, a naphthalene group, an anthracene group, and a phenanthrene group.

In one or more embodiments, ia) ring $A_1$ may be a group represented by one of Formulae 2A-1 to 2A-6, iia) ring $A_2$ may be a group represented by one of Formulae 2B-1 to 2B-3, iiia) ring $A_3$ may be a group represented by Formula 2C-1, or any combination of ia), iia), and iiia):

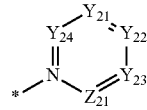

2A-1

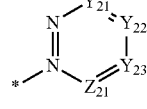

2A-2

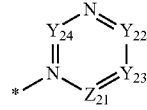

2A-3

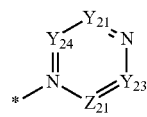

2A-4

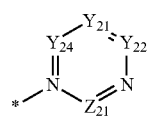

2A-5

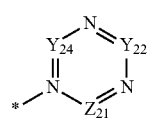

2A-6

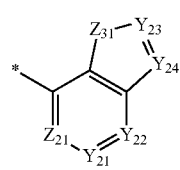

2B-1

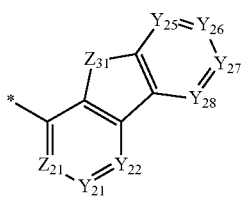

2B-2

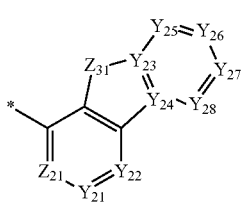

2B-3

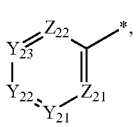

2C-1 wherein, in Formulae 2A-1 to 2A-6, Formulae 2B-1 to 2B-3, and Formula 2C-1, $Y_{21}$ may be N or $C(R_{21a})$, $Y_{22}$ may be N or $C(R_{22a})$, $Y_{23}$ may be N or $C(R_{23a})$, $Y_{24}$ may be N or $C(R_{24a})$, $Y_{25}$ may be N or $C(R_{25a})$, $Y_{26}$ may be N or $C(R_{26a})$, $Y_{27}$ may be N or $C(R_{27a})$, $Y_{28}$ may be N or $C(R_{28a})$, $Z_{21}$ may be *'—C, $C(R_{21a})$ or N, $Z_{22}$ may be *'—C, $C(R_{22a})$, or N, $Z_{31}$ may be *'—N or $N(R_{31a})$, $R_{21a}$ to $R_{28a}$ and $R_{31a}$ may be the same as described in connection with R', R", $R_1$ to $R_5$, $R_{11}$ and $R_{12}$, and

* indicates a binding site to respective neighboring $T_1$, $T_2$, or $T_3$, and *' indicates a binding site to respective neighboring $L_1$, $L_2$, or $L_3$.

For example, in Formulae 2A-1 to 2A-6 and 2C-1, $Y_{22}$ may be $C(R_{22a})$, and $R_{22a}$ may be hydrogen, a $C_1$-$C_{20}$ alkyl group, a $C_6$-$C_{20}$ aryl group, a $C_1$-$C_{20}$ alkyl group substituted with at least one $R_{10a}$ or a $C_6$-$C_{20}$ aryl group substituted with at least one $R_{10a}$.

For example, in Formulae 2A-1 to 2A-6 and 2C-1, $Y_{21}$ may be $C(R_{21a})$, $Y_{23}$ may be $C(R_{23a})$, and $Y_{24}$ may be $C(R_{24a})$, and $R_{21a}$, $R_{23a}$, and $R_{24a}$ may each be hydrogen.

For example, $Z_{21}$ in Formula 2A-1 to 2A-6 may be *'—C.

For example, in Formulae 2B-1 to 2B-3, $Z_{21}$ may be *'—C and $Z_{31}$ may be *'—N.

For example, in Formula 2C-1, $Y_{21}$ may be $C(R_{21a})$, and $Y_{23}$ may be $C(R_{23a})$. For example, $R_{21a}$ and $R_{23a}$ may each be hydrogen.

For example, in Formula 2C-1, $Z_{21}$ may be *'—C and $Z_{22}$ may be *'—C.

For example, ring $A_1$ may be a group represented by one of Formulae 2A-1 to 2A-6 and ring $A_2$ may be a group represented by one of Formulae 2B-1 to 2B-3. For example, ring $A_1$ may be a group represented by one of Formulae 2A-1 to 2A-6 and ring $A_3$ may be a group represented by Formula 2C-1. For example, ring $A_2$ may be a group represented by one of Formulae 2B-1 to 2B-3 and ring $A_3$ may be a group represented by Formula 2C-1. For example, ring $A_1$ may be a group represented by one of Formulae 2A-1 to 2A-6, ring $A_2$ may be a group represented by one of Formulae 2B-1 to 2B-3, and ring $A_3$ may be a group represented by Formula 2C-1.

In one or more embodiments, a group represented by

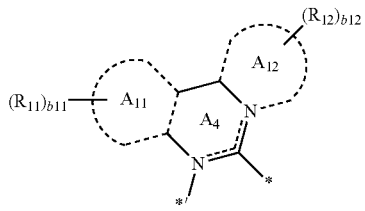

in Formula 1 may be a group represented by one of Formulae 2D-1 and 2D-2:

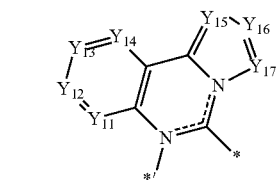

2D-1

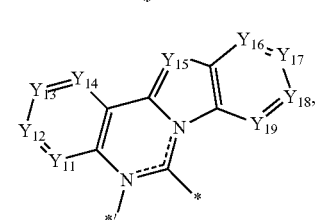

2D-2 wherein, in Formulae 2D-1 and 2D-2, $Y_{11}$ may be N or $C(R_{11a})$, $Y_{12}$ may be N or $C(R_{12a})$, $Y_{13}$ may be N or $C(R_{13a})$, $Y_{14}$ may be N or $C(R_{14a})$, $Y_{15}$ may be N or $C(R_{15a})$, $Y_{16}$ may be N or $C(R_{16a})$, $Y_{17}$ may be N or $C(R_{17a})$, $Y_{18}$ may be N or $C(R_{18a})$, and $Y_{19}$ may be N or $C(R_{19a})$, $R_{11a}$ to $R_{19a}$ are the same as described in connection with R', R", $R_1$ to $R_5$, $R_{11}$ and $R_{12}$, and

* indicates a binding site to neighboring $T_4$, and *' indicates a binding site to neighboring $L_3$.

For example, $Y_{11}$ may be $C(R_{11a})$, $Y_{12}$ may be $C(R_{12a})$, $Y_{13}$ may be $C(R_{13a})$, and Yu may be $C(R_{14a})$.

For example, $Y_{11}$ may be $C(R_{11a})$, $Y_{12}$ may be $C(R_{12a})$, $Y_{13}$ may be $C(R_{13a})$, and $Y_{14}$ may be $C(R_{14a})$, and $R_{11a}$ to $R_{14a}$ may each be hydrogen.

For example, $Y_{15}$ may be N.

$L_1$ to $L_3$ in Formula 1 may each independently be selected from a single bond, a double bond, *—$N(R_4)$—*', *—$B(R_4)$—*', *—$P(R_4)$—*', *—$C(R_4)(R_5)$—*', *—$Si(R_4)(R_5)$—*', *—$Ge(R_4)(R_5)$—*', *—S—*', *—Se*', *—C(=O)—*', *—S(=O)—*', *—S(=O)$_2$—*', *—$C(R_4)$=*', *=$C(R_4)$—*', *—$C(R_4)$=$C(R_5)$—*', *—C(=S)—*' and *—C≡C—*', a1 to a3 may each independently an integer from 0 to 3, when a1 is 0, ring $A_1$ and ring $A_2$ may not be linked to each other, when a2 is 0, ring $A_2$ and ring $A_3$ may not be linked to each other, when a3 is 0, ring $A_3$ and ring $A_4$ may not be linked to each other, and * and *' may each be a binding site to a neighboring atom.

In an embodiment, a1 to a3 may each be 1, and Li and $L_3$ may each be a single bond.

In an embodiment, a1 to a3 may each be 1, and $L_2$ may be *—O—*'.

R', R", $R_1$ to $R_5$, $R_{11}$ and $R_{12}$ in Formula 1 may each independently be selected from hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), b1 to b3, b11 and b12 may each independently be an integer from 1 to 20, and two or more neighboring groups from among $R_1$ to $R_5$, $R_{11}$ and $R_{12}$ may be optionally bonded to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, R', R", $R_1$ to $R_5$, $R_{11}$ and $R_{12}$ may each independently be selected from:

hydrogen, deuterium, —F, —Cl, —Br, —I, a hydroxyl group, a cyano group, a nitro group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, a $C_1$-$C_{20}$ alkyl group, and a $C_1$-$C_{20}$ alkoxy group;

a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, a pyrrolyl group, an indolyl group, an isoindolyl group, an indazolyl group, a quinolinyl group, an isoquinolinyl group, a quinoxalinyl group, a quinazolinyl group, a cinnolinyl group, and a triazinyl group; a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, and isoquinolinyl group, a quinoxalinyl group, a quinazolinyl group, a cinnolinyl group, and a triazinyl group, each substituted with at least one selected from deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$);

a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, each substituted with at least one selected from a $C_1$-$C_{20}$ alkyl group, a $C_1$-$C_{20}$ alkoxy group a cyclopentyl group, a cyclohexyl group, and adamantyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, each substituted with at least one selected from deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and —Si($Q_1$)($Q_2$)($Q_3$), —N($Q_1$)($Q_2$), —B($Q_1$)($Q_2$), —C(=O)($Q_1$), —S(=O)$_2$($Q_1$), —P(=O)($Q_1$)($Q_2$), —P(=S)($Q_1$)($Q_2$), =O, =S, =N($Q_1$), and =C($Q_1$)($Q_2$), wherein $Q_1$ to $Q_3$ and $Q_{31}$ to $Q_{33}$ may each independently be selected from:

hydrogen, deuterium, —F, —Cl, —Br, —I, a cyano group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group.

In an embodiment, the organometallic compound represented by Formula 1 may be represented by Formula 1-1:

Formula 1-1

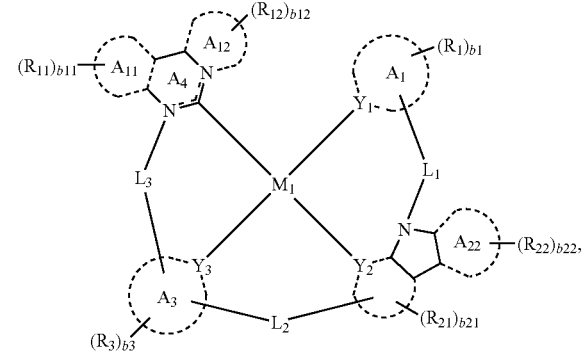

wherein, in Formula 1-1, $M_1$, ring $A_1$, ring $A_3$, ring $A_{11}$, ring $A_{12}$, $Y_1$ to $Y_3$, $L_1$ to $L_3$, $R_1$, $R_3$, $R_{11}$, $R_{12}$, b1, b3, b11, and b12 are each independently the same as respectively described above, ring $A_{21}$ and ring $A_{22}$ are each independently the same as described in connection with ring $A_1$ to ring $A_3$, ring $A_{11}$ and ring $A_{12}$, $R_{21}$ and $R_{22}$ are each independently the same as described in connection with R', R", $R_1$ to $R_5$, $R_{11}$ and $R_{12}$, and b21 and b22 are each independently the same as described in connection with b1 to b3, b11 and b12.

In an embodiment, ring $A_{11}$ may be a benzene group.

For example, Ru may be hydrogen.

In an embodiment, the organometallic compound represented by Formula 1 may be selected from Compounds 1 to 131, but embodiments of the present disclosure are not limited thereto:

1
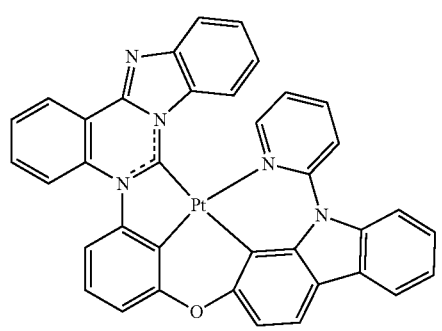

2
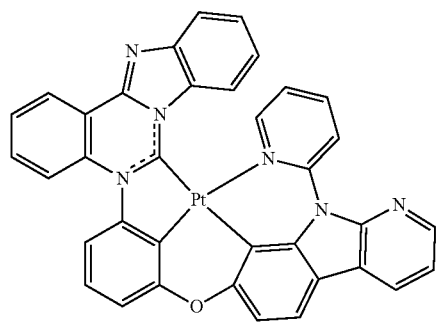

3
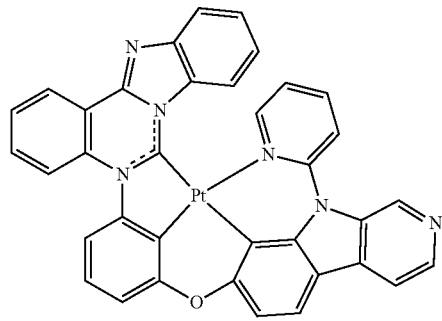

4
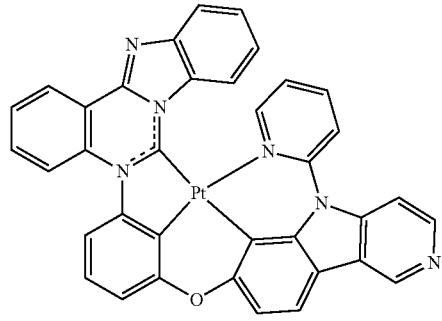

5
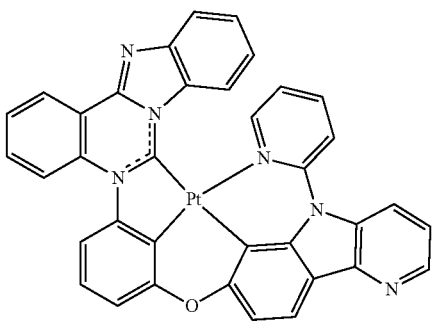

6
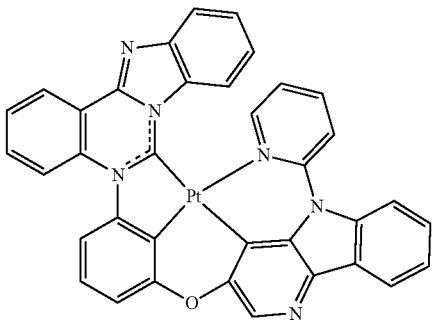

7
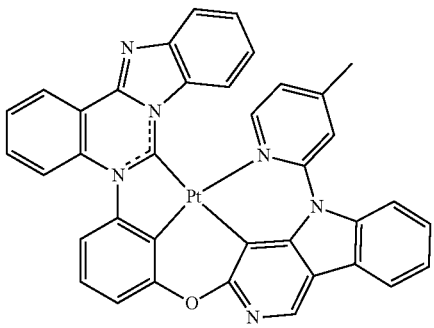

8
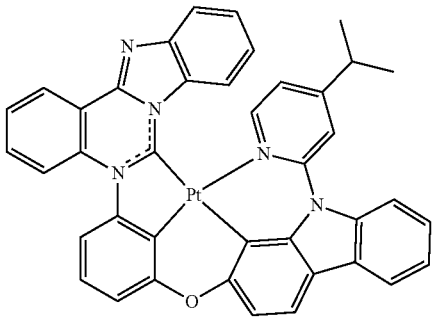

9

10
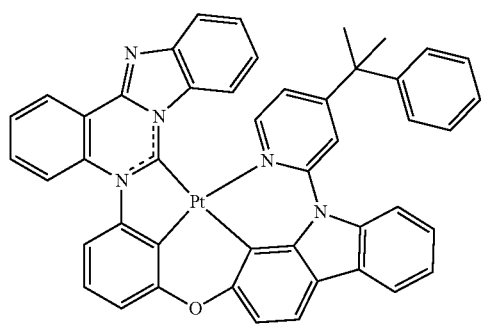
11
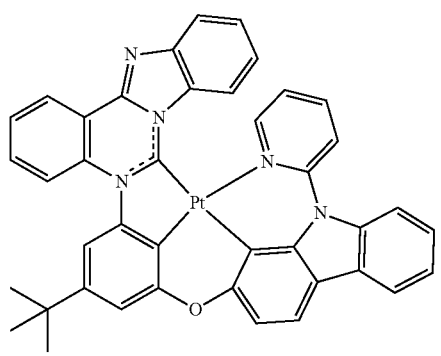
12
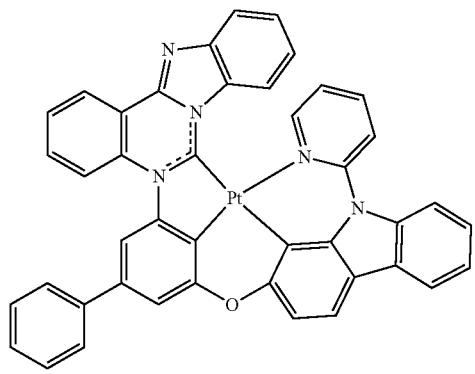
13
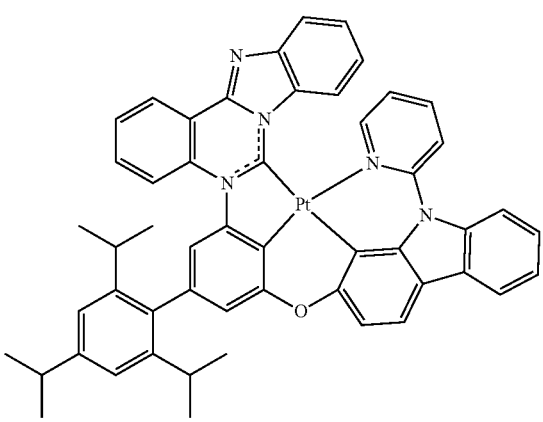
14
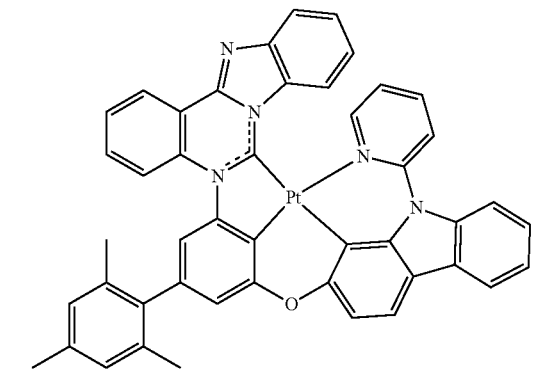
15
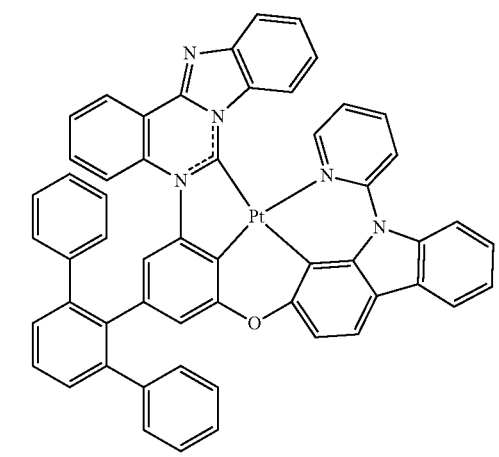
16
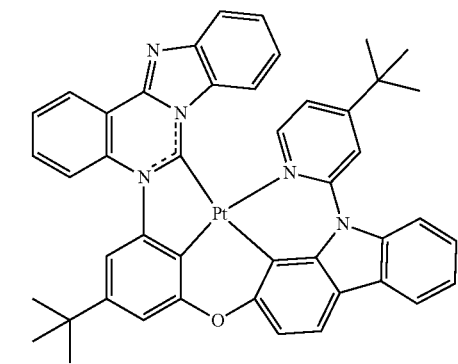
17
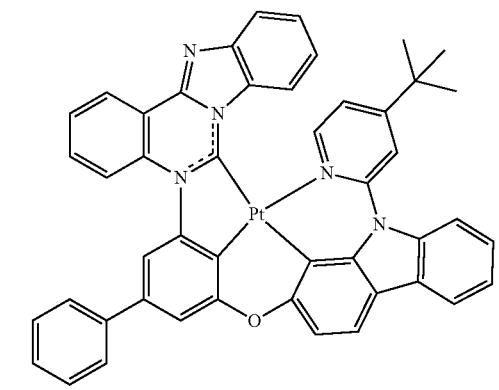

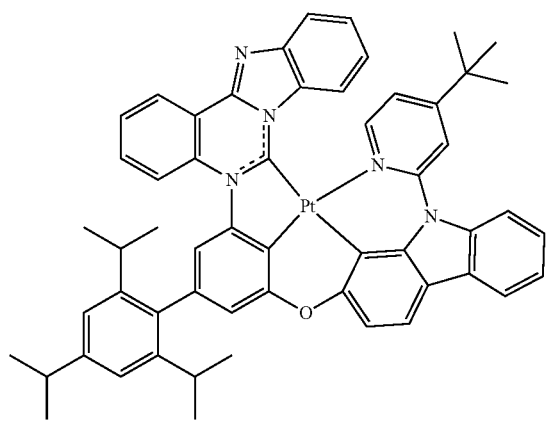
18
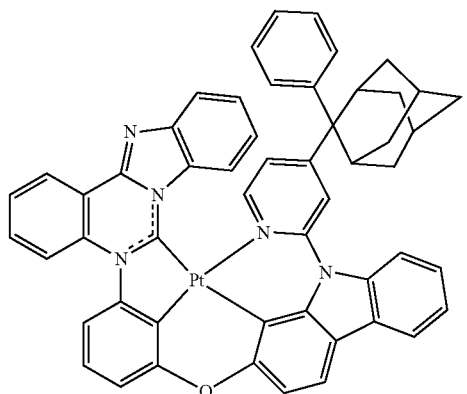
21
19
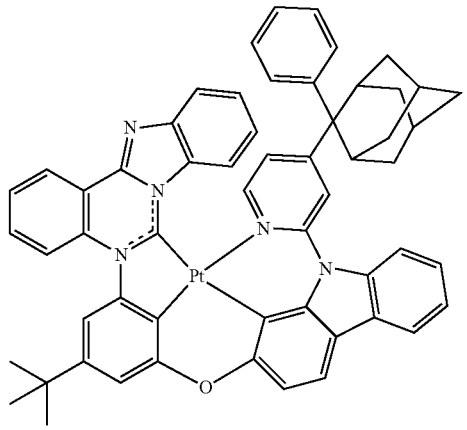
22
20
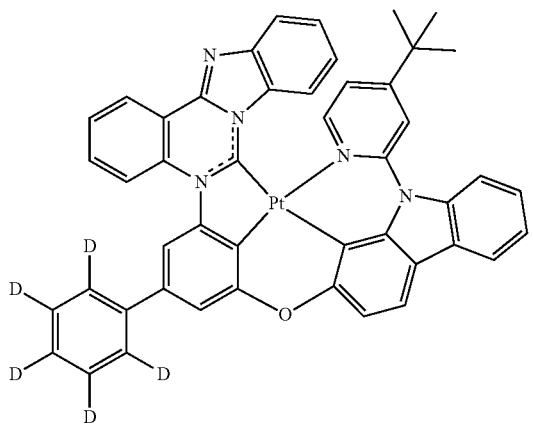
23
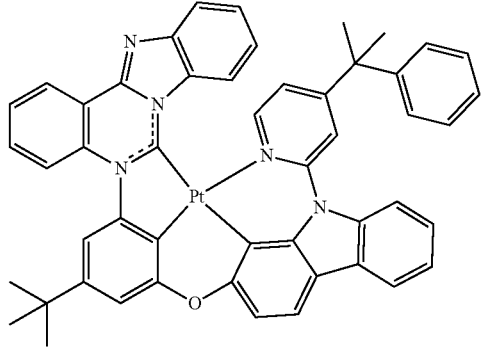
24

25
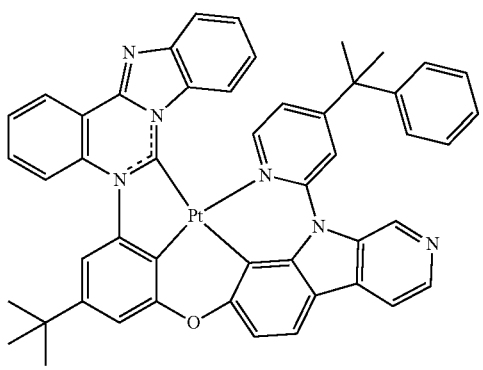
26
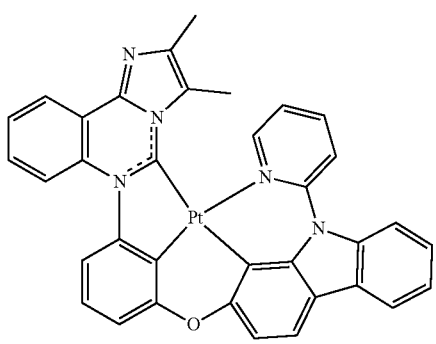
27
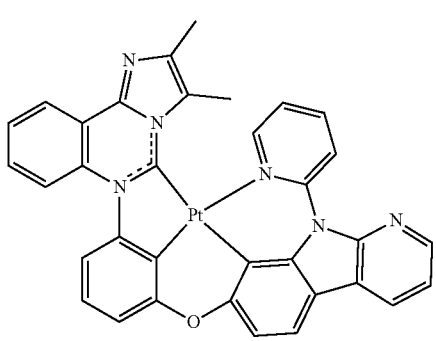
28
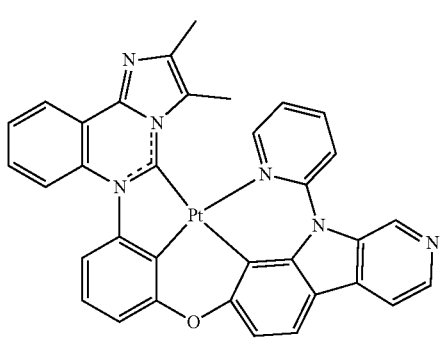
29
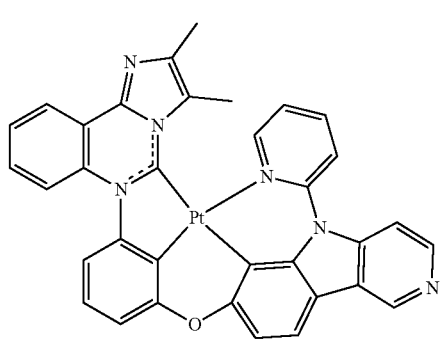
30
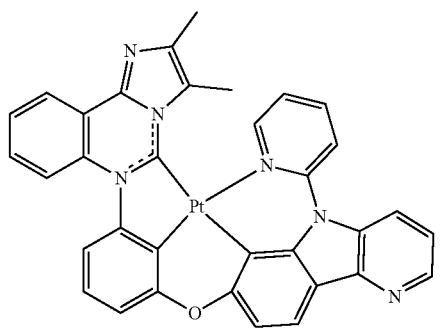
31
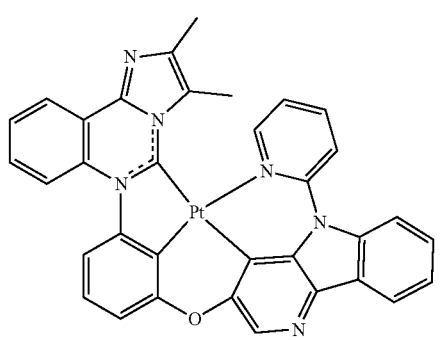
32
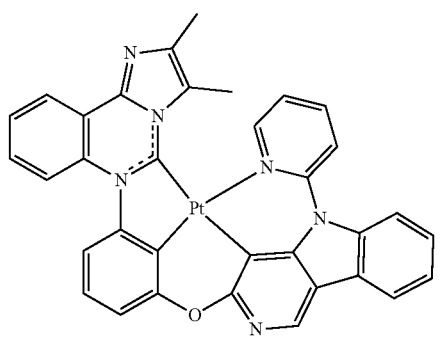

33
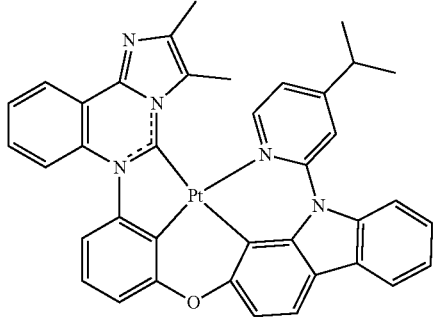
34
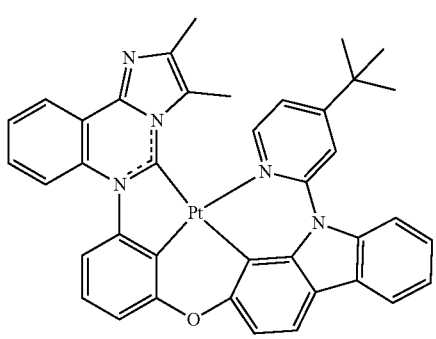
35
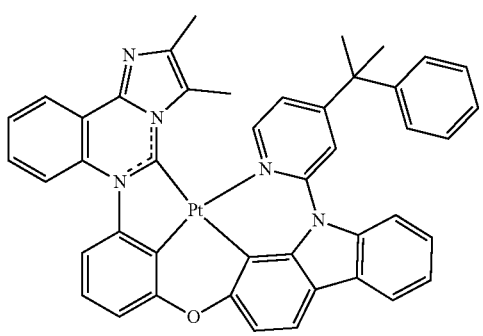
36
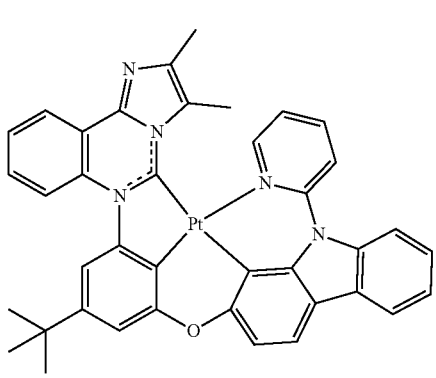
37
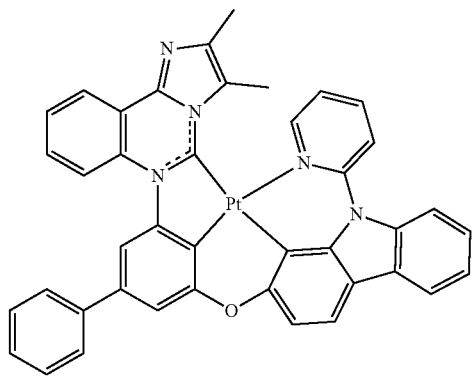
38
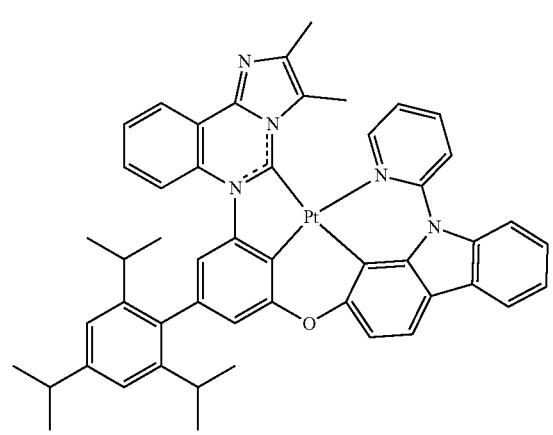
39
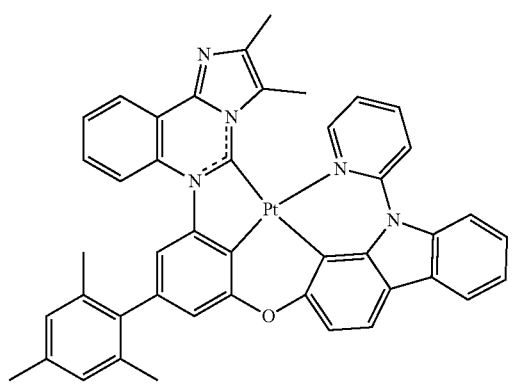

21
-continued
40
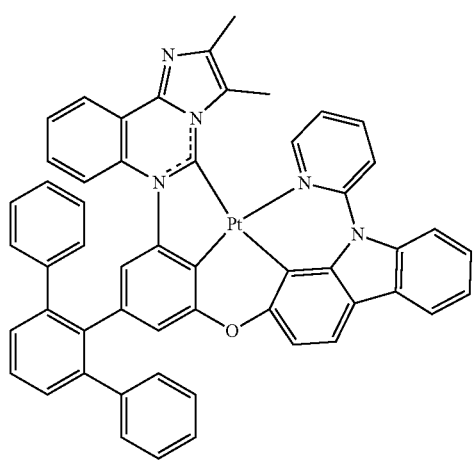
41
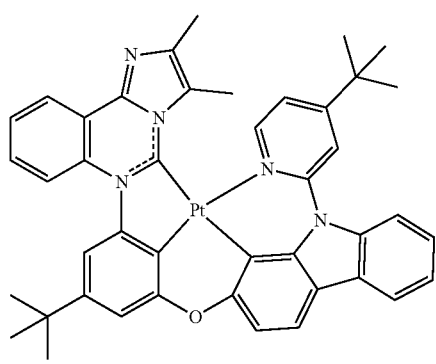
42
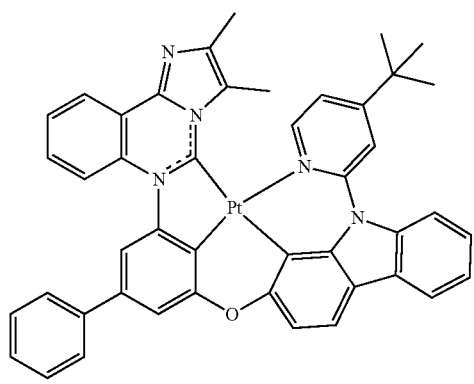
43
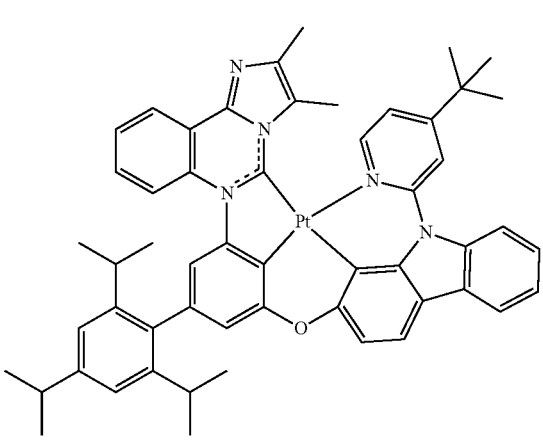
22
-continued
44
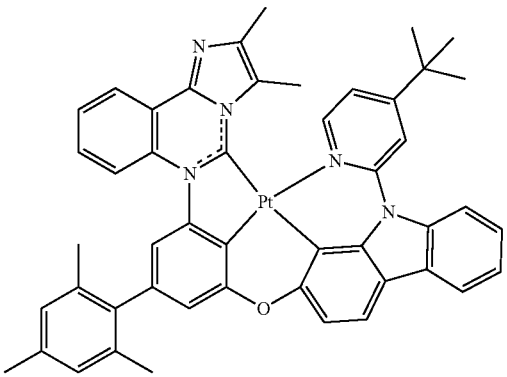
45
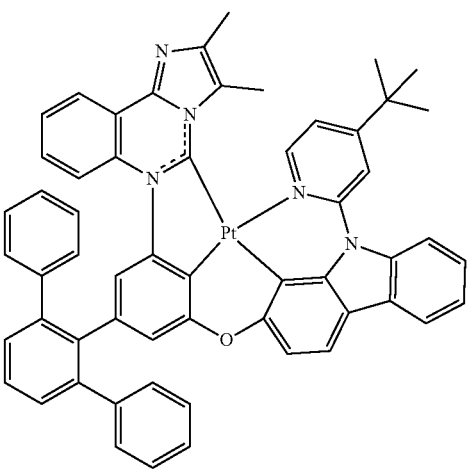
46
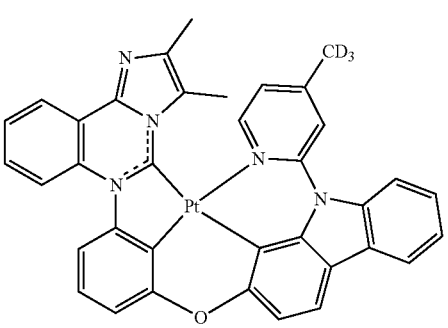
47
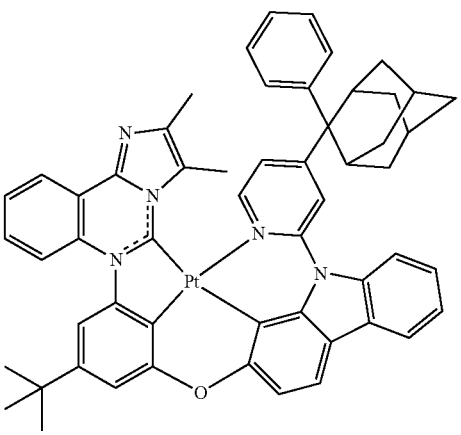

48
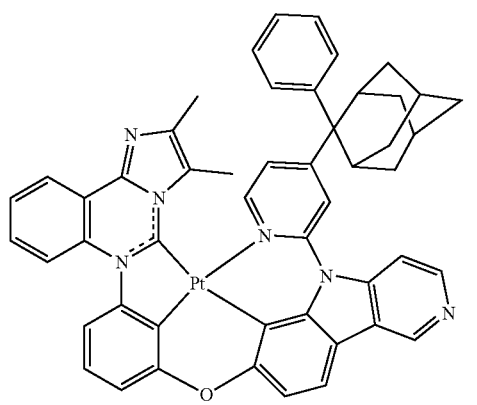
49
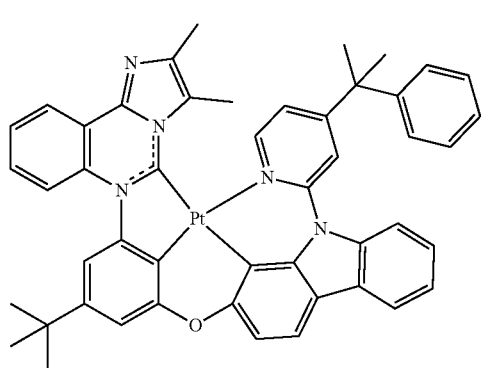
50
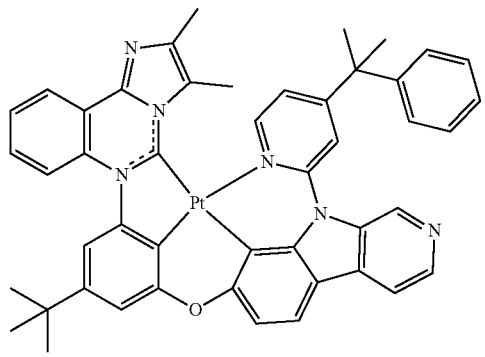
51
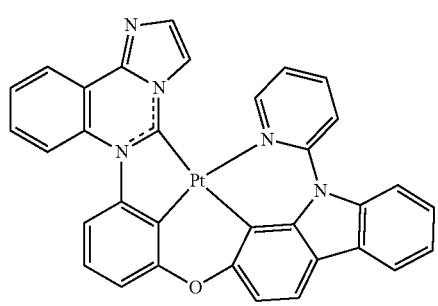
52
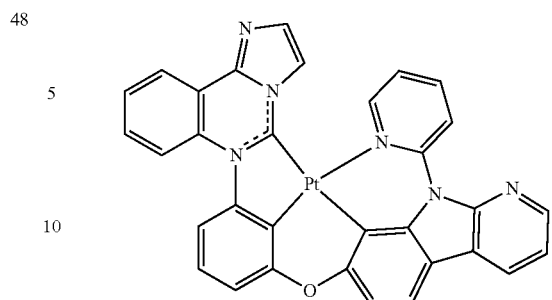
53
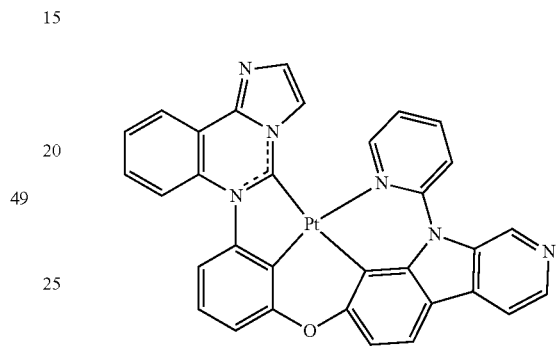
54
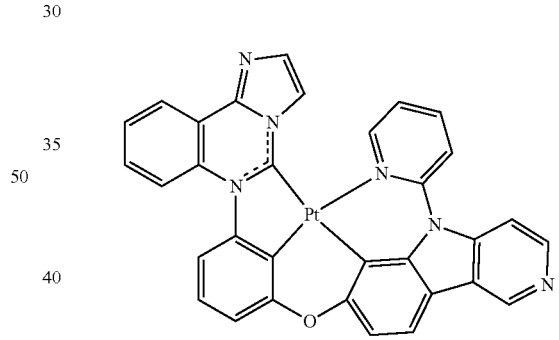
55
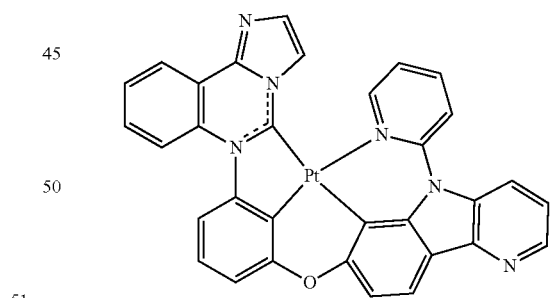
56
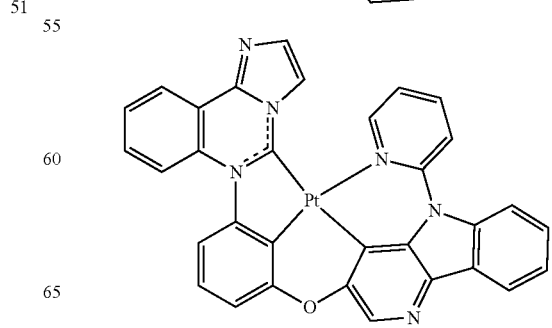

-continued
57
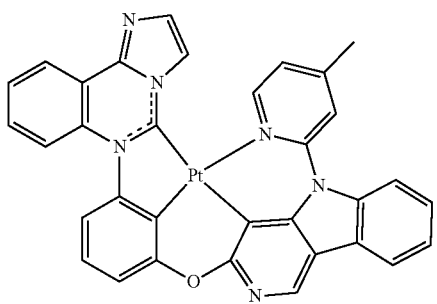
58
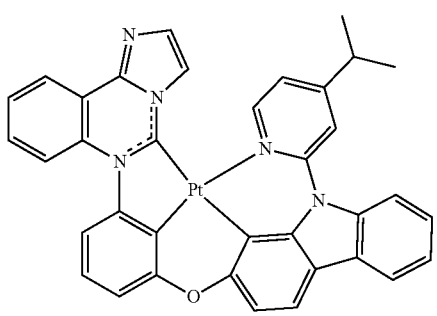
59
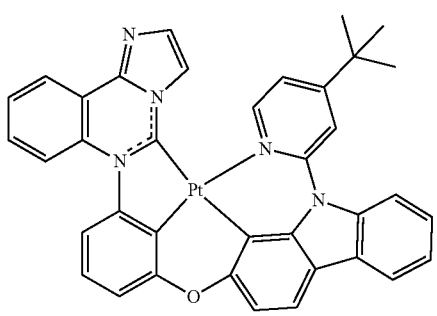
60
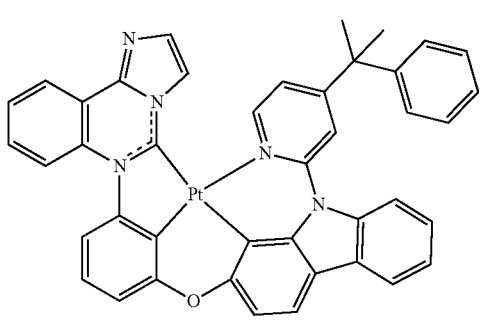
61
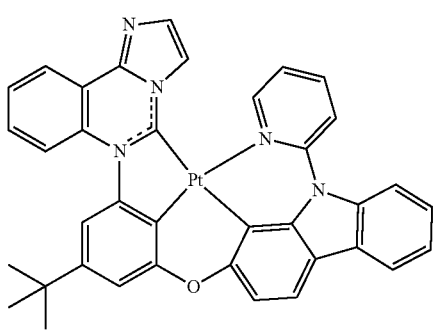
-continued
62
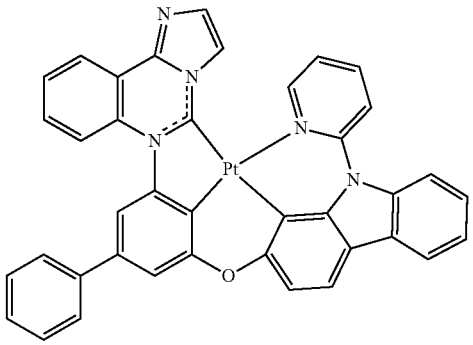
63
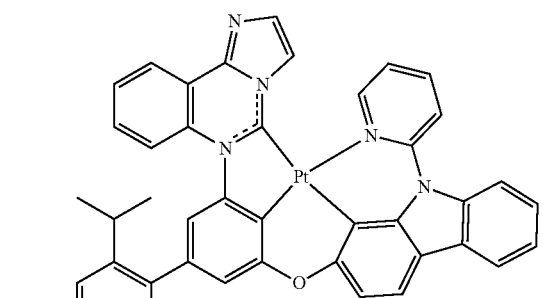
64
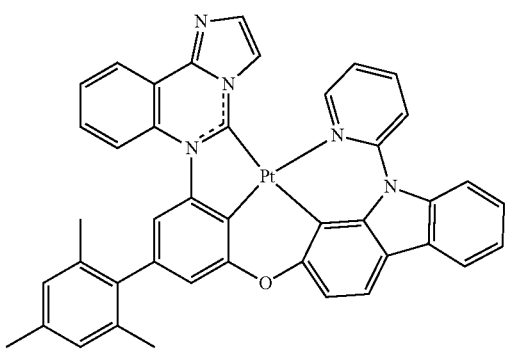
65
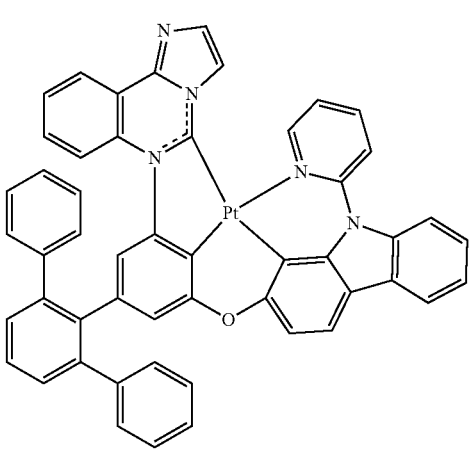

66
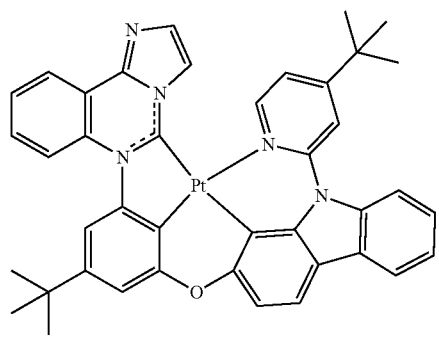
67
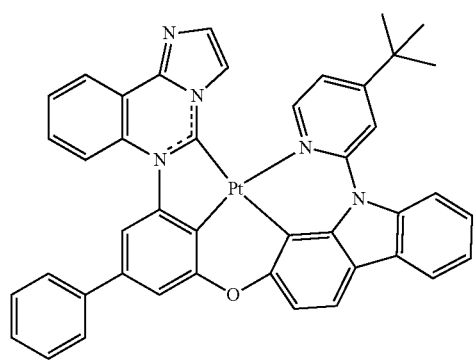
68
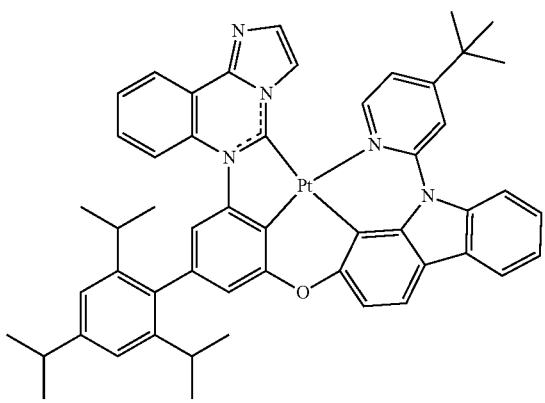
69
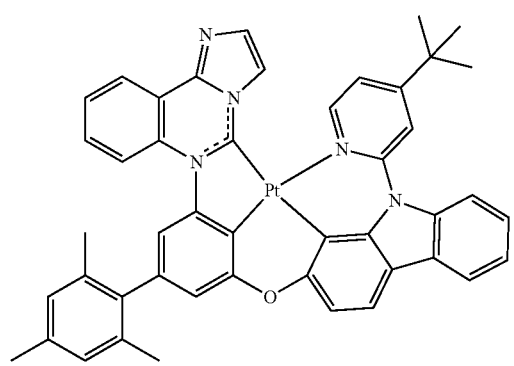
70
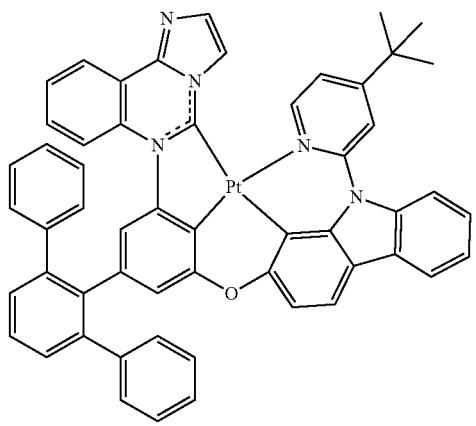
71
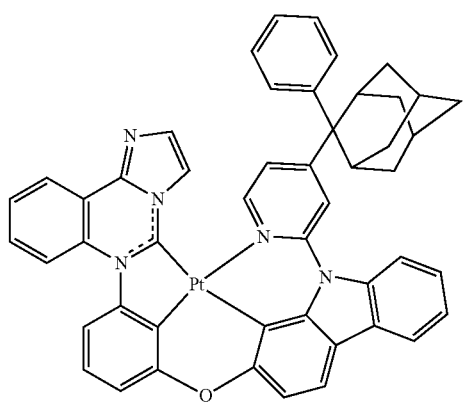
72
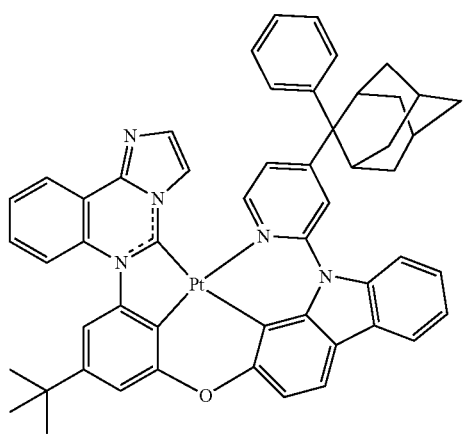
73
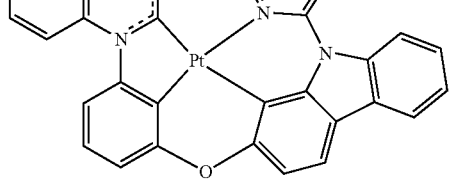

74
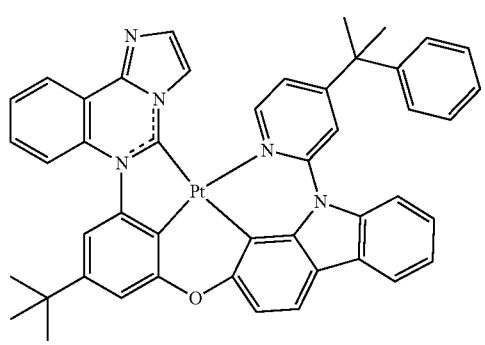
75
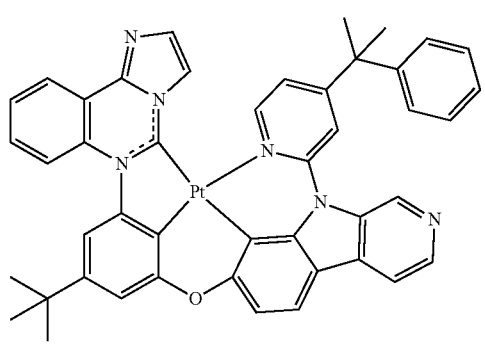
76
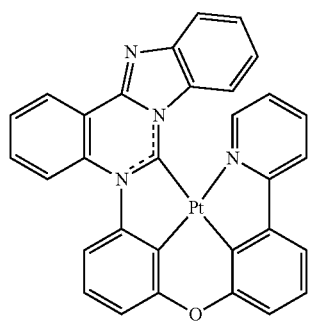
77
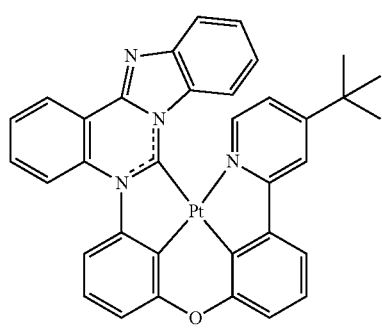
78
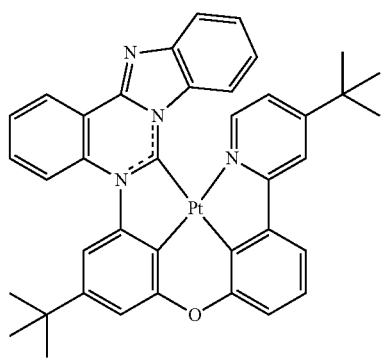
79
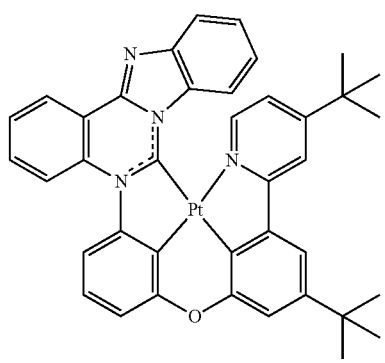
80
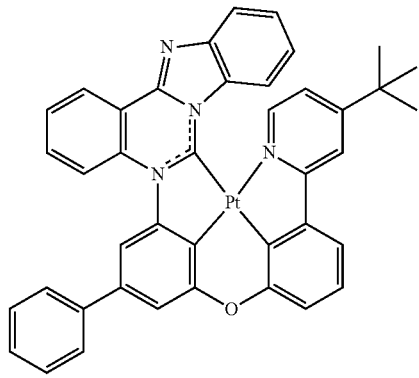
81
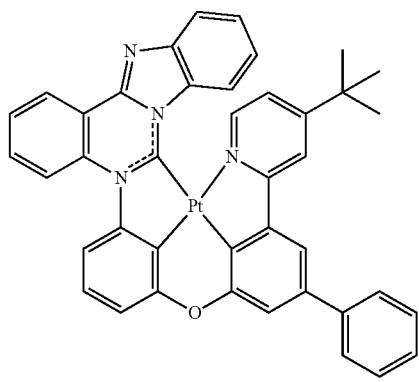

82
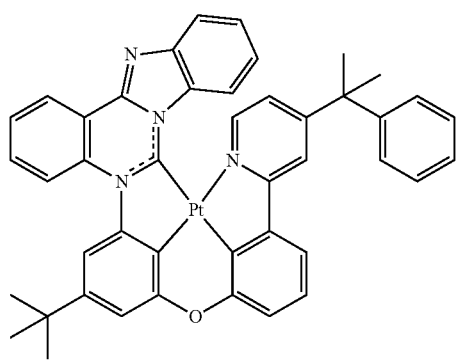
83
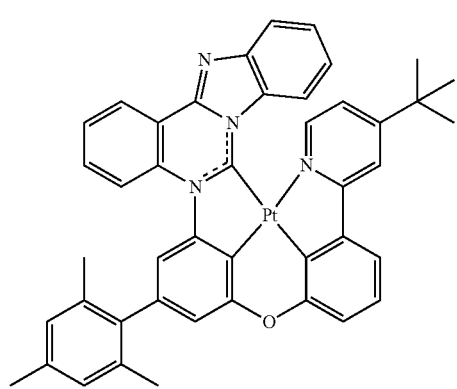
84
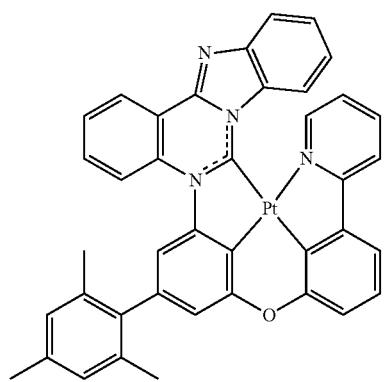
85
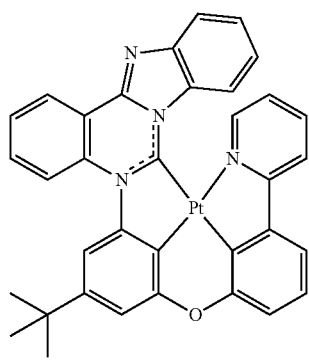
86
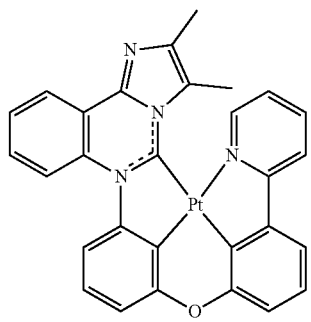
87
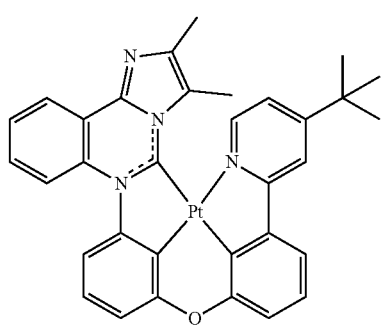
88
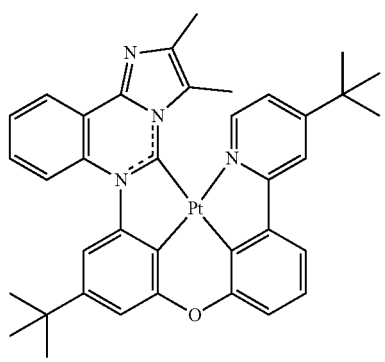
89
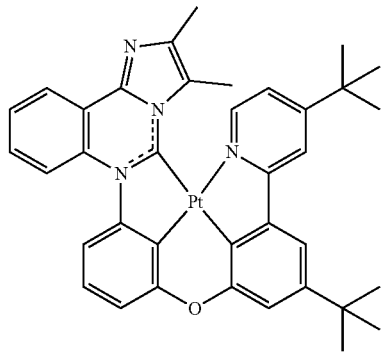

-continued
90
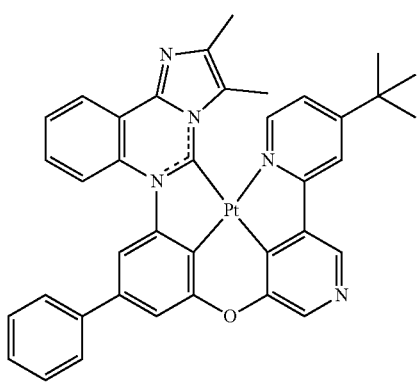
91
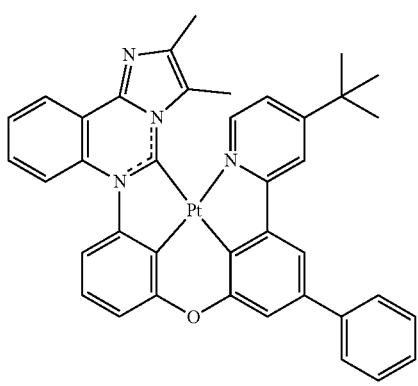
92
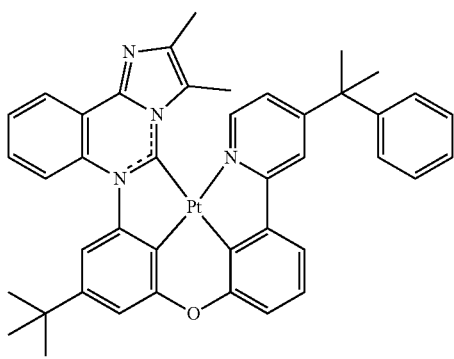
93
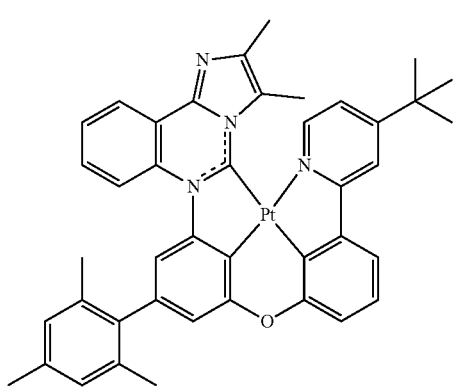
-continued
94
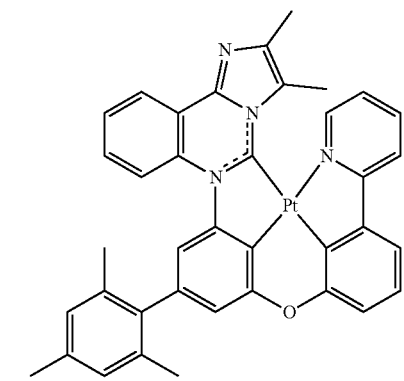
95
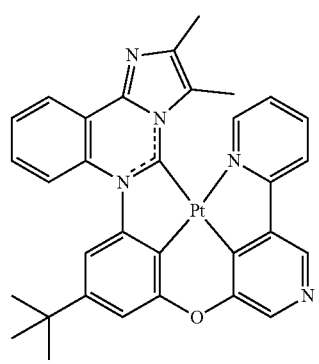
96
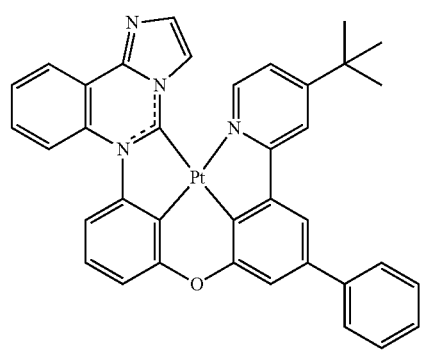
97
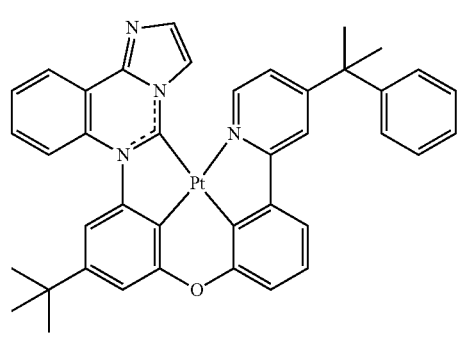

98
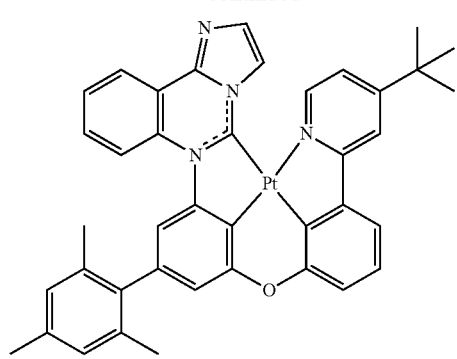
99
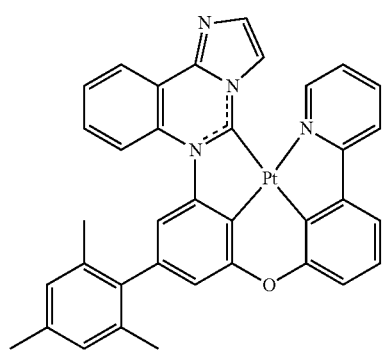
100
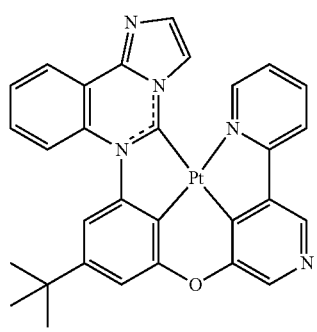
101
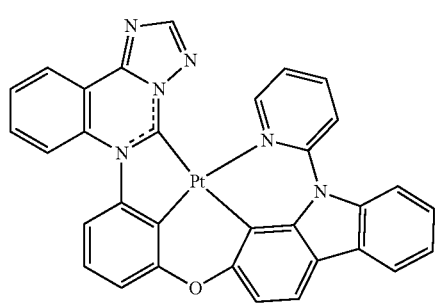
102
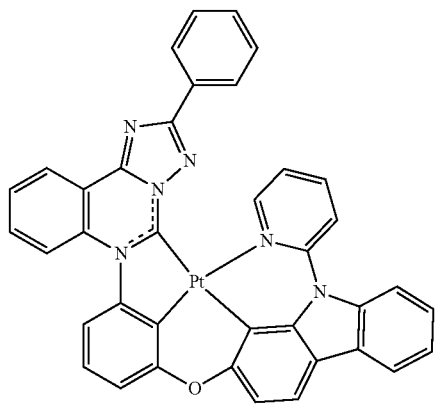
103
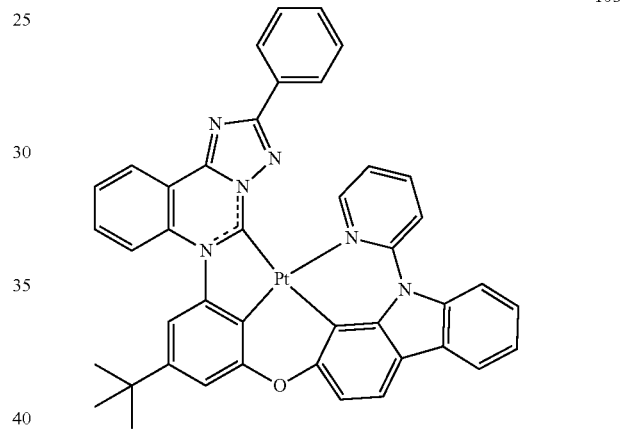
104
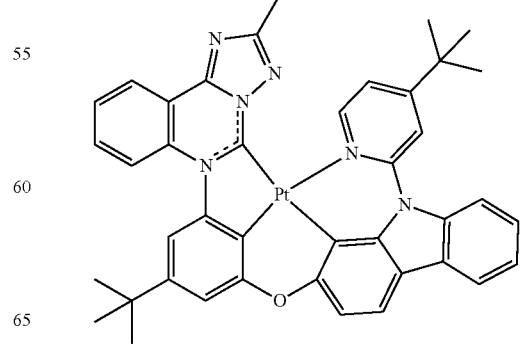

105
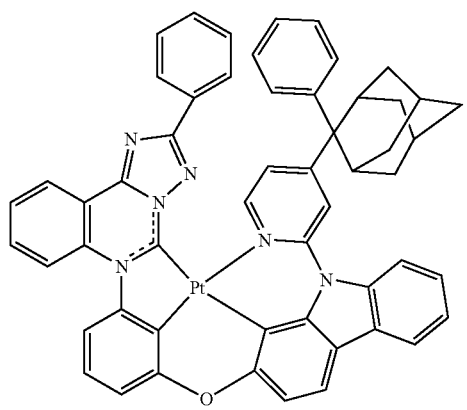
106
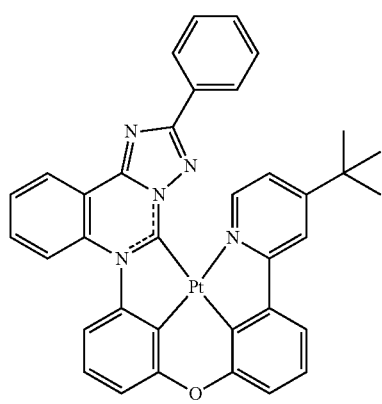
107
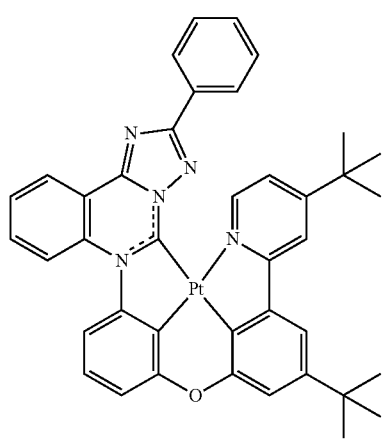
108
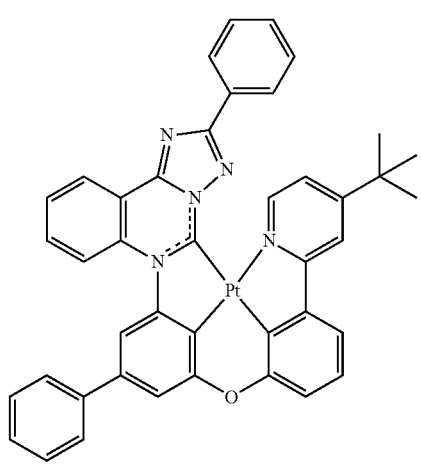
109
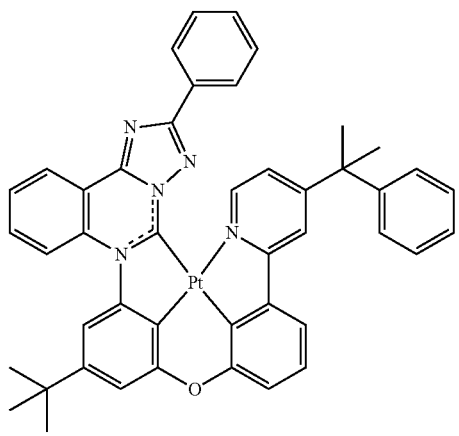
110
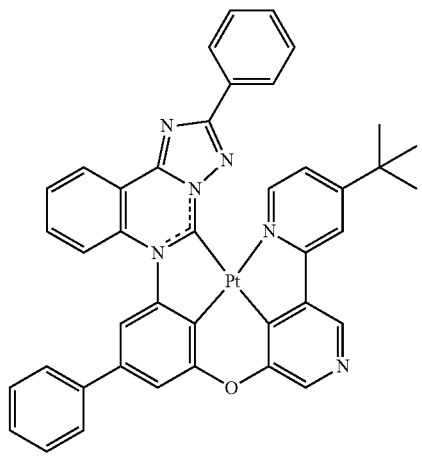
111
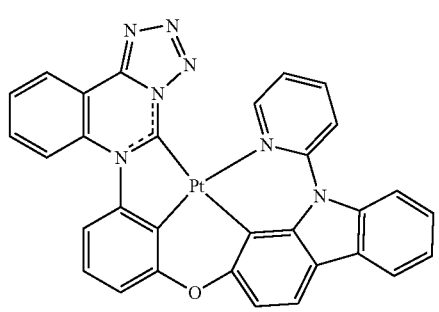

112 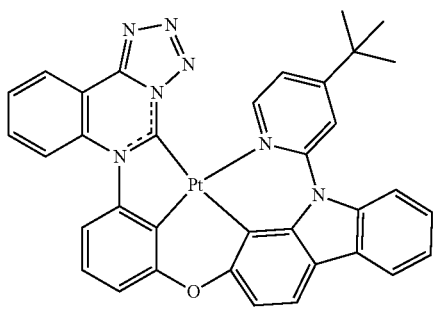
113 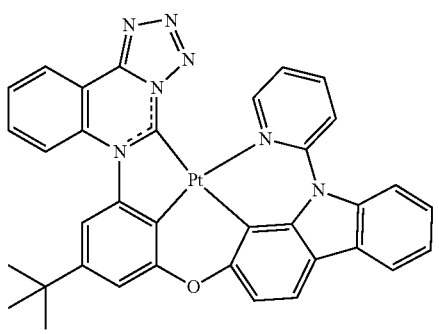
114 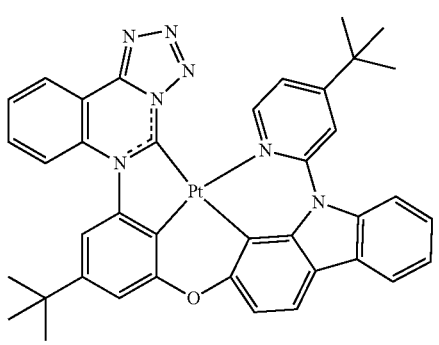
115 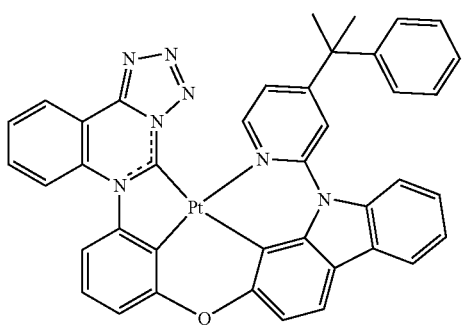
116 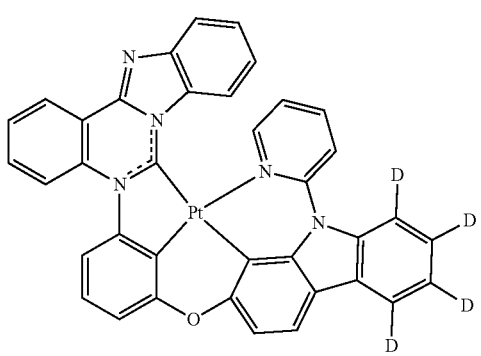
117 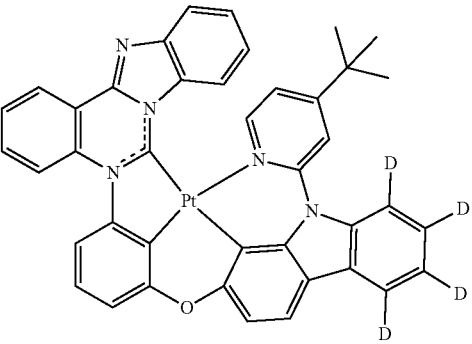
118 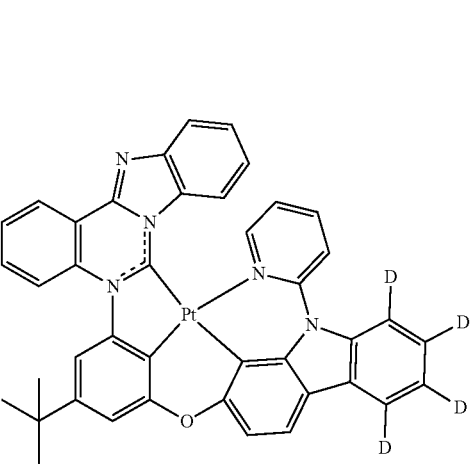
119 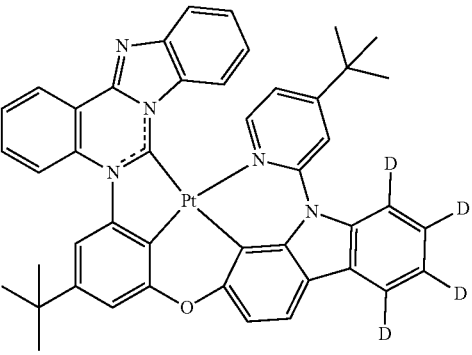
120 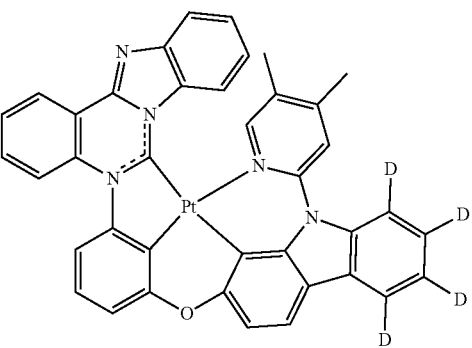

121 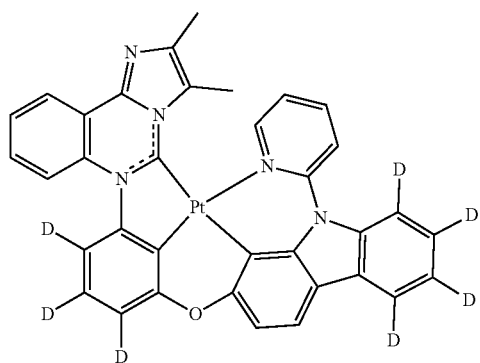
122 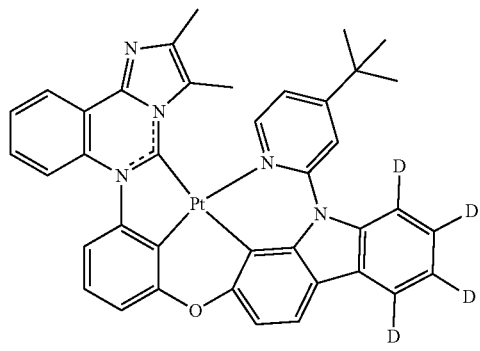
123 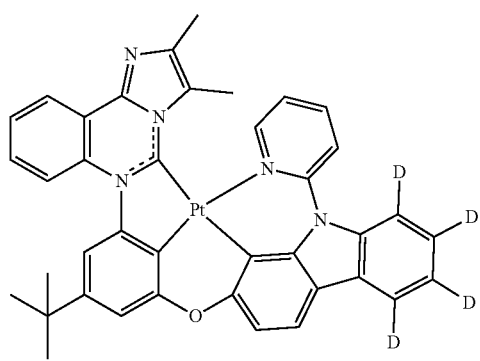
124 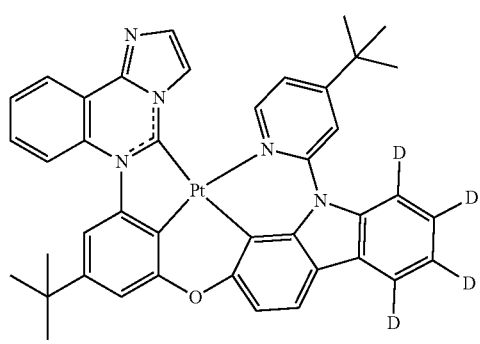
125 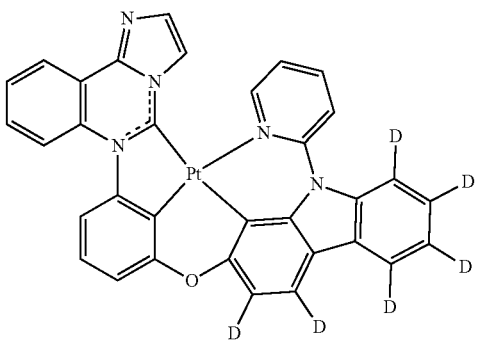
126 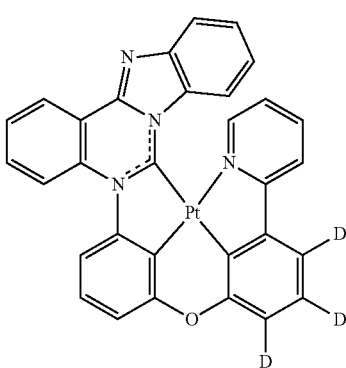
127 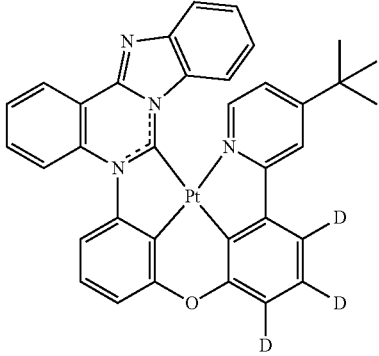
128 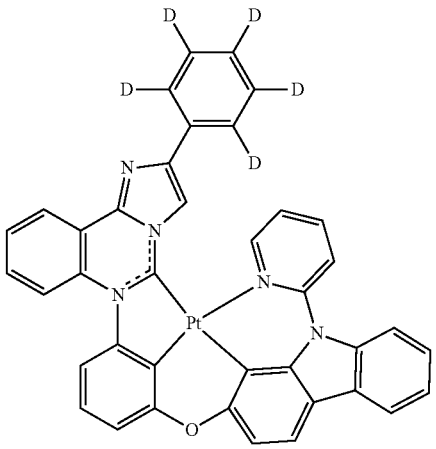

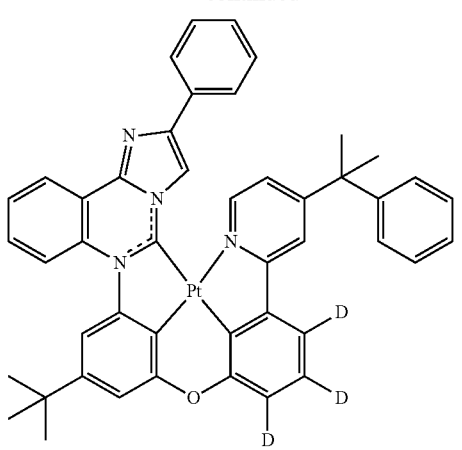

129

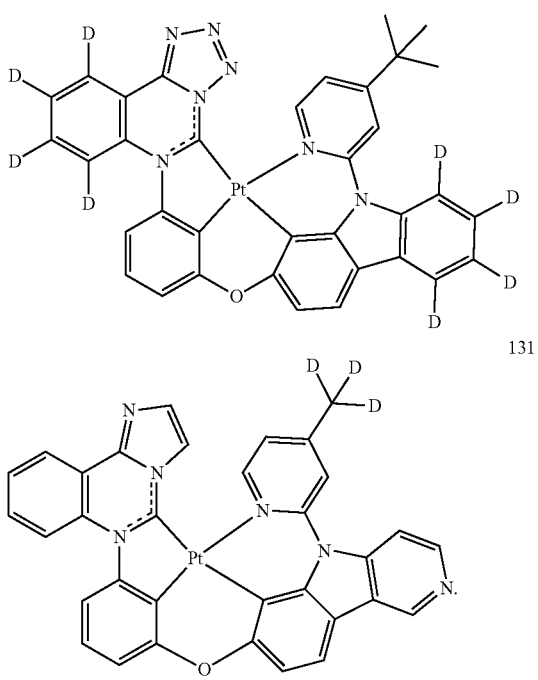

130

131

Because in the organometallic compound represented by Formula 1, a carbene ligand that is bonded to the central metal thereof ($M_1$ in Formula 1) includes 6 atoms, the binding force between the central metal and the carbene ligand is strengthened and thus, rigidity may be increased. Accordingly, the lifespan characteristics of a light-emitting device to which the organometallic compound is applied, may be improved.

For example, because the carbene ligand in the organometallic compound represented by Formula 1 has a condensed cyclic structure, metal-to-ligand charge transfer (MLCT) is increased due to the increase in the sigma binding force, and thus, the stability of a device utilizing the organometallic compound may be increased.

In addition, in the organometallic compound represented by Formula 1, the atom of the carbene ligand connected to the central metal is carbon, and the carbon forms, with the central metal, a covalent bond rather than a coordinate bond, thereby increasing the binding force. Accordingly, a device utilizing the organometallic compound may have a long lifespan.

As a result, when the organometallic compound is applied to a light-emitting device, the phenomenon that the triplet exciton is transferred to the non-emissive $^3MC$ state due to ligand rupture, may be prevented or reduced, so that the stability in the excited state is suitable (e.g., excellent) and the organic light-emitting device may have suitable (e.g., excellent) lifespan and efficiency characteristics.

The organometallic compound may emit green light. For example, the organometallic compound may emit green light (a bottom emission) having a maximum luminescence wavelength (also referred to "a maximum emission wavelength") of about 500 nm or more and about 570 nm or less, but the present disclosure is not limited thereto. Accordingly, the organometallic compound represented by Formula 1 may be useful for the manufacturing of a light-emitting device that emits green light.

Synthesis methods of the organometallic compound represented by Formula may be recognizable by one of ordinary skill in the art by referring to Examples provided below.

At least one organometallic compound represented by Formula 1 may be utilized in a light-emitting device (for example, an organic light-emitting device). Accordingly, a light-emitting device may include: a first electrode; a second electrode facing the first electrode; and an interlayer located between the first electrode and the second electrode and including an emission layer, wherein the interlayer includes the organometallic compound represented by Formula 1.

In some embodiments,
the first electrode is an anode,
the second electrode is a cathode,
the interlayer further includes a hole transport region located between the first electrode and the emission layer and an electron transport region located between the emission layer and the second electrode,
the hole transport region includes a hole injection layer, a hole transport layer, an emission auxiliary layer, an electron blocking layer, or any combination thereof, and
the electron transport region may include a buffer layer, a hole blocking layer, an electron transport layer, an electron injection layer, or any combination thereof.

In an embodiment, the organometallic compound may be included between a pair of electrodes of the light-emitting device. Accordingly, the organometallic compound may be included in the interlayer of the light-emitting device, for example, in the emission layer of the interlayer. In one or more embodiments, the organometallic compound represented by Formula 1 may be utilized as a material for a capping layer located outside a pair of electrodes of a light-emitting device (e.g., an organic light-emitting device).

In an embodiment, a second capping layer may be located on the second electrode, and
the second capping layer may include a material having a refractive index of 1.6 or more at a wavelength of 589 nm.

In an embodiment, the emission layer may include the organometallic compound.

In an embodiment, the emission layer may further include a host, and the amount of the organometallic compound may be from 0.01 parts by weight to 49.99 parts by weight based on 100 parts by weight of the emission layer.

For example, the emission layer may emit green light having a maximum luminescence wavelength of about 500 nm to about 570 nm.

For example, the electron transport region may contain a phosphineoxide-containing compound.

In one or more embodiments, the light-emitting device may further include at least one of the first capping layer located outside the first electrode and the second capping layer located outside the second electrode, and the organometallic compound represented by Formula 1 may be included in at least one of the first capping layer and the second capping layer. More details for the first capping layer and/or second capping layer are the same as described in the present specification.

In an embodiment, the light-emitting device may include:
a first capping layer located outside the first electrode and including the organometallic compound represented by Formula 1;
a second capping layer located outside the second electrode and including the organometallic compound represented by Formula 1; or
the first capping layer and the second capping layer. That is, the light-emitting device may include both the first capping layer located outside the first electrode and including the organometallic compound represented by Formula 1 and the second capping layer located outside the second electrode and including the organometallic compound represented by Formula 1 (e.g., the first and second electrodes being interposed between the first and second capping layers).

The wording "(interlayer and/or capping layer) includes an organometallic compound" as used herein may be understood as "(interlayer and/or capping layer) may include one kind of organometallic compound represented by Formula 1 or two different kinds of organometallic compounds, each represented by Formula 1."

For example, the interlayer and/or capping layer may include only Compound 1 as the organometallic compound. In this regard, Compound 1 may exist in the emission layer of the light-emitting device. In one or more embodiments, the interlayer may include, as the organometallic compound, Compound 1 and Compound 2. In this regard, Compound 1 and Compound 2 may exist in the same layer (for example, both Compound 1 and Compound 2 may exist in the emission layer) or in different layers (for example, Compound 1 may exist in the emission layer, and Compound 2 may exist in the electron transport region).

The term "interlayer" as used herein refers to a single and/or a plurality of layers located between a first electrode and a second electrode in the light-emitting device.

According to another embodiment, an electronic apparatus including the light-emitting device is provided. The electronic apparatus may further include a thin-film transistor. In one or more embodiments, the electronic apparatus may further include a thin-film transistor including a source electrode and a drain electrode, and the first electrode of the light-emitting device may be electrically connected to the source electrode or the drain electrode. In an embodiment, the electronic apparatus may further include a color filter, a color conversion layer, a touch screen layer, a polarizing layer, or any combination thereof. More details on the electronic apparatus are the same as described in the present specification

[Description of FIG. 1]
FIG. 1 is a schematic cross-sectional view of a light-emitting device 10 according to an embodiment. The light-emitting device 10 includes a first electrode 110, an interlayer 130, and a second electrode 150.

Hereinafter, the structure of the light-emitting device 10 according to an embodiment and a method of manufacturing the light-emitting device 10 will be described in connection with FIG. 1.

[First Electrode 110]
In FIG. 1, a substrate may be additionally located under the first electrode 110 or above the second electrode 150.

The substrate may be a glass substrate and/or a plastic substrate. The substrate may be a flexible substrate. In one or more embodiments, the substrate may include plastics with suitable (e.g., excellent) heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a high work function material that can easily inject holes may be utilized as a material for a first electrode 110.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In one or more embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be utilized as a material for forming the first electrode 110.

The first electrode 110 may have a single-layered structure including (e.g., consisting of) a single layer or a multi-layered structure including a plurality of layers. In an embodiment, the first electrode 110 may have a three-layered structure of ITO/Ag/ITO.

[Interlayer 130]
The interlayer 130 is located on the first electrode 110. The interlayer 130 includes an emission layer.

The interlayer 130 may further include a hole transport region located between the first electrode 110 and the emission layer, and an electron transport region located between the emission layer and the second electrode 150.

The interlayer 130 may further include metal-containing compounds such as organometallic compounds, inorganic materials such as quantum dots, and/or the like, in addition to various organic materials.

In one or more embodiments, the interlayer 130 may include, i) two or more emitting units sequentially stacked between the first electrode 110 and the second electrode 150 and ii) a charge generation layer located between the two (e.g., adjacent two) emitting units. When the interlayer 130 includes the emitting units and the charge generation layer as described above, the light-emitting device 10 may be a tandem light-emitting device.

[Hole Transport Region in Interlayer 130]
The hole transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The hole transport region may include a hole injection layer (HIL), a hole transport layer (HTL), an emission auxiliary layer, an electron blocking layer(EBL), or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially from the first electrode 110 in the respective stated order.

The hole transport region may include a compound represented by Formula 201, a compound represented by Formula 202, or any combination thereof:

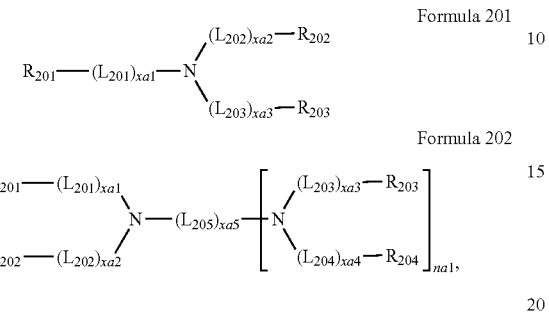

in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)—*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (for example, a carbazole group and/or the like) unsubstituted or substituted with at least one $R_{10a}$ (for example, compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, Formulae 201 and 202 may each include at least one of the groups represented by Formulae CY201 to CY217:

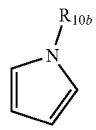

CY201

CY202
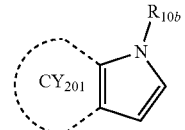

CY203
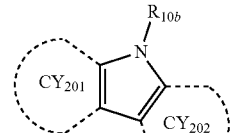

CY204
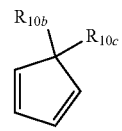

CY205
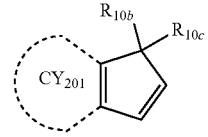

CY206
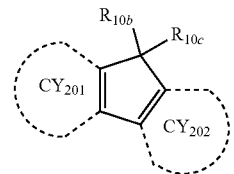

CY207
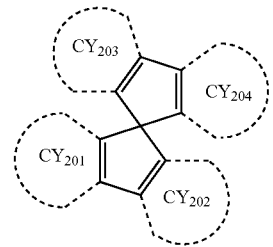

CY208
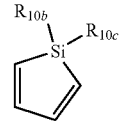

CY209
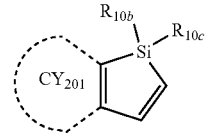

CY210
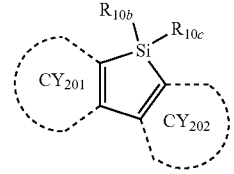

-continued

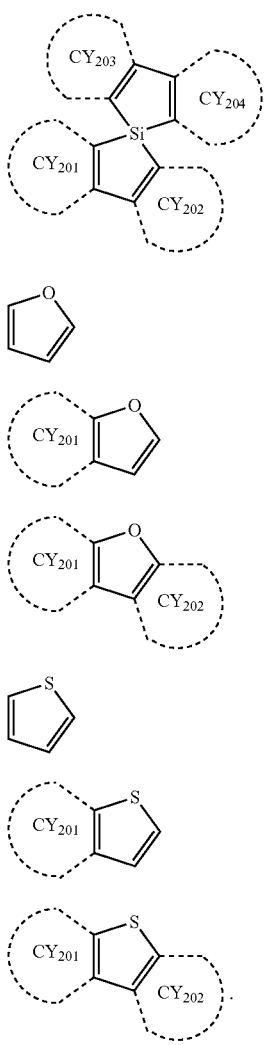

In Formulae CY201 to CY217, $R_{10b}$ and Rick may each independently be the same as described in connection with $R_{10a}$, ring CY201 to ring CY204 may each independently be a $C_3$-$C_{20}$ carbocyclic group or a $C_1$-$C_{20}$ heterocyclic group, and at least one hydrogen in Formula CY201 to CY217 may be unsubstituted or substituted with at least one $R_{10a}$ described herein.

In an embodiment, ring CY201 to ring CY204 in Formulae CY201 to CY217 may each independently be a benzene group, a naphthalene group, a phenanthrene group, or an anthracene group.

In an embodiment, Formulae 201 and 202 may each include at least one of the groups represented by Formulae CY201 to CY203.

In one or more embodiments, Formula 201 may include at least one of the groups represented by Formulae CY201 to CY203 and at least one of the groups represented by Formulae CY204 to CY217.

In one or more embodiments, in Formula 201, xa1 may be 1, $R_{201}$ may be a group represented by any one of Formulae CY201 to CY203, xa2 may be 0, and $R_{202}$ may be a group represented by any one of Formulae CY204 to CY207.

In one or more embodiments, each of Formulae 201 and 202 may not include a group represented by any of (e.g., one of) Formulae CY201 to CY203.

In one or more embodiments, each of Formulae 201 and 202 may not include a group represented by any of (e.g., one of) Formulae CY201 to CY203 and may include at least one of the groups represented by Formulae CY204 to CY217.

In an embodiment, each of Formulae 201 and 202 may not include a group represented by any of (e.g., one of) Formulae CY201 to CY217.

In an embodiment, the hole transport region may include one of Compounds HT1 to HT44, m-MTDATA, TDATA, 2-TNATA, NPB(NPD), β-NPB, TPD, spiro-TPD, spiro-NPB, methylated-NPB, TAPC, HMTPD, 4,4',4''-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

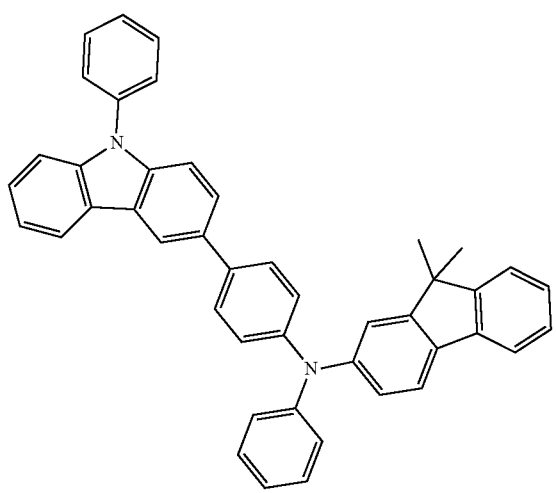

HT1

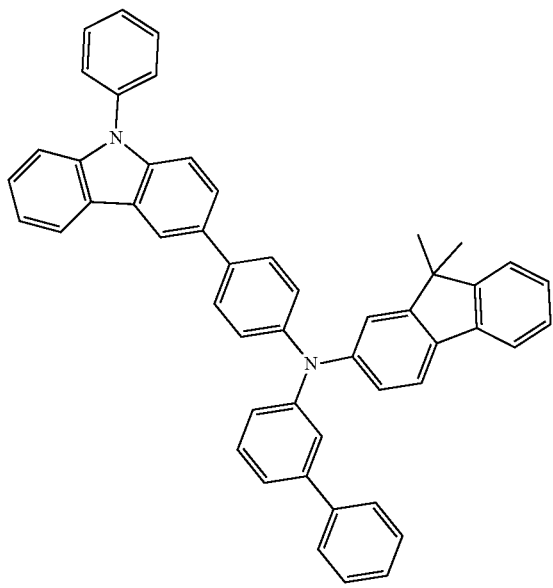
HT2
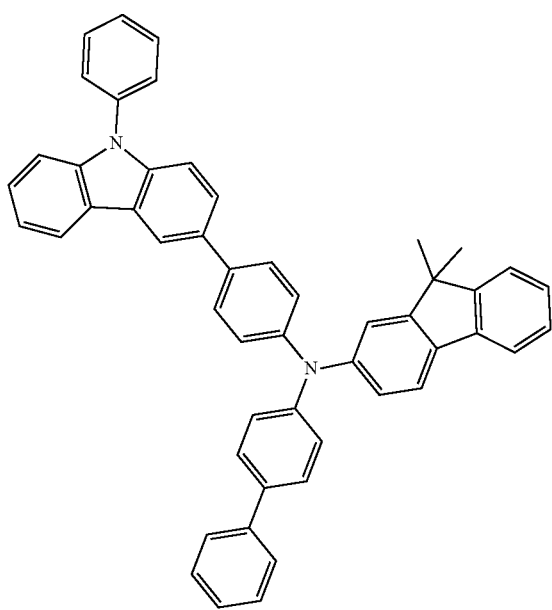
HT3

-continued
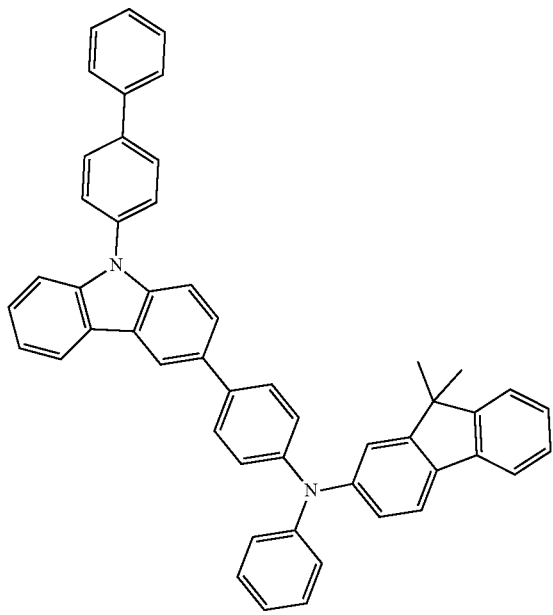
HT4
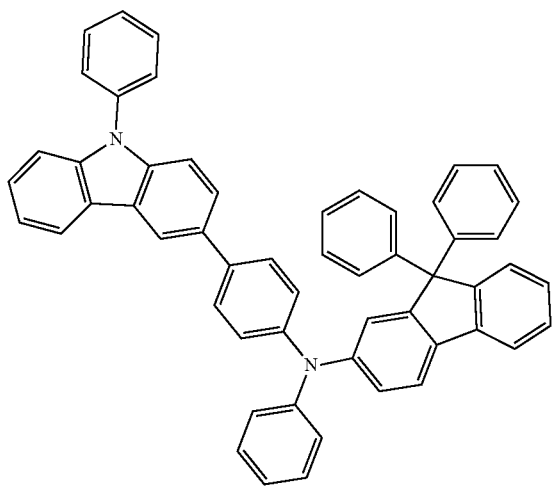
HT5

HT6
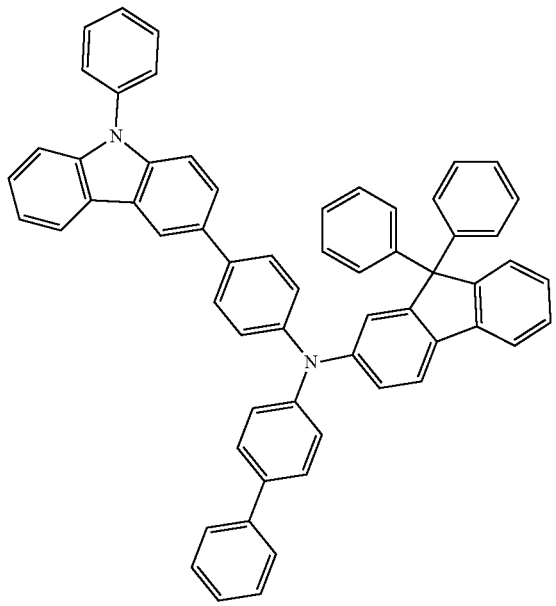
HT7
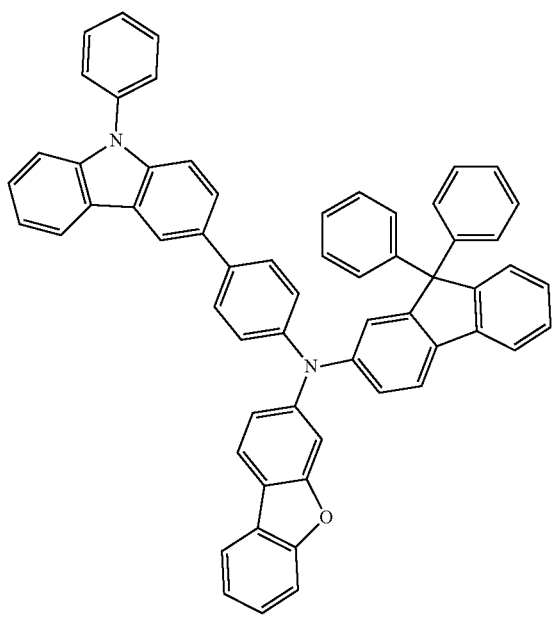

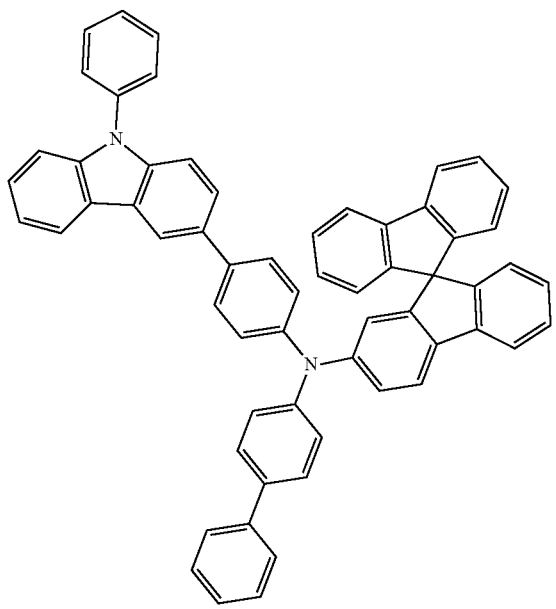
HT8
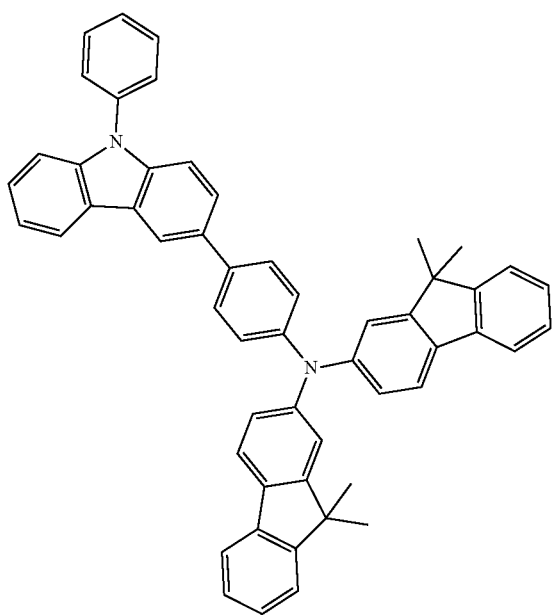
HT9

-continued
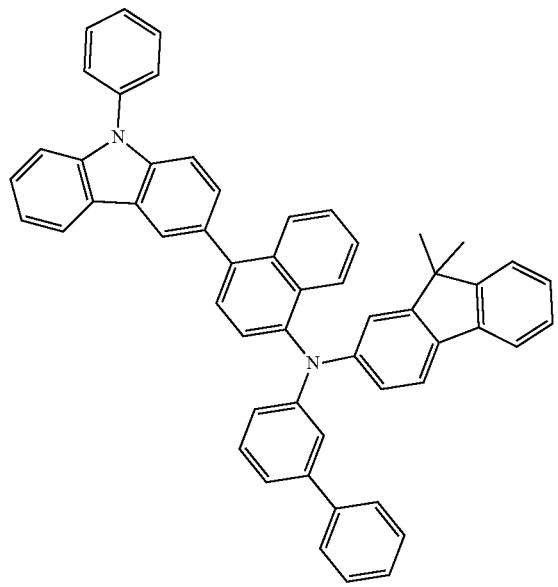
HT10
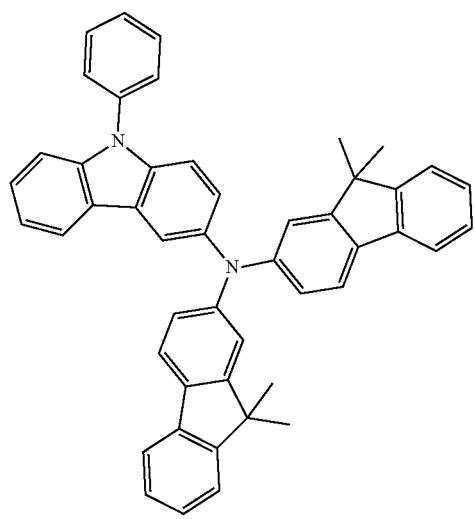
HT11
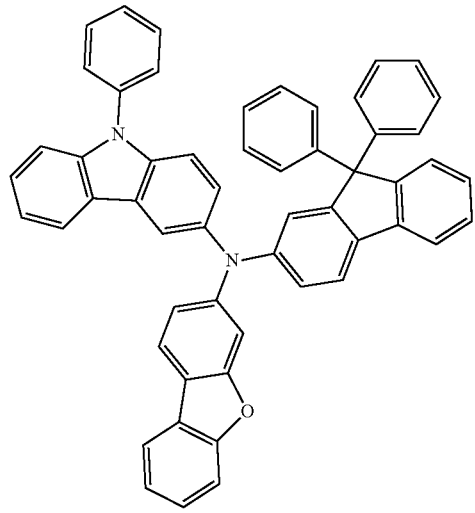
HT12

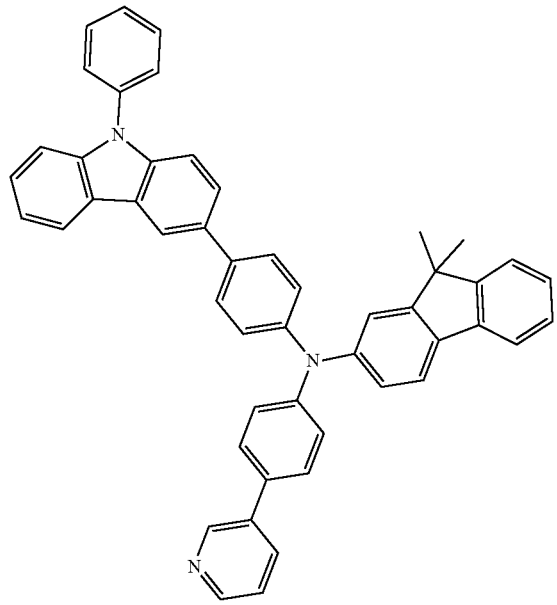
HT13
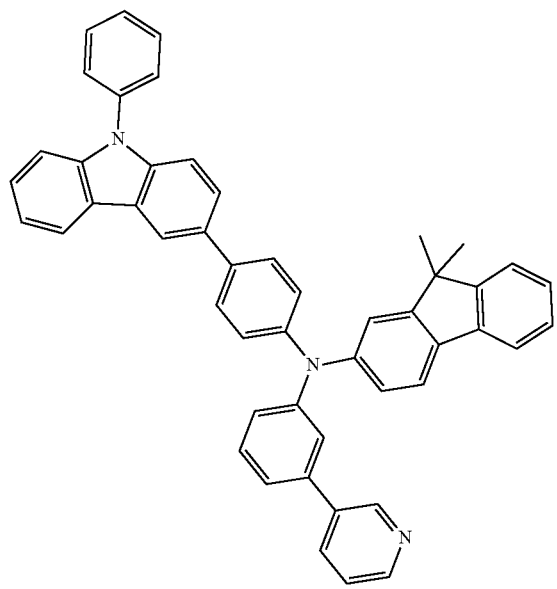
HT14

HT15
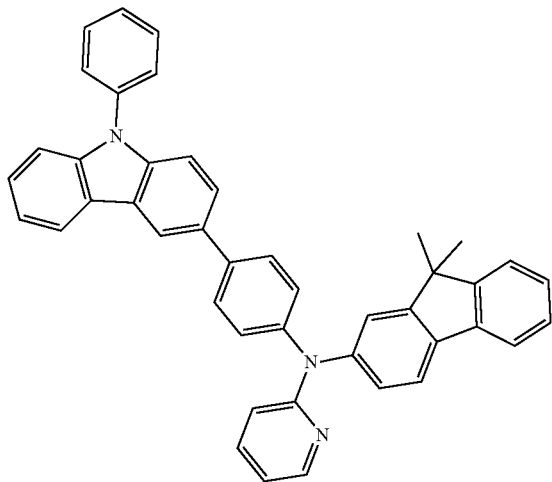
HT16
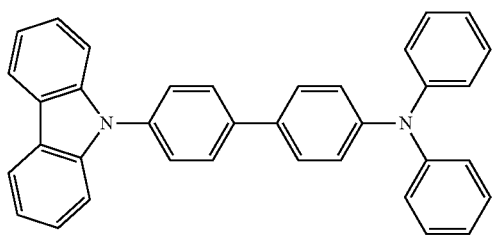
HT17
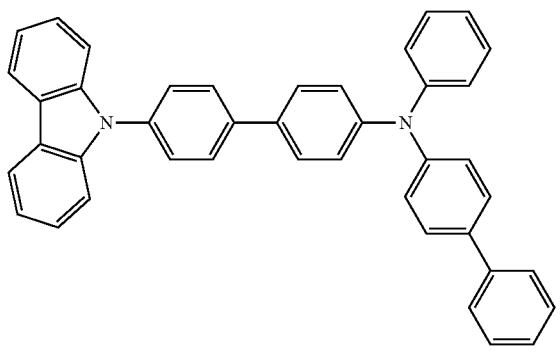
HT18
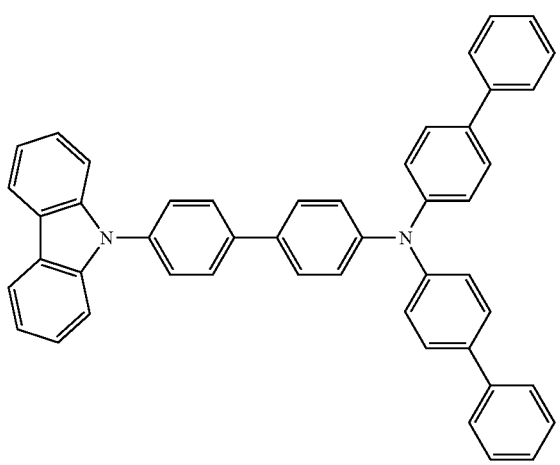

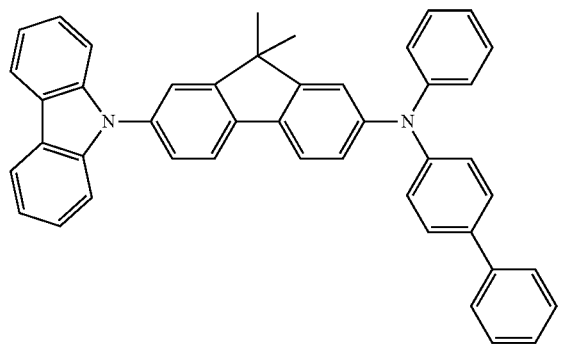
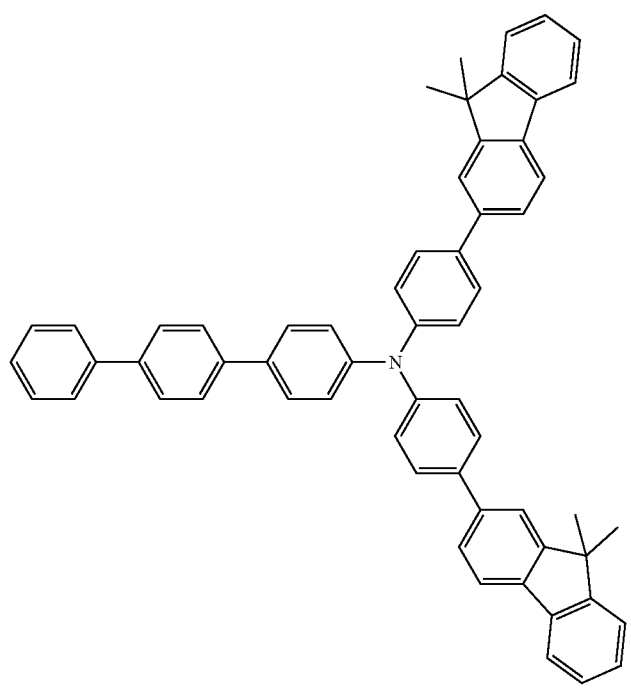
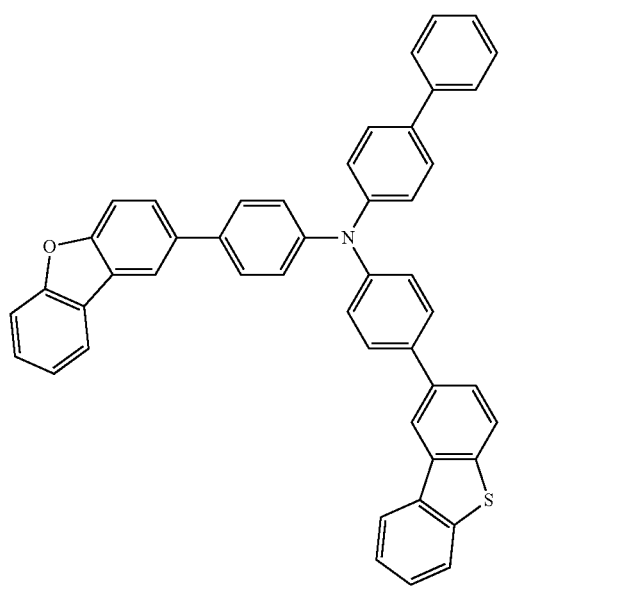
HT19
HT20
HT21

HT22
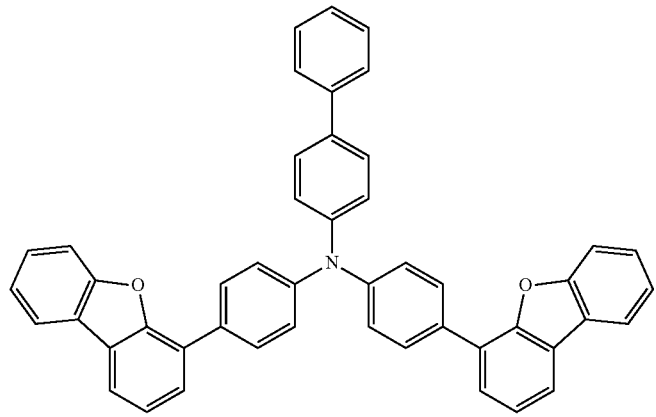
HT23
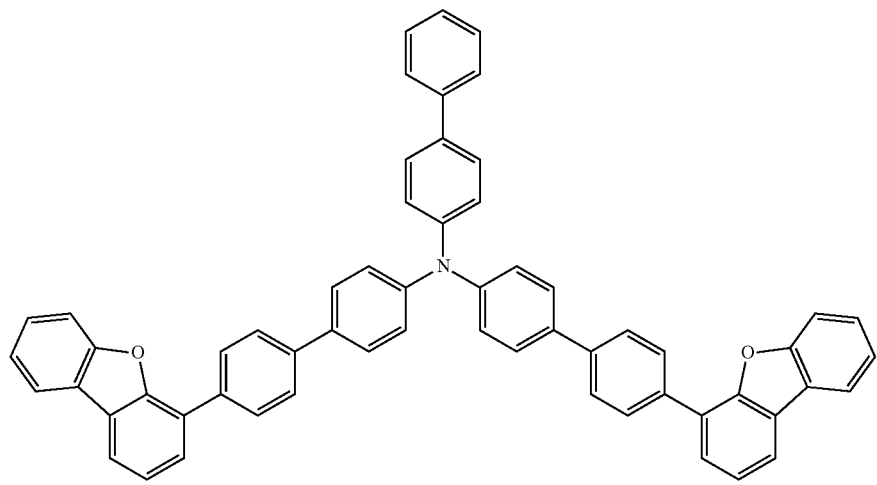
HT24
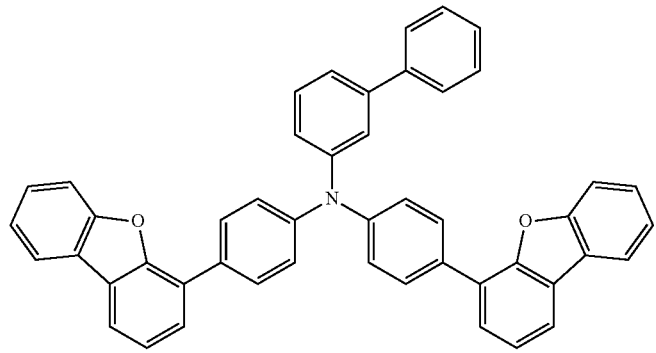

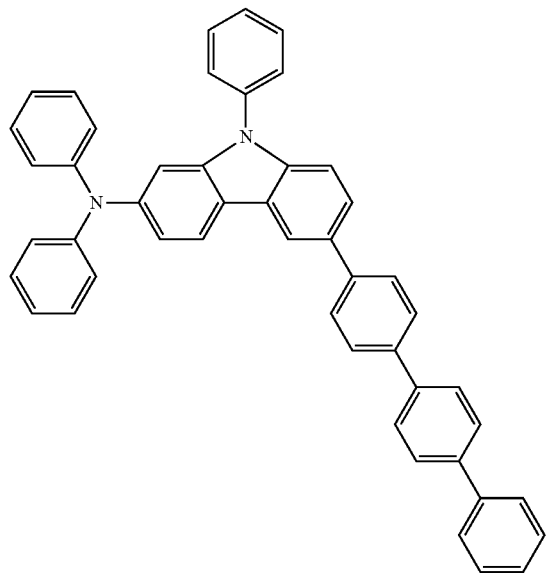
HT25
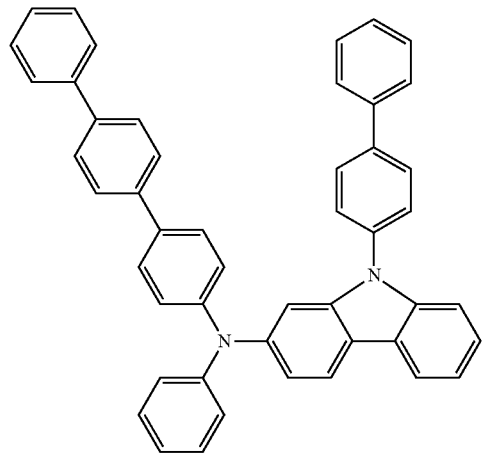
HT26
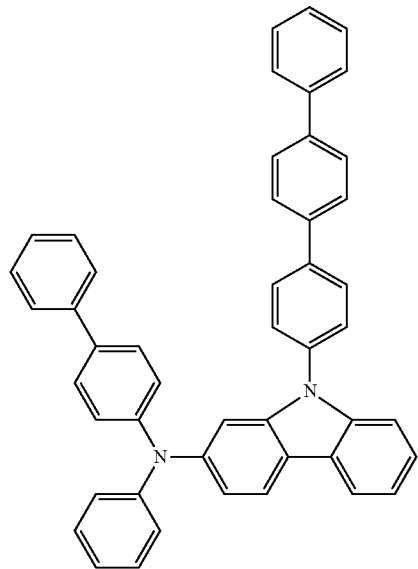
HT27

HT28
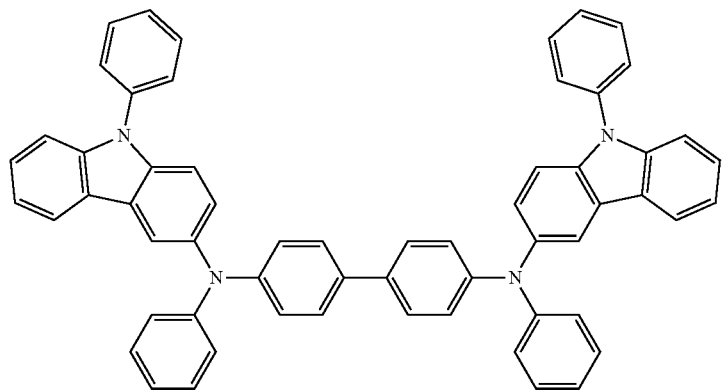
HT29
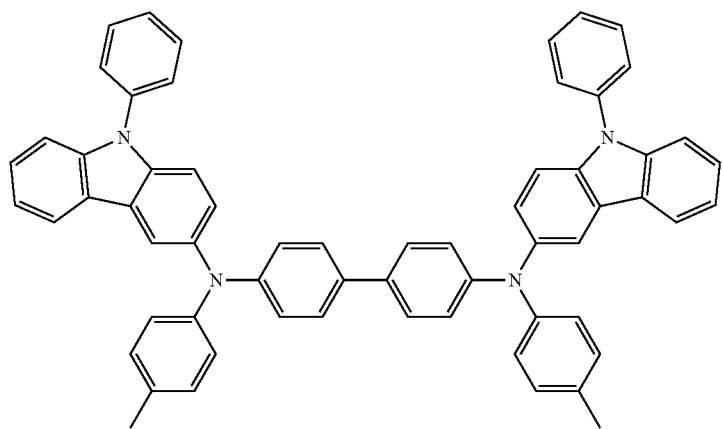
HT30
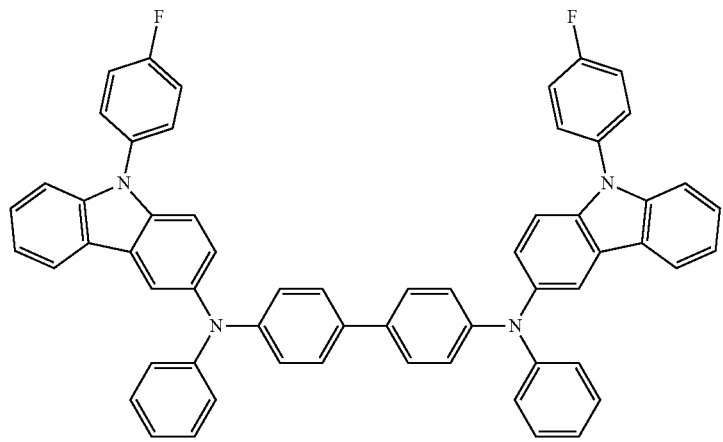

HT31
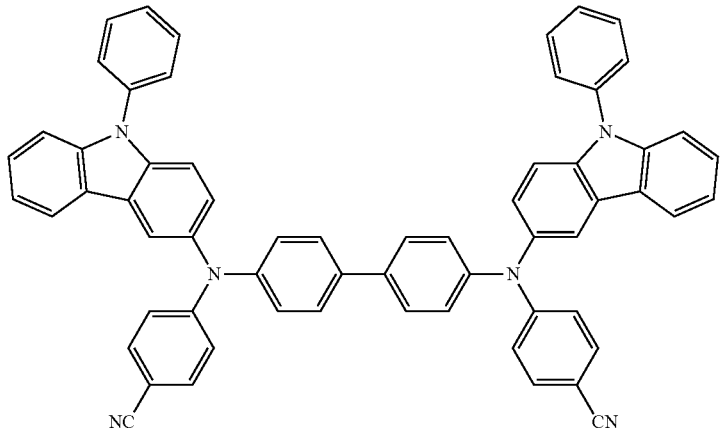
HT32
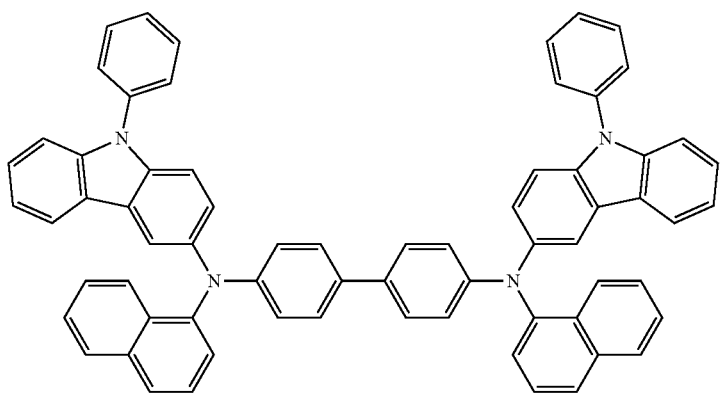
HT33
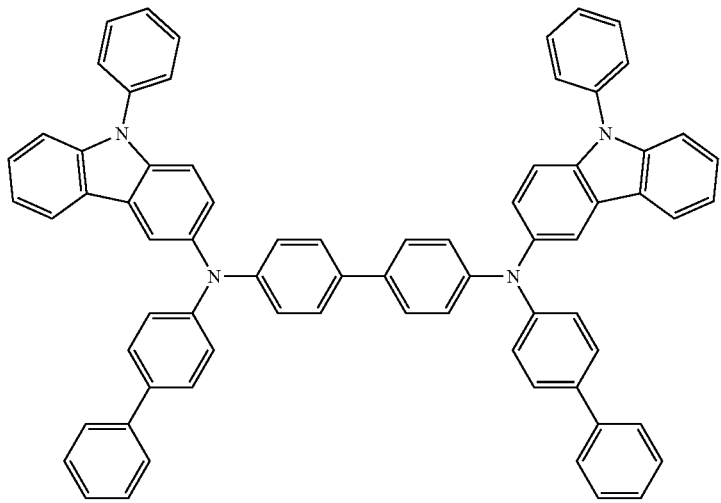

HT34

HT35

HT36

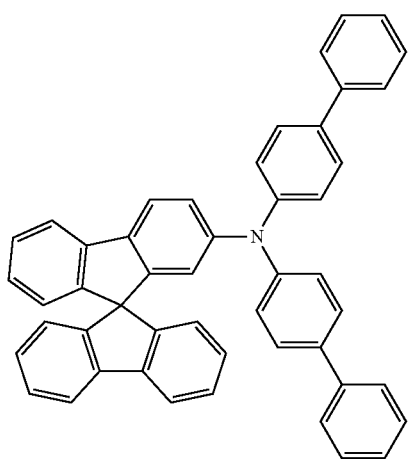
HT37
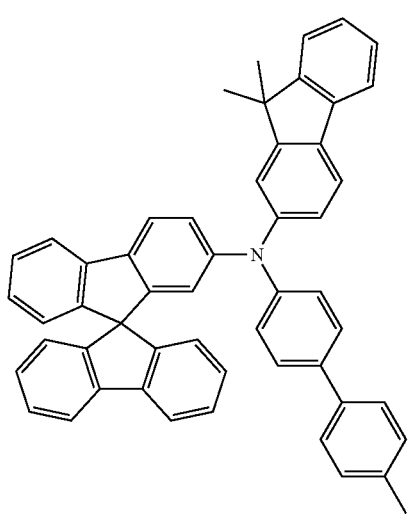
HT38
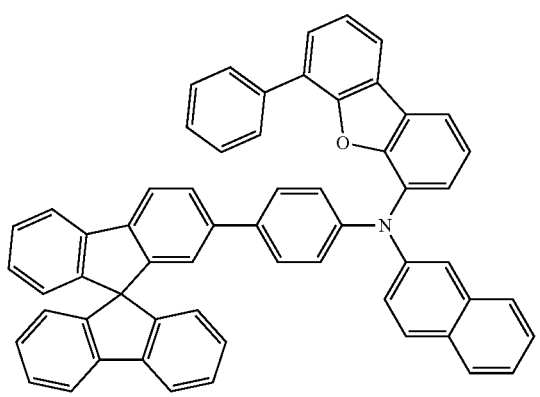
HT39

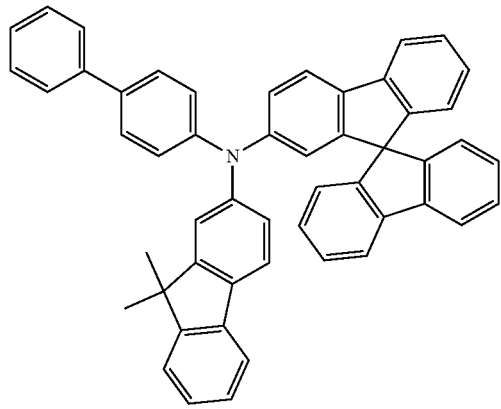
HT40
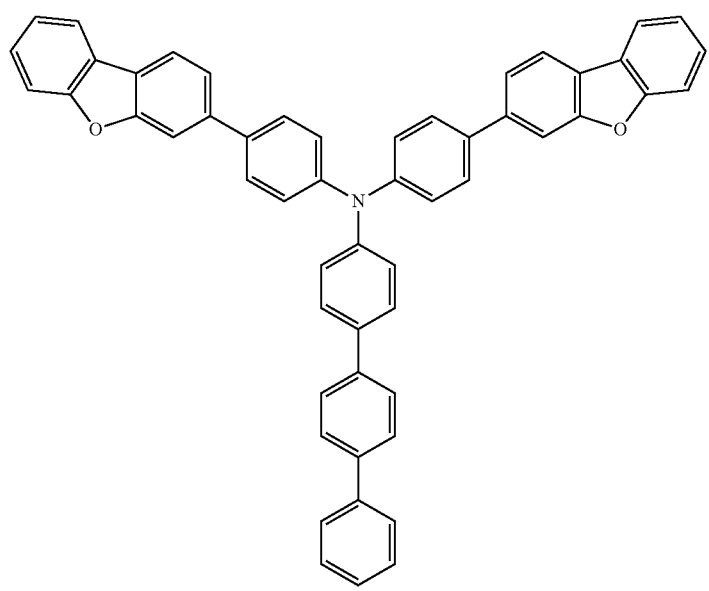
HT41
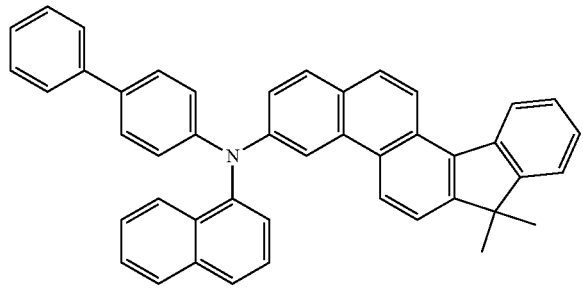
HT42

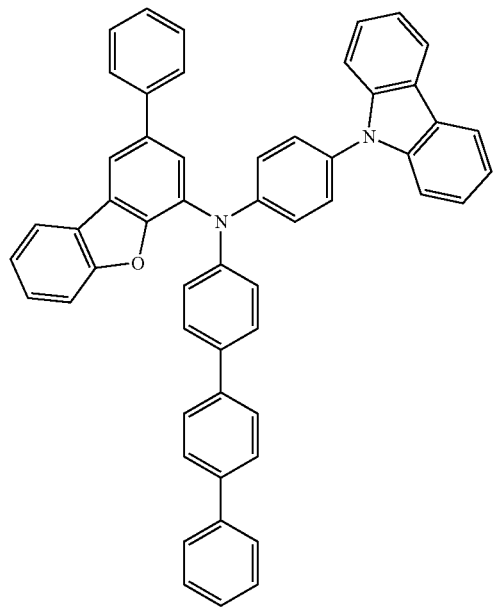
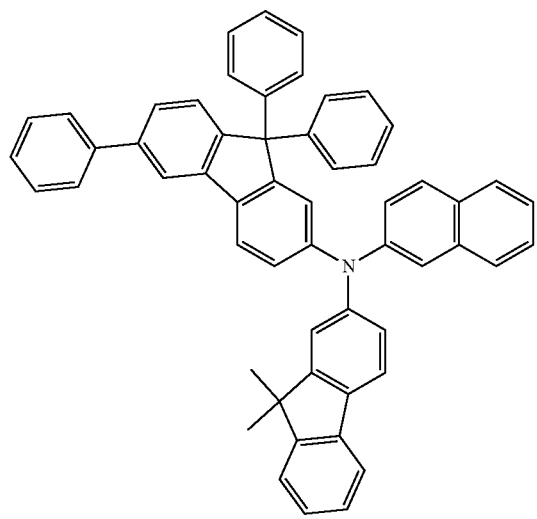
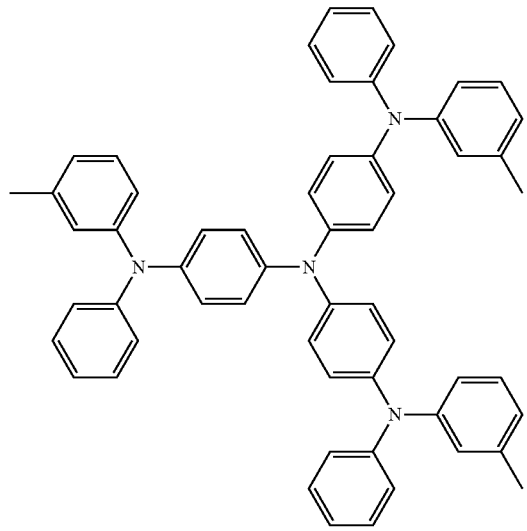
HT43
HT44
m-MDATA

-continued
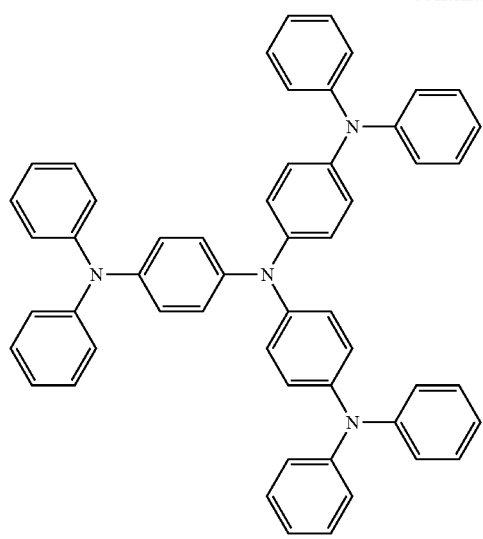
TDATA
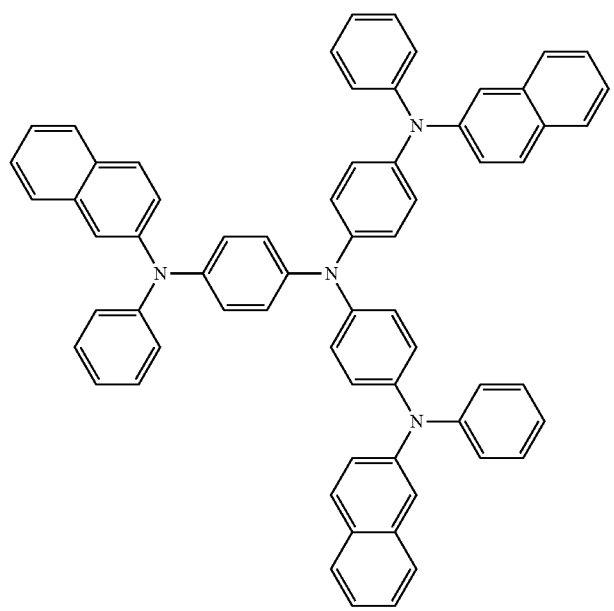
2-TNATA
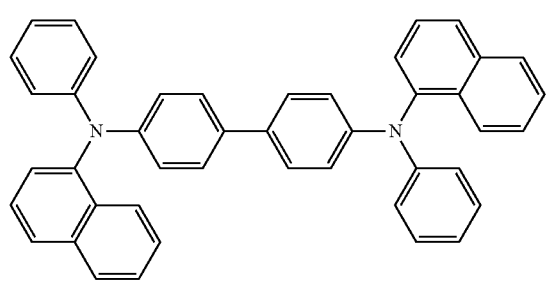
NPB

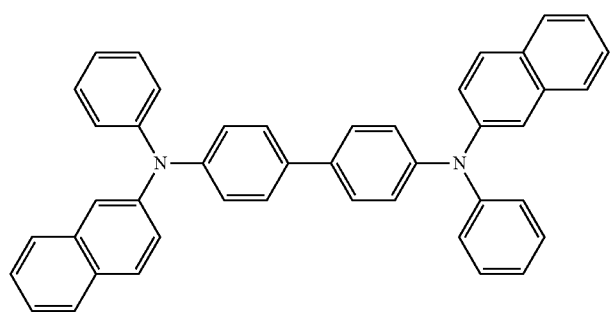
β-NPB
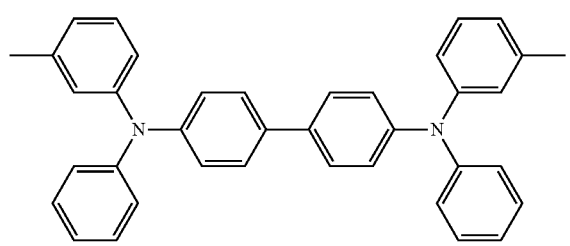
TPD
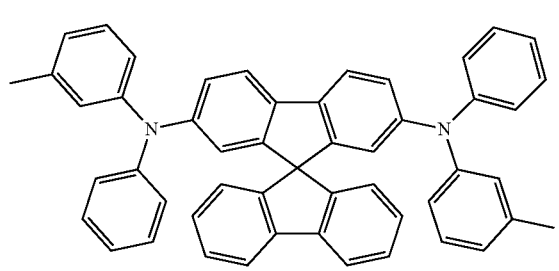
Spiro-TPD
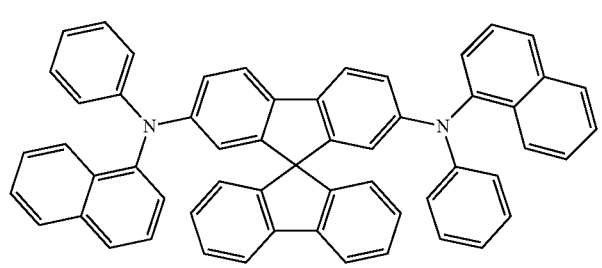
Spiro-NPB
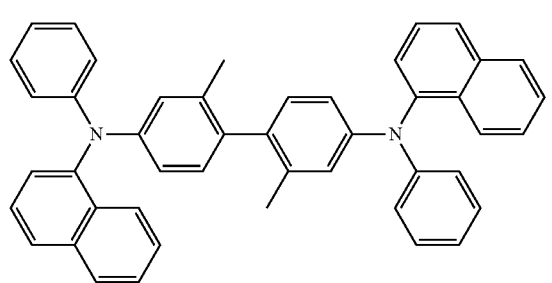
methylated-NPB

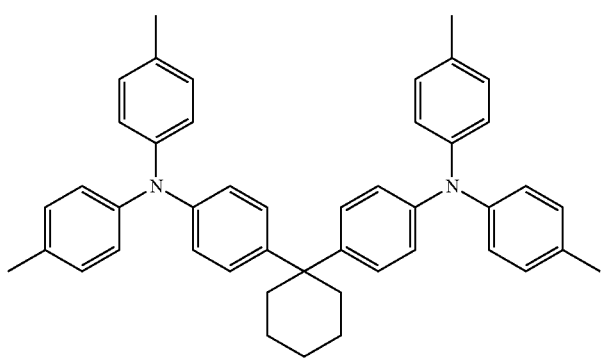

TAPC

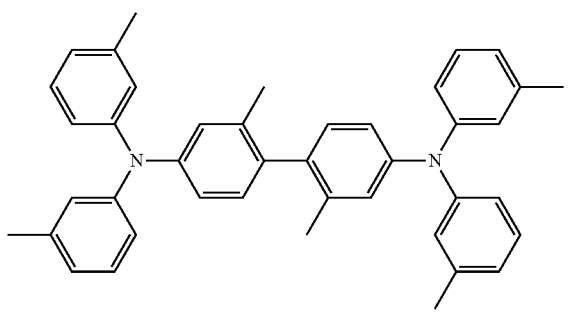

HMTPD

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block the flow of electrons from an electron transport region. The emission auxiliary layer and the electron blocking layer may include the materials as described above.

[P-Dopant]

The hole transport region may further include, in addition to these materials, a charge-generation material for the improvement of conductive properties. The charge-generation material may be uniformly or non-uniformly dispersed in the hole transport region (for example, in the form of a single layer including (e.g., consisting of) a charge-generation material).

The charge-generation material may be, for example, a p-dopant.

In an embodiment, the lowest unoccupied molecular orbital (LUMO) energy level of the p-dopant may be about −3.5 eV or less.

In an embodiment, the p-dopant may include a quinone derivative, a cyano group-containing compound, a compound containing element EL1 and element EL2, or any combination thereof.

Examples of the quinone derivative are TCNQ and F4-TCNQ.

Examples of the cyano group-containing compound are HAT-CN and a compound represented by Formula 221 below.

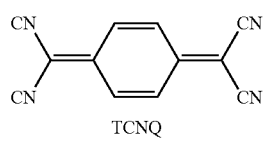

TCNQ

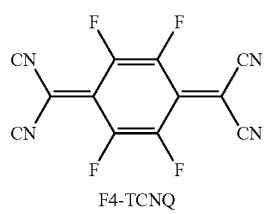

F4-TCNQ

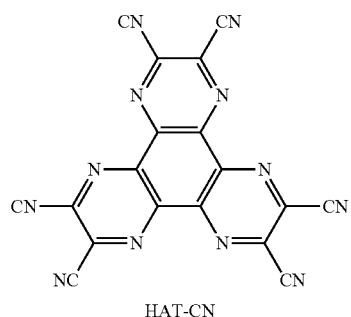

HAT-CN

-continued

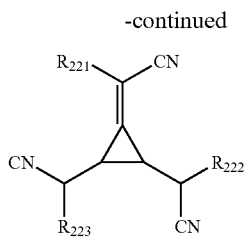

Formula 221

Wherein, in Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —$C_1$; —Br; —I; a $C_1$-$C_{20}$ alkyl group substituted with a cyano group, —F, —Cl, —Br, —I, or any combination thereof; or any combination thereof.

Regarding the compound containing element EL1 and element EL2, element EL1 may be a metal, a metalloid, or a combination thereof, and element EL2 may be a non-metal, a metalloid, or a combination thereof.

Non-limiting examples of the metal may include: an alkali metal (for example, lithium (Li), sodium (Na), potassium (K), rubidium (Rb), cesium (Cs), and/or the like); an alkaline earth metal (for example, beryllium (Be), magnesium (Mg), calcium (Ca), strontium (Sr), barium (Ba), and/or the like); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper(Cu), silver (Ag), gold (Au), and/or the like); a post-transition metal (for example, zinc (Zn), indium (In), tin (Sn), and/or the like); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and/or the like).

Non-limiting examples of the metalloid may include silicon (Si), antimony (Sb), and tellurium (Te).

Non-limiting examples of the non-metal may include oxygen (O) and halogen (for example, F, Cl, Br, I, etc.).

In an embodiment, examples of the compound containing element EL1 and element EL2 may include a metal oxide, a metal halide (for example, metal fluoride, metal chloride, metal bromide, and/or metal iodide), a metalloid halide (for example, metalloid fluoride, metalloid chloride, metalloid bromide, and/or metalloid iodide), a metal telluride, and any combination thereof.

Examples of the metal oxide may include tungsten oxide (for example, WO, $W_2O_3$, $WO_2$, $WO_3$, and/or $W_2O_5$), vanadium oxide (for example, VO, $V_2O_3$, $VO_2$, and/or $V_2O_5$), molybdenum oxide (MoO, $Mo_2O_3$, $MoO_2$, $MoO_3$, and/or $Mo_2O_5$), and rhenium oxide (for example, $ReO_3$).

Examples of the metal halide may include alkali metal halide, alkaline earth metal halide, transition metal halide, post-transition metal halide, and lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include titanium halide (for example, $TiF_4$, $TiCl_4$, $TiBr_4$, and/or $TiI_4$), zirconium halide (for example, $ZrF_4$, $ZrCl_4$, $ZrBr_4$, and/or $ZrI_4$), hafnium halide (for example, $HfF_4$, $HfC_{14}$, $HfBr_4$, and/or $HfI_4$), vanadium halide (for example, $VF_3$, $VCl_3$, $VBr_3$, and/or $VI_3$), niobium halide (for example, $NbF_3$, $NbCl_3$, $NbBr_3$, and/or $NbI_3$), tantalum halide (for example, $TaF_3$, $TaCl_3$, $TaBr_3$, and/or $TaI_3$), chromium halide (for example, $CrF_3$, $CrCl_3$, $CrBr_3$, and/or $CrI_3$), molybdenum halide (for example, $MoF_3$, $MoCl_3$, $MoBr_3$, and/or $Mo_{13}$), tungsten halide (for example, $WF_3$, $WCl_3$, $WBr_3$, and/or $W_{13}$), manganese halide (for example, $MnF_2$, $MnCl_2$, $MnBr_2$, and/or $MnI_2$), technetium halide (for example, $TcF_2$, $TcCl_2$, $TcBr_2$, and/or $TcI_2$), rhenium halide (for example, $ReF_2$, $ReCl_2$, $ReBr_2$, and/or $ReI_2$), iron halide (for example, $FeF_2$, $FeCl_2$, $FeBr_2$, and/or $FeI_2$), ruthenium halide (for example, $RuF_2$, $RuC_{12}$, $RuBr_2$, and/or $RuI_2$), osmium halide (for example, $OsF_2$, $OsC_{12}$, $OsBr_2$, and/or $OsI_2$), cobalt halide (for example, $CoF_2$, $CoCl_2$, $CoBr_2$, and/or $CoI_2$), rhodium halide (for example, $RhF_2$, $RhCl_2$, $RhBr_2$, and/or $RhI_2$), iridium halide (for example, $IrF_2$, $IrCl_2$, $IrBr_2$, and/or $IrI_2$), nickel halide (for example, $NiF_2$, $NiCl_2$, $NiBr_2$, and/or $NiI_2$), palladium halide (for example, $PdF_2$, $PdC_{12}$, $PdBr_2$, and/or $PdI_2$), platinum halide (for example, $PtF_2$, $PtC_{12}$, $PtBr_2$, and/or $PtI_2$), copper halide (for example, CuF, CuCl, CuBr, and/or CuI), silver halide (for example, AgF, AgCl, AgBr, and/or AgI), and gold halide (for example, AuF, AuCl, AuBr, and/or AuI).

Examples of the post-transition metal halide may include zinc halide (for example, $ZnF_2$, $ZnCl_2$, $ZnBr_2$, and/or $ZnI_2$), indium halide (for example, $In_{13}$), and tin halide (for example, $SnI_2$).

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$.

Examples of the metalloid halide may include antimony halide (for example, $SbCl_5$).

Examples of the metal telluride may include an alkali metal telluride (for example, $Li_2Te$, $Na_2Te$, $K_2Te$, $Rb_2Te$, and/or $Cs_2Te$), alkaline earth metal telluride (for example, BeTe, MgTe, CaTe, SrTe, and/or BaTe), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, and/or $Au_2Te$), post-transition metal telluride (for example, $In_2Te_3$, SnTe and/or ZnTe), and lanthanide metal telluride (for example, LaTe, CeTe, PrTe, NdTe, PmTe, EuTe, GdTe, TbTe, DyTe, HoTe, ErTe, TmTe, YbTe, and/or LuTe).

[Emission Layer in Interlayer 130]

When the light-emitting device 10 is a full-color light-emitting device, the emission layer may be patterned into a red emission layer, a green emission layer, and/or a blue emission layer, according to a subpixel. In one or more embodiments, the emission layer may have a stacked structure of two or more layers of a red emission layer, a green emission layer, and a blue emission layer, in which the two or more layers contact each other or are separated from each other. In one or more embodiments, the emission layer may include two or more materials of a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof.

The amount of the dopant in the emission layer may be from about 0.01 parts to about 15 parts by weight based on 100 parts by weight of the host.

In one or more embodiments, the emission layer may include a quantum dot.

In one or more embodiments, the emission layer may include a delayed fluorescence material. The delayed fluorescence material may act as a host or a dopant in the emission layer.

A thickness of the emission layer may be in the range of about 100 Å to about 1,000 Å, for example, about 200 Å to about 600 Å. When the thickness of the emission layer satisfies the ranges described above, suitable (e.g., excellent) luminescence characteristics may be exhibited without a substantial increase in driving voltage.

[Host]

The host may include a silicon-containing compound, a phosphineoxide-containing compound, or any combination thereof, as described above.

In an embodiment, the host may include a compound represented by Formula 301 below:

$[Ar_{301}]_{xb11}$-$[(L_{301})_{xb1}$-$R_{301}]_{xb21}$,    Formula 301 wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{301})(Q_{302})(Q_{303})$,
—$N(Q_{301})(Q_{302})$,   —$B(Q_{301})(Q_{302})$,   —$C(=O)(Q_{301})$, —$S(=O)_2(Q_{301})$, or —$P(=O)(Q_{301})(Q_{302})$, xb21 may be an integer from 1 to 5, and $Q_{301}$ to $Q_{303}$ are the same as described in connection with $Q_1$.

In one or more embodiments, when xb11 in Formula 301 is 2 or more, two or more of $Ar_{301}(s)$ may be linked to each other via a single bond.

In an embodiment, the host may include a compound represented by Formula 301-1, a compound represented by Formula 301-2, or any combination thereof:

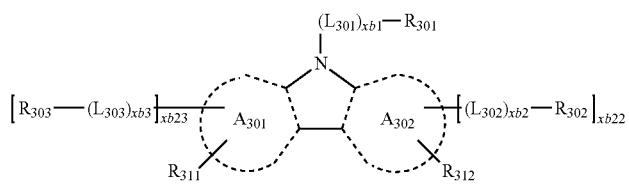

Formula 301-1

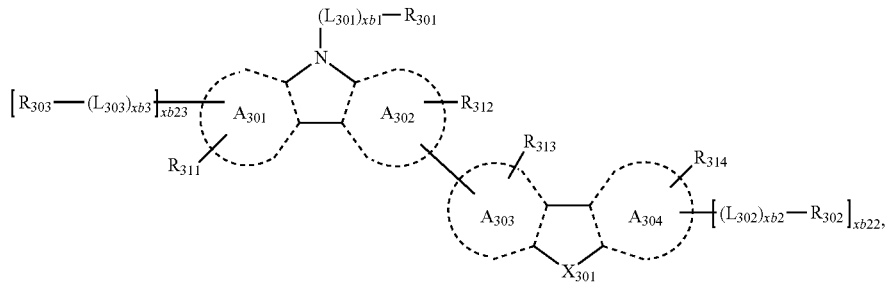

Formula 301-2 wherein, in Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-$[(L_{304})_{xb4}$-$R_{304}]$, $C(R_{304})(R_{305})$, or $Si(R_{304})(R_{305})$, xb22 and xb23 may each independently be 0, 1, or 2, $L_{301}$, xb1, and $R_{301}$ may each independently be the same as respectively described above, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each independently be the same as described in connection with $R_{301}$.

In one or more embodiments, the host may include an alkaline earth metal complex. In an embodiment, the host may be a Be complex (for example, Compound H55), a Mg complex, a Zn complex, or any combination thereof.

In an embodiment, the host may include one of Compounds H1 to H124, 9,10-di(2-naphthyl)anthracene (ADN), 2-methyl-9,10-bis(naphthalen-2-yl)anthracene (MADN), 9,10-di(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), 3,3-di(9H-carbazol-9-yl)biphenyl (mCBP), or any combination thereof, but embodiments of the present disclosure are not limited thereto:

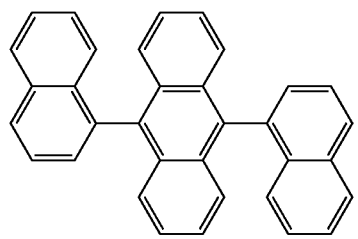 H1
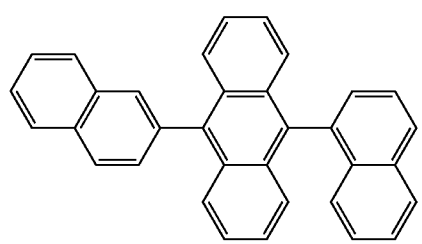 H2
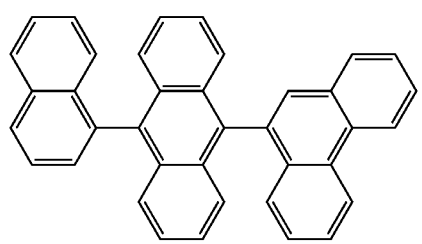 H3
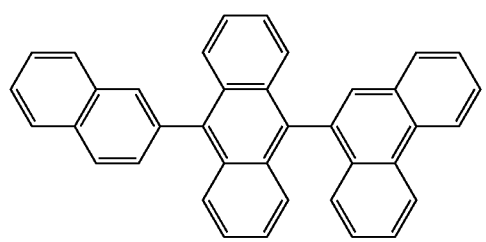 H4
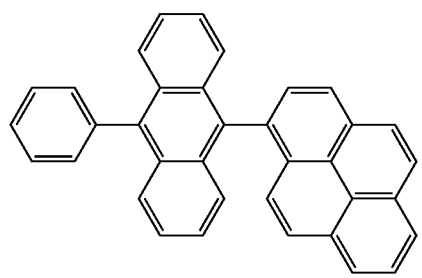 H5
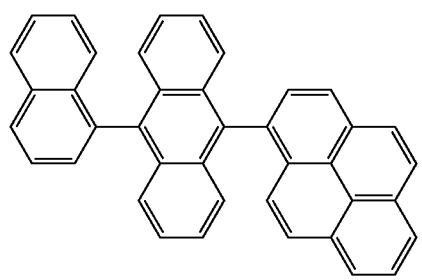 H6

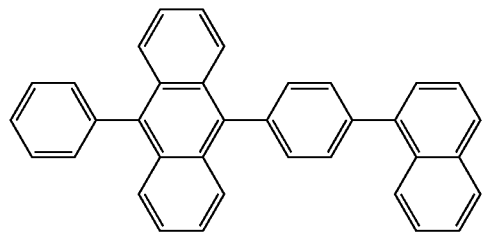
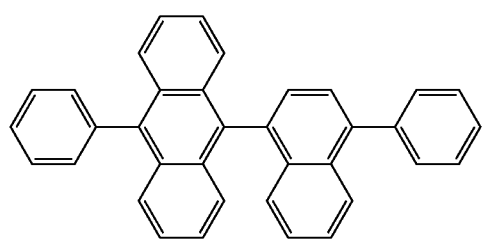
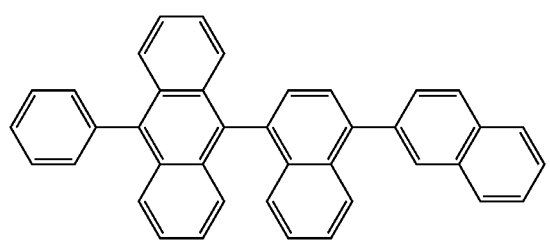
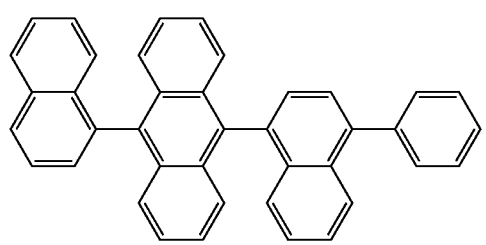
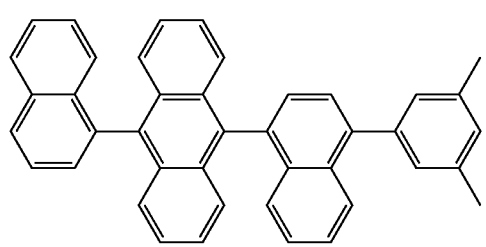
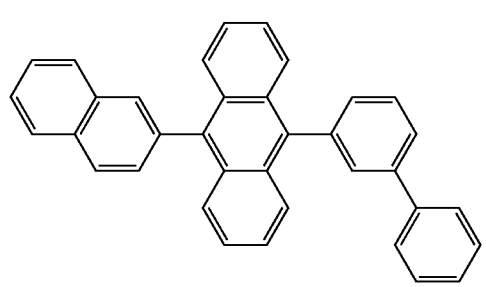
H7
H8
H9
H10
H11
H12

-continued
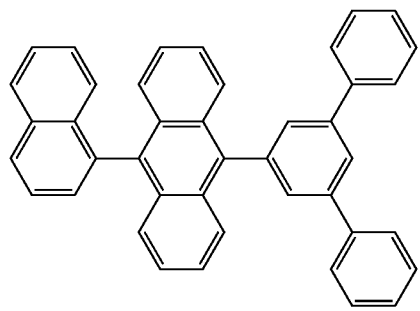
H13
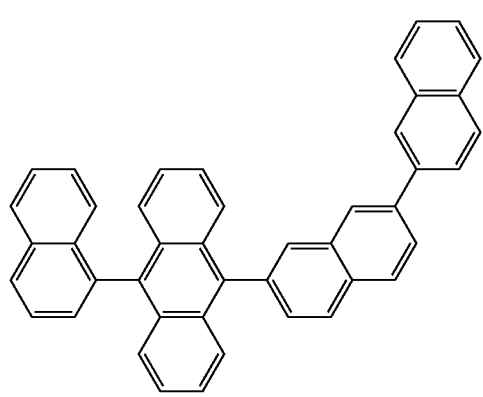
H14
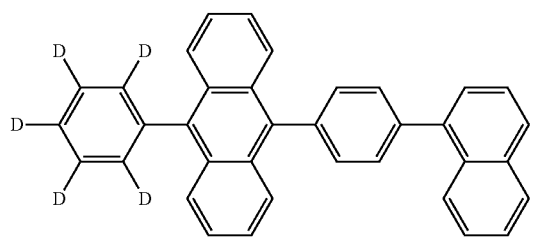
H15
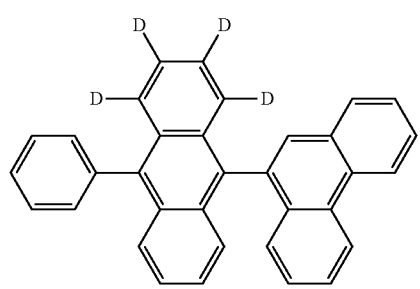
H16
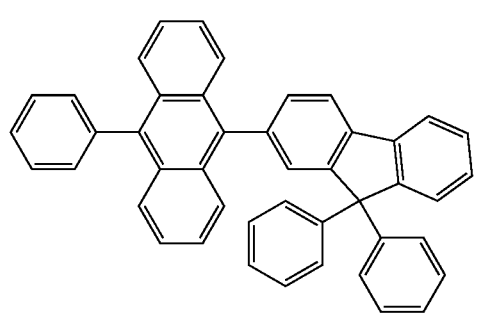
H17

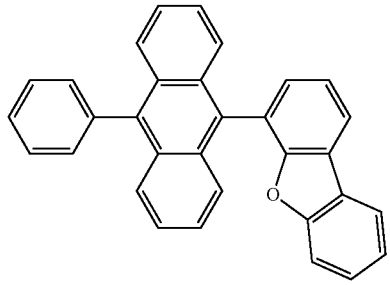
H18
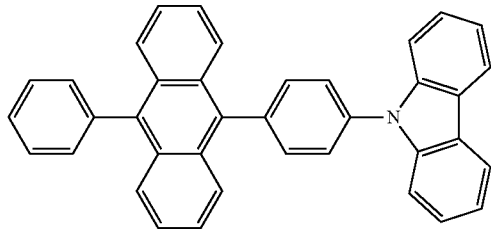
H19
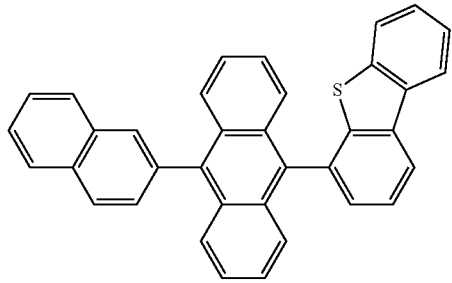
H20
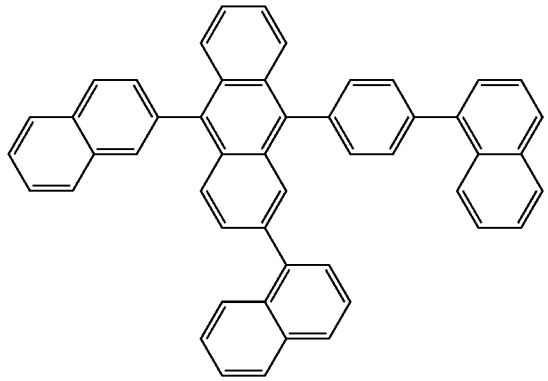
H21
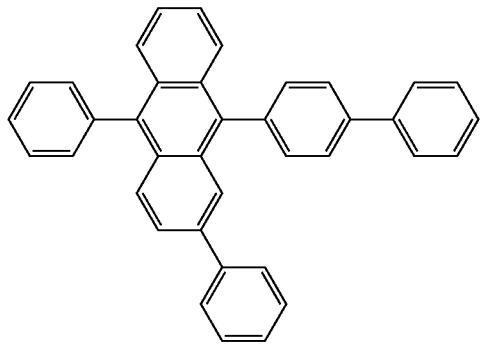
H22

-continued
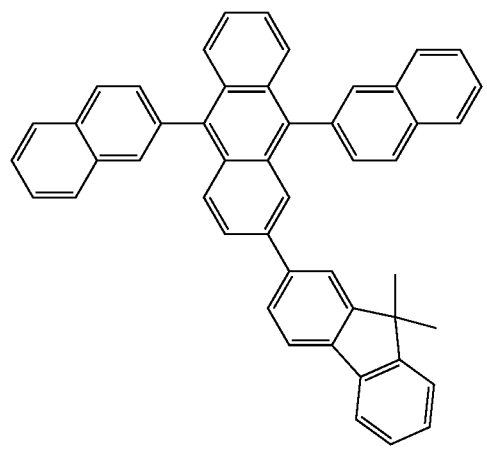
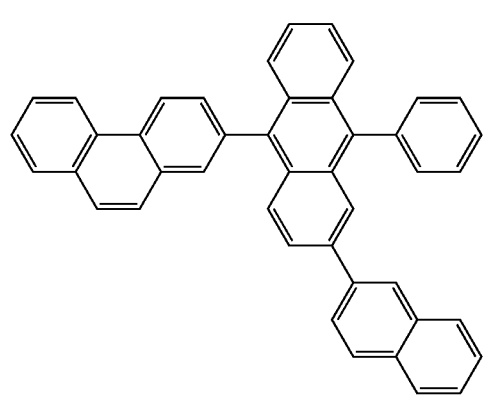
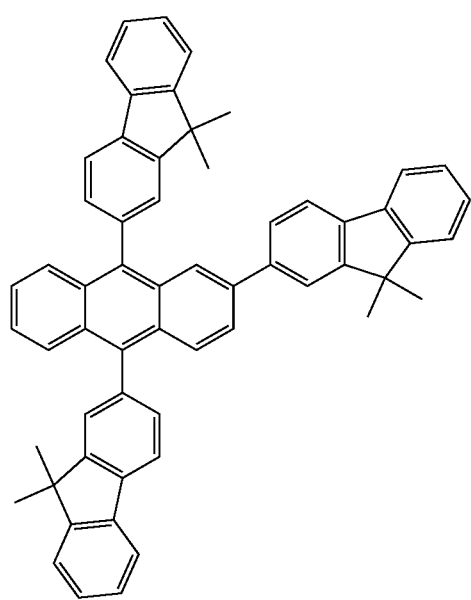
H23
H24
H25

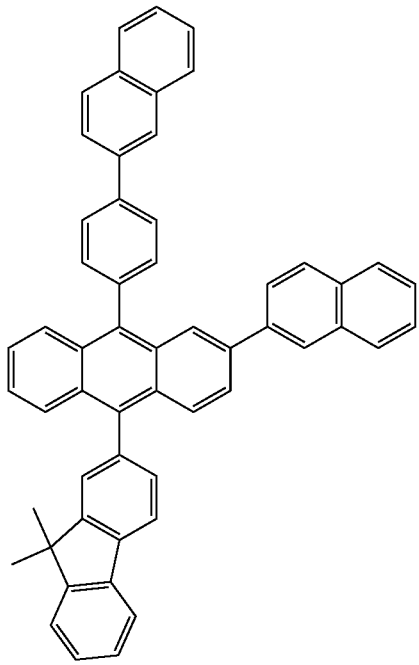
H26
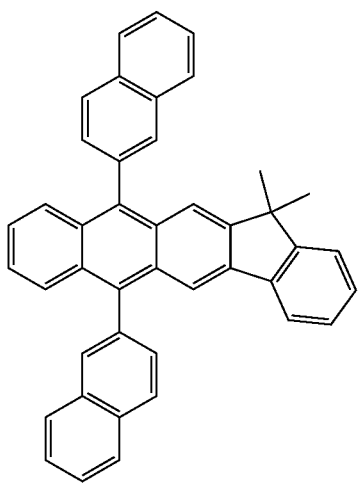
H27
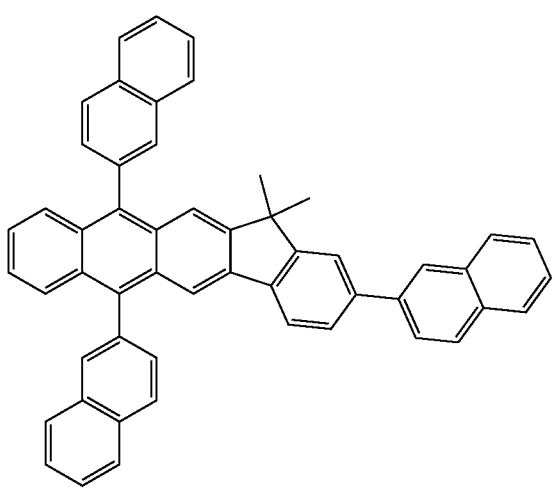
H28

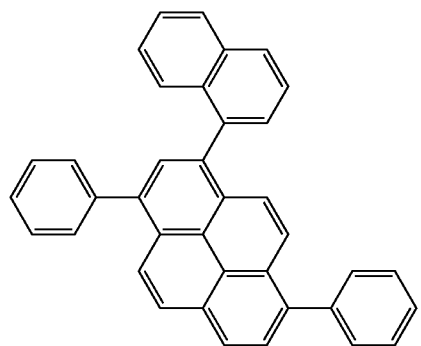
H29
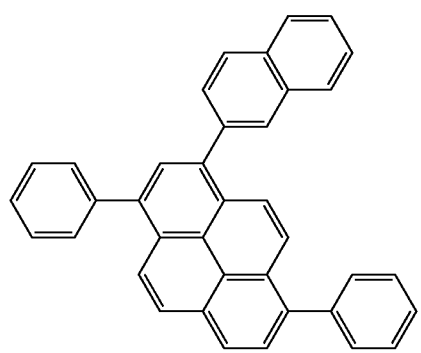
H30
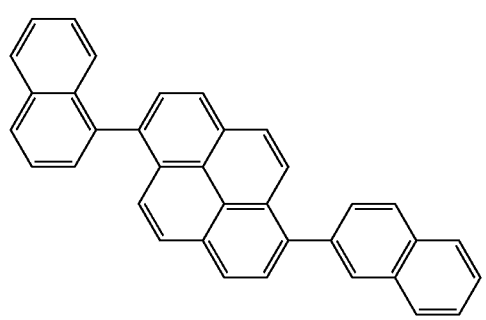
H31
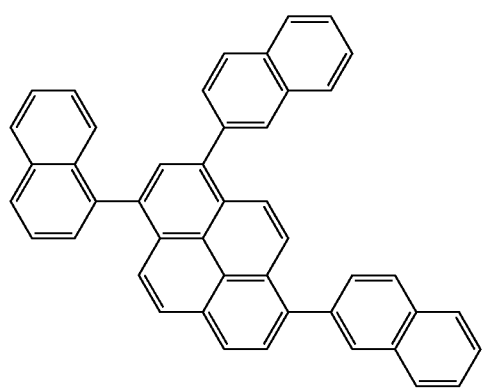
H32
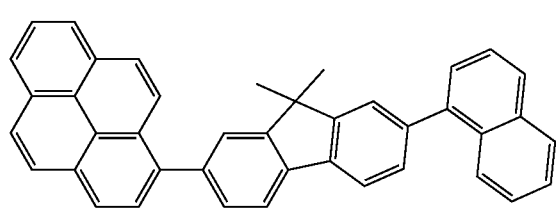
H33

H34
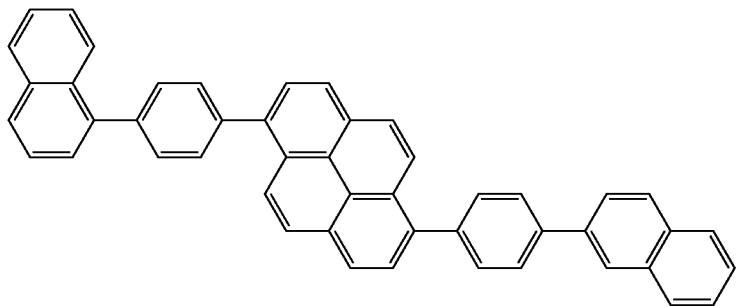
H35
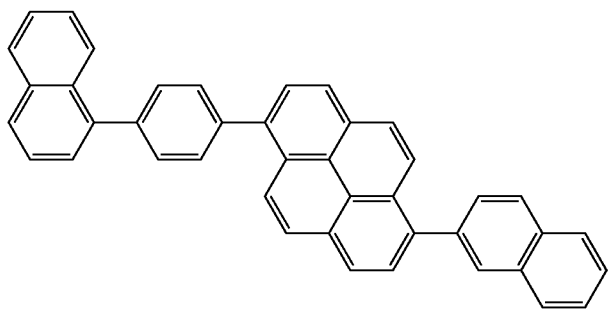
H36
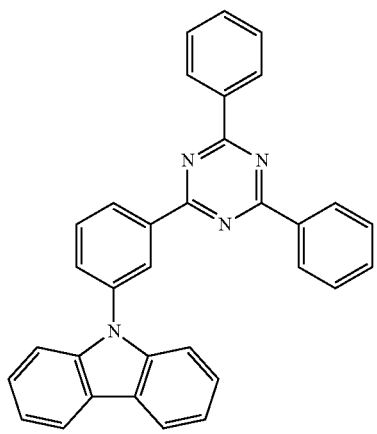
H37
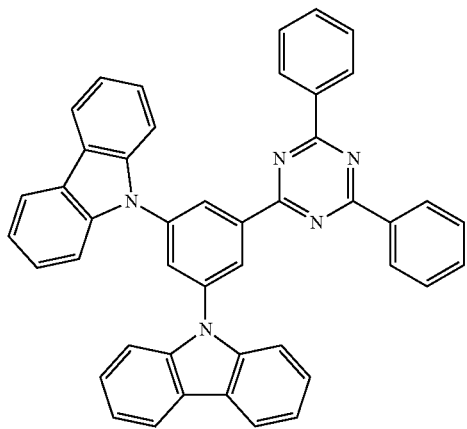

H38
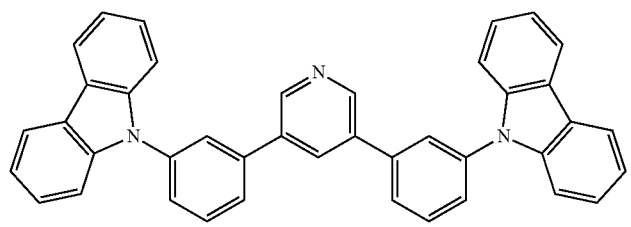
H39
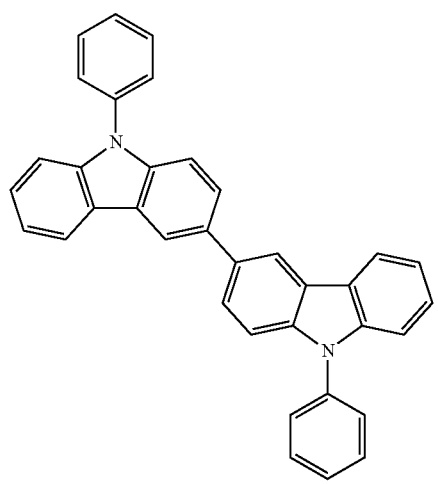
H40
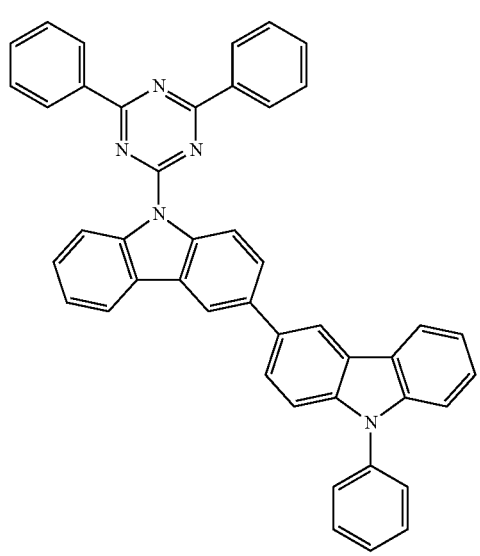

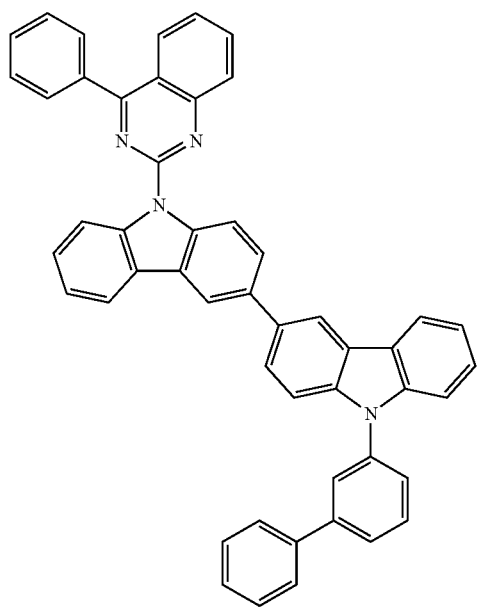
H41
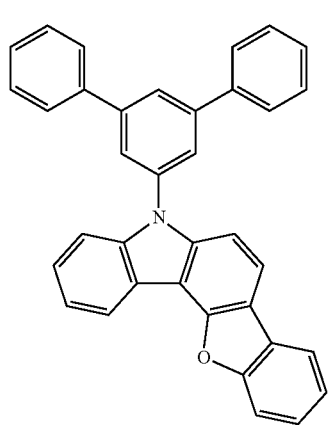
H42
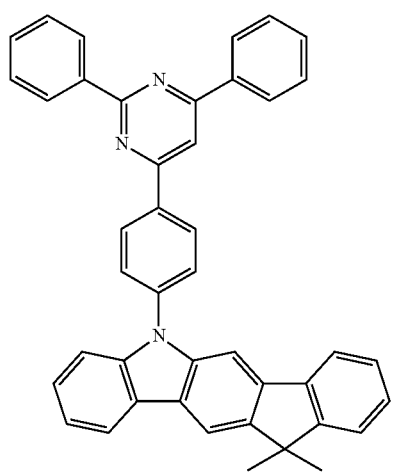
H43

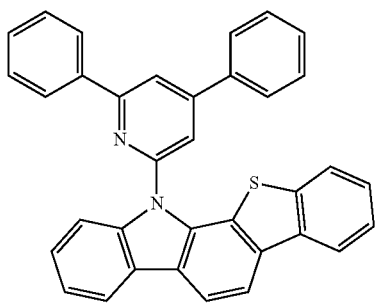
H44
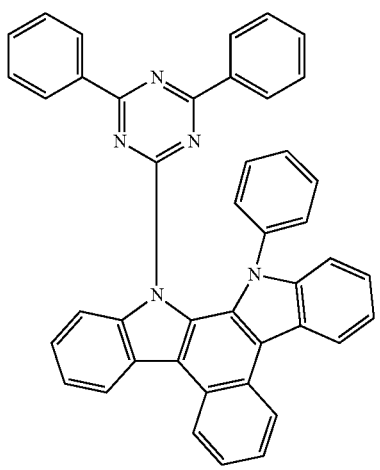
H45
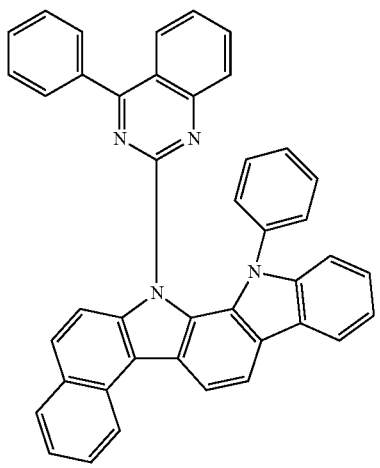
H46
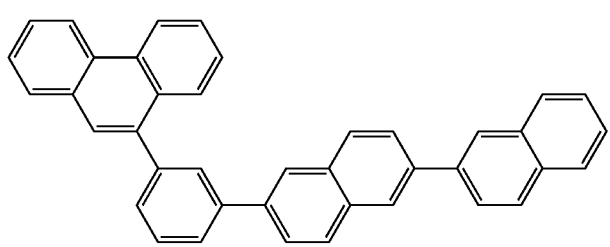
H47

-continued
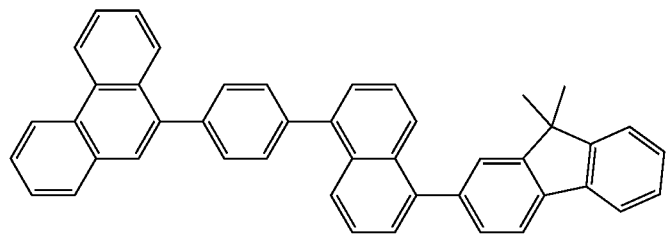
H48
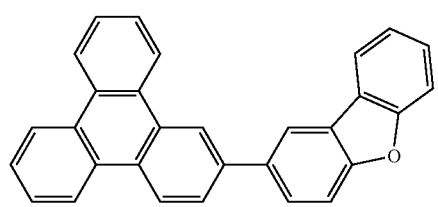
H49
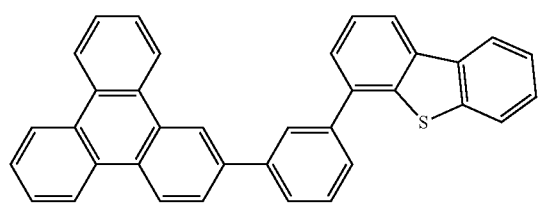
H50
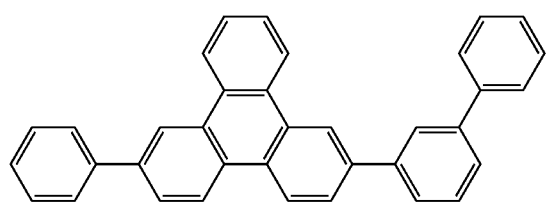
H51
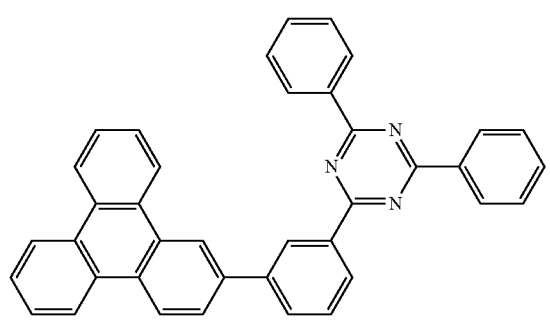
H52
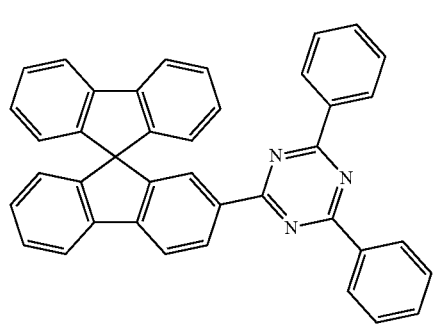
H53

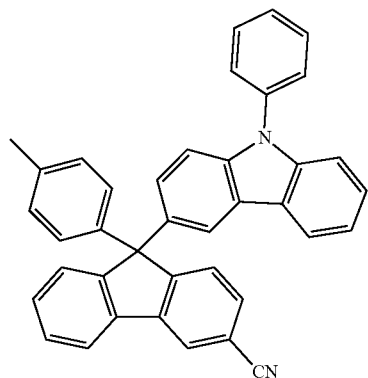
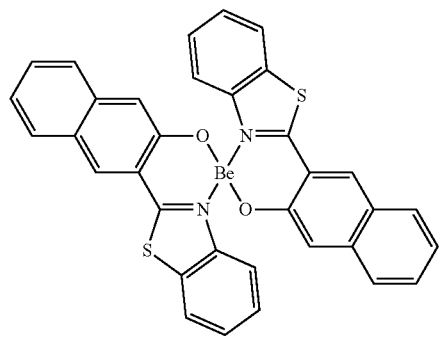
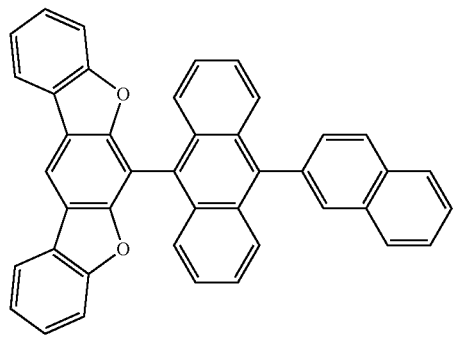
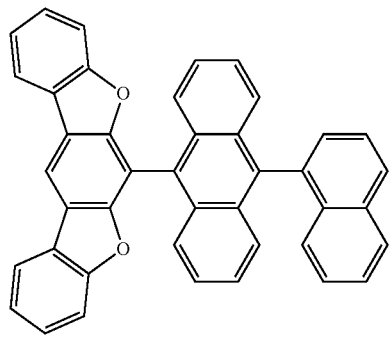

-continued
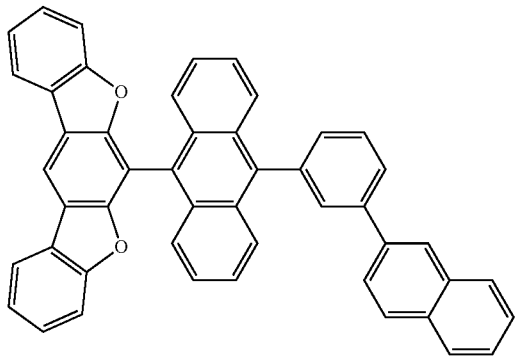
H58
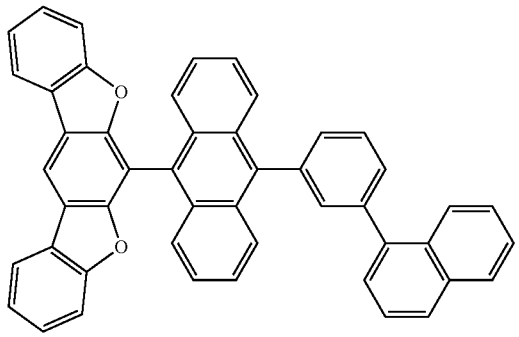
H59
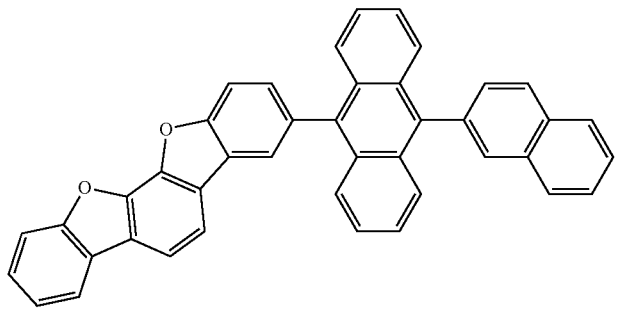
H60
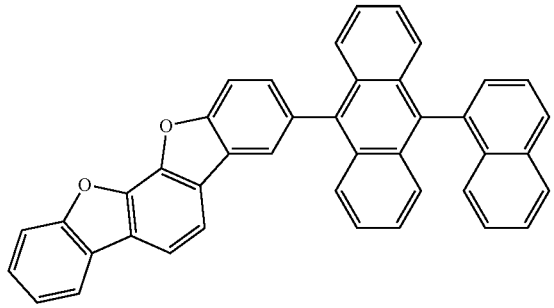
H61
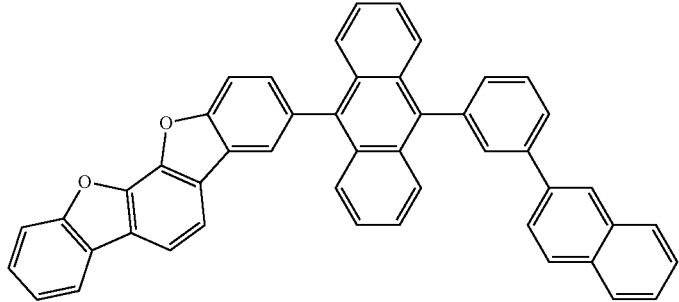
H62

-continued
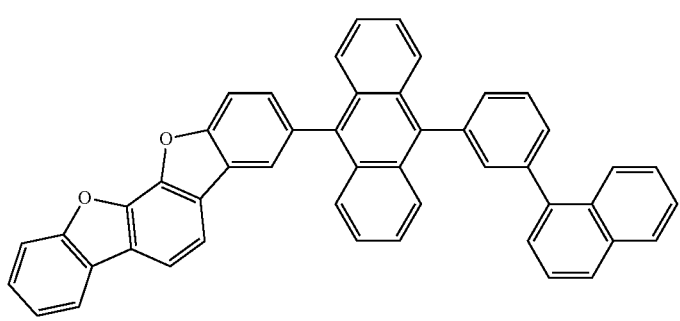
H63
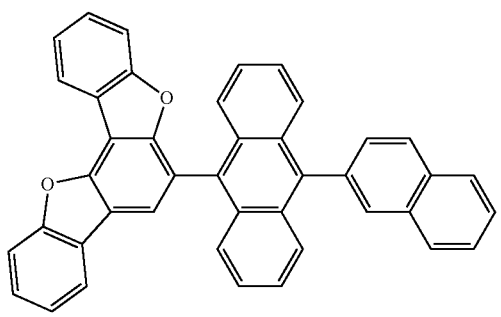
H64
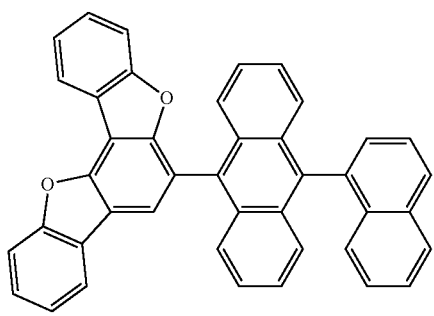
H65
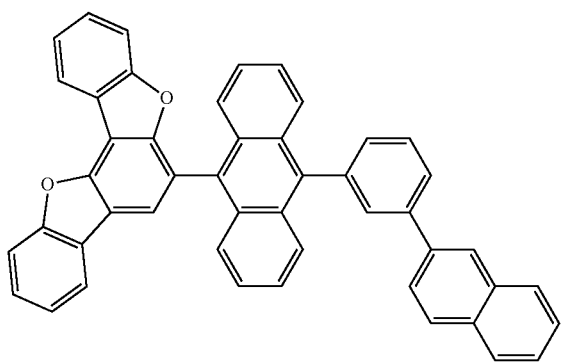
H66
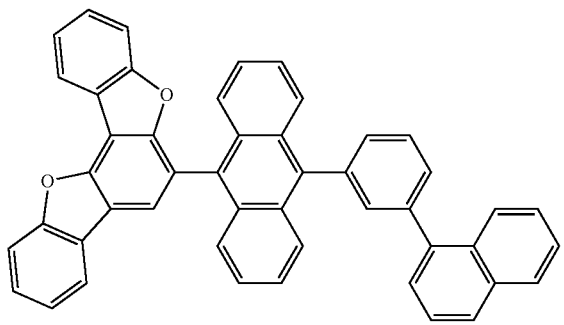
H67

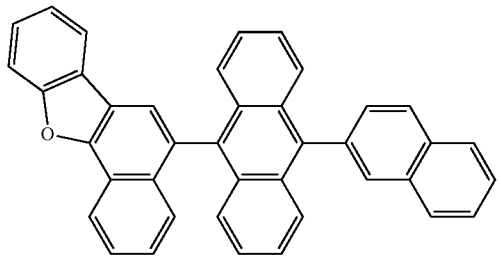
H68
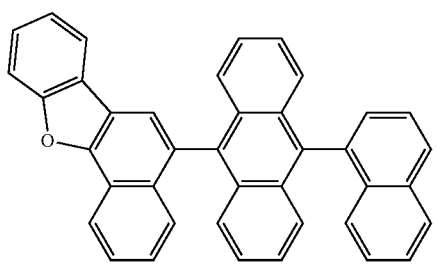
H69
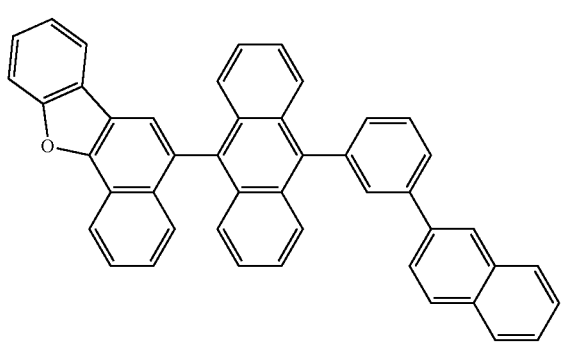
H70
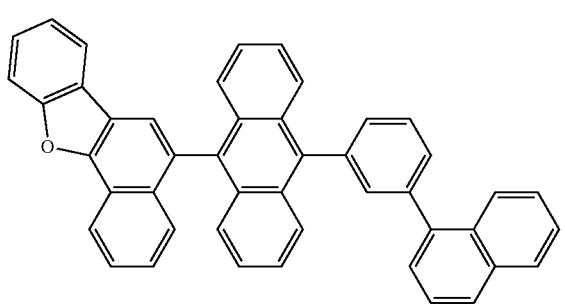
H71
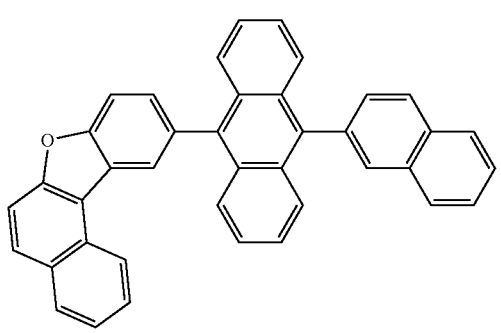
H72

-continued
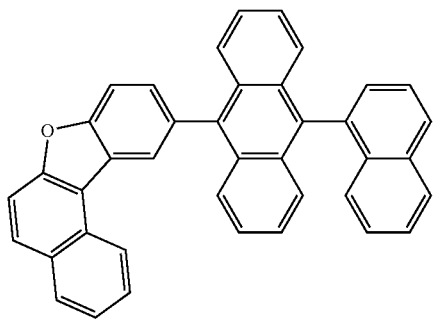
H73
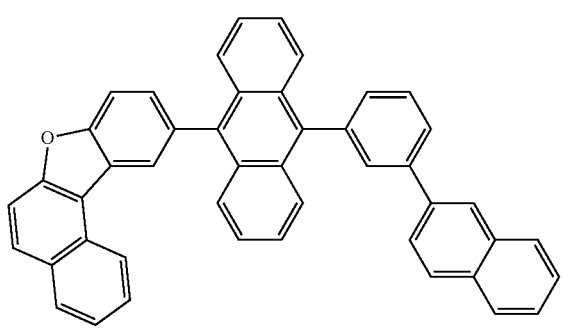
H74
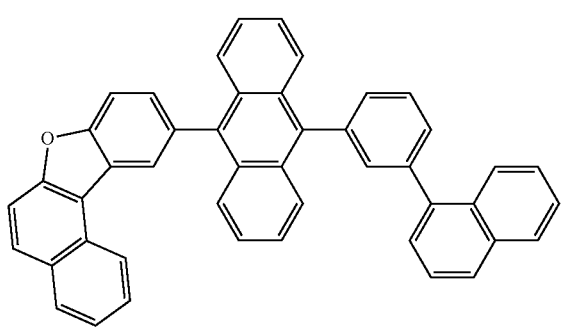
H75
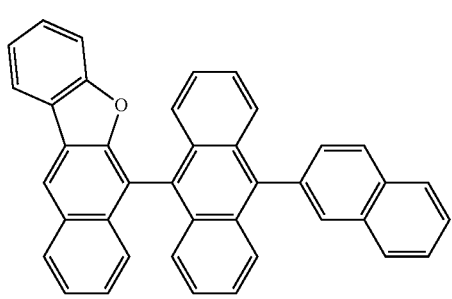
H76
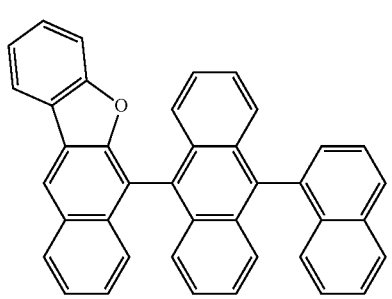
H77

-continued
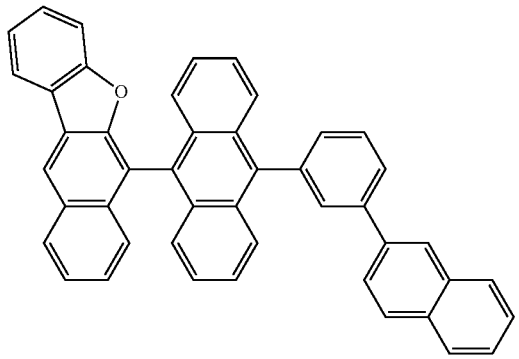
H78
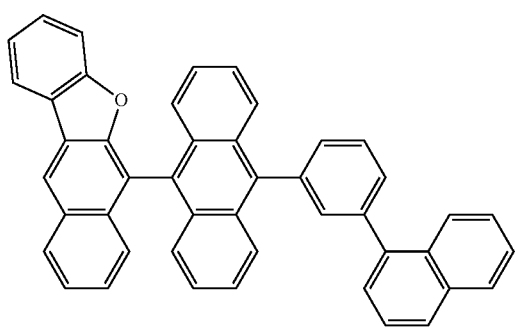
H79
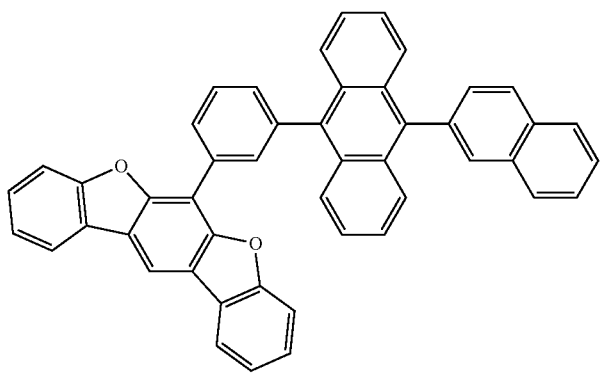
H80
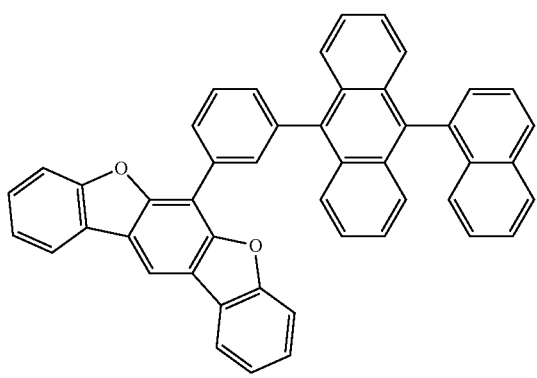
H81

-continued
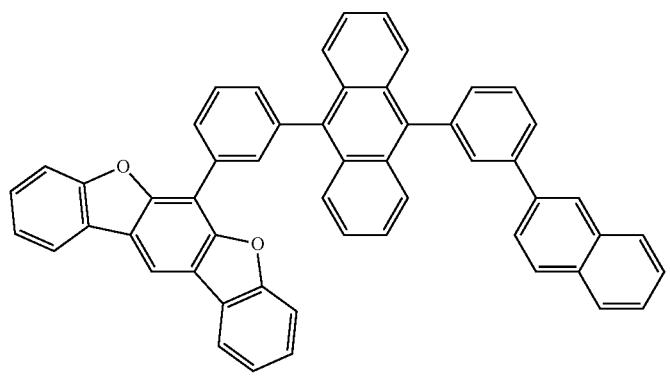
H82
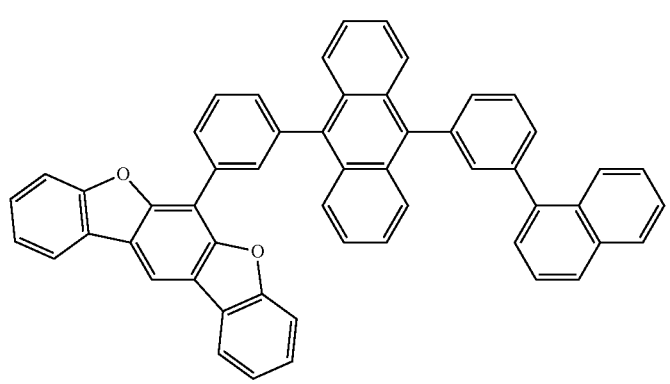
H83
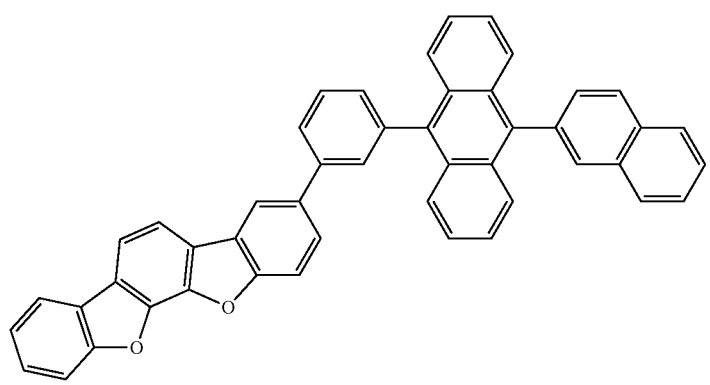
H84
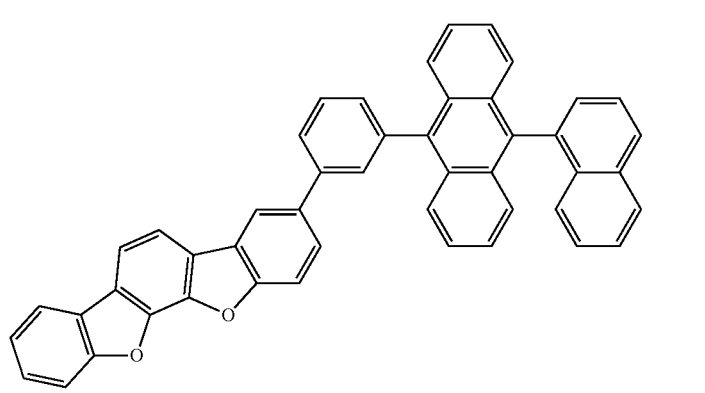
H85

H86
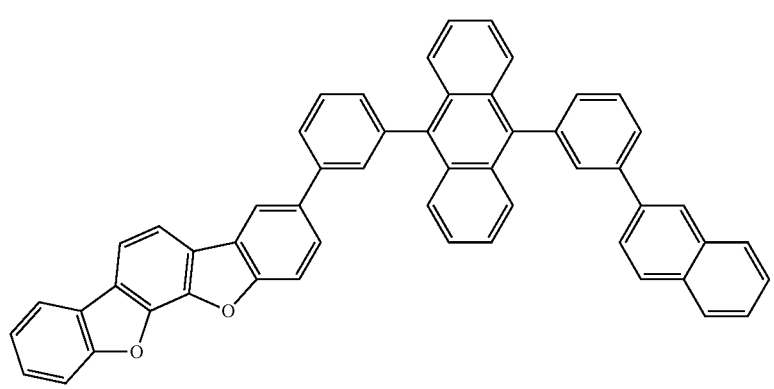
H87
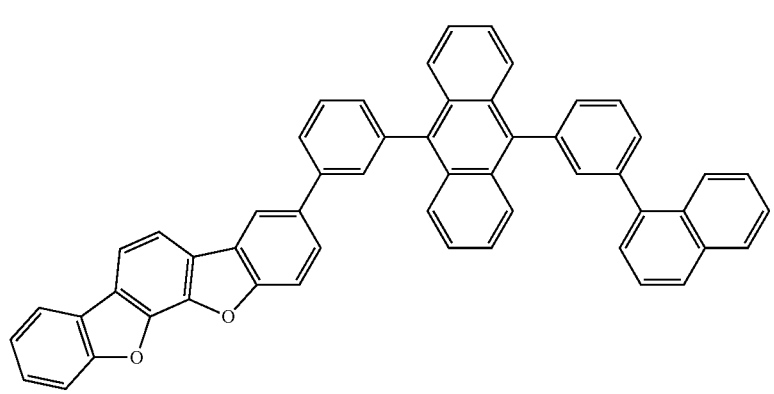
H88
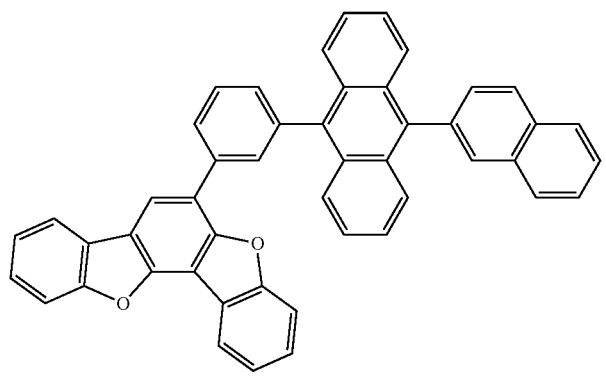
H89
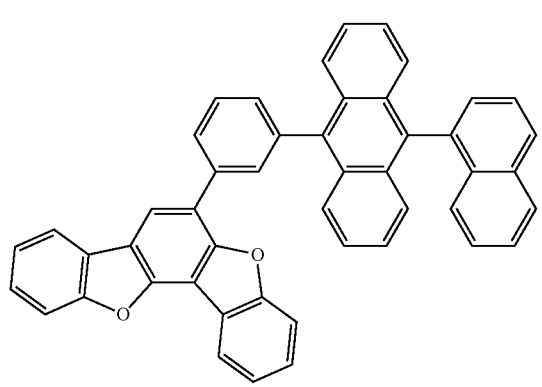

-continued
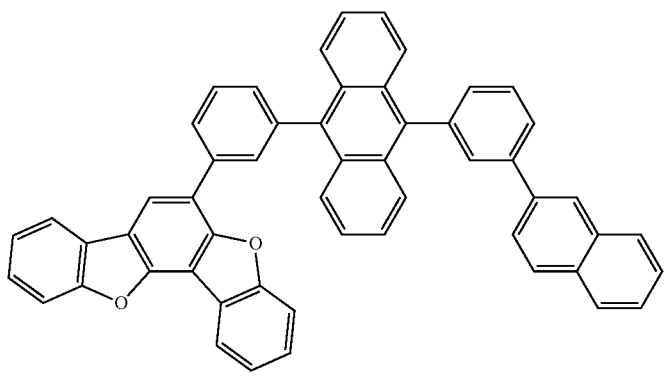
H90
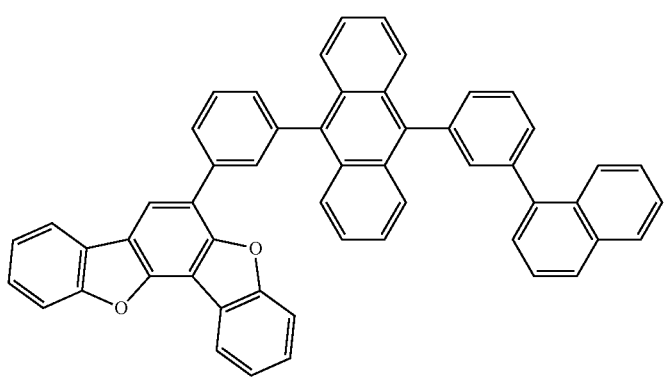
H91
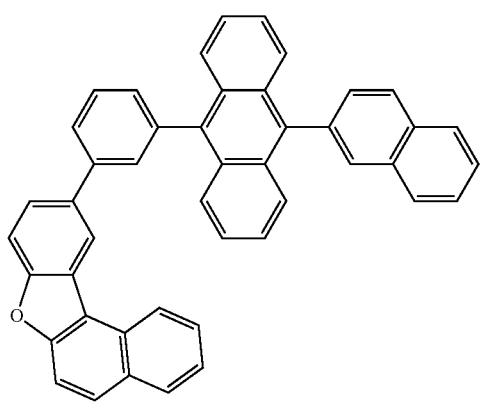
H92
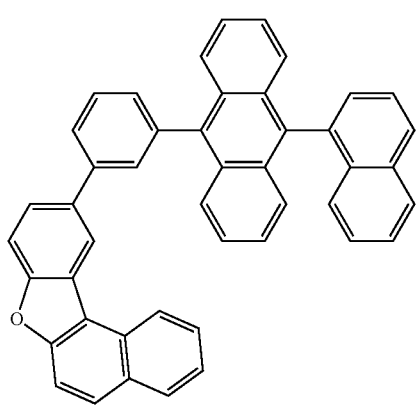
H93

-continued
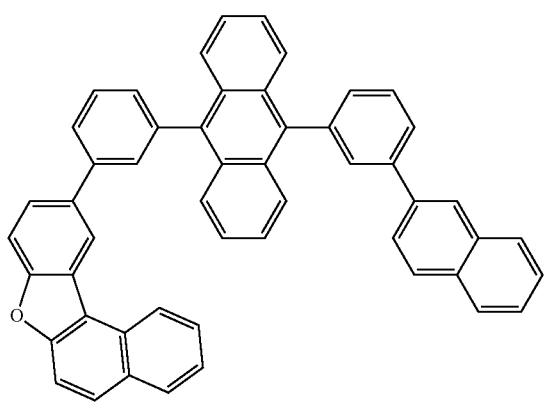
H94
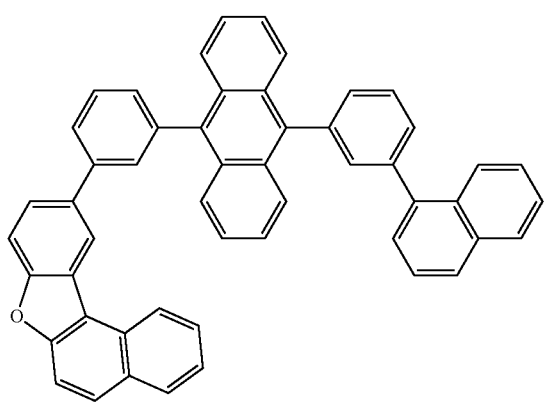
H95
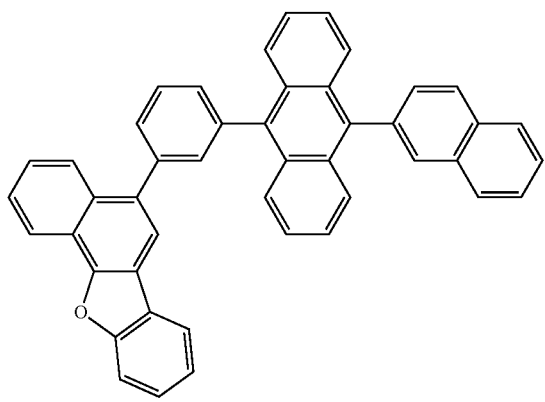
H96
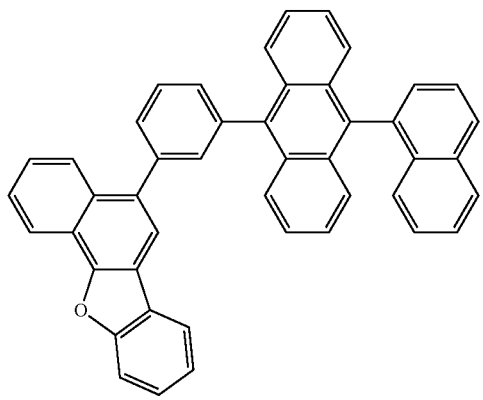
H97

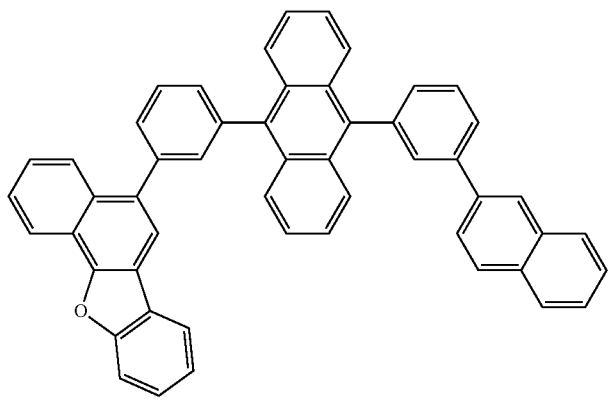
H98
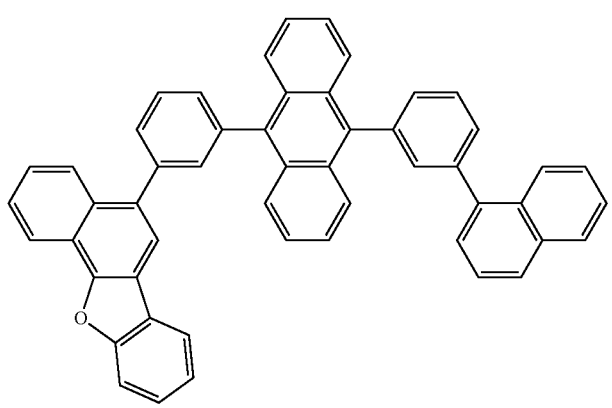
H99
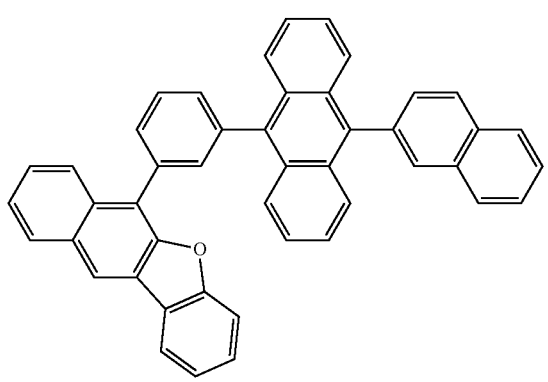
H100
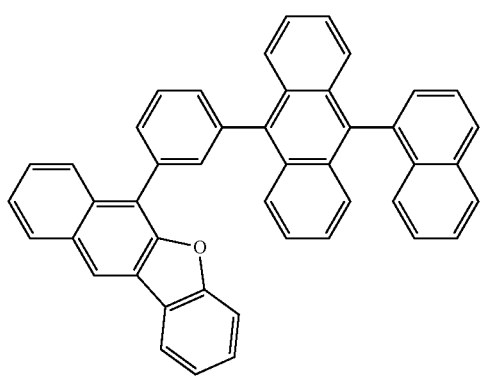
H101

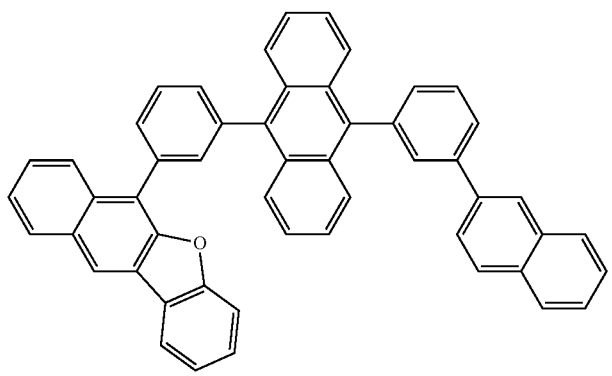
H102
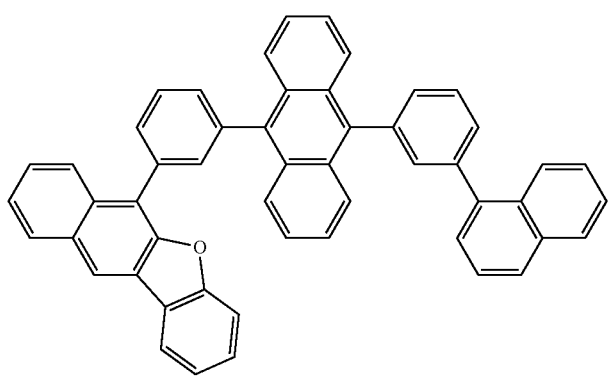
H103
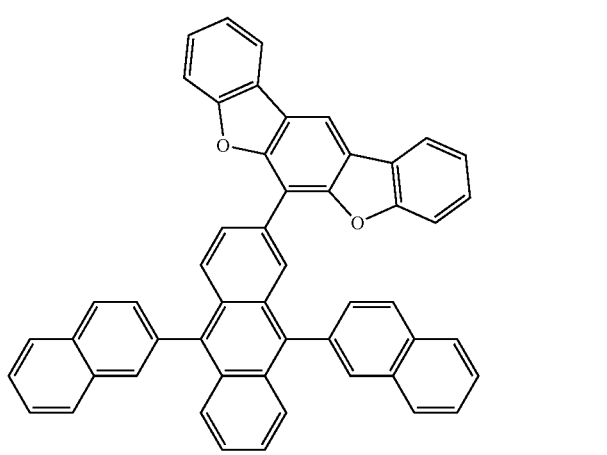
H104
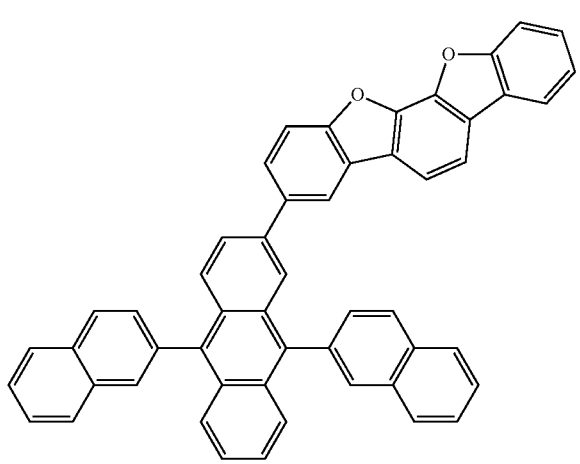
H105

-continued
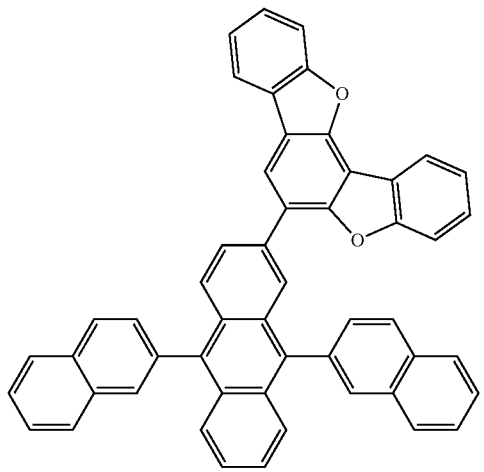
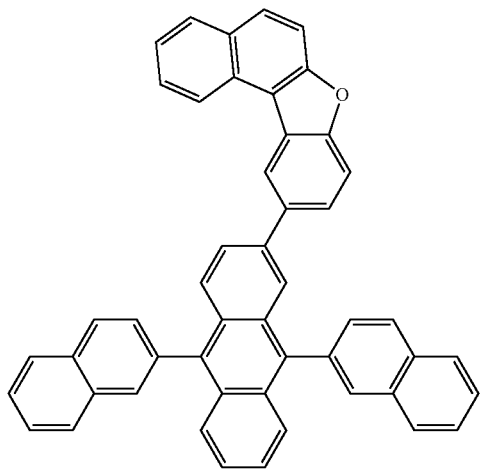
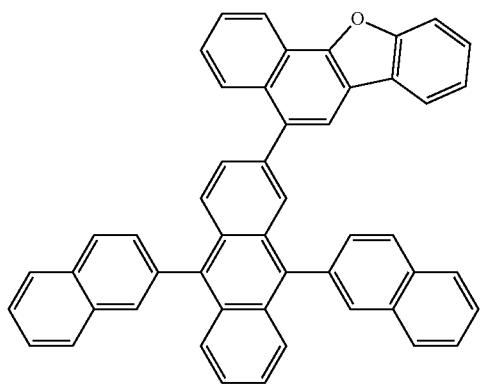
H106
H107
H108

H109
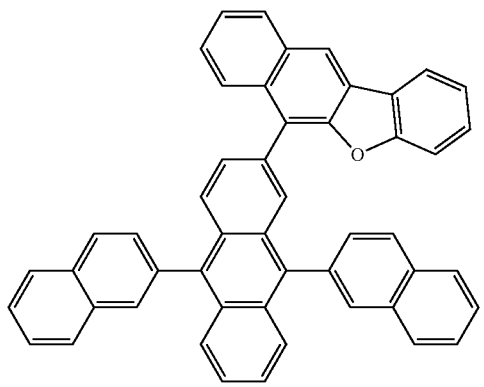
H110
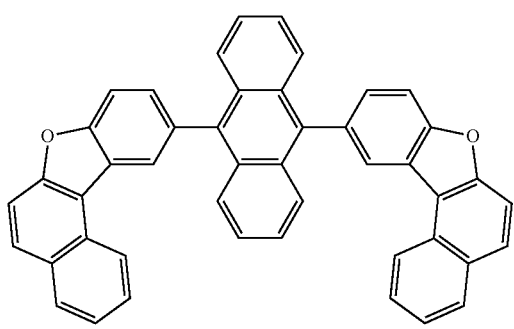
H111
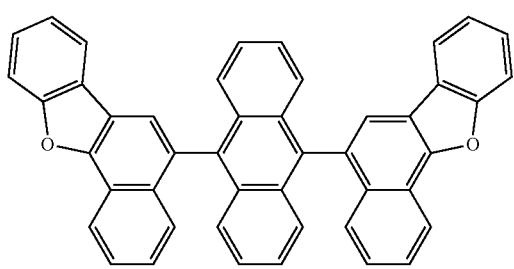
H112
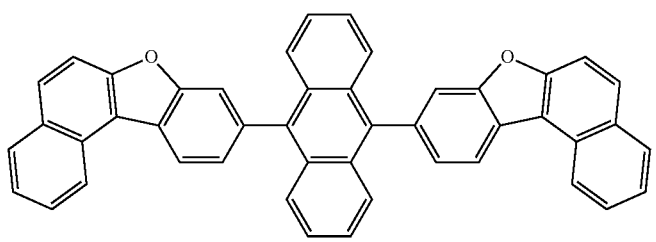
H113
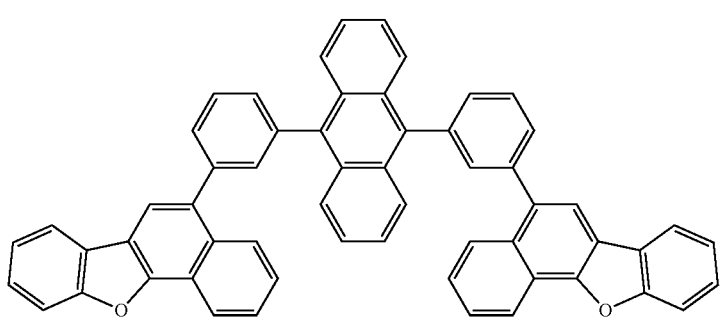

H114
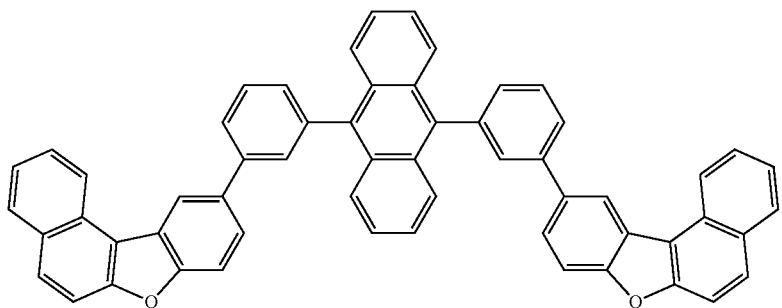
H115
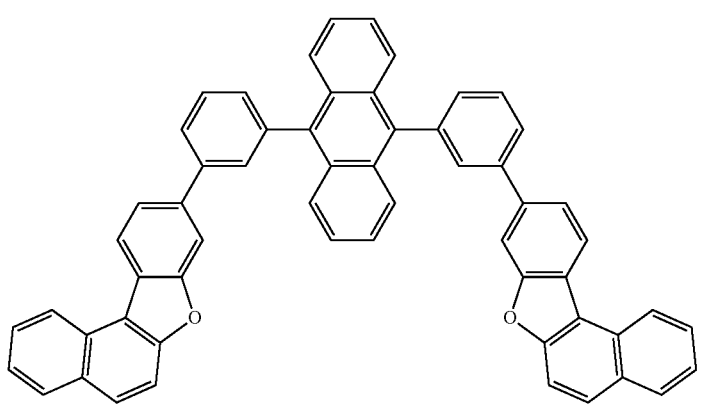
H116
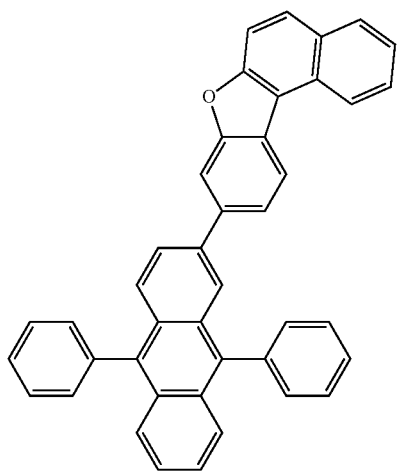
H117
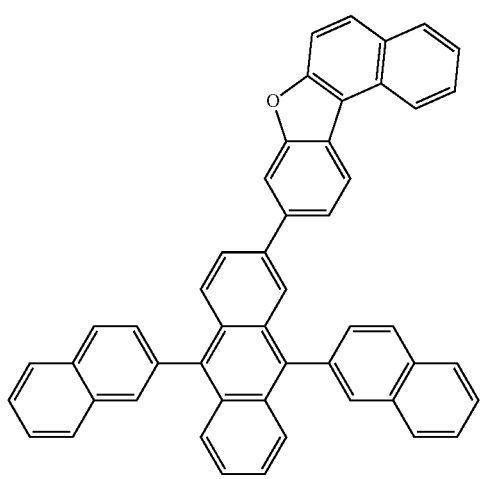

-continued
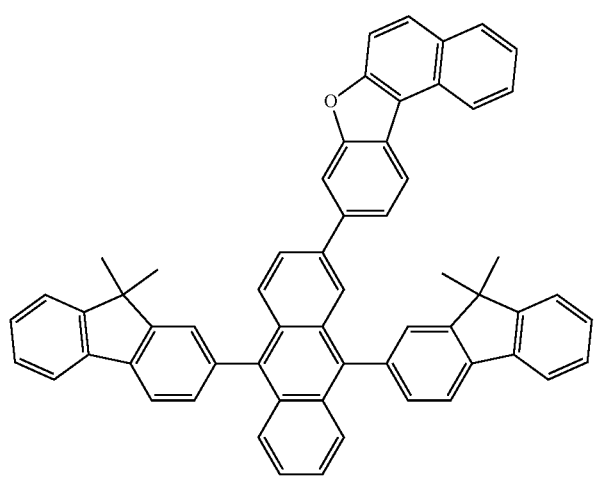
H118
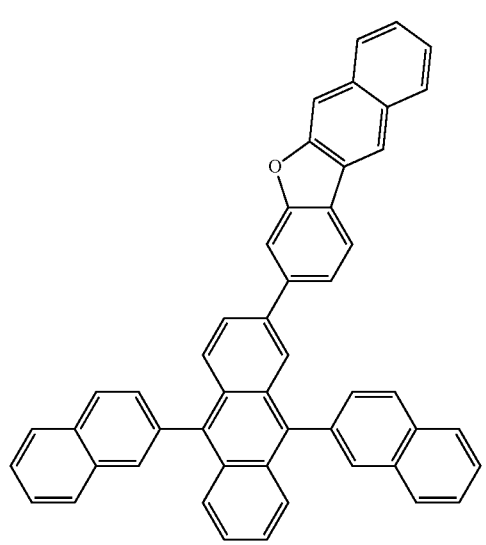
H119
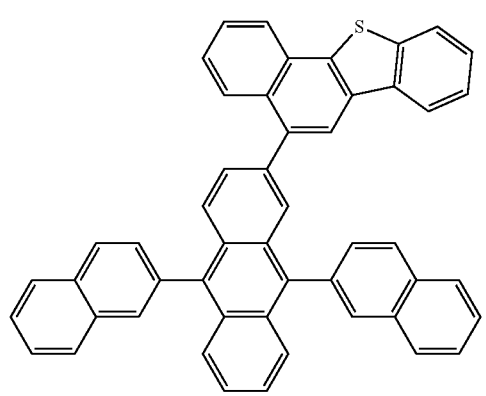
H120

-continued
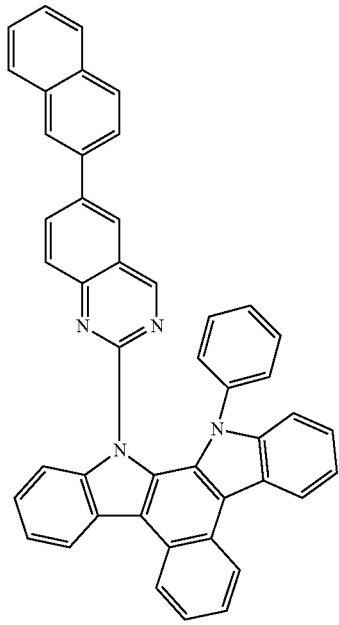
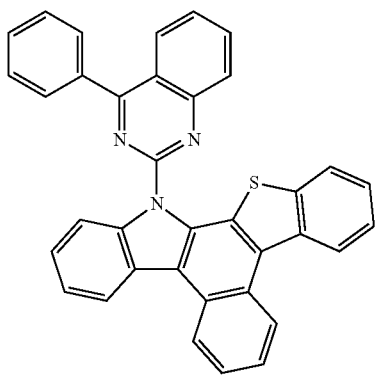
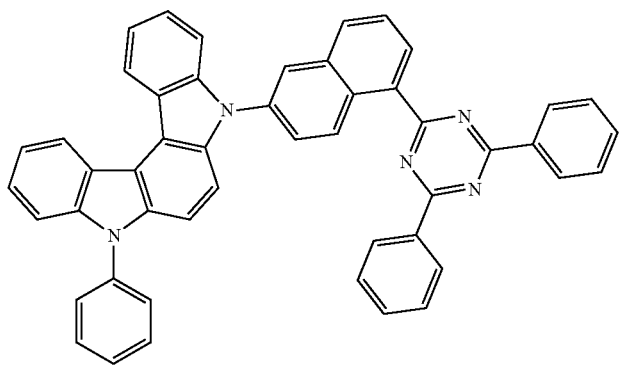
H121
H122
H123

H124

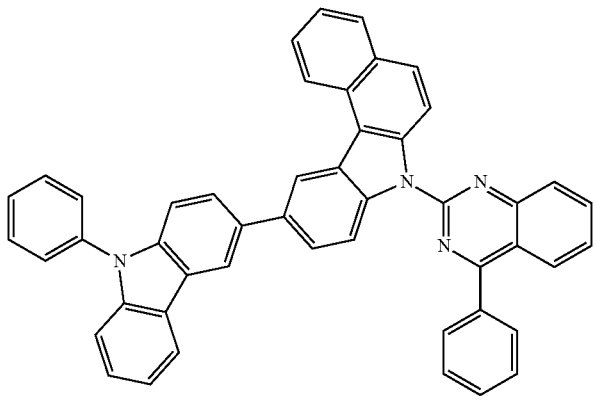

[Phosphorescent Dopant]

The dopant (e.g., phosphorescent dopant) may include the organometallic compound represented by Formula 1.

In an embodiment, the phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In an embodiment, the phosphorescent dopant may include an organometallic compound represented by Formula 401:

$$M(L_{401})_{xc1}(L_{402})_{xc2}$$ Formula 401

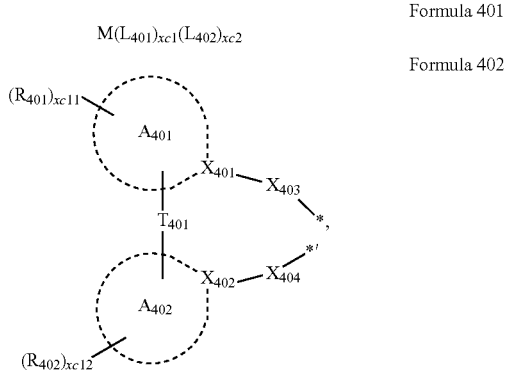 Formula 402 wherein, in Formulae 401 and 402,

M may be transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is 2 or more, two or more of $L_{401}$(s) may be identical to or different from each other, $L_{402}$ may be an organic ligand, xc2 may be 0, 1, 2, 3, or 4, and when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—C(=O)—*', *—N($Q_{411}$)—*', *—C($Q_{411}$)($Q_{412}$)—*', *—C($Q_{411}$)=C($Q_{412}$)—*', *—C($Q_{411}$)=*', or *=C=*', $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described in connection with Qi, xc11 and xc12 may each independently be an integer from 0 to 10, and

* and *' in Formula 402 each indicate a binding site to M in Formula 401.

In one or more embodiments, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 401 is 2 or more, two ring $A_{401}$(s) in two or more $L_{401}$ (s) may optionally be linked to each other via $T_{402}$, which is a linking group, or two ring $A_{402}$(s) in two or more $L_{401}$ (s) may optionally be linked to each other via $T_{403}$, which is a linking group (see Compounds PD1 to PD4 and PD7). $T_{402}$ and $T_{403}$ may each independently be the same as described in connection with $T_{401}$.

$L_{402}$ in Formula 401 may be an organic ligand. In an embodiment, $L_{402}$ may be a halogen group, a diketone group (for example, an acetylacetonate group), a carboxylic acid group (for example, a picolinate group), —C(=O), an isonitril group, a —CN group, a phosphorus group (for example, a phosphine group or a phosphite group), or any combination thereof.

The phosphorescent dopant may include, for example, one of the following Compounds PD1 to PD25, or any combination thereof:

PD1
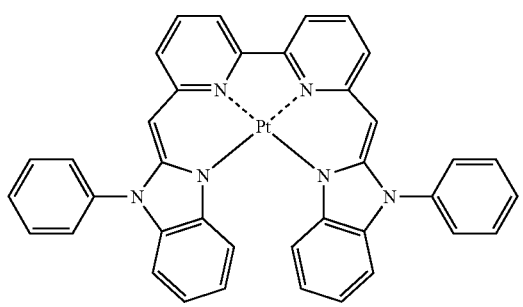
PD2
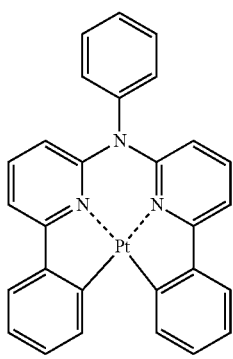
PD3
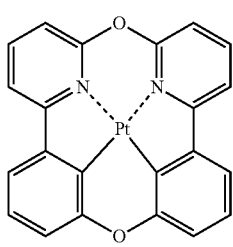
PD4
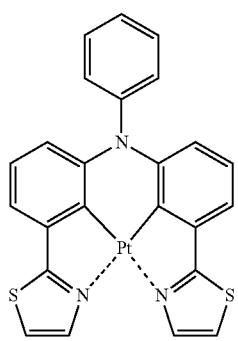
PD5
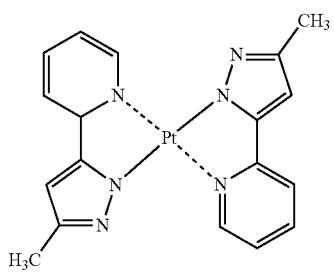
-continued
PD6
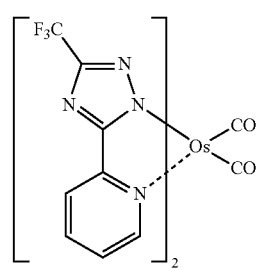
PD7
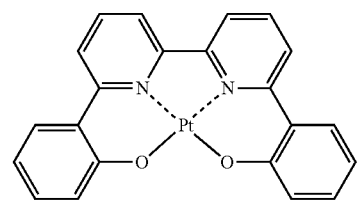
PD8
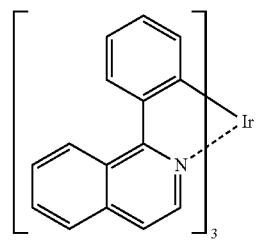
PD9
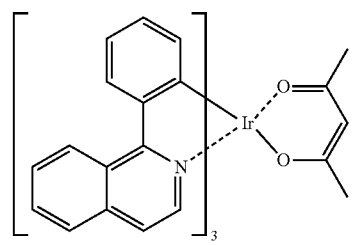
PD10
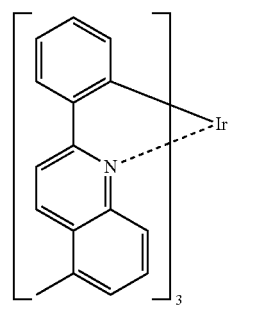
PD11
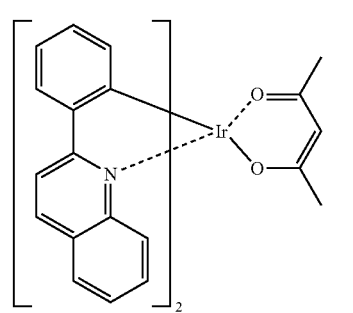

PD12 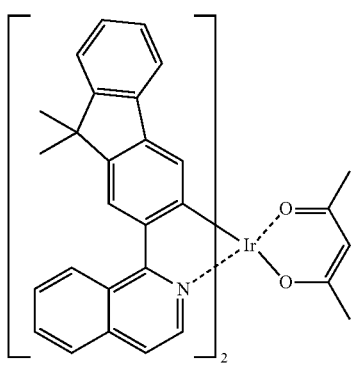
PD13 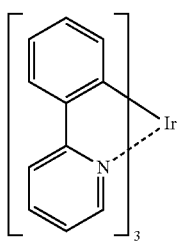
PD14 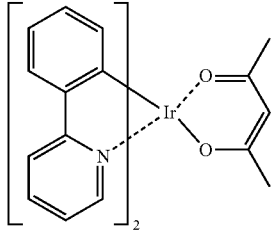
PD15 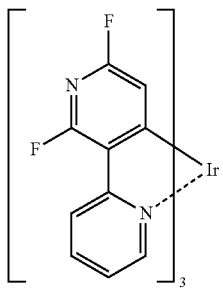
PD16 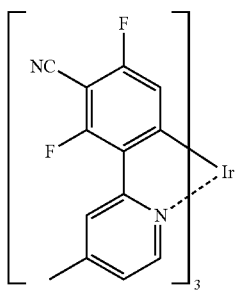
PD17 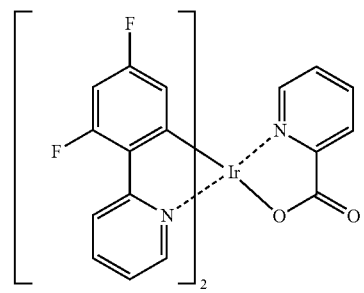
PD18 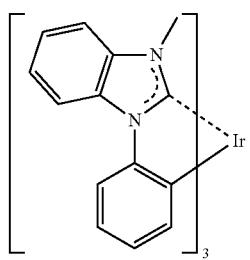
PD19 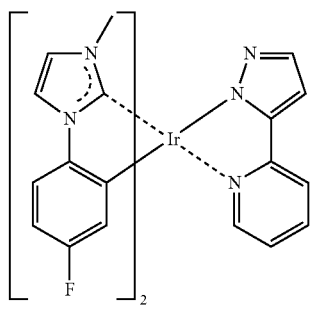
PD20 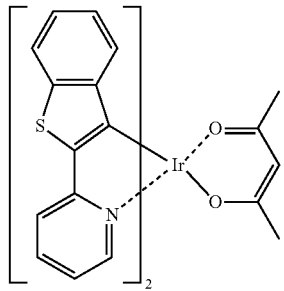
PD21 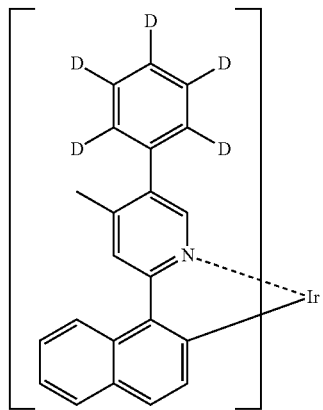

PD22 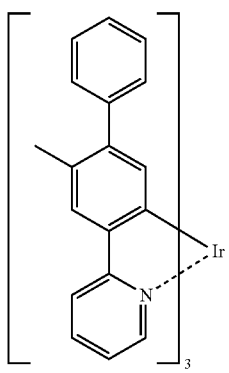

PD23 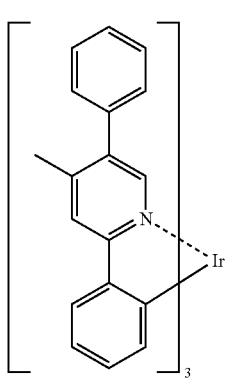

PD24 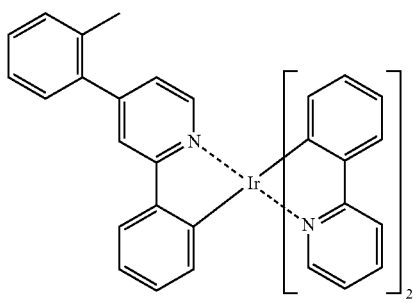

PD25 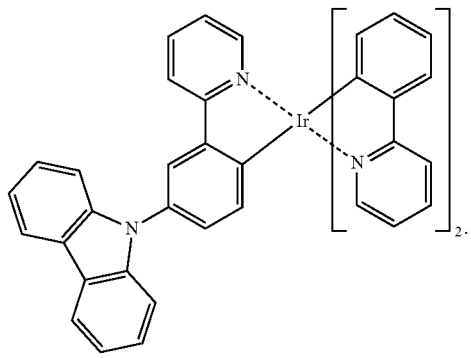

[Fluorescent Dopant]

The fluorescent dopant may include an amine group-containing compound, a styryl group-containing compound, or any combination thereof.

In an embodiment, the fluorescent dopant may include a compound represented by Formula 501:

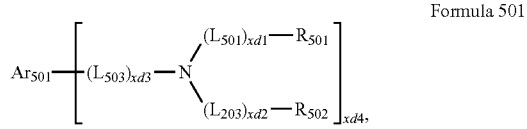

Formula 501 wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, $Ar_{501}$ in Formula 501 may be a condensed cyclic group (for example, an anthracene group, a chrysene group, or a pyrene group) in which three or more monocyclic groups are condensed together.

In one or more embodiments, xd4 in Formula 501 may be 2.

In an embodiment, the fluorescent dopant may include: one of Compounds FD1 to FD36; DPVBi; DPAVBi; or any combination thereof:

FD1 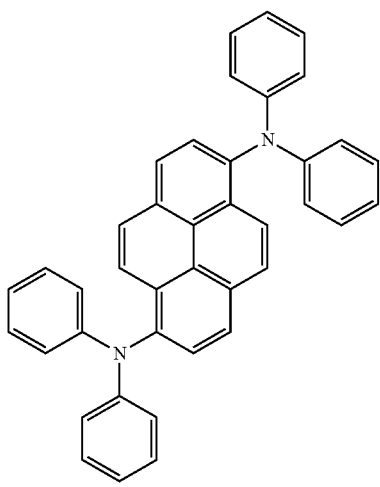

FD2 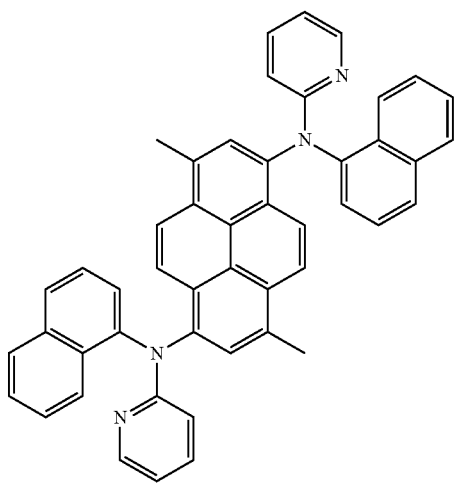

159
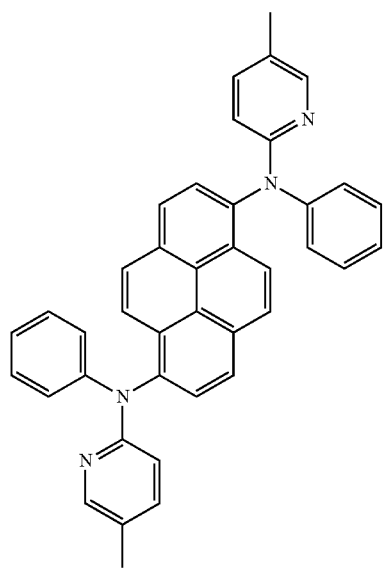
FD3
160
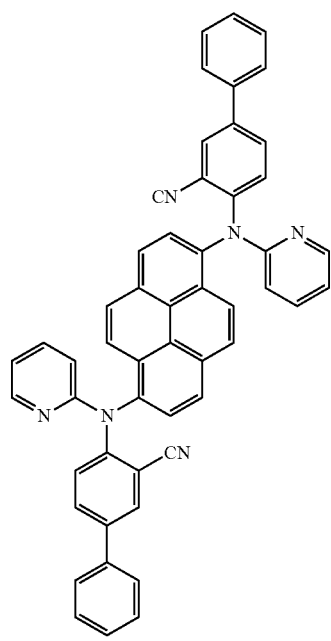
FD4
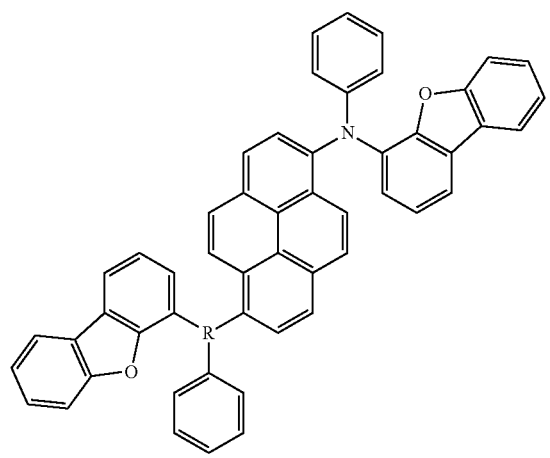
FD5
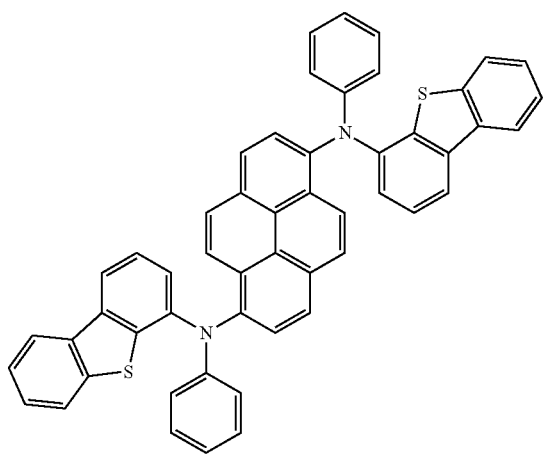
FD6

-continued
FD7
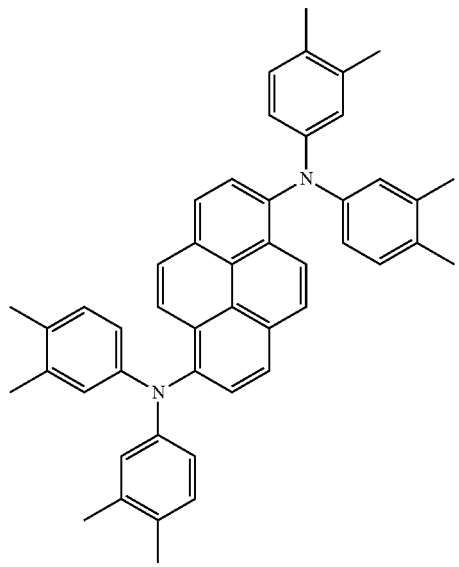
FD8
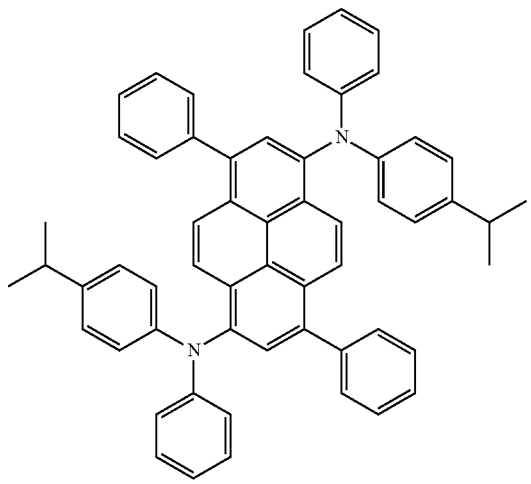
FD9
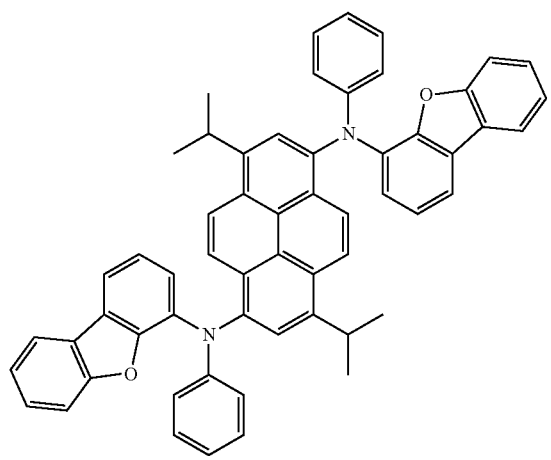
FD10
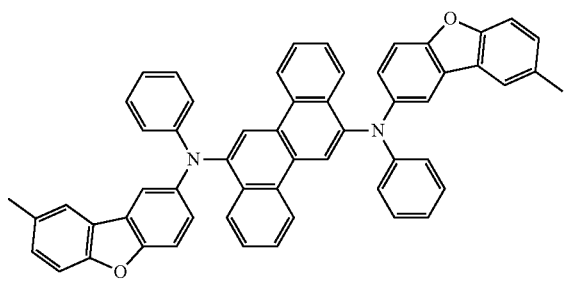
FD11
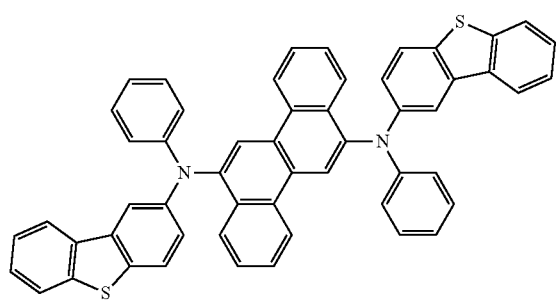
FD12
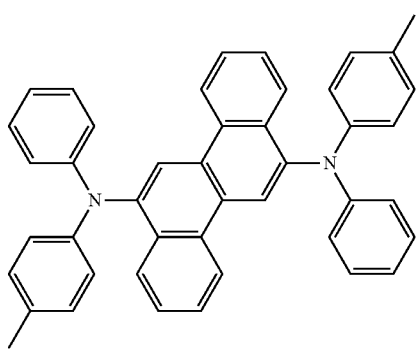

-continued
FD13
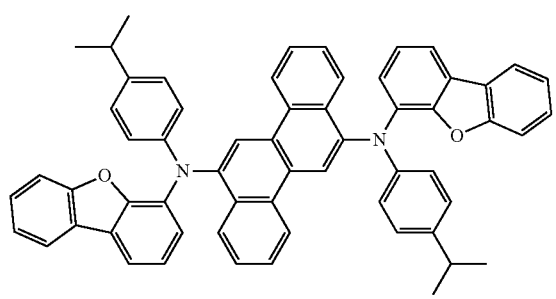
FD14
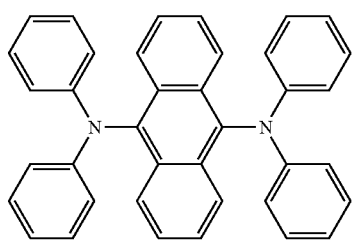
FD15
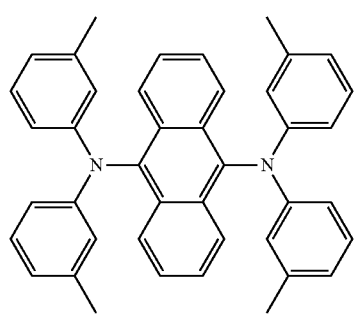
FD16
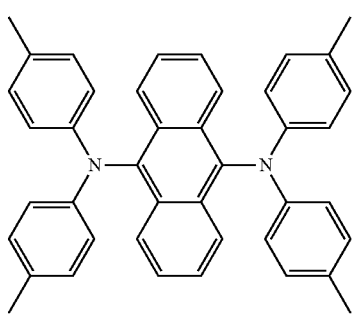
FD17
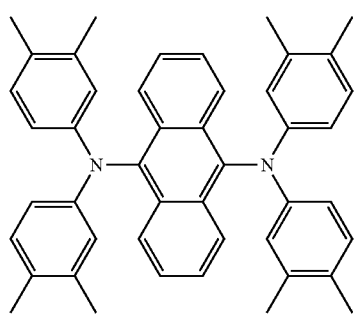
FD18
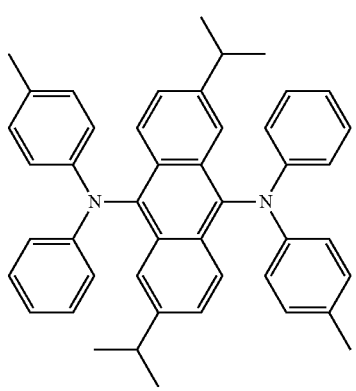
FD19
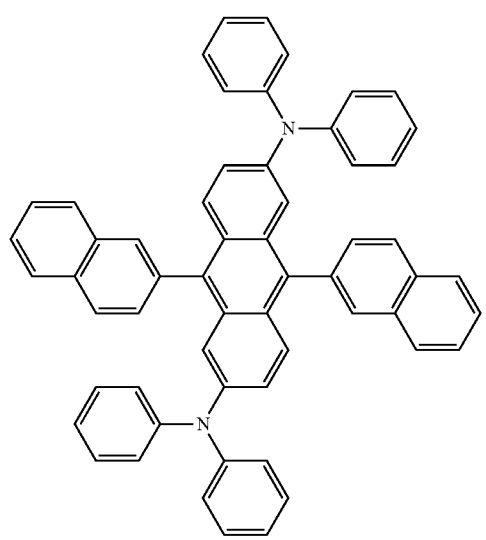
FD20
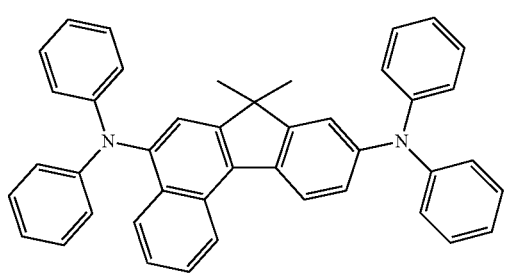

-continued
FD21
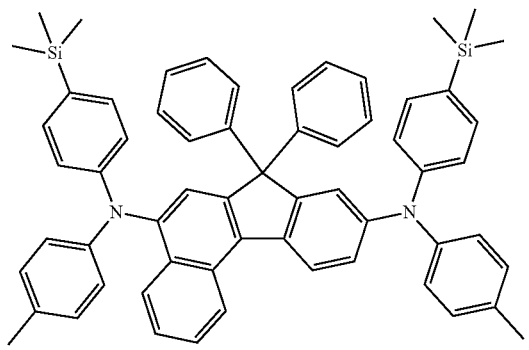
FD22
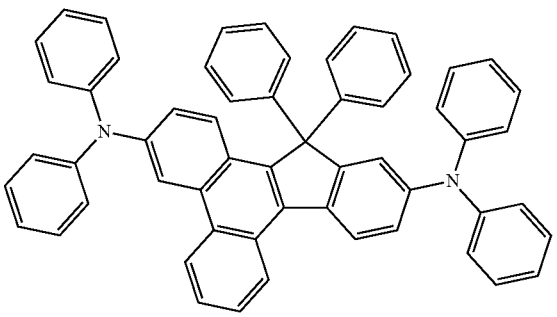
FD23
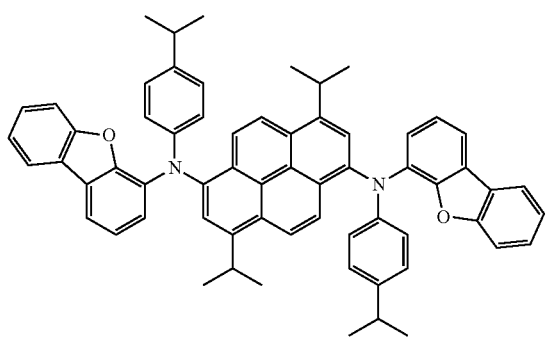
FD24
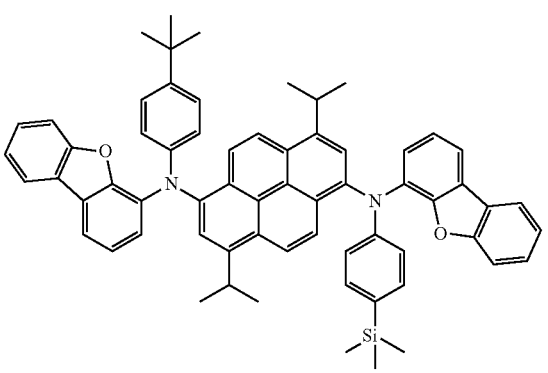
FD25
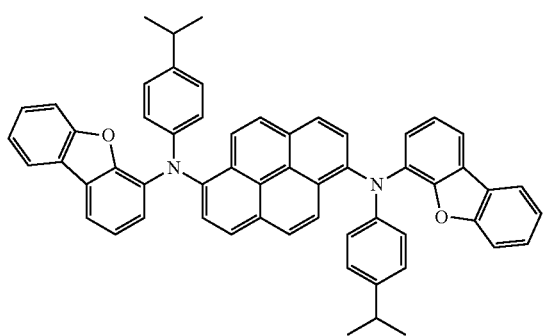
FD26
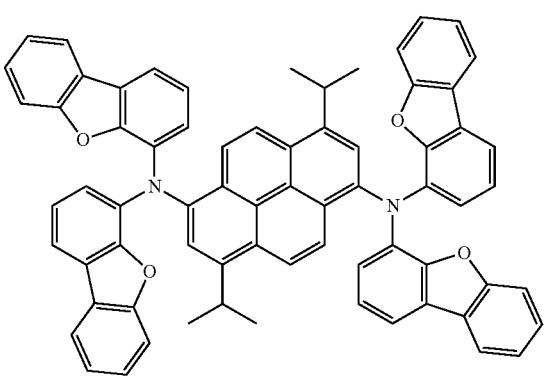
FD27
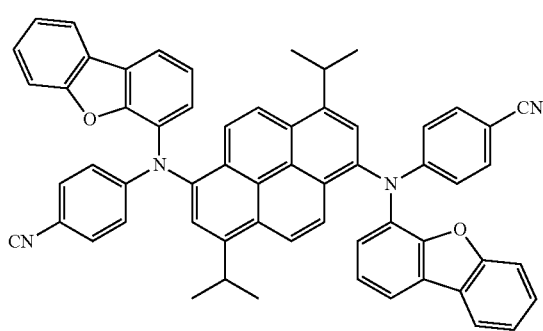
FD28
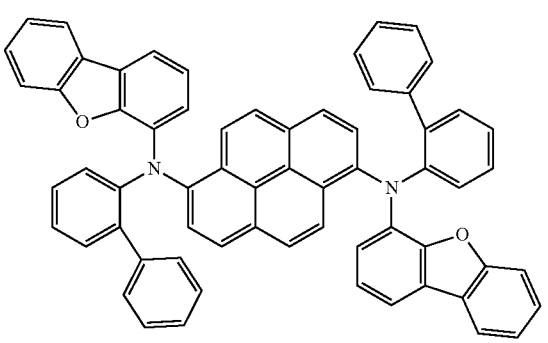

-continued
FD29
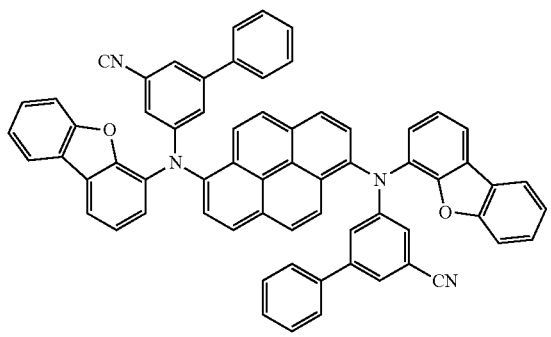
FD30
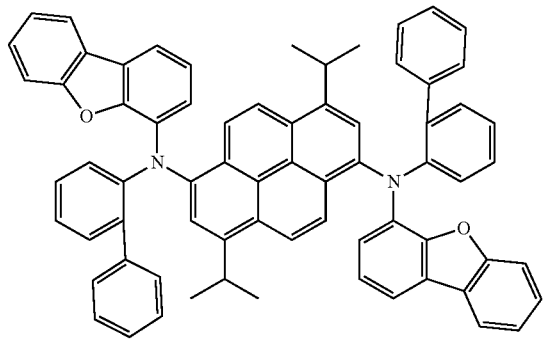
FD31
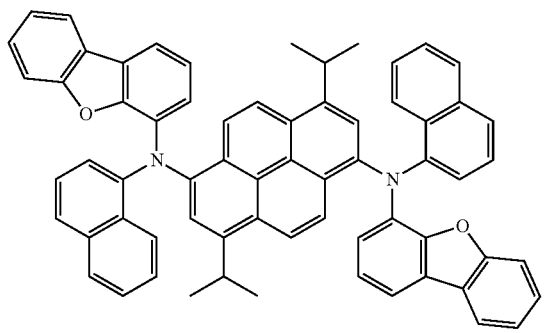
FD32
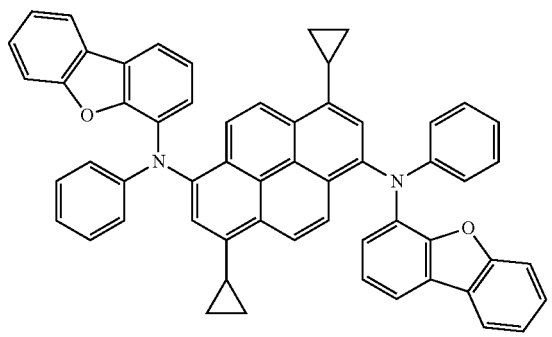
FD33
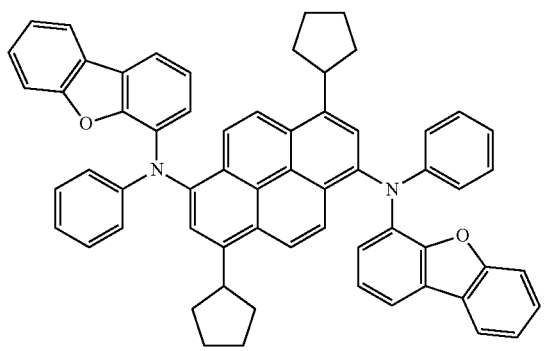
FD34
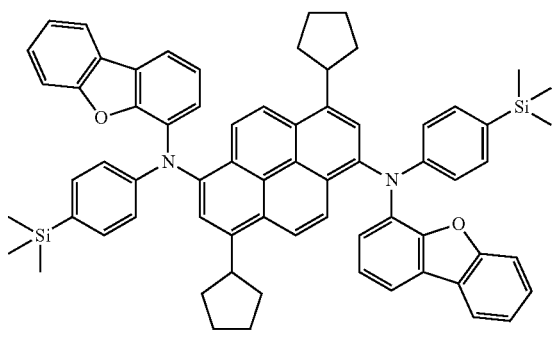
FD35
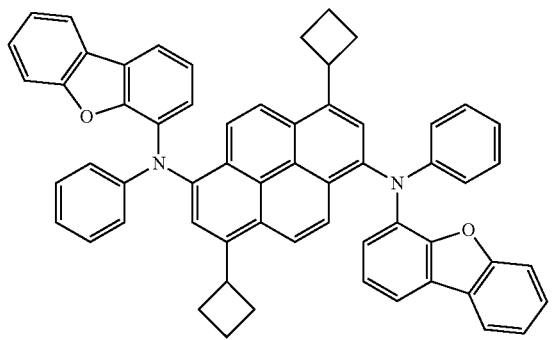
FD36
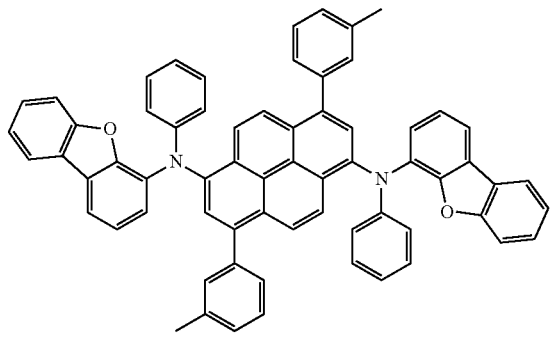

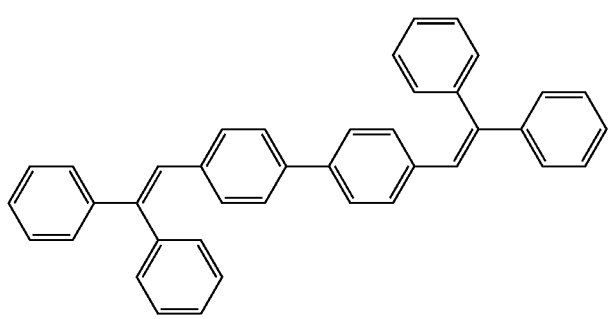

DPVBi

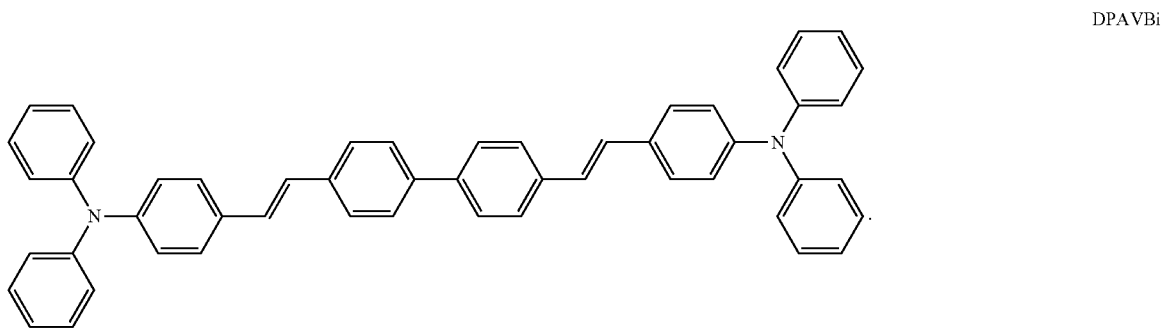 [SMILES: C(=C\c1ccc(N(c2ccccc2)c2ccccc2)cc1)/c1ccc(-c2ccc(/C=C/c3ccc(N(c4ccccc4)c4ccccc4)cc3)cc2)cc1]

DPAVBi

[Delayed Fluorescent Material]

The emission layer may include a delayed fluorescent material.

The delayed fluorescent material utilized herein may be any suitable compound that is capable of emitting delayed fluorescent light based on a delayed fluorescence emission mechanism.

The delayed fluorescent material included in the emission layer may act as a host or a dopant depending on the kind (e.g., type) of other materials included in the emission layer.

In an embodiment, the difference between the triplet energy level (eV) of the delayed fluorescent material and the singlet energy level (eV) of the delayed fluorescent material may be 0 eV or more and 0.5 eV or less. When the difference between the triplet energy level (eV) of the delayed fluorescent material and the singlet energy level (eV) of the delayed fluorescent material satisfies the above-described range, up-conversion in which the delayed fluorescence materials transfer from the triplet state to the singlet state may effectively occur, and thus, the luminescence efficiency of the light-emitting device 10 may be improved.

In an embodiment, the delayed fluorescent material may include i) a material that includes at least one electron donor (for example, a π electron-rich $C_3$-$C_{60}$ cyclic group, such as a carbazole group) and at least one electron acceptor (for example, a sulfoxide group, a cyano group, or a 7 electron-deficient nitrogen-containing $C_1$-$C_{60}$ cyclic group), ii) a material including a $C_8$-$C_{60}$ polycyclic group in which two or more cyclic groups share a boron (B) atom and are condensed with each other.

The delayed fluorescent material may include at least one of compounds DF1 to DF9:

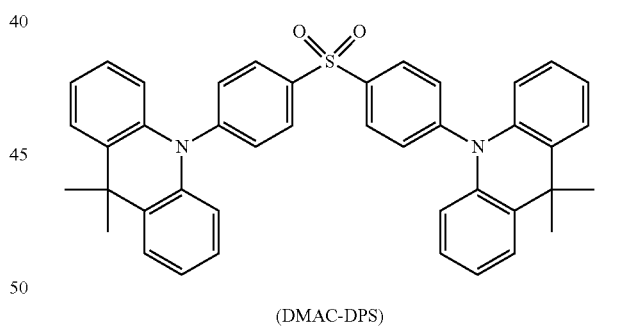

(DMAC-DPS)

DF1

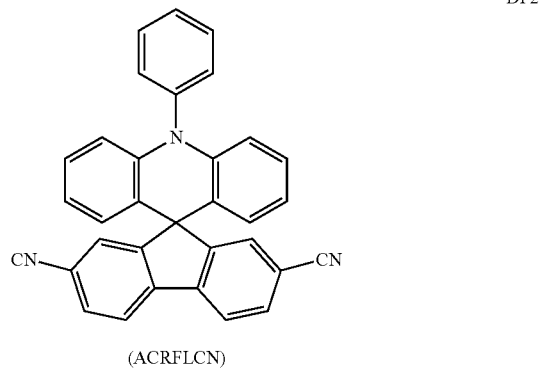

(ACRFLCN)

DF2

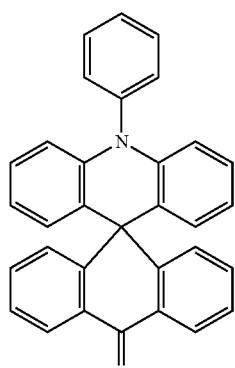
(ACRSA)
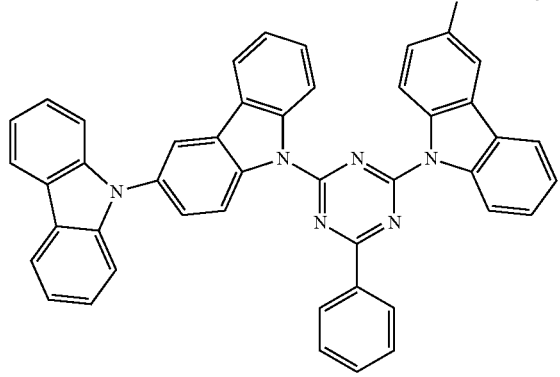
(CC2TA)
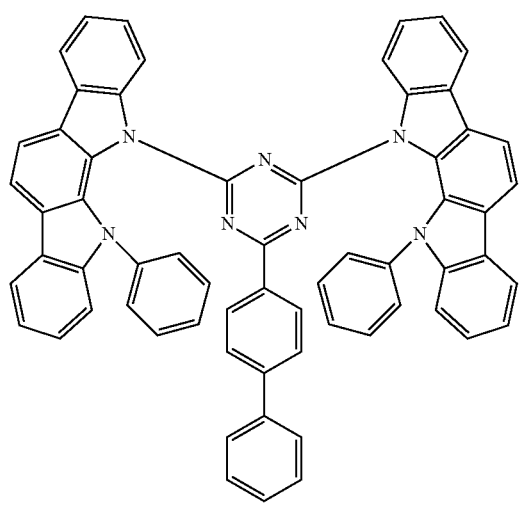
(PIC-TRZ)
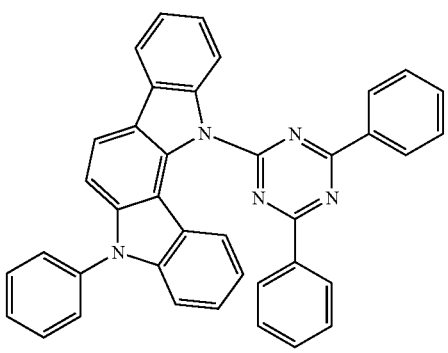
(PIC-TRZ2)
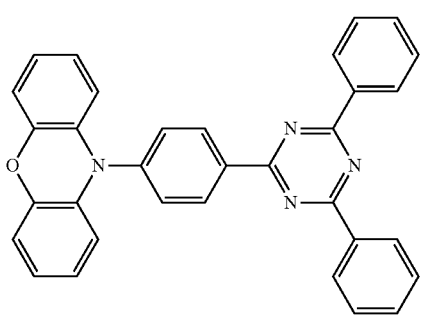
(PXZ-TRZ)
(DABNA-1)
(DABNA-2)
[Quantum Dot]
The emission layer may include a quantum dot.
The term "quantum dot" as used herein refers to a crystal of a semiconductor compound, and may include any suitable material that is capable of emitting light of various suitable emission wavelengths depending on the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, and/or a process that is similar to these processes.

The wet chemical process refers to a method in which an organic solvent and a precursor material are mixed, and then, a quantum dot particle crystal is grown. When the crystal grows, the organic solvent acts as a dispersant naturally coordinated on the surface of the quantum dot crystal and controls the growth of the crystal. Accordingly, by utilizing a process that is easily performed at low costs compared to a vapor deposition process, such as a metal organic chemical vapor deposition (MOCVD) process and/or a molecular beam epitaxy (MBE) process, the growth of quantum dot particles may be controlled.

The quantum dot may include one or more Groups II-VI semiconductor compounds, one or more Groups III-V semiconductor compounds, one or more Groups III-VI semiconductor compounds, one or more Group semiconductor compounds, one or more Groups IV-VI semiconductor compounds, one or more Group IV elements and/or compounds, or one or more combinations thereof.

Non-limiting examples of the Groups II-VI semiconductor compounds may include a binary compound, such as CdSe, CdTe, ZnS, ZnSe, ZnTe, ZnO, HgS, HgSe, HgTe, MgSe, and/or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS; a quaternary compound, such as CdZnSeS, CdZnSeTe, CdZnSTe, CdHgSeS, CdHgSeTe, CdHgSTe, HgZnSeS, HgZnSeTe, and/or HgZnSTe; and any combination thereof.

Non-limiting examples of the Groups III-V semiconductor compounds may include a binary compound, such as GaN, GaP, GaAs, GaSb, AlN, AlP, AlAs, AlSb, InN, InP, InAs, and/or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, and/or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and/or InAlPSb; and any combination thereof. The Groups III-V semiconductor compounds may further include a Group II element. Non-limiting examples of the Groups III-V semiconductor compounds further including a Group II element may include InZnP, InGaZnP, and InAlZnP.

Non-limiting examples of the Groups III-VI semiconductor compounds may include a binary compound, such as GaS, GaSe, $Ga_2Se_3$, GaTe, InS, InSe, $In_2S_3$, $In_2Se_3$, and/or InTe; a ternary compound, such as $InGaS_3$, and/or $InGaSe_3$; and any combination thereof.

Non-limiting examples of the Groups semiconductor compounds may include a ternary compound, such as AgInS, $AgInS_2$, CuInS, $CuInS_2$, $CuGaO_2$, $AgGaO_2$, and/or $AgAlO_2$; and any combination thereof.

Non-limiting examples of the Group IV-VI semiconductor compounds may include a binary compound, such as SnS, SnSe, SnTe, PbS, PbSe, and/or PbTe; a ternary compound, such as SnSeS, SnSeTe, SnSTe, PbSeS, PbSeTe, PbSTe, SnPbS, SnPbSe, and/or SnPbTe; a quaternary compound, such as SnPbSSe, SnPbSeTe, and/or SnPbSTe; and any combination thereof.

In an embodiment, the Group IV elements and/or compounds may include a single element, such as Si and/or Ge; a binary compound, such as SiC and/or SiGe; or any combination thereof.

Each element included in the multi-element compound such as the binary compound, the ternary compound, and the quaternary compound may be present, in the particle, at a uniform concentration or a non-uniform concentration.

In an embodiment, the quantum dot may have a single structure having a uniform concentration of each element included in the corresponding quantum dot or a dual structure of a core-shell. In an embodiment, the material included in the core may be different from the material included in the shell.

The shell of the quantum dot may function as a protective layer for maintaining semiconductor characteristics by preventing or reducing chemical degeneration of the core and/or may function as a charging layer for imparting electrophoretic characteristics to the quantum dot. The shell may be a single layer or a multilayer. An interface between the core and the shell may have a concentration gradient in which the concentration of elements existing in the shell decreases toward the center.

Non-limiting examples of the shell of the quantum dot may include an oxide of metal, metalloid, or non-metal; a semiconductor compound; and any combination thereof. Non-limiting examples of the oxide of metal, metalloid, or non-metal may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; a ternary compound, such as $MgAl_2O_4$, $CoFe_2O_4$, $NiFe_2O_4$, and/or $CoMn_2O_4$; and any combination thereof. Non-limiting examples of the semiconductor compound may include, as described herein, Groups II-VI semiconductor compounds; Groups III-V semiconductor compounds; Groups III-VI semiconductor compounds; Group I-III-VI semiconductor compounds; Groups IV-VI semiconductor compounds; and any combination thereof. In an embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be about 45 nm or less, for example, about 40 nm or less, for example, about 30 nm or less. When the FWHM of the emission wavelength spectrum of the quantum dot is within these ranges, color purity and/or color reproduction may be improved. In addition, light emitted through such quantum dots is irradiated in omnidirection (e.g., in all directions). Accordingly, a wide viewing angle may be increased.

In addition, the quantum dot may be, for example, a spherical nanoparticle, a pyramidal nanoparticle, a multi-arm nanoparticle, a cubic nanoparticle, a nanotube particle, a nanowire particle, a nanofiber particle, or a nanoplate particle.

By adjusting the size of the quantum dot, the energy band gap may also be adjusted, thereby obtaining light of various suitable wavelengths in the quantum dot emission layer. Therefore, by utilizing quantum dots of different sizes, a light-emitting device that emits light of various suitable wavelengths may be implemented. In an embodiment, the size of the quantum dot may be selected to emit red, green and/or blue light. In addition, the size of the quantum dot may be adjusted such that light of various suitable colors are combined to emit white light.

[Electron Transport Region in Interlayer 130]

The electron transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

In an embodiment, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, for each structure, constituting layers are sequentially stacked from the emission layer in the respective stated order.

The electron transport region may include phosphineoxide-containing compounds, silyl compounds, or any combination thereof, as described above.

In an embodiment, the electron transport region (for example, the buffer layer, the hole blocking layer, the electron control layer, or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601 below:

$[Ar_{601}]_{xe11}-[(L_{601})_{xe1}-R_{601}]_{xe21}$,  Formula 601 wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $-Si(Q_{601})(Q_{602})(Q_{603})$, $-C(=O)(Q_{601})$, $-S(=O)_2(Q_{601})$, or $-P(=O)(Q_{601})(Q_{602})$, $Q_{601}$ to $Q_{603}$ may each independently be the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In one or more embodiments, when xe11 in Formula 601 is 2 or more, two or more of $Ar_{601}$(s) may be linked to each other via a single bond.

In an embodiment, $Ar_{601}$ in Formula 601 may be a substituted or unsubstituted anthracene group.

In an embodiment, the electron transport region may include a compound represented by Formula 601-1:

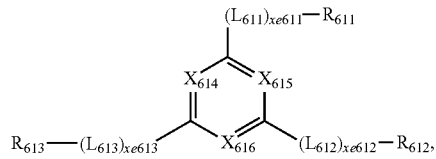

Formula 601-1 wherein, in Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each independently be understood by referring to the description presented in connection with $L_{601}$, xe611 to xe613 may each independently be understood by referring to the description presented in connection with xe1, $R_{611}$ to $R_{613}$ may each independently be understood by referring to the description presented in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), Alq₃, BAlq, TAZ, NTAZ, diphenyl(4-(triphenylsilyl)phenyl)-phosphine oxide (TSPO1), or any combination thereof:

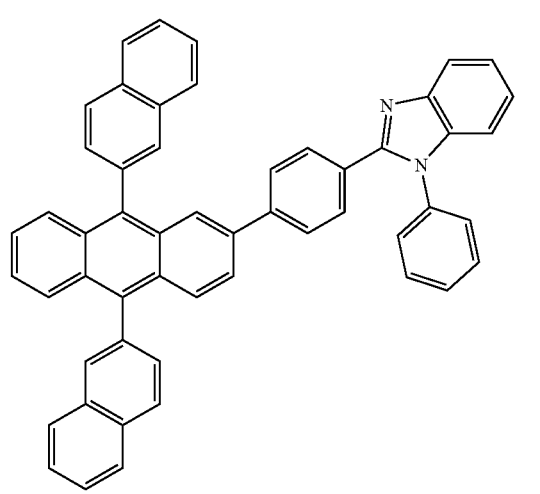

ET1

177
-continued
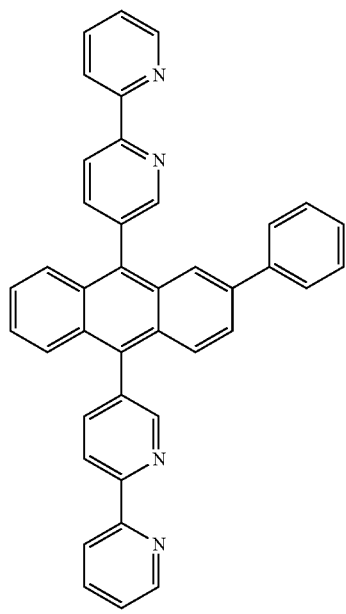
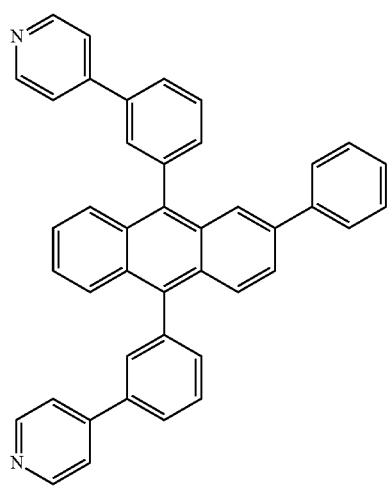
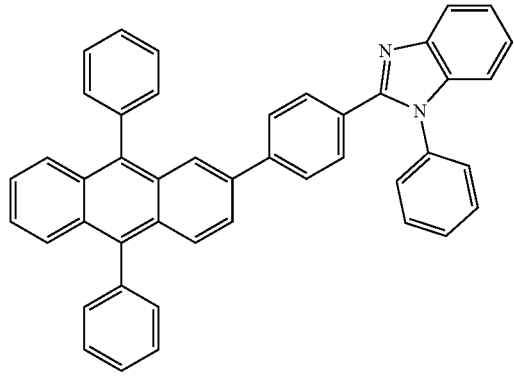
178
-continued
ET2
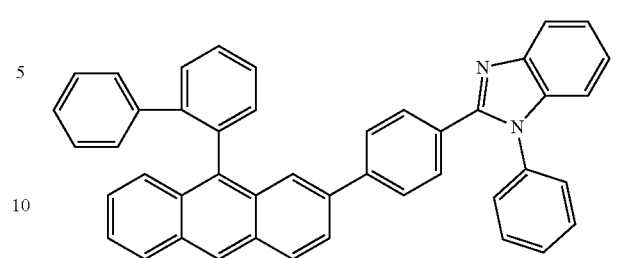
ET5
ET3
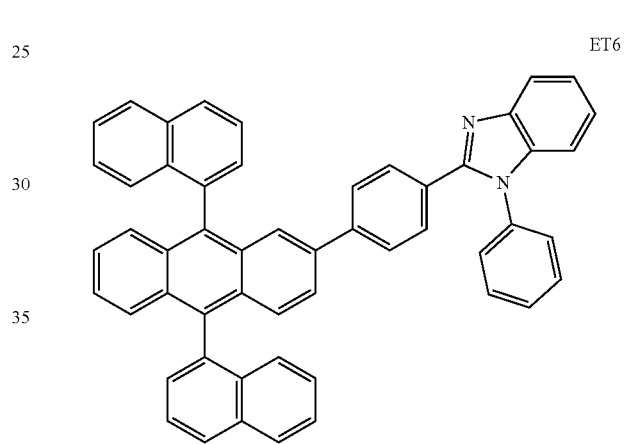
ET6
ET4
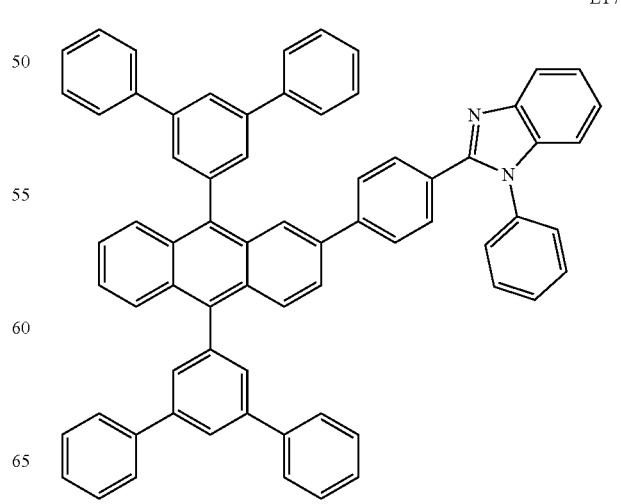
ET7

ET8
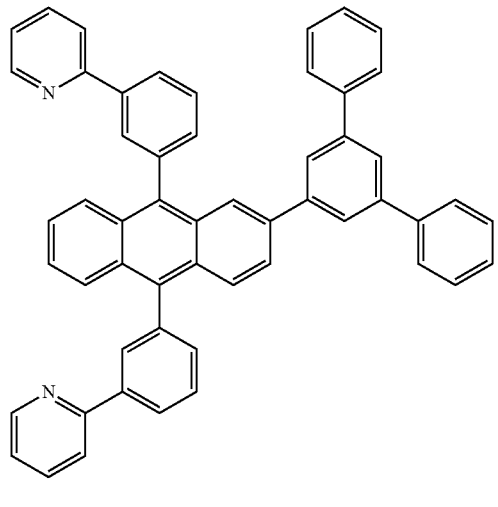
ET9
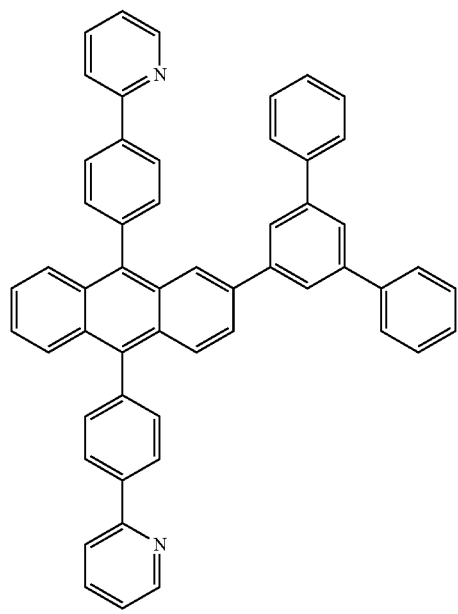
ET10
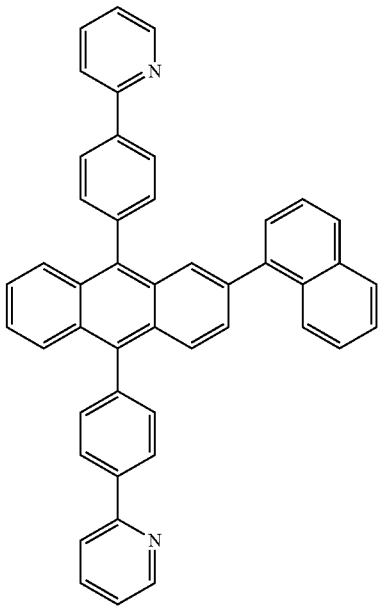
ET11
ET12
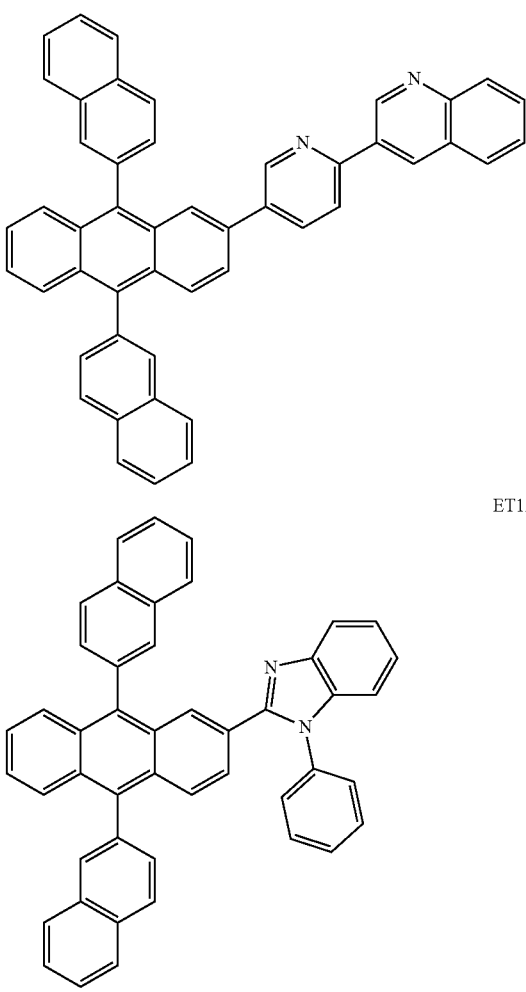

ET13
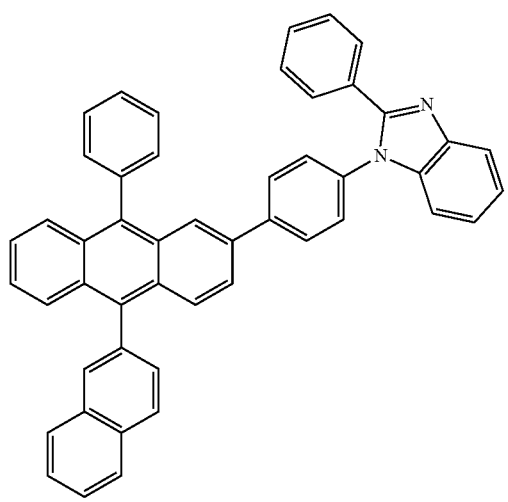
ET16
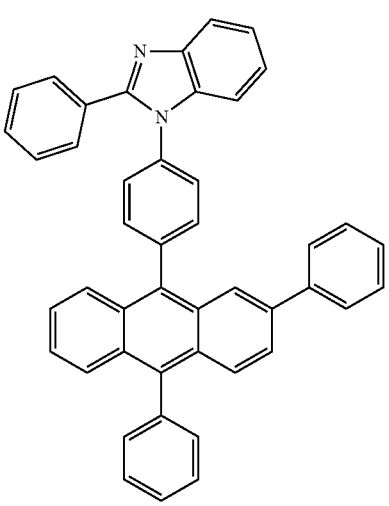
ET14
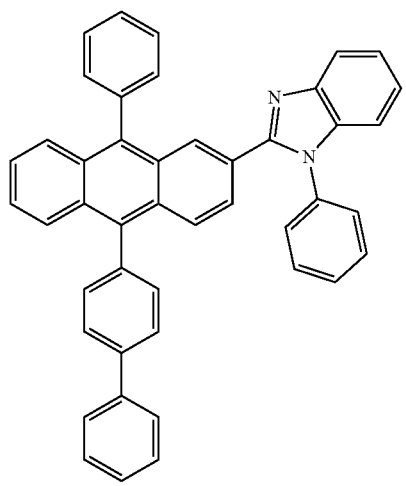
ET17
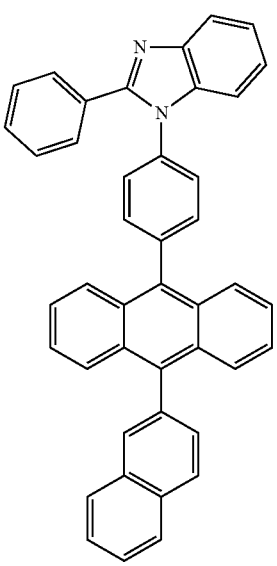
ET15
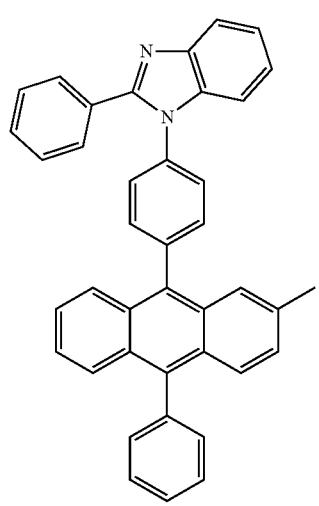
ET18
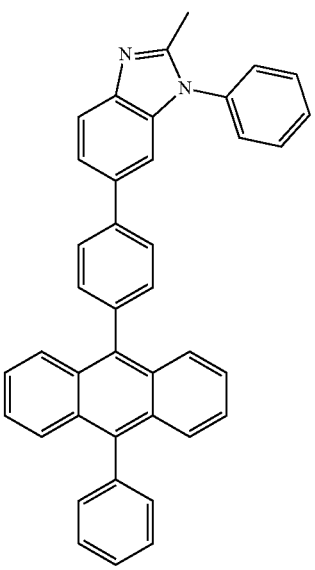

ET19
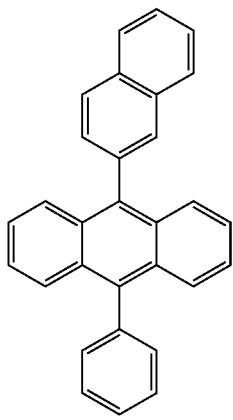
ET20
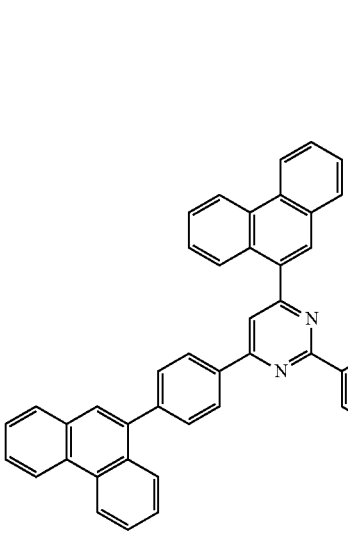
ET21
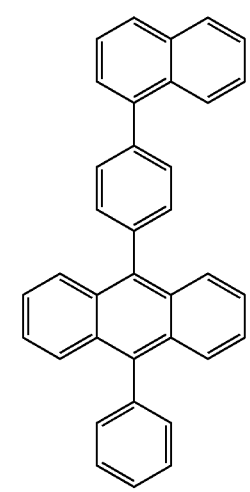
ET22
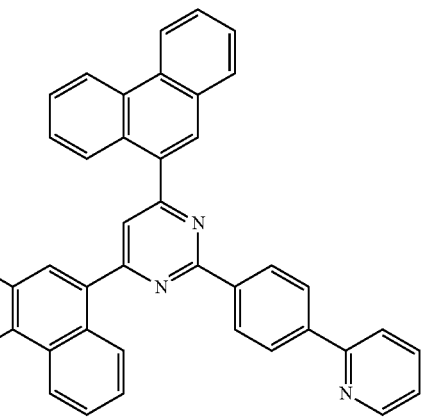
ET23
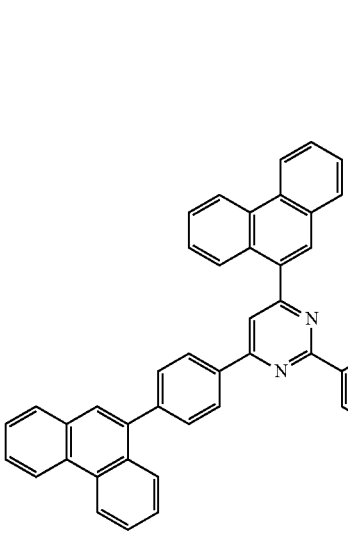
ET24
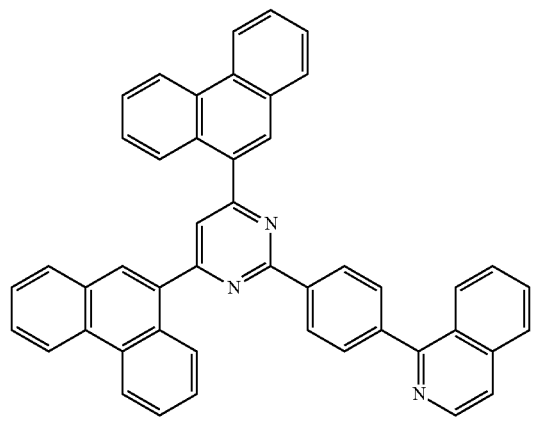

ET25
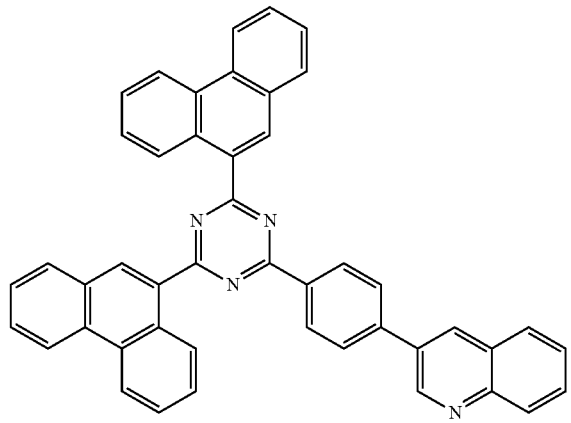
ET26
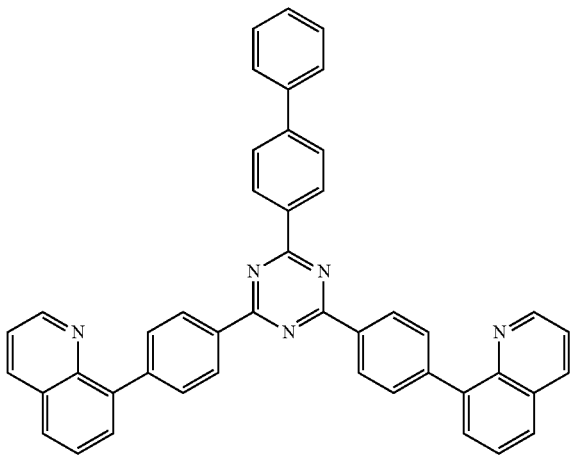
ET27
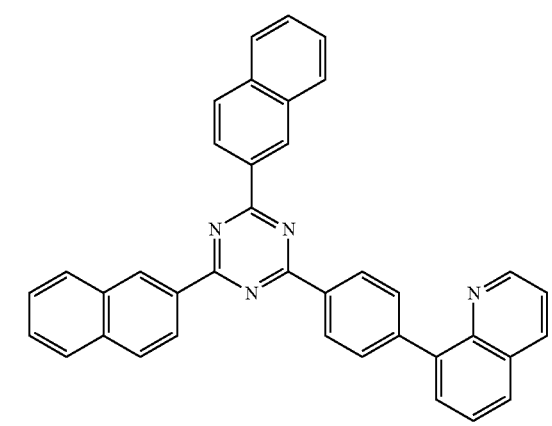
ET28
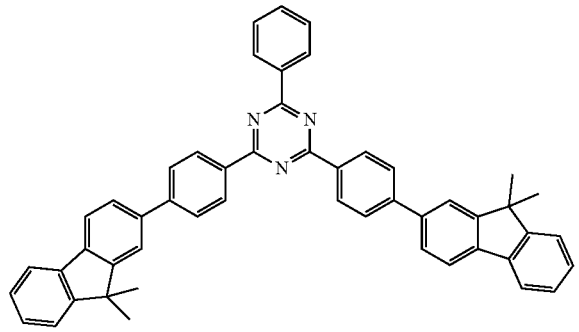
ET29
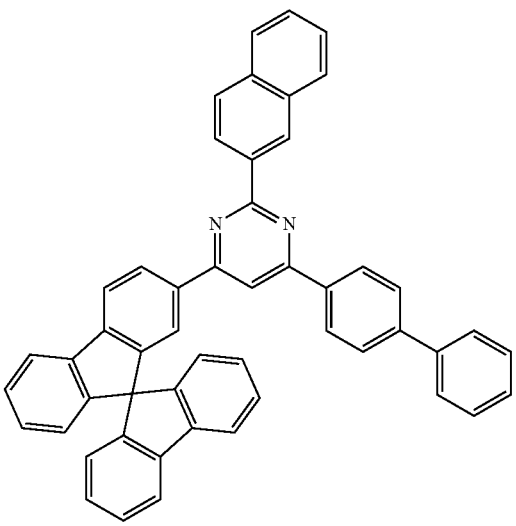
ET30
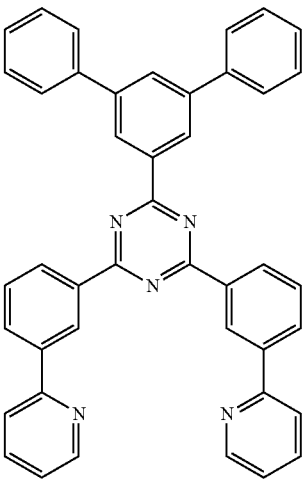

ET31
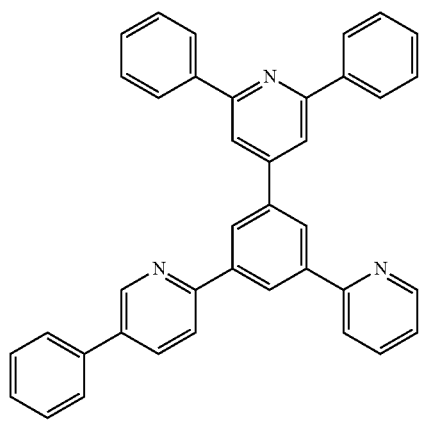
ET32
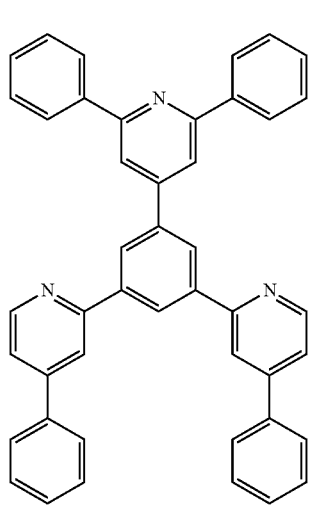
ET33
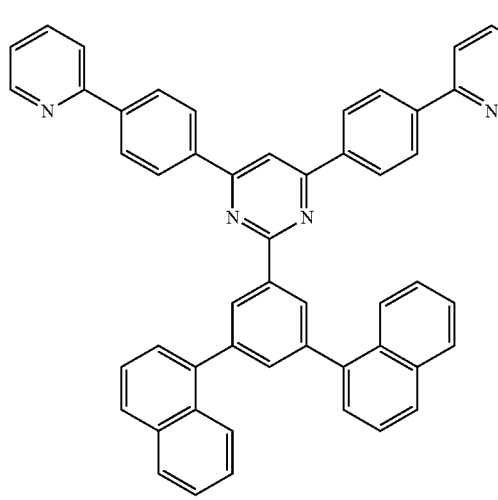
ET34
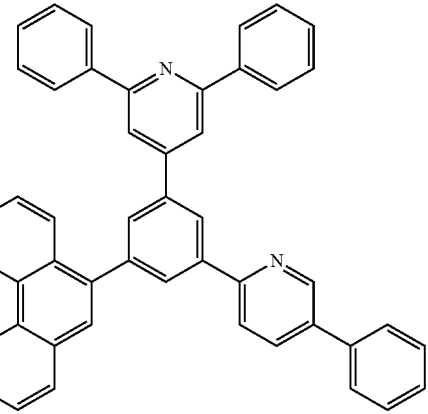
ET35
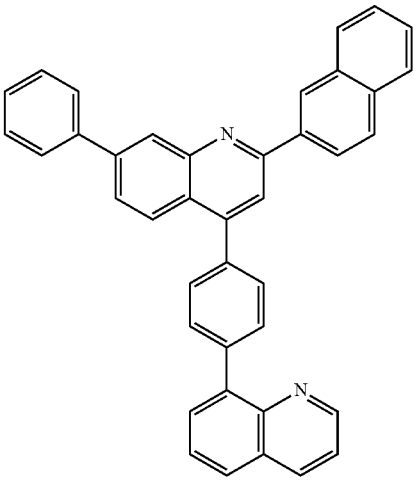
ET36
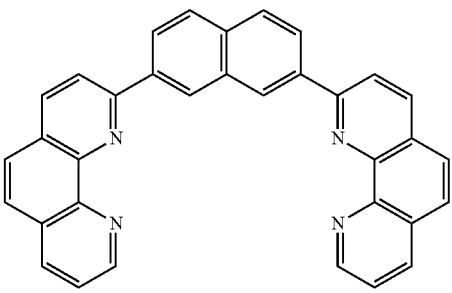
ET37
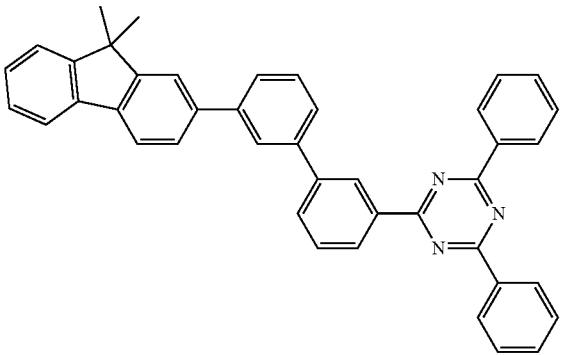

ET38
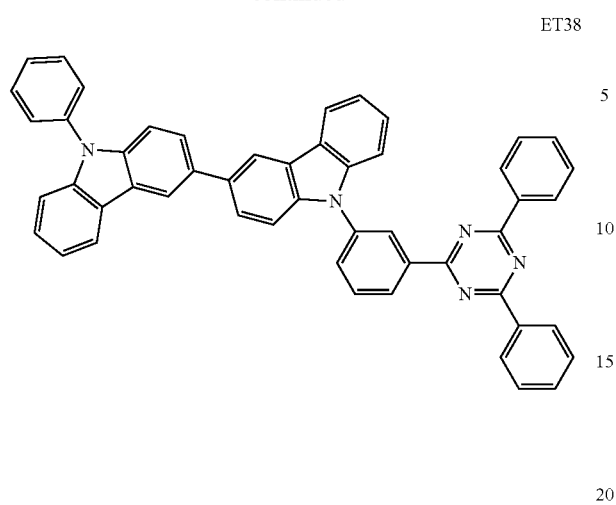
ET41
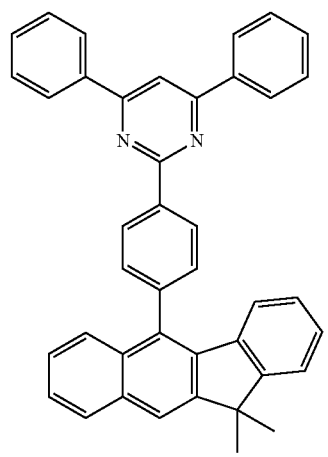
ET39
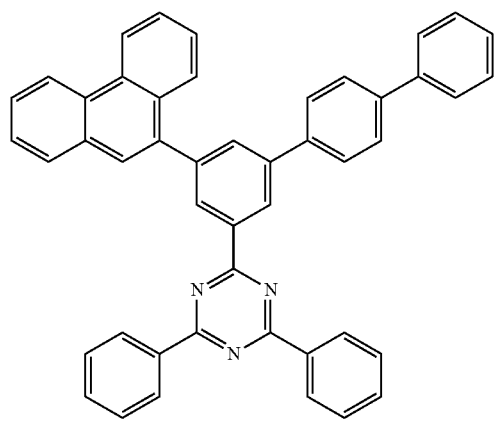
ET42
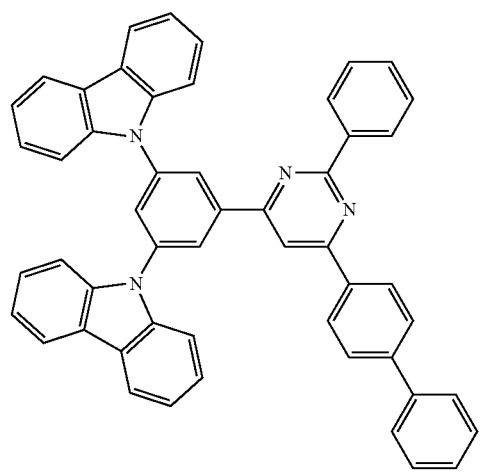
ET40
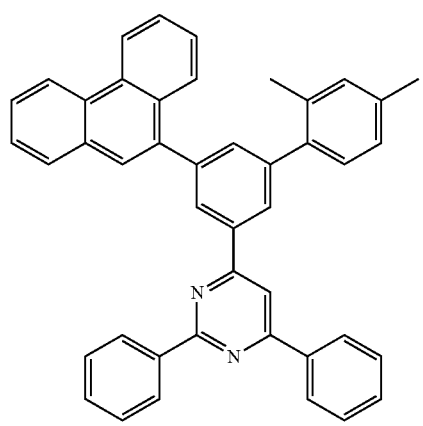
ET43
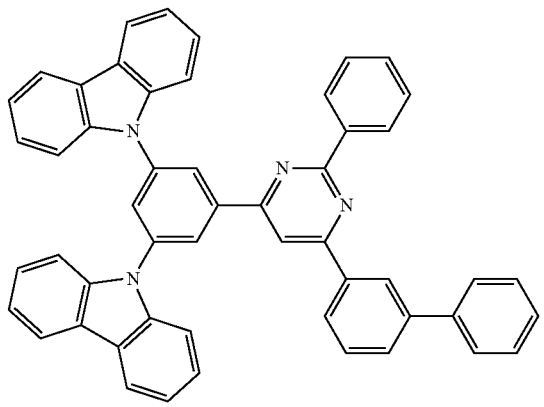

ET44

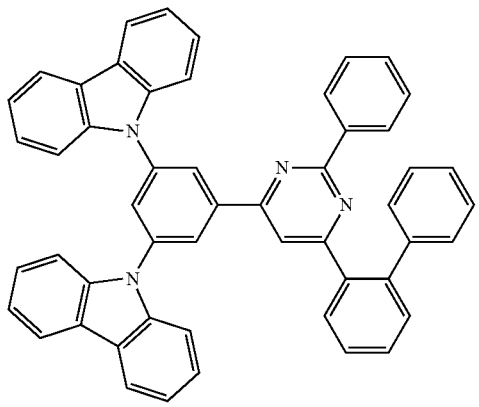

ET45

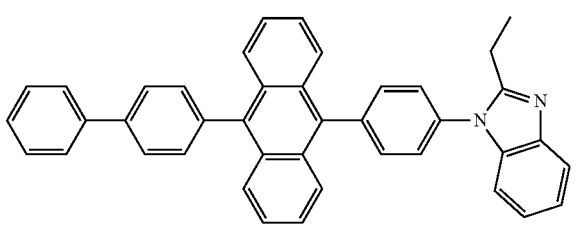

Alq₃

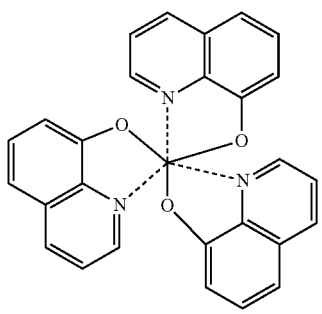

BAlq

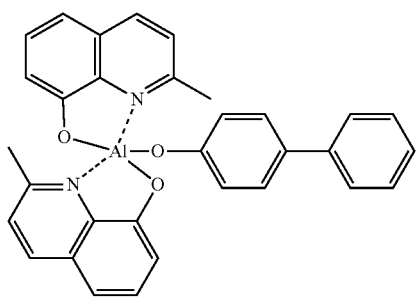

TAZ

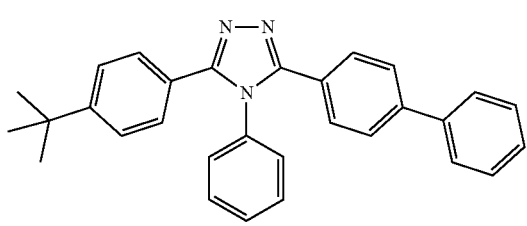

NTAZ

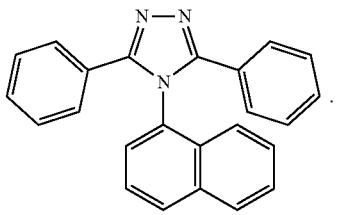

The thickness of the electron transport region may be from about 100 Å to about 5000 Å, for example, about 160 Å to about 4000 Å. When the electron transport region includes a buffer layer, a hole blocking layer, an electron control layer, an electron transport layer, or any combination thereof, the thickness of the buffer layer, the hole blocking layer, or the electron control layer may each independently be from about 20 Å to about 1000 Å, for example, about 30 Å to about 300 Å, and the thickness of the electron transport layer may be from about 100 Å to about 1000 Å, for example, about 150 Å to about 500 Å. When the thicknesses of the buffer layer, the hole blocking layer, the electron control layer, and/or the electron transport layer are within these ranges, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth-metal complex, or any combination thereof. A metal ion of the alkali metal complex may be a Li ion, a Na ion, a K ion, a Rb ion, and/or a Cs ion, and a metal ion of the alkaline earth-metal complex may be a Be ion, a Mg ion, a Ca ion, a Sr ion, and/or a Ba ion. A ligand coordinated with the metal ion of the alkali metal complex and/or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or ET-D2:

ET-D1

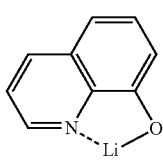

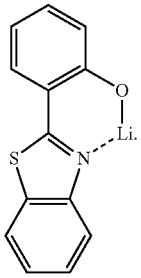
ET-D2

The electron transport region may include an electron injection layer that facilitates the injection of electrons from the second electrode 150. The electron injection layer may directly contact the second electrode 150.

The electron injection layer may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combinations thereof.

The alkali metal may include Li, Na, K, Rb, Cs, or any combination thereof.

The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides and/or halides (for example, fluorides, chlorides, bromides, and/or iodides) of the alkali metal, the alkaline earth metal, and the rare earth metal, telluride, or any combination thereof.

The alkali metal-containing compound may be alkali metal oxides, such as $Li_2O$, $Cs_2O$, and/or $K_2O$, alkali metal halides, such as LiF, NaF, CsF, KF, LiI, NaI, CsI, and/or KI, or any combination thereof. The alkaline earth metal-containing compound may include an alkaline earth metal oxides, such as BaO, SrO, CaO, $Ba_xSr_{1-x}O$ (x is a real number that satisfies the condition of 0<x<1), and/or $Ba_xCa_{1-x}O$ (x is a real number that satisfies the condition of 0<x<1). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include lanthanide metal telluride. Non-limiting examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii) as a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof, or may further include an organic material (for example, a compound represented by Formula 601).

In an embodiment, the electron injection layer may include (e.g., consist of) i) an alkali metal-containing compound (for example, an alkali metal halide), or ii) a) an alkali metal-containing compound (for example, an alkali metal halide); and b) an alkali metal, an alkaline earth metal, a rare earth metal, or any combination thereof. In an embodiment, the electron injection layer may be a KI:Yb co-deposited layer or a RbI:Yb co-deposited layer.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or any combination thereof may be homogeneously or non-homogeneously dispersed in a matrix including the organic material.

A thickness of the electron injection layer may be in the range of about 1 Å to about 100 Å, for example, about 3 Å to about 90 Å. When the thickness of the electron injection layer is within the ranges described above, the electron injection layer may have satisfactory electron injection characteristics without a substantial increase in driving voltage.

[Second Electrode 150]

The second electrode 150 may be located on the interlayer 130 having such a structure. The second electrode 150 may be a cathode, which is an electron injection electrode, and as the material for forming the second electrode 150, a metal, an alloy, an electrically conductive compound, or any combination thereof, each having a low work function, may be utilized.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, and/or a combination thereof. The second electrode 150 may be a transmissive electrode, a semi-transmissive electrode, or a reflective electrode.

The second electrode 150 may have a single-layered structure or a multi-layered structure including two or more layers. [Capping layer]

A first capping layer may be located outside the first electrode 110 (e.g., on the side facing oppositely away from the second electrode 150), and/or a second capping layer may be located outside the second electrode 150 (e.g., on the side facing oppositely away from the first electrode 110). For example, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in the emission layer of the interlayer 130 of the light-emitting device 10 may be extracted (e.g., emitted) toward the outside through the first electrode 110 (which is a semi-transmissive electrode or a transmissive electrode) and the first capping layer, and/or light generated in the emission layer of the interlayer 130 of the light-emitting device 10 may be extracted (e.g., emitted) toward the outside through the second electrode 150 (which is a semi-transmissive electrode or a transmissive electrode) and the second capping layer.

The first capping layer and the second capping layer may increase external luminescence efficiency according to the principle of constructive interference. Accordingly, the light extraction efficiency of the light-emitting device 10 is increased, so that the luminescence efficiency of the light-emitting device 10 may be improved.

Each of the first capping layer and the second capping layer may include a material having a refractive index of 1.6 or more (at 589 nm).

The first capping layer and the second capping layer may each independently be an organic capping layer including an organic material, an inorganic capping layer including an inorganic material, or a composite capping layer including an organic material and an inorganic material.

At least one selected from the first capping layer and the second capping layer may each independently include a carbocyclic compound, a heterocyclic compound, an amine group-containing compound, a porphyrine derivative, a phthalocyanine derivative, a naphthalocyanine derivative, an alkali metal complex, an alkaline earth-metal complex, or a combination thereof. The carbocyclic compound, the heterocyclic compound, and the amine group-containing compound may be optionally substituted with a substituent containing O, N, S, Se, Si, F, Cl, Br, I, or any combination thereof. In an embodiment, at least one of the first capping layer and the second capping layer may each independently include an amine group-containing compound.

In an embodiment, at least one of the first capping layer and second capping layer may each independently include a compound represented by Formula 201, a compound represented by Formula 202, or any combination thereof.

In one or more embodiments, at least one of the first capping layer and the second capping layer may each independently include one of Compounds HT28 to HT33, one of Compounds CP1 to CP6, β-NPB, or any combination thereof:

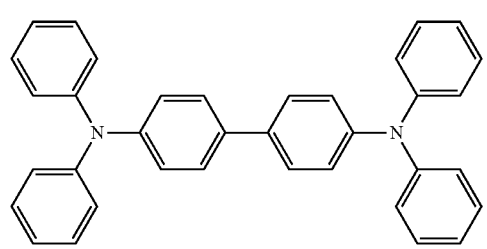

CP1

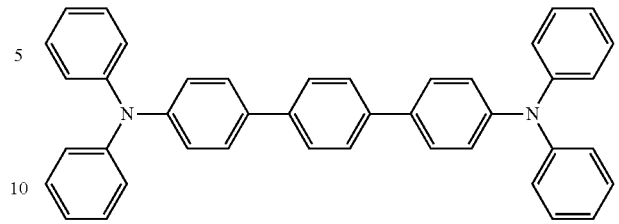

CP2

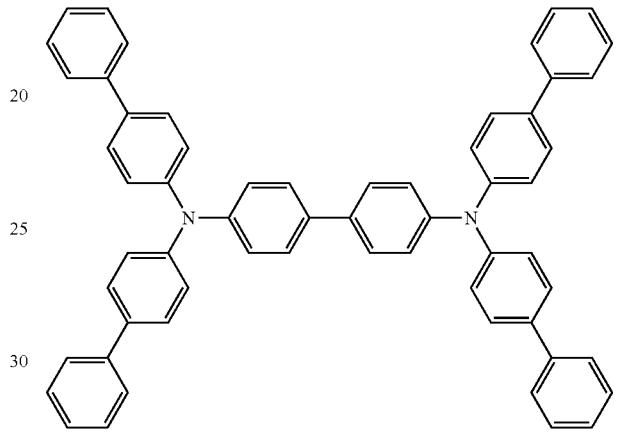

CP3

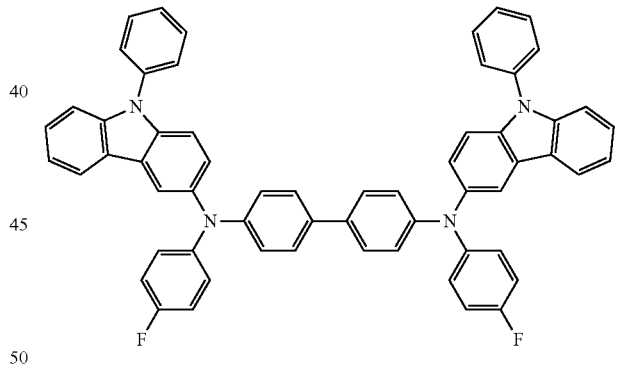

CP4

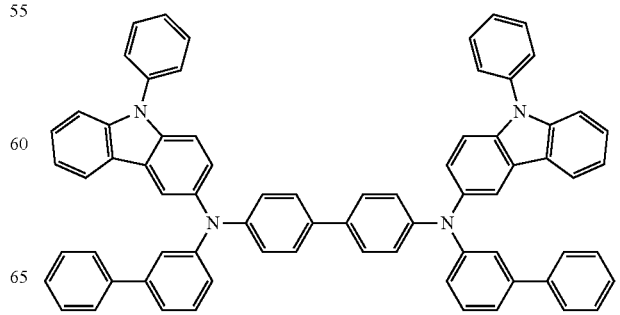

CP5

-continued

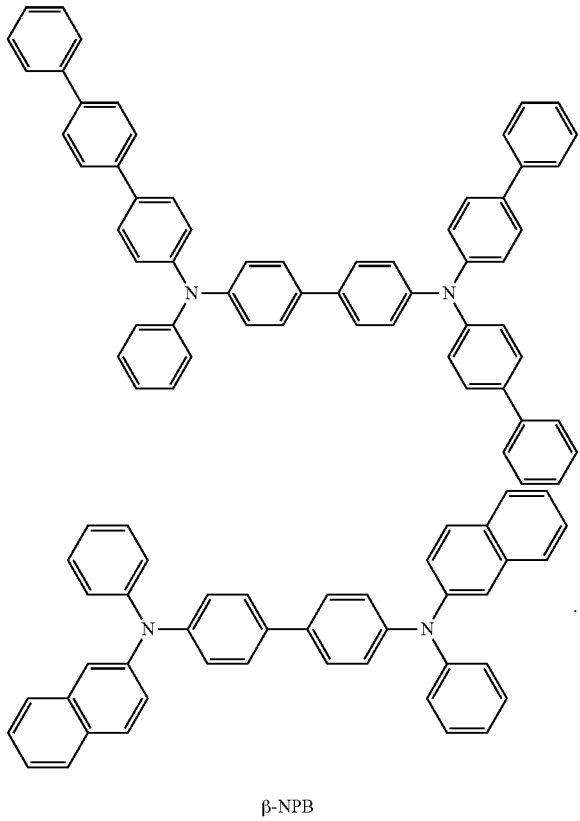

CP6

β-NPB

[Electronic Apparatus]

The light-emitting device may be included in various suitable electronic apparatuses. In an embodiment, the electronic apparatus including the light-emitting device may be a light-emitting apparatus, an authentication apparatus, or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. In an embodiment, light emitted from the light-emitting device may be blue light or white light. The light-emitting device may be the same as described above. In an embodiment, the color conversion layer may include quantum dots. The quantum dot may be, for example, a quantum dot as described herein.

The electronic apparatus may include a first substrate. The first substrate may include a plurality of subpixel areas, the color filter may include a plurality of color filter areas respectively corresponding to the plurality of subpixel areas, and the color conversion layer may include a plurality of color conversion areas respectively corresponding to the subpixel areas.

A pixel-defining film (or referred to "a pixel-defining layer") may be located between the plurality of subpixel areas to define each of the subpixel areas.

The color filter may further include the color filter areas and a light-blocking pattern located between adjacent color filter areas of the color filter areas, and the color conversion layer may further include the color conversion areas and a light-blocking pattern located between adjacent color conversion areas of the color conversion areas.

The color filter areas (or, a plurality of color conversion areas) may include: a first area emitting first-color light; a second area emitting second-color light; and/or a third area emitting third-color light, and the first-color light, the second-color light and/or the third-color light may have different maximum luminescence wavelengths. In an embodiment, the first color light may be red light, the second color light may be green light, and the third color light may be blue light. In an embodiment, the color filter areas (or the color conversion areas) may include quantum dots. In more detail, the first area may include a red quantum dot (e.g., a red light emitting quantum dot), the second area may include a green quantum dot (e.g., a green light emitting quantum dot), and the third area may not include a quantum dot. The quantum dot may be the same as described in the present specification. Each of the first area, the second area and/or the third area may further include a scattering body (e.g., a scatterer).

In an embodiment, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths from one another. In an embodiment, the first light may be blue light, the first first-color light may be red light, the second first-color light may be green light, and the third first-color light may be blue light.

The electronic apparatus may further include a thin-film transistor in addition to the light-emitting device 10 as described above. The thin-film transistor may include a source electrode, a drain electrode, and an activation layer (e.g., an active layer), wherein any one of the source electrode and the drain electrode may be electrically connected to any one of the first electrode 110 and the second electrode 150 of the light-emitting device 10.

The thin-film transistor may further include a gate electrode, a gate insulation layer, and/or the like.

The active layer may include crystalline silicon, amorphous silicon, an organic semiconductor, an oxide semiconductor, and/or the like.

The electronic apparatus may further include a sealing portion (e.g., a sealing layer) for sealing the light-emitting device 10. The sealing portion may be located between the color filter and the light-emitting device 10 and/or between the color conversion layer and the light-emitting device 10. The sealing portion allows light from the light-emitting device 10 to be extracted (e.g., emitted) to the outside, while also or simultaneously preventing or substantially preventing ambient air and moisture from penetrating into the light-emitting device 10. The sealing portion may be a sealing substrate including a transparent glass substrate or a plastic substrate. The sealing portion may be a thin film encapsulation layer including at least one layer of an organic layer and/or an inorganic layer. When the sealing portion is a thin film encapsulation layer, the electronic apparatus may be flexible.

On the sealing portion, in addition to the color filter and/or color conversion layer, various suitable functional layers may be further located according to the usage of the electronic apparatus. The functional layers may include a touch screen layer, a polarizing layer, and/or the like. The touch screen layer may be a pressure-sensitive touch screen layer, a capacitive touch screen layer, and/or an infrared touch screen layer. The authentication apparatus may be, for example, a biometric authentication apparatus for authenticating an individual by utilizing biometric information of a biometric body (for example, a fingertip, a pupil, and/or the like).

The authentication apparatus may further include, in addition to the light-emitting device, a biometric information collector.

The electronic apparatus may be applied to various suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various suitable measuring instruments, meters (for example, meters for a vehicle, an aircraft, and a vessel), projectors, and/or the like.

Figure 2:
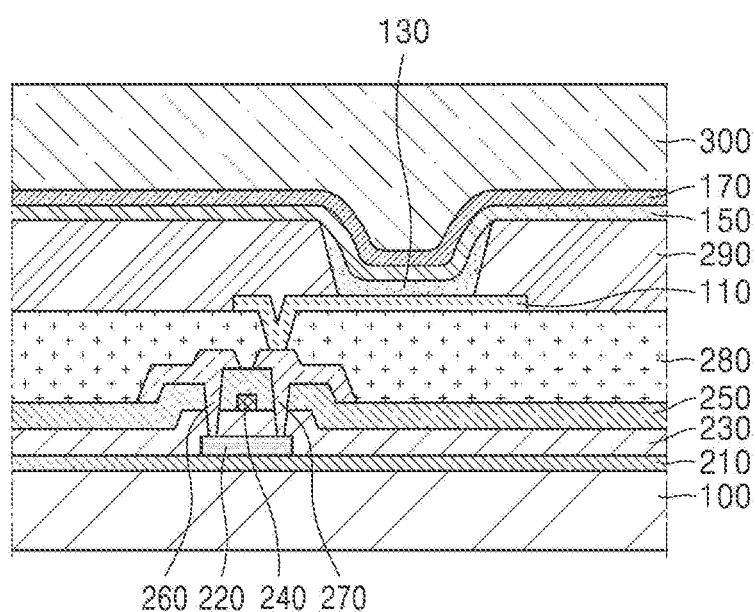
FIGS. 2 and 3 are each a schematic cross-sectional view of a light-emitting apparatus according to a respective embodiment of the present disclosure.
Figure 3:
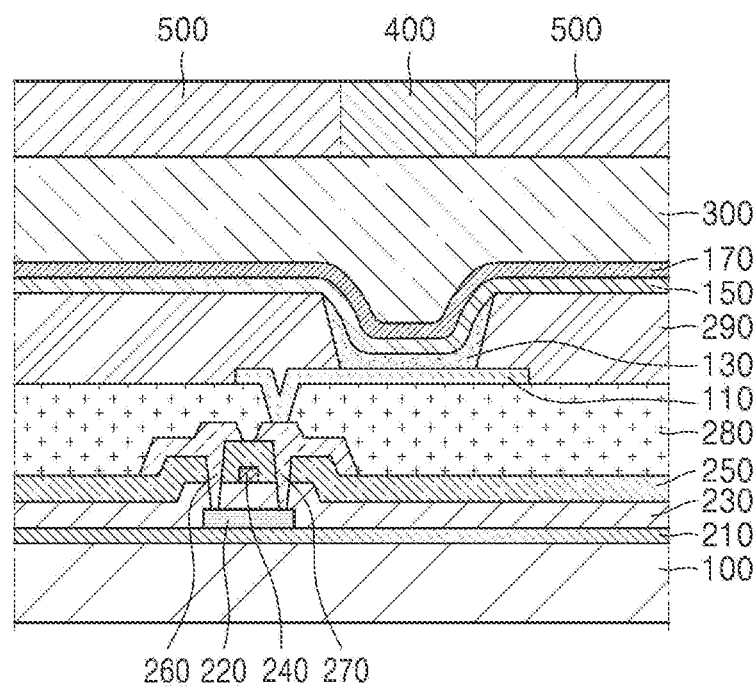

[Description of FIGS. 2 and 3]

FIG. 2 is a cross-sectional view showing a light-emitting apparatus according to an embodiment of the present disclosure.

The light-emitting apparatus of FIG. 2 includes a substrate 100, a thin-film transistor (TFT), a light-emitting device, and an encapsulation portion 300 that seals light-emitting device.

The substrate 100 may be a flexible substrate, a glass substrate, or a metal substrate. A buffer layer 210 may be located on the substrate 100. The buffer layer 210 prevents or reduces the penetration of impurities through the substrate 100 and may provide a flat surface on the substrate 100.

A TFT may be located on the buffer layer 210. The TFT may include an activation layer (e.g., an active layer) 220, a gate electrode 240, a source electrode 260, and a drain electrode 270.

The activation layer 220 may include an inorganic semiconductor such as silicon or polysilicon, an organic semiconductor, or an oxide semiconductor, and may include a source region, a drain region and a channel region.

A gate insulating film 230 for insulating the activation layer 220 from the gate electrode 240 may be located on the activation layer 220, and the gate electrode 240 may be located on the gate insulating film 230.

An interlayer insulating film 250 may be located on the gate electrode 240. The interlayer insulating film 250 may be located between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be located to be in contact with the exposed portions of the source region and the drain region of the activation layer 220.

The TFT may be electrically connected to the light-emitting device to drive the light-emitting device, and may be covered by a passivation layer 280. The passivation layer 280 may include an inorganic insulating film, an organic insulating film, or a combination thereof. The light-emitting device may be provided on the passivation layer 280. The light-emitting device includes the first electrode 110, the interlayer 130, and the second electrode 150.

The first electrode 110 may be located on the passivation layer 280. The passivation layer 280 does not completely cover the drain electrode 270 and exposes a portion of the drain electrode 270, and the first electrode 110 may be connected to the exposed portion of the drain electrode 270.

A pixel defining layer 290 including an insulating material may be located on the first electrode 110. The pixel defining layer 290 may expose a certain region of the first electrode 110, and the interlayer 130 may be formed in the exposed region of the first electrode 110. The pixel defining layer 290 may be a polyimide-based organic film and/or a polyacryl-based organic film. In an embodiment, at least one or more portions or layers of the interlayer 130 may extend beyond the upper portion of the pixel defining layer 290 and may thus be located in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device and protects the light-emitting device from moisture or oxygen. The encapsulation portion 300 may include: an inorganic film including silicon nitride ($SiN_x$), silicon oxide ($SiO_x$), indium tin oxide, indium zinc oxide, or a combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate and/or polyacrylic acid), an epoxy-based resin (for example, aliphatic glycidyl ether (AGE)), or a combination thereof; or a combination of an inorganic film and an organic film.

FIG. 3 is a cross-sectional view showing a light-emitting apparatus according to an embodiment of the present disclosure.

The light-emitting apparatus of FIG. 3 is the same as the light-emitting apparatus of FIG. 2, except that a light-blocking pattern 500 and a functional region 400 are additionally located on the encapsulation portion 300. The functional region 400 may be i) a color filter area, ii) a color conversion area, or iii) a combination of the color filter area and the color conversion area. In an embodiment, the light-emitting device included in the light-emitting apparatus of FIG. 3 may be a tandem light-emitting device.

[Preparation Method]

Layers constituting the hole transport region, the emission layer, and layers constituting the electron transport region may be formed in a certain region by utilizing one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a vacuum deposition speed of about 0.01 Å/sec to about 100 Å/sec by taking into account a material to be included in the layer to be formed and the structure of the layer to be formed.

Definition of Terms

The term "$C_3$-$C_{60}$ carbocyclic group" as used herein refers to a cyclic group that consists of only carbon as a ring-forming atom and has three to sixty carbon atoms, and the term "$C_1$-$C_{60}$ heterocyclic group" as used herein refers to a cyclic group that has one to sixty carbon atoms and further includes, in addition to carbon, a heteroatom as a ring-forming atom. The $C_3$-$C_{60}$ carbocyclic group and the $C_1$-$C_{60}$ heterocyclic group may each be a monocyclic group that consists of one ring or a polycyclic group in which two or more rings are condensed with each other. In an embodiment, the number of ring-forming atoms of the $C_1$-$C_{60}$ heterocyclic group may be from 3 to 61.

The term "cyclic group" as used herein includes the $C_3$-$C_{60}$ carbocyclic group and the $C_1$-$C_{60}$ heterocyclic group.

The term "$T_1$ electron-rich $C_3$-$C_{60}$ cyclic group" as used herein refers to a cyclic group that has three to sixty carbon atoms and does not include *—N=*' as a ring-forming moiety, and the term "$T_1$ electron-deficient nitrogen-containing $C_1$-$C_{60}$ cyclic group" as used herein refers to a heterocyclic group that has one to sixty carbon atoms and also includes *—N=*' as a ring-forming moiety.

For example, the $C_3$-$C_{60}$ carbocyclic group may be i) a group T1 or ii) a condensed cyclic group in which two or more groups T1 are condensed with each other (for example, a cyclopentadiene group, an adamantane group, a norbornane group, a benzene group, a pentalene group, a naphthalene group, an azulene group, an indacene group, acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, and/or an indenoanthracene group), the $C_1$-$C_{60}$ heterocyclic group may be i) a group T2, ii) a condensed cyclic group in which two or more groups T2 are condensed with each other, or iii) a condensed cyclic group in which at least one group T2 and at least one group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothieno dibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, and/or an azadibenzofuran group), the π electron-rich $C_3$-$C_{60}$ cyclic group may be i) a group T1, ii) a condensed cyclic group in which two or more groups T1 are condensed with each other, iii) a group T3, iv) a condensed cyclic group in which two or more groups T3 are condensed with each other, or v) a condensed cyclic group in which at least one group T3 and at least one group T1 are condensed with each other (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, and/or a benzothienodibenzothiophene group), the π electron-deficient nitrogen-containing $C_1$-$C_{60}$ cyclic group may be i) a group T4, ii) a condensed cyclic group in which two or more groups T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with each other (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, and/or an azadibenzofuran group), the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane group (or, a bicyclo[2.2.1]heptane group), a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group," "$C_3$-$C_{60}$ carbocyclic group," "$C_1$-$C_{60}$ heterocyclic group," "π electron-rich $C_3$-$C_{60}$ cyclic group," or "π electron-deficient nitrogen-containing $C_1$-$C_{60}$ cyclic group" as used herein each refer to a group that is condensed with a cyclic group, a monovalent group, a polyvalent group (for example, a divalent group, a trivalent group, a tetravalent group, and/or the like), according to the structure of a formula described with corresponding terms. In an embodiment, "a benzene group" may be a benzo group, a phenyl group, a phenylene group, and/or the like, which may be easily understand by one of ordinary skill in the art according to the structure of a formula including the "benzene group."

In an embodiment, non-limiting examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and non-limiting examples of the divalent $C_3$-$C_{60}$ carbocyclic group and the divalent $C_1$-$C_{60}$ heterocyclic group are a $C_3$-$C_{10}$ cycloalkylene group, a $C_1$-$C_{10}$heterocycloalkylene group, a $C_3$-$C_{10}$ cycloalkenylene group, a $C_1$-$C_{10}$heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein refers to a linear or branched aliphatic saturated hydrocarbon monovalent group having 1 to 60 carbon atoms, and non-limiting examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at a terminal end (e.g., the terminus) of a $C_2$-$C_{60}$ alkyl group, and non-limiting examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at a terminal end (e.g., the terminus) of a $C_2$-$C_{60}$ alkyl group, and non-limiting examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and non-limiting examples thereof are a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that further includes, in addition to 1 to 10 carbon atoms, at least one heteroatom as a ring-forming atom, and non-limiting examples thereof are a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in the ring thereof and no aromaticity, and non-limiting non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has, in addition to 1 to 10 carbon atoms, at least one heteroatom as a ring-forming atom, and at least one double bond in the cyclic structure thereof. Non-limiting examples of the $C_1$-$C_{10}$ heterocycloalkenyl group include a 4,5-dihydro-1,2,3,4-oxatriazolylgroup, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, a fluorenyl group and an ovalenyl group. When the $C_6$-$C_{60}$ aryl group and the $C_6$-$C_{60}$ arylene group each include two or more rings, the two or more rings may be condensed to each other.

The term "$C_1$-$C_{60}$ heteroaryl group" as used herein refers to a monovalent group having a heterocyclic aromatic system that has, in addition to 1 to 60 carbon atoms, at least one heteroatom as a ring-forming atom. The term "$C_1$-$C_{60}$ heteroarylene group" as used herein refers to a divalent group having a heterocyclic aromatic system that has, in addition to 1 to 60 carbon atoms, at least one heteroatom as a ring-forming atom. Non-limiting examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a carbazolyl group, a dibenzofuranyl group, a dibenzothienyl group, a dibenzothienofuranyl group, and a naphthyridinyl group. When the $C_1$-$C_{60}$ heteroaryl group and the $C_1$-$C_{60}$ heteroarylene group each include two or more rings, the two or more rings may be condensed with each other.

The term "monovalent non-aromatic condensed polycyclic group" as used herein refers to a monovalent group having two or more rings condensed with each other, only carbon atoms (for example, having 8 to 60 carbon atoms) as ring-forming atoms, and no aromaticity in its entire molecular structure (e.g., the entire molecular structure is not aromatic). Non-limiting examples of the monovalent non-aromatic condensed polycyclic group are an indenyl group, a fluorenyl group, a spiro-bifluorenyl group, a benzofluorenyl group, an indenophenanthrenyl group, an adamantyl group, and an indenoanthracenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group having two or more rings condensed to each other, at least one heteroatom other than carbon atoms (for example, having 1 to 60 carbon atoms), as a ring-forming atom, and no aromaticity in its entire molecular structure (e.g., the entire molecular structure is not aromatic). Non-limiting examples of the monovalent non-aromatic condensed heteropolycyclic group are a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a 9H-xanthenyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, an azaadamantyl group, and a benzothienodibenzothiophenyl group. The term "divalent non-aromatic condensed heteropolycyclic group" as used herein refers to a divalent group having the same structure as the monovalent non-aromatic condensed heteropolycyclic group.

The term "$C_6$-$C_{60}$ aryloxy group" as used herein refers to a monovalent group represented by —$OA_{102}$ (wherein $A_{102}$ is the $C_6$-$C_{60}$ aryl group), and the term "$C_6$-$C_{60}$ arylthio group" as used herein refers to a monovalent group represented by —$SA_{103}$ (wherein $A_{103}$ is the $C_6$-$C_{60}$ aryl group).

The term "$R_{10a}$" as used herein refers to:
deuterium (-D), —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).
wherein $Q_1$ to $Q_3$, $Q_{11}$ to $Q_{13}$, $Q_{21}$ to $Q_{23}$ and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom. Non-limiting examples of the heteroatom are O, S, N, P, Si, B, Ge, Se, and any combination thereof.

The term "Ph" as used herein refers to a phenyl group, the term "Me" as used herein refers to a methyl group, the term "Et" as used herein refers to an ethyl group, the term "tert-Bu" or "But" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula.

Hereinafter, a compound according to embodiments and a light-emitting device (e.g., an organic light-emitting device) according to embodiments will be described in more detail with reference to Synthesis Examples and Examples. The wording "B was utilized instead of A" used in describing Synthesis Examples refers to that an identical molar equivalent of B was utilized in place of an identical molar equivalent of A.

SYNTHESIS EXAMPLE

Synthesis Example 1: Synthesis of Compound 1

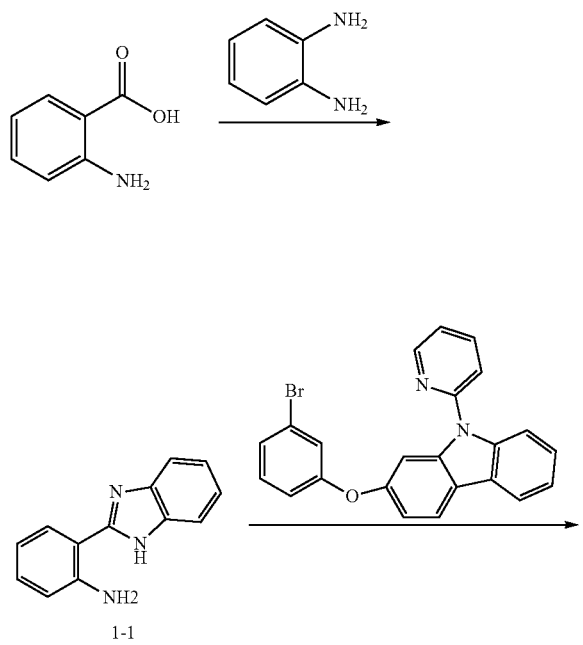

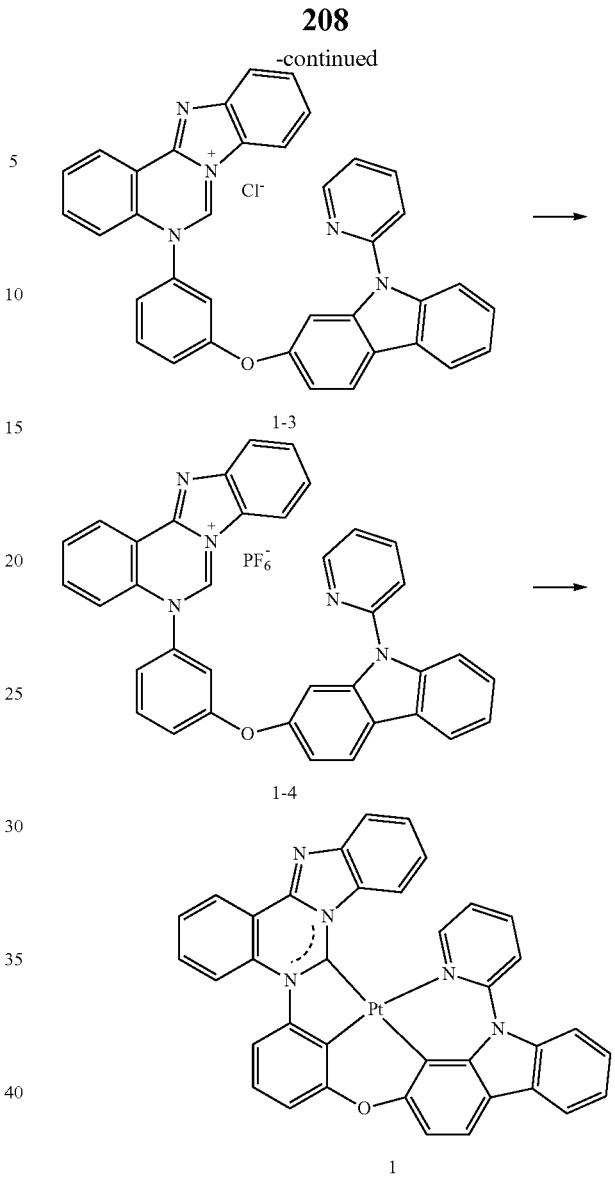

(Synthesis of Intermediate 1-1)

2-aminobenzoic acid (20 mmol) was added to methanol (20 mL), and then, the mixture was added dropwise to a solution in which o-phenylene diamine (20 mmol) was added to methanol, and stirred at room temperature for one hour. The reaction mixture was heated and stirred for 6 hours. After completion of the reaction, the resultant mixture was cooled to room temperature, and distilled water was added to obtain 3.38 g (16.2 mmol) of Intermediate 1-1.

(Synthesis of Intermediate 1-2)

4.15 g (10 mmol) of 2-(3-bromophenoxy)-9-(pyridine-2-yl)-9H-carbazole, 2.30 g (11 mmol) Intermediate 1-1, SPhos (0.75 mmol), $Pd_2(dba)_3$ (0.5 mmol), and sodium t-butoxide (20 mmol) were suspended in 100 ml of toluene as a solvent, heated to 100° C., and stirred for 5 hours. After completion of the reaction, the solvent was removed therefrom under reduced pressure, and extracted with methylene chloride and distilled water. An extracted organic layer was washed with a saturated aqueous sodium chloride solution and dried by utilizing anhydrous sodium sulfate. The residue, from which the solvent was removed, was separated by column chromatography to obtain 4.08 g (7.5 mmol) of Intermediate 1-2.

209

(Synthesis of Intermediate 1-3)

4.08 g (7.5 mmol) of Intermediate 1-2 was dissolved in 375 mmol of triethyl orthoformate, and then, 9.1 mmol of HCl was added dropwise thereto, and the temperature was raised to 100° C. Then, the resultant mixture was stirred for 20 hours. After completion of the reaction, a solvent was removed therefrom under reduced pressure, and extracted with methylene chloride and distilled water. An extracted organic layer was washed with a saturated aqueous sodium chloride solution and dried by utilizing anhydrous sodium sulfate. The residue, from which the solvent was removed, was separated by column chromatography to obtain 3.54 g (6.0 mmol) of Intermediate 1-3.

(Synthesis of Intermediate 1-4)

3.54 g (6.0 mmol) of Intermediate 1-3 and 3.98 g (24 mmol) of ammonium hexafluorophosphate were placed in a reaction vessel and suspended in a mixed solution including 80 mL of methyl alcohol and 20 mL of water. The reaction mixture was stirred at room temperature for 15 hours. After completion of the reaction, the resulting solid was filtered and washed with ether. The washed solid was dried to obtain 4.06 g (5.8 mmol) of Intermediate 1-4.

(Synthesis of Compound 1)

4.06 g (5.8 mmol) of Intermediate 1-4, 2.38 g (6.38 mmol) of dichloro(1,5-cyclooctadiene)platinum, and 1.4 g (17.4 mmol) of sodium acetate were suspended in 140 ml of dioxane. The reaction mixture was heated, and stirred at the temperature of 110° C. for 72 hours. After completion of the reaction, the reaction result was cooled at room temperature, and 100 ml of distilled water was added thereto and an extraction process was performed thereon by utilizing ethyl acetate. An extracted organic layer was washed with a saturated aqueous sodium chloride solution and dried by utilizing anhydrous sodium sulfate. A residue obtained by removing the solvent therefrom was separated by column chromatography to obtain 1.4 g (yield: 32%) of Compound 1.

Synthesis Example 2: Synthesis of Compound 16

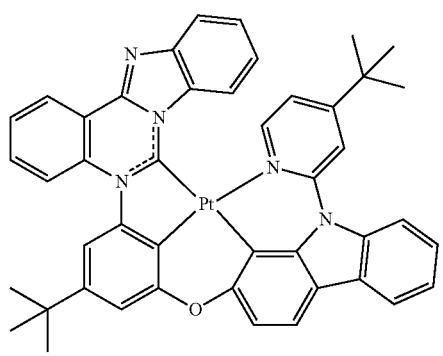

16

Compound 16 was obtained in the same manner as Compound 1, except that 2-(3-bromo-5-(t-butyl)phenoxy)-9-(4-(t-butyl) pyridine-2-yl)-9H-carbazole was utilized instead of 2-(3-bromophenoxy)-9-(pyridine-2-yl)-9H-carbazole.

210

Synthesis Example 3: Synthesis of Compound 35

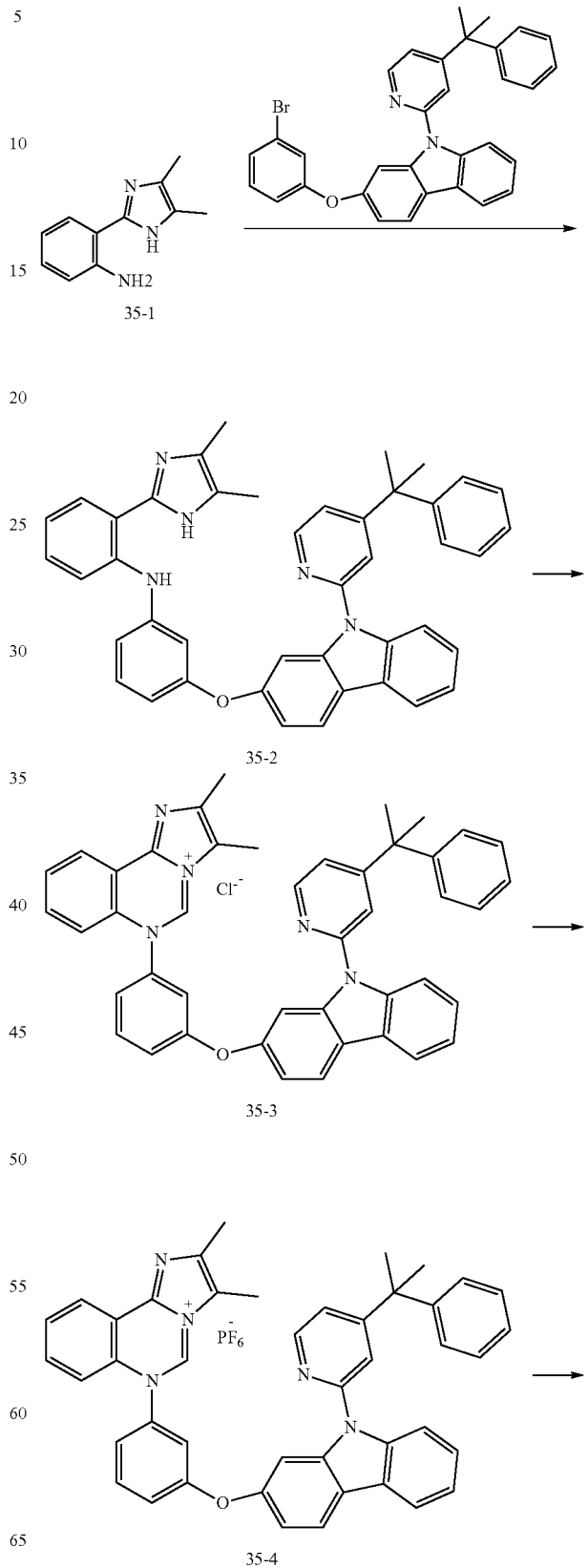

35-1

35-2

35-3

35-4

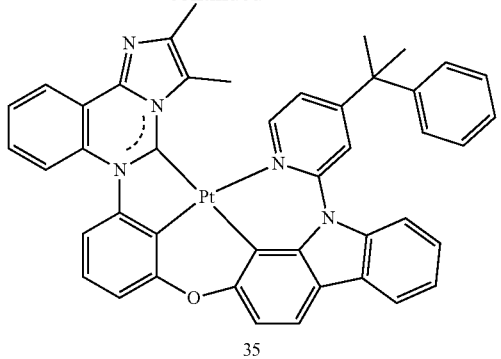

35

(Synthesis of Intermediate 35-2)

Intermediate 35-2 was obtained in the same manner as Intermediate 1-2 of Synthesis Example 1, except that 2-(3-bromophenoxy)-9-(4-(2-phenylpropane-2-yl)pyridine-2-yl)-9H-carbazole was utilized instead of 2-(3-bromophenoxy)-9-(pyridine-2-yl)-9H-carbazole, and Intermediate 35-1 was utilized instead of Intermediate 1-1.

(Synthesis of Intermediate 35-3)

Intermediate 35-3 was obtained in the same manner as Intermediate 1-3 of Synthesis Example 1, except that Intermediate 35-2 was utilized instead of Intermediate 1-2.

(Synthesis of Intermediate 35-4)

Intermediate 35-4 was obtained in the same manner as Intermediate 1-4 of Synthesis Example 1, except that Intermediate 35-3 was utilized instead of Intermediate 1-3.

(Synthesis of Compound 35)

Compound 35 was obtained in the same manner as Compound 1, except that Intermediate 35-4 was utilized instead of Intermediate 1-4.

Synthesis Example 4: Synthesis of Compound 45

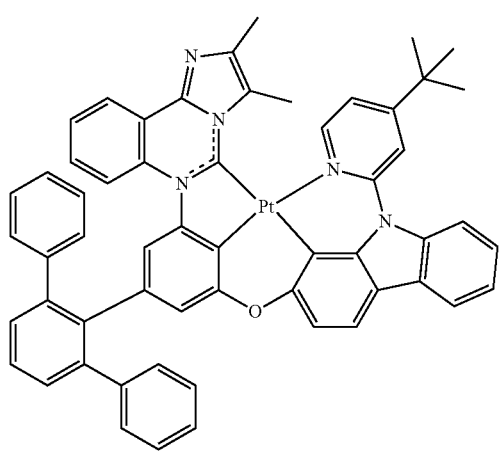

Compound 45 was obtained in the same manner as Compound 1, except that 2-((5-bromo-6'-phenyl-[1,1':2',1"-terphenyl]-3-yl)oxy)-9-(4-(t-butyl)pyridine-2-yl)-9H-carbazole was utilized instead of 2-(3-bromophenoxy)-9-(pyridine-2-yl)-9H-carbazole, and Intermediate 35-1 was utilized instead of Intermediate 1-1.

Synthesis Example 5: Synthesis of Compound 73

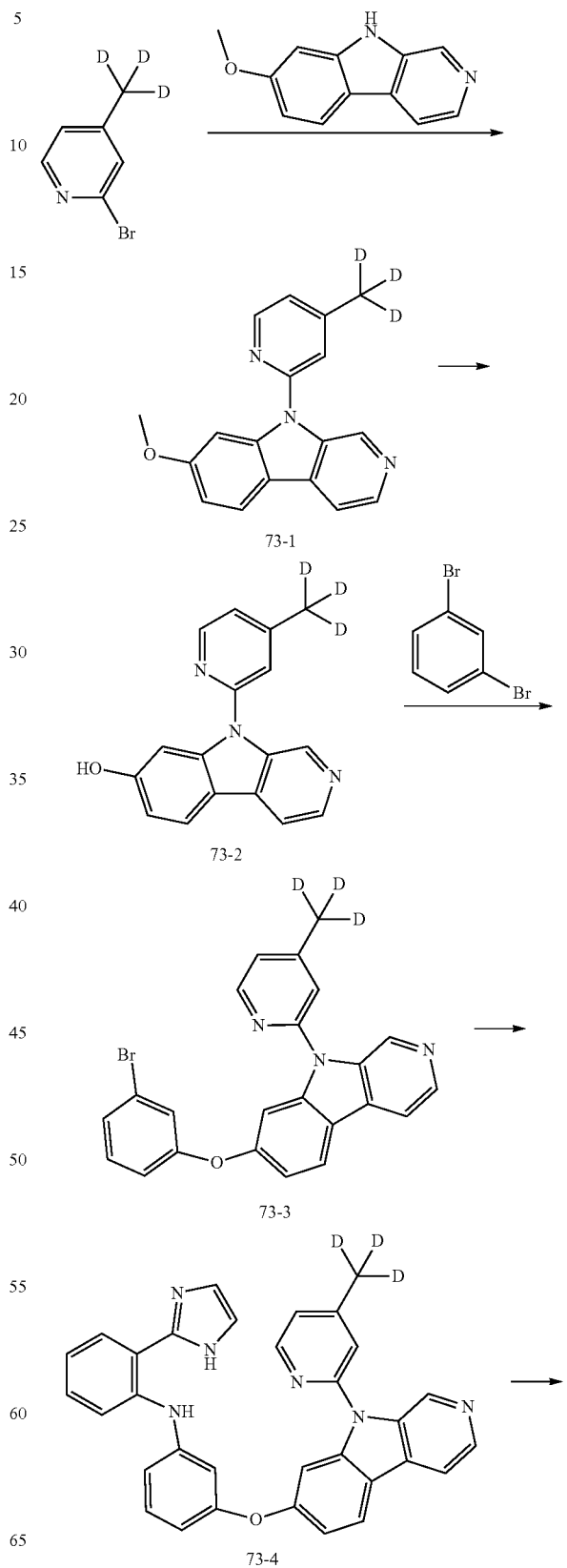

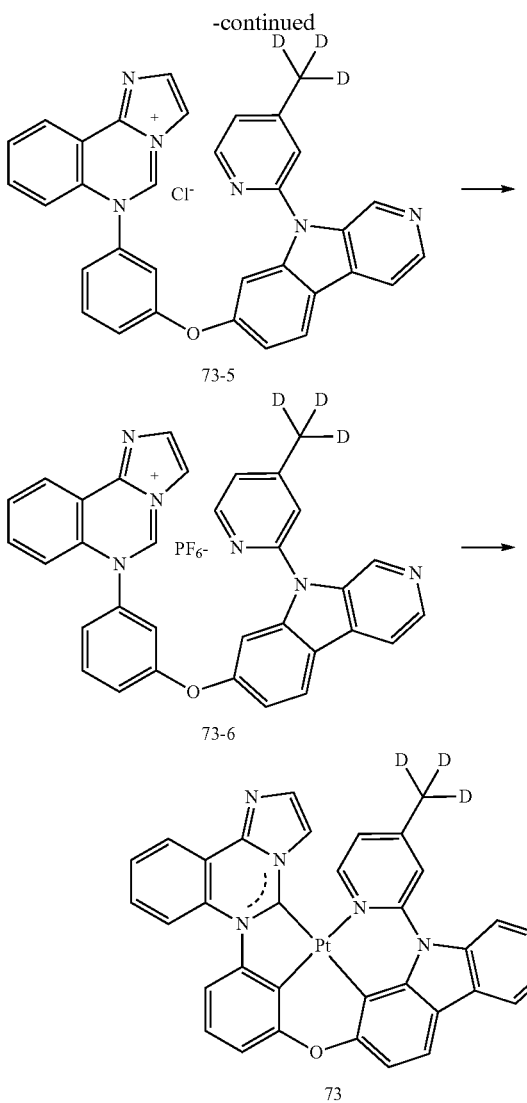

73-5

73-6

73

(Synthesis of Intermediate 73-1)

9.91 g (50 mmol) of 7-methoxy-9H-pyrido[3,4-b]indole, 13.1 g (75 mmol) of 2-bromo-4-(methyl-d$_3$)pyridine, 23 g (100 mmol) of tripotassium phosphate, 1.83 g (10 mmol) of CuI, and 1.17 g (10 mmol) of picolinic acid were placed in a reaction vessel and suspended in 150 mL of dimethyl sulfoxide. The reaction mixture was heated, and stirred at the temperature of 160° C. for 24 hours. After completion of the reaction, the reaction result was cooled at room temperature, and 300 ml of distilled water was added thereto and an extraction process was performed thereon by utilizing ethyl acetate. An extracted organic layer was washed with a saturated aqueous sodium chloride solution and dried by utilizing anhydrous sodium sulfate. A residue obtained by removing the solvent therefrom was separated by column chromatography to obtain 13.1 g (45 mmol) of Intermediate 73-1.

(Synthesis of Intermediate 73-2)

13.1 g (45 mmol) of Intermediate 73-1 was suspended in an excess of bromic acid solution. The reaction mixture was heated, and stirred at the temperature of 110° C. for 24 hours. After completion of the reaction, the reaction product was cooled at room temperature, and then, an appropriate amount of sodium hydrogen carbonate was added thereto to perform neutralization. 300 ml of distilled water was added thereto and an extraction process was performed thereon by utilizing ethyl acetate. An extracted organic layer was washed with a saturated aqueous sodium chloride solution and dried by utilizing anhydrous sodium sulfate. A residue obtained by removing the solvent therefrom was separated by column chromatography to obtain 9.56 g (35 mmol) of Intermediate 73-2.

(Synthesis of Intermediate 73-3)

10.1 g (43 mmol) of 1,3-dibromobenzene, 9.1 g (35 mmol) of Intermediate 73-2, 16.2 g (70 mmol) of tripotassium phosphate, 1.3 g (7.0 mmol) of CuI, and 0.8 g (7.0 mmol) of picolinic acid were placed in a reaction vessel and then, suspended in 100 mL of dimethylsulfoxide. The reaction mixture was heated, and stirred at the temperature of 160° C. for 24 hours. After completion of the reaction, the reaction result was cooled at room temperature, and 300 ml of distilled water was added thereto and an extraction process was performed thereon by utilizing ethyl acetate. An extracted organic layer was washed with a saturated aqueous sodium chloride solution and dried by utilizing anhydrous sodium sulfate. A residue obtained by removing the solvent therefrom was separated by column chromatography to obtain 11.7 g (27 mmol) of Intermediate 73-3.

(Synthesis of Intermediate 73-4)

Intermediate 73-4 was obtained in the same manner as Intermediate 1-2 of Synthesis Example 1, except that Intermediate 73-3 was utilized instead of 2-(3-bromophenoxy)-9-(pyridine-2-yl)-9H-carbazole and 2-(1H-imidazole-2-yl) aniline was utilized instead of Intermediate 1-1.

(Synthesis of Intermediate 73-5)

Intermediate 73-5 was obtained in the same manner as Intermediate 1-3 of Synthesis Example 1, except that Intermediate 73-4 was utilized instead of Intermediate 1-2.

(Synthesis of Intermediate 73-6)

Intermediate 73-6 was obtained in the same manner as Intermediate 1-4 of Synthesis Example 1, except that Intermediate 73-5 was utilized instead of Intermediate 1-3.

(Synthesis of Compound 73)

Compound 73 was obtained in the same manner as Compound 1, except that Intermediate 73-6 was utilized instead of Intermediate 1-4.

Synthesis Example 6: Synthesis of Compound 83

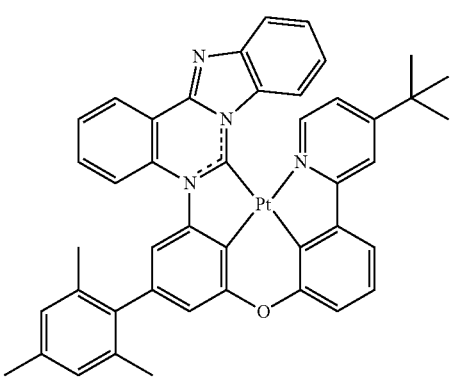

83

Compound 83 was obtained in the same manner Compound 1, except that 2434(5-bromo-2',4', 6'-trimethyl-[1, 1'biphenyl]-3-yl)oxy)phenyl)-44t-butyl)pyridine was utilized instead of 2-(3-bromophenoxy)-9-(pyridine-2-yl)-9H-carbazole.

Synthesis Example 7: Synthesis of Compound 106

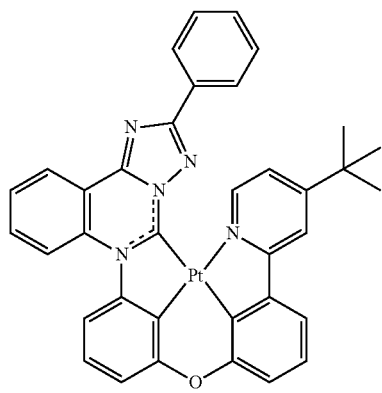

106

Compound 106 was obtained in the same manner as Compound 1, except that 2-(3-((3-bromophenoxy)phenyl)-4-(t-butyl)pyridine was utilized instead of 2-(3-bromophenoxy)-9-(pyridine-2-yl)-9H-carbazole, and 2-(3-phenyl-1H-1,2,4-triazole-5-yl)aniline was utilized instead of Intermediate 1-1.

Synthesis Example 8: Synthesis of Compound 115

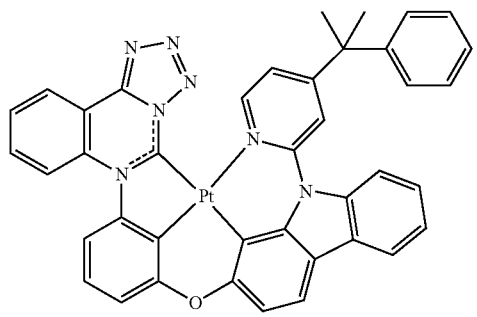

115

Compound 115 was obtained in the same manner as Compound 35, except that 2-(1H-tetrazole-5-yl)aniline was utilized instead of Intermediate 35-1.

Synthesis Example 9: Synthesis of Compound 117

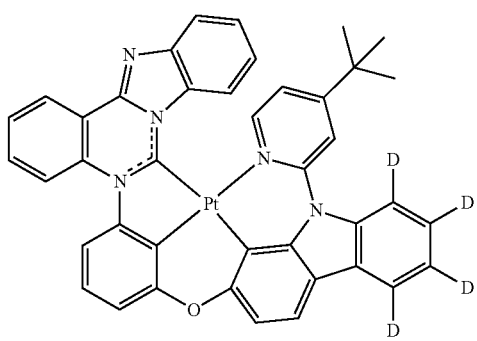

117

Compound 117 was obtained in the same manner as Compound 1, except that 2-(3-bromophenoxy)-9-(4-(t-butyl)pyridine-2-yl)-9H-carbazole-5,6,7,8-d4 was utilized instead of 2-(3-bromophenoxy)-9-(pyridine-2-yl)-9H-carbazole.

The compounds synthesized according to Synthesis Examples above were identified by $^1$H NMR and MS/FAB, and results are shown in Table 1 below.

Compounds other than the compounds shown in Table 1 should be easily recognized by those skilled in the art by referring to the above synthesis routes and source materials.

TABLE 1

| Compound No. | $^1$H NMR (CDCl$_3$, 400 MHz) | MS/FAB found | calc. |
|---|---|---|---|
| 1 | δ 8.73(d, 1H), 8.39-8.37(m, 1H), 8.19-8.15(m, 2H), 8.02-8.00(m, 1H), 7.73(d, 1H), 7.57-7.51(m, 4H), 7.31-7.10(m, 8H), 6.90(d, 1H), 6.70-6.69(m, 2H) | 746.1395 | 746.1394 |
| 16 | δ 8.73(d, 1H), 8.39-8.38(m, 1H), 8.19-8.18(m, 1H), 7.73(d, 1H), 7.57~7.51(m, 4H), 7.41-7.37(m, 4H), 7.20-7.14(m, 5H), 6.70~6.68(m, 2H), 1.40(s, 9H), 1.36(s, 9H) | 858.2645 | 858.2646 |
| 35 | δ 8.74(d, 1H), 8.39-8.38(m, 1H), 8.19-8.18(m, 1H), 7.73(d, 1H), 7.58~7.55(m, 2H), 7.30-7.18(m, 12H), 6.90(d, 1H), 6.70~6.68(m, 2H), 2.55(s, 3H), 2.23(s, 3H), 1.69(s, 6H) | 842.2335 | 842.2333 |

TABLE 1-continued

| Compound No. | $^1$H NMR (CDCl$_3$, 400 MHz) | MS/FAB found | calc. |
|---|---|---|---|
| 45 | δ 8.74(d, 1H), 8.39-8.38(m, 1H), 8.19(d, 1H), 8.06(d, 2H), 7.78-7.71(m, 6H), 7.58~7.40(m, 12H), 7.17-7.16(m, 2H), 6.99(s, 2H), 6.69(d, 1H), 2.55(s, 3H), 2.23(s, 3H), 1.32(s, 9H) | 1008.3113 | 1008.3115 |
| 73 | δ 8.87(s, 1H), 8.74(d, 1H), 8.43-8.39(m, 2H), 7.73(d, 1H), 7.46~7.38(m, 6H), 7.17-7.16(m, 2H), 7.03(d, 1H), 6.90-6.89(m, 1H), 6.69-6.66(m, 2H) | 714.1534 | 714.1535 |
| 83 | δ 8.73(d, 1H), 7.88-7.84(m, 2H), 7.73(d, 1H), 7.58~7.54(m, 2H), 7.40-7.36(m, 3H), 7.20-7.03(m, 9H), 2.92(s, 6H), 2.48(s, 3H), 1.32(s, 9H) | 831.2539 | 831.2537 |
| 106 | δ 8.75(d, 1H), 8.09-8.08(m, 2H), 7.84-7.80(m, 2H), 7.73(d, 1H), 7.44-7.39(m, 6H), 7.17-7.10(m, 4H), 6.90(d, 1H), 6.70(d, 1H), 1.32(s, 9H) | 740.1862 | 740.1863 |
| 115 | δ 8.74(d, 1H), 8.39(d, 1H), 8.19(d, 1H), 7.73(d, 1H), 7.58-7.50(m, 2H), 7.37-7.20(m, 12H), 6.90(d, 1H), 6.70-6.66(m, 2H), 1.69(s, 6H) | 816.1924 | 816.1925 |
| 117 | δ 8.75(d, 1H), 8.39(d, 1H), 7.73(d, 1H), 7.57-7.54(m, 2H), 7.40-7.36(m, 4H), 7.24-7.21(m, 4H), 6.90(d, 1H), 6.70-6.66(m, 2H), 1.32(s, 9H) | 806.2270 | 806.2271 |

EXAMPLES

Example 1

As a substrate and an anode, a glass substrate with 15 Ω/cm² (1,200 Å) ITO thereon, which was manufactured by Corning Inc., was cut to a size of 50 mm×50 mm×0.7 mm, and the glass substrate was sonicated by utilizing isopropyl alcohol and pure water for 5 minutes each, and then cleaned by exposure to ultraviolet (UV) light for 30 minutes thereto and exposure to ozone. Then, the resultant glass substrate was loaded onto a vacuum deposition apparatus.

2-TNATA was vacuum-deposited on the ITO anode formed on the glass substrate to form a hole injection layer having a thickness of 600 Å, and then, NPB was vacuum-deposited on the hole injection layer to form a hole transport layer having a thickness of 300 Å.

mCBP as a host and Compound 1 as a dopant were co-deposited at the weight ratio of 90:10 on the hole transport layer to form an emission layer having a thickness of 300 Å.

Diphenyl(4-(triphenylsilyl)phenyl)-phosphine oxide (TSPO1) was vacuum-deposited on the emission layer to form a hole blocking layer having a thickness of 50 Å, Alq$_3$ was vacuum-deposited on the hole blocking layer to form an electron transport layer having a thickness of 300 Å, LiF was vacuum-deposited on the electron transport layer to form an electron injection layer having a thickness of 10 Å, and Al was vacuum-deposited on the electron injection layer to form a cathode having a thickness of 3,000 Å, thereby completing the manufacture of an organic light-emitting device.

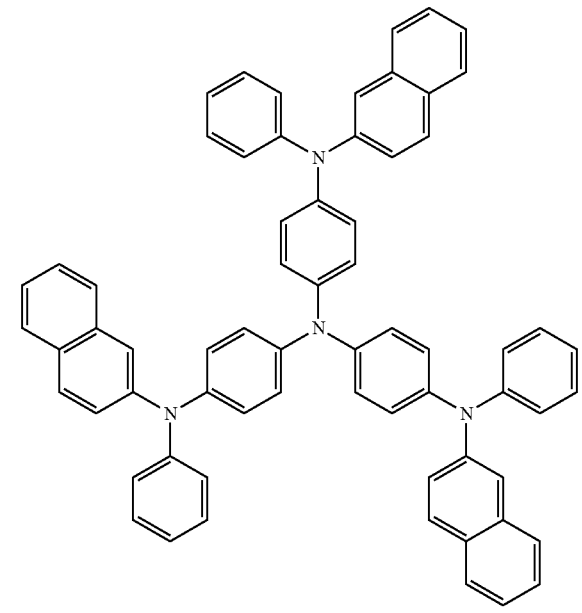

2-TNATA

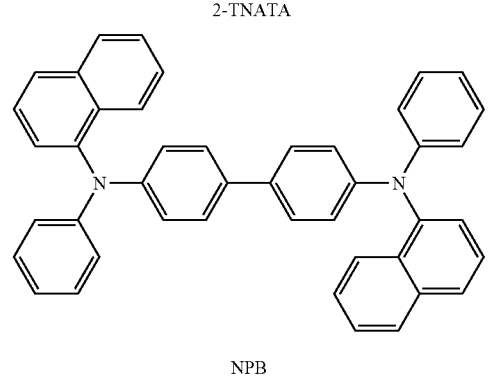

NPB

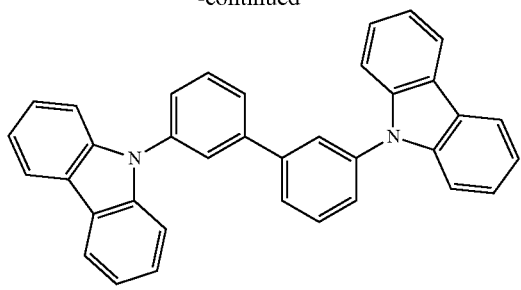

mCBP

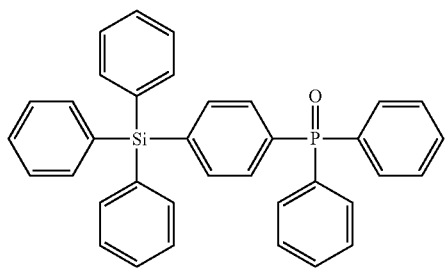

TSPO1

Examples 2 to 9 and Comparative Examples 1 to 4

Organic light-emitting devices were manufactured in the same manner as in Example 1, except that Compounds shown in Table 2 were each utilized instead of Compound 1 as a dopant in forming a respective emission layer.

Evaluation Example

The characteristics of the manufactured organic light-emitting devices were evaluated by utilizing an apparatus for measuring luminance orientation characteristics. In order to evaluate the characteristics of organic light-emitting devices according to Examples and Comparative Examples, the driving voltage, luminance, efficiency, emission wavelength, and lifespan ($T_{80}$) of each of the organic light-emitting devices were measured. The driving voltage (V), current efficiency (cd/A) at the current density of 50 mA/cm$^2$, and luminance (cd/m$^2$) of each of the organic light-emitting devices are shown in Table 2. The device lifespan ($T_{80}$) refers to a time taken for the luminance to decrease down to the level of 80% based on 1000 nit. The device lifespan ($T_{80}$) was measured by continuously driving at the current density of 40 mA/cm$^2$. In addition, the luminance spectra of Examples and Comparative Examples were each measured with a spectral emission luminance meter. From each of the measured luminance spectrum, the emission peak, which is the maximum luminescence wavelength, was measured.

TABLE 2

| | Emission layer | Driving voltage (V) | Current density (mA/cm$^2$) | Luminance (cd/m$^2$) | Efficiency (cd/A) | Emission color | Emission wavelength (nm) | Lifespan ($T_{80}$ @ J = 40 mA/cm$^2$) (hr) |
|---|---|---|---|---|---|---|---|---|
| Example 1 | 1 | 5.25 | 50 | 4025 | 8.15 | green | 530 | 323 |
| Example 2 | 16 | 5.29 | 50 | 4065 | 8.25 | green | 526 | 351 |
| Example 3 | 35 | 5.14 | 50 | 4165 | 8.28 | green | 522 | 313 |
| Example 4 | 45 | 5.17 | 50 | 4085 | 8.33 | green | 520 | 325 |
| Example 5 | 73 | 5.05 | 50 | 4025 | 8.11 | green | 525 | 332 |
| Example 6 | 83 | 5.09 | 50 | 4065 | 8.23 | green | 528 | 314 |
| Example 7 | 106 | 5.02 | 50 | 4165 | 8.03 | green | 521 | 310 |
| Example 8 | 115 | 5.15 | 50 | 4085 | 8.27 | green | 524 | 305 |
| Example 9 | 117 | 5.11 | 50 | 4250 | 8.47 | green | 522 | 375 |
| Comparative Example 1 | Ir(PPy)$_3$ | 6.74 | 50 | 3870 | 7.74 | green | 516 | 278 |
| Comparative Example 2 | C2 | 6.68 | 50 | 3790 | 7.58 | green | 515 | 194 |
| Comparative Example 3 | C3 | 6.72 | 50 | 3535 | 7.07 | green | 537 | 307 |
| Comparative Example 4 | C4 | 5.41 | 50 | 3840 | 7.68 | Blue | 452 | 50 |

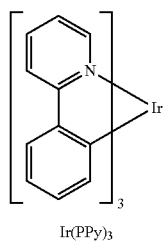

Ir(PPy)$_3$

TABLE 2-continued

| Emission layer | Driving voltage (V) | Current density (mA/cm²) | Luminance (cd/m²) | Efficiency (cd/A) | Emission color | Emission wavelength (nm) | Lifespan (T$_{80}$@ J = 40 mA/cm²) (hr) |
|---|---|---|---|---|---|---|---|

C2

C3

C4

Referring to Table 2, it was confirmed that the organic light-emitting devices of Examples 1 to 9 had lower driving voltages and higher luminance, luminescence efficiency and lifespan than the organic light-emitting devices of Comparative Examples 1 to 4.

A light-emitting device including the organometallic compound as described above may have a low driving voltage, a high luminance, a high efficiency, and/or a long lifespan.

The use of "may" when describing embodiments of the present invention refers to "one or more embodiments of the present invention." It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art. Moreover, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a), and 35 U.S.C. § 132(a).

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various suitable changes in form and details may be made therein without departing from the spirit and scope as defined by the claims, and equivalents thereof.

What is claimed is:
1. A light-emitting device comprising:
a first electrode;
a second electrode facing the first electrode; and
an interlayer between the first electrode and the second electrode and comprising an emission layer,
wherein the interlayer comprises at least one organometallic compound represented by Formula 1:

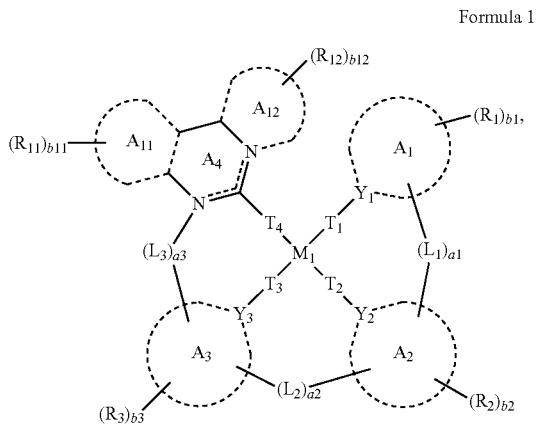

Formula 1 wherein, in Formula 1,
$M_1$ is selected from the group consisting of platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm),
$Y_1$ to $Y_3$ are each independently selected from the group consisting of a carbon atom (C) and a nitrogen atom (N),
$T_1$ to $T_4$ are each independently a chemical bond, O, S, B(R'), N(R'), P(R'), C(R')(R''), Si(R')(R''), Ge(R')(R''), or C(=O),
when $T_1$ is a chemical bond, $Y_1$ and $M_1$ are directly bonded to each other,
when $T_2$ is a chemical bond, $Y_2$ and $M_1$ are directly bonded to each other,
when $T_3$ is a chemical bond, $Y_3$ and $M_1$ are directly bonded to each other,
when $T_4$ is a chemical bond, C in ring $A_4$ is directly bonded to $M_1$,
two bonds selected from the group consisting of a bond between $M_1$ and $Y_1$ or $T_1$, a bond between $M_1$ and $Y_2$ or $T_2$, a bond between $M_1$ and $Y_3$ or $T_3$, and a bond between $M_1$ and C in ring $A_4$ or $T_4$ are each a coordinate bond, and the remaining two bonds are each a covalent bond,
ring $A_1$ to ring $A_3$, ring $A_{11}$ and ring $A_{12}$ are each independently selected from the group consisting of a $C_5$-$C_{60}$ carbocyclic group and a $C_1$-$C_{60}$ heterocyclic group,
$L_1$ to $L_3$ are each independently selected from the group consisting of a single bond, a double bond, *—N($R_4$)—*', *—B($R_4$)—*', *—P($R_4$)—*', *—C($R_4$)($R_5$)—*', *—Si($R_4$)($R_5$)—*', *—Ge($R_4$)($R_5$)—*', *—S—*', *—Se*', *—C(=O)—*', *—S(=O)—*', *—S(=O)$_2$—*', *—C($R_4$)=*', *=C($R_4$)—*', *—C($R_4$)=C($R_5$)—*', *—C(=S)—*' and *—C≡C—*',
a1 to a3 are each independently an integer from 0 to 3,
when a1 is 0, ring $A_1$ and ring $A_2$ are not linked to each other,
when a2 is 0, ring $A_2$ and ring $A_3$ are not linked to each other,
when a3 is 0, ring $A_3$ and ring $A_4$ are not linked to each other,
R', R'', $R_1$ to $R_5$, $R_{11}$ and $R_{12}$ are each independently selected from the group consisting of hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —B($Q_1$)($Q_2$), —N($Q_1$)($Q_2$), —P($Q_1$)($Q_2$), —C(=O) ($Q_1$), —S(=O)($Q_1$), —S(=O)$_2$($Q_1$), —P(=O)($Q_1$) ($Q_2$), and —P(=S)($Q_1$)($Q_2$),
b1 to b3, b11 and b12 are each independently an integer from 1 to 20,
two or more neighboring groups from among $R_1$ to $R_5$, $R_{11}$ and $R_{12}$ are optionally bonded to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, * and *' each indicate a binding site to a neighboring atom, and
$R_{10a}$ is:
deuterium (—D), —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si ($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$) ($Q_{12}$), or any combination thereof;
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si(Q$_{21}$)(Q$_{22}$)(Q$_{23}$), —N(Q$_{21}$)(Q$_{22}$), —B(Q$_{21}$)(Q$_{22}$), —C(=O)(Q$_{21}$), —S(=O)$_2$(Q$_{21}$), —P(=O)(Q$_{21}$)(Q$_{22}$), or any combination thereof; or —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), or —P(=O)(Q$_{31}$)(Q$_{32}$), and wherein Q$_1$ to Q$_3$, Q$_{11}$ to Q$_{13}$, Q$_{21}$ to Q$_{23}$, and Q$_{31}$ to Q$_{33}$ are each independently: hydrogen; deuterium; —F; —Cl; —Br; —I; a hydroxyl group; a cyano group; a nitro group; a C$_1$-C$_{60}$ alkyl group; a C$_2$-C$_{60}$ alkenyl group; a C$_2$-C$_{60}$ alkynyl group; a C$_1$-C$_{60}$ alkoxy group; or a C$_3$-C$_{60}$ carbocyclic group or a C$_1$-C$_{60}$ heterocyclic group, each unsubstituted or substituted with deuterium, —F, a cyano group, a C$_1$-C$_{60}$ alkyl group, a C$_1$-C$_{60}$ alkoxy group, a phenyl group, a biphenyl group, or any combination thereof.

2. The light-emitting device of claim 1, wherein the first electrode is an anode, the second electrode is a cathode, the interlayer further comprises a hole transport region between the first electrode and the emission layer and an electron transport region between the emission layer and the second electrode, the hole transport region comprises a hole injection layer, a hole transport layer, an emission auxiliary layer, an electron blocking layer, or any combination thereof, and the electron transport region comprises a buffer layer, a hole blocking layer, an electron control layer, an electron transport layer, an electron injection layer, or any combination thereof.

3. The light-emitting device of claim 1, further comprising a capping layer on the second electrode, wherein the capping layer comprises a material having a refractive index of 1.6 or more at a wavelength of 589 nm.

4. The light-emitting device of claim 1, wherein the emission layer comprises the at least one organometallic compound.

5. The light-emitting device of claim 4, wherein the emission layer further comprises a host, and an amount of the at least one organometallic compound is from 0.01 parts by weight to 49.99 parts in amount by weight based on 100 parts by weight of the emission layer.

6. The light-emitting device of claim 4, wherein the emission layer is configured to emit green light having a maximum luminescence wavelength of 500 nm to 570 nm.

7. The light-emitting device of claim 2, wherein the electron transport region comprises a phosphine oxide-containing compound.

8. An electronic apparatus comprising the light-emitting device of claim 1.

9. The electronic apparatus of claim 8, further comprising a thin-film transistor, wherein the thin-film transistor comprises a source electrode and a drain electrode, and the first electrode of the light-emitting device is electrically connected to the source electrode or the drain electrode of the thin-film transistor.

10. The electronic apparatus of claim 8, further comprising a color filter, a color conversion layer, a touch screen layer, a polarizing layer, or any combination thereof.

11. An organometallic compound represented by Formula 1:

Formula 1 wherein, in Formula 1,

M$_1$ is selected from the group consisting of platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm), Y$_1$ to Y$_3$ are each independently selected from the group consisting of a carbon atom (C) and a nitrogen atom (N), T$_1$ to T$_4$ are each independently a chemical bond, O, S, B(R'), N(R'), P(R'), C(R')(R"), Si(R')(R"), Ge(R')(R"), or C(=O), when T$_1$ is a chemical bond, Y$_1$ and M$_1$ are directly bonded to each other, when T$_2$ is a chemical bond, Y$_2$ and M$_1$ are directly bonded to each other, when T$_3$ is a chemical bond, Y$_3$ and M$_1$ are directly bonded to each other, when T$_4$ is a chemical bond, C in ring A$_4$ is directly bonded to M$_1$, two bonds selected from the group consisting of a bond between M$_1$ and Y$_1$ or T$_1$, a bond between M$_1$ and Y$_2$ or T$_2$, a bond between M$_1$ and Y$_3$ or T$_3$, and a bond between M$_1$ and C in ring A$_4$ or T$_4$ are each a coordinate bond, and the remaining two bonds are each a covalent bond, ring A$_1$ to ring A$_3$, ring A$_{11}$ and ring A$_{12}$ are each independently selected from the group consisting of a C$_5$-C$_{60}$ carbocyclic group and a C$_1$-C$_{60}$ heterocyclic group, L$_1$ to L$_3$ are each independently selected from the group consisting of a single bond, a double bond, *—N(R$_4$)—*', *—B(R$_4$)—*', *—P(R$_4$)—*', *—C(R$_4$)(R$_5$)—*', *—Si(R$_4$)(R$_5$)—*', *—Ge(R$_4$)(R$_5$)—*', *—S—*', *—Se*', *—C(=O)—*', *—S(=O)—*', *—S(=O)$_2$—*', *—C(R$_4$)=*', *=C(R$_4$)—*', *—C(R$_4$)=C(R$_5$)—*', *—C(=S)—*' and *—C≡C—*' a1 to a3 are each independently an integer from 0 to 3, when a1 is 0, ring A$_1$ and ring A$_2$ are not linked to each other, when a2 is 0, ring A$_2$ and ring A$_3$ are not linked to each other, when a3 is 0, ring A$_3$ and ring A$_4$ are not linked to each other, R', R", R$_1$ to R$_5$, R$_{11}$ and R$_{12}$ are each independently selected from the group consisting of hydrogen, deuterium, —F, —Cl, —Br, —I, a hydroxyl group, a cyano group, a nitro group, a C$_1$-C$_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), b1 to b3, b11 and b12 are each independently an integer from 1 to 20, two or more neighboring groups from among $R_1$ to $R_5$, $R_{11}$ and $R_{12}$ are optionally bonded to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, and *' each indicate a binding site to a neighboring atom, and $R_{10a}$ is:

deuterium (—D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

12. The organometallic compound of claim 11, wherein $M_1$ is selected from the group consisting of Pt, Pd, Cu, Ag, Au, Rh, Ir, Ru, and Os.

13. The organometallic compound of claim 11, wherein $Y_1$ is N, and $Y_2$ and $Y_3$ are each C.

14. The organometallic compound of claim 11, wherein ring $A_1$ to ring $A_3$, ring $A_{11}$ and ring $A_{12}$ are each independently selected from the group consisting of a benzene group, a naphthalene group, an anthracene group, a phenanthrene group, a triphenylene group, a pyrene group, a chrysene group, a cyclopentane group, a cyclopentadiene group, a cyclohexane group, a cyclohexene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 1,2,4-triazole group, a tetrazole group, a 2,3-dihydrotriazole group, an azasilole group, a diazasilole group, a triazasilole group, an oxazole group, an isooxazole group, a thiazole group, an isothiazole group, an oxadiazole group, a thiadiazole group, a benzopyrazole group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

15. The organometallic compound of claim 11, wherein at least one of ring $A_1$ to ring $A_3$ is a 6-membered ring having one or more N(s) or a condensed cyclic group comprising the 6-membered ring having one or more N(s).

16. The organometallic compound of claim 11, wherein
ia) ring $A_1$ is a group represented by one of Formulae 2A-1 to 2A-6,
iia) ring $A_2$ is a group represented by one of Formulae 2B-1 to 2B-3,
iiia) ring $A_3$ is a group represented by Formula 2C-1, or any combination of ia), iia), and iiia):

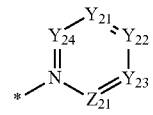

2A-1

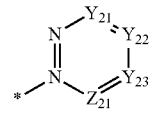

2A-2

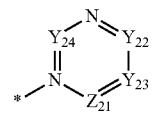

2A-3

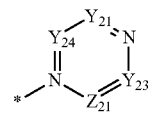

2A-4

-continued

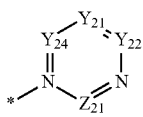
2A-5

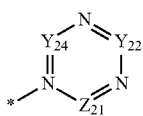
2A-6

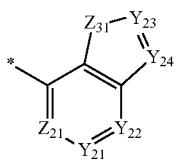
2B-1

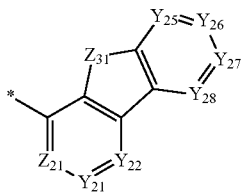
2B-2

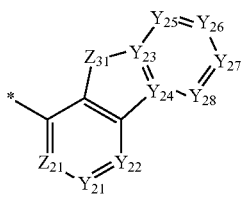
2B-3

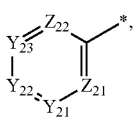
2C-1 wherein, in Formulae 2A-1 to 2A-6, Formulae 2B-1 to 2B-3, and Formula 2C-1, $Y_{21}$ is N or $C(R_{21a})$, $Y_{22}$ is N or $C(R_{22a})$, $Y_{23}$ is N or $C(R_{23a})$, $Y_{24}$ is N or $C(R_{24a})$, $Y_{25}$ is N or $C(R_{25a})$, $Y_{26}$ is N or $C(R_{26a})$, $Y_{27}$ is N or $C(R_{27a})$, and $Y_{28}$ is N or $C(R_{28a})$, $Z_{21}$ is *'—C, $C(R_{21a})$ or N, and $Z_{22}$ is *'—C, $C(R_{22a})$, or N, $Z_{31}$ is *'—N or $N(R_{31a})$, $R_{21a}$ to $R_{28a}$ and $R_{31a}$ are the same as described in connection with R', R", $R_1$ to $R_5$, $R_{11}$ and $R_{12}$ of Formula 1, and

* indicates a binding site to respective neighboring $T_1$, $T_2$, or $T_3$, and *' indicates a binding site to respective neighboring $L_1$, $L_2$, or $L_3$.

17. The organometallic compound of claim 11, wherein a group

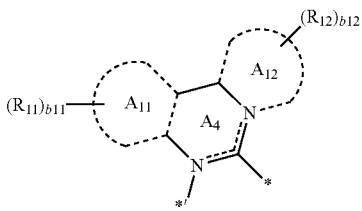

represented by in Formula 1 is represented by one of Formulae 2D-1 and 2D-2:

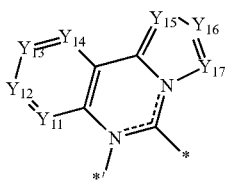
2D-1

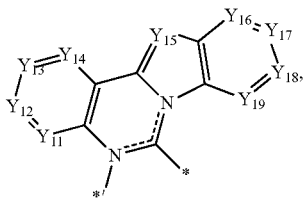
2D-2 wherein, in Formulae 2D-1 and 2D-2, $Y_{11}$ is N or $C(R_{11a})$, $Y_{12}$ is N or $C(R_{12a})$, $Y_{13}$ is N or $C(R_{13a})$, $Y_{14}$ is N or $C(R_{14a})$, $Y_{15}$ is N or $C(R_{15a})$, $Y_{16}$ is N or $C(R_{16a})$, $Y_{17}$ is N or $C(R_{17a})$, $Y_{18}$ is N or $C(R_{18a})$, and $Y_{19}$ is N or $C(R_{19a})$, $R_{11a}$ to $R_{19a}$ are the same as described in connection with R', R", $R_1$ to $R_5$, $R_{11}$ and $R_{12}$ in of Formula 1, and

* indicates a binding site to neighboring $T_4$, and *' indicates a binding site to neighboring $L_3$.

18. The organometallic compound of claim 11, wherein R', R", $R_1$ to $R_5$, $R_{11}$ and $R_{12}$ are each independently selected from the group consisting of:

hydrogen, deuterium, —F, —Cl, —Br, —I, a hydroxyl group, a cyano group, a nitro group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from the group consisting of deuterium, —F, —Cl, —Br, —I, a hydroxyl group, a cyano group, a nitro group, a $C_1$-$C_{20}$ alkyl group, and a $C_1$-$C_{20}$ alkoxy group;

a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, a pyrrolyl group, an indolyl group, an isoindolyl group, an indazolyl group, a quinolinyl group, an isoquinolinyl group, a quinoxalinyl group, a quinazolinyl group, a cinnolinyl group, and a triazinyl group;

a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, each substituted with at least one selected from the group consisting of deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$);

a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, each substituted with at least one selected from the group consisting of a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, each substituted with at least one selected from the group consisting of deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$); and —Si($Q_1$)($Q_2$)($Q_3$), —N($Q_1$)($Q_2$), —B($Q_1$)($Q_2$), —C(=O)($Q_1$), —S(=O)$_2$($Q_1$), —P(=O)($Q_1$)($Q_2$), —P(=S)($Q_1$)($Q_2$), =O, =S, =N($Q_1$), and =C($Q_1$)($Q_2$), and wherein $Q_1$ to $Q_3$ and $Q_{31}$ to $Q_{33}$ are each independently selected from the group consisting of hydrogen, deuterium, —F, —Cl, —Br, —I, a cyano group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group.

19. The organometallic compound of claim 11, wherein the organometallic compound is represented by Formula 1-1:

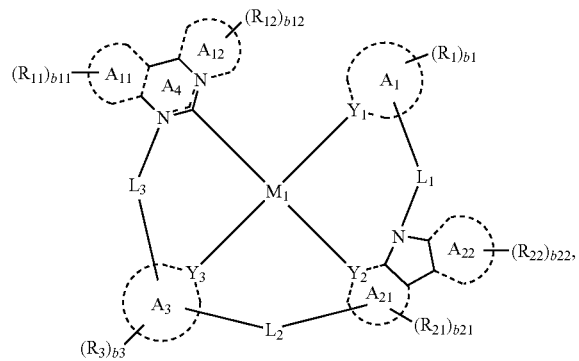

Formula 1-1 wherein, in Formula 1-1, $M_1$, ring $A_1$, ring $A_3$, ring $A_{11}$, ring $A_{12}$, $Y_1$ to $Y_3$, L$i$ to $L_3$, $R_1$, $R_3$, $R_{11}$, $R_{12}$, b1, b3, b11, and b12 are each independently the same as respectively described in connection with Formula 1, ring $A_{21}$ and ring $A_{22}$ are each independently the same as described in connection with ring $A_1$ to ring $A_3$, ring $A_{11}$ and ring $A_{12}$ of Formula 1, $R_{21}$ and $R_{22}$ are each independently the same as described in connection with R', R'', $R_1$ to $R_5$, $R_{11}$ and $R_{12}$ of Formula 1, and b21 and b22 are each independently the same as described in connection with b1 to b3, b11 and b12 of Formula 1.

20. The organometallic compound of claim 11, wherein the organometallic compound represented by Formula 1 is one or more selected from Compounds 1 to 131:

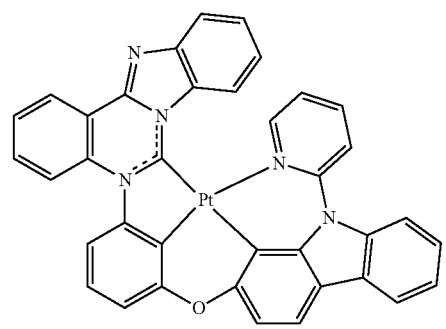

1

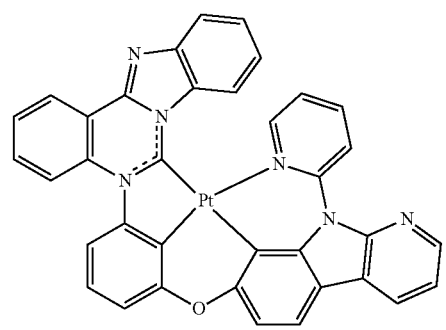

2

3
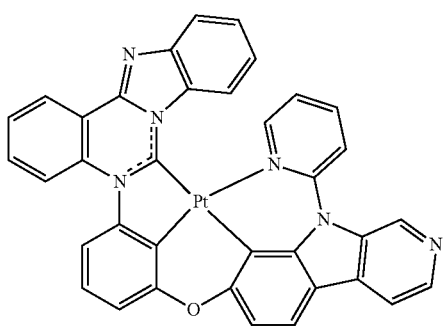
4
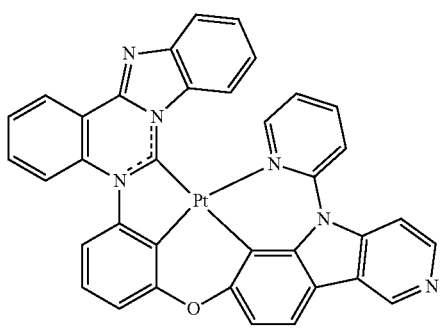
5
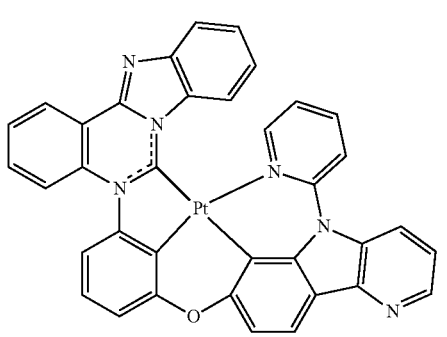
6
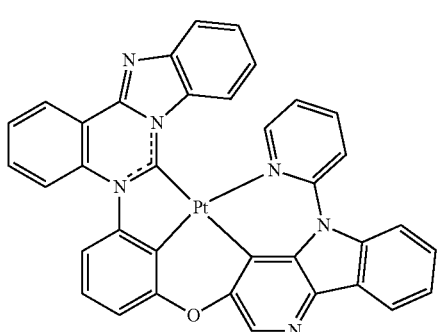
7
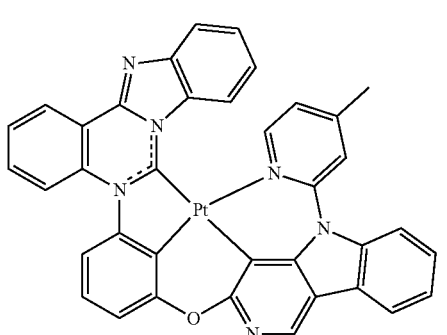
8
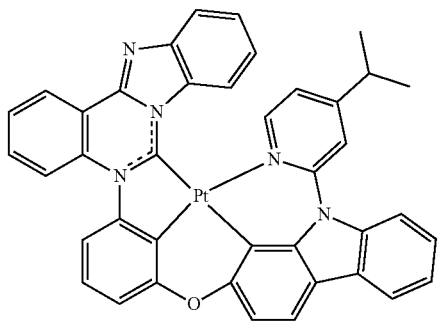
9
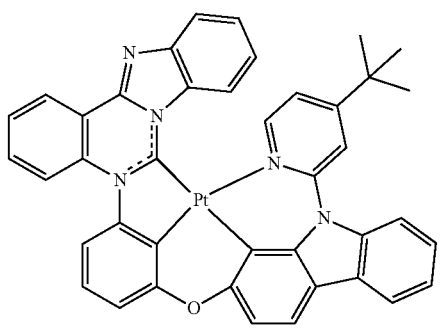
10
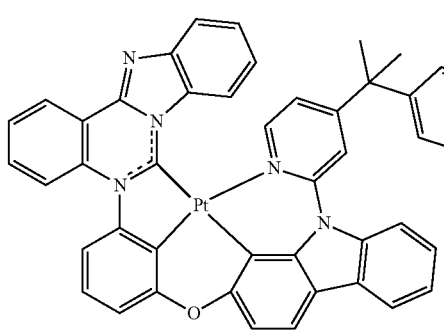
11
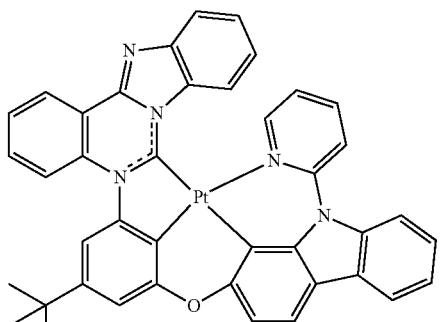

12
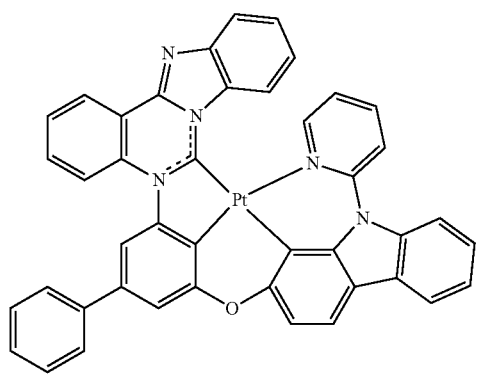
13
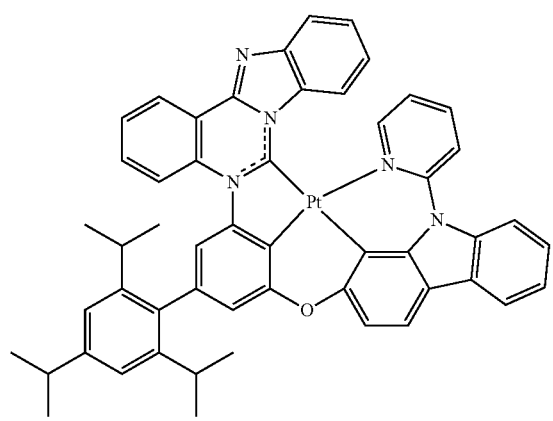
14
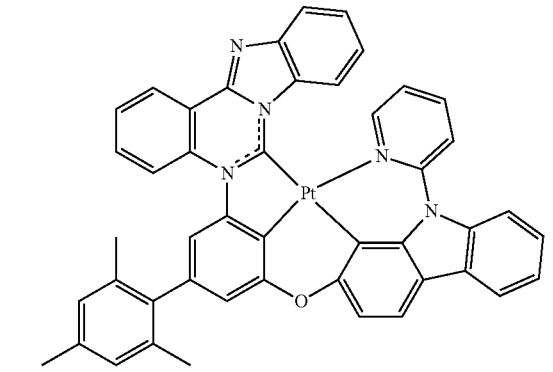
15
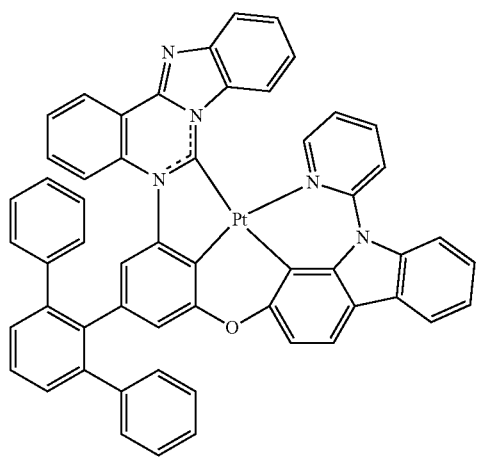
16
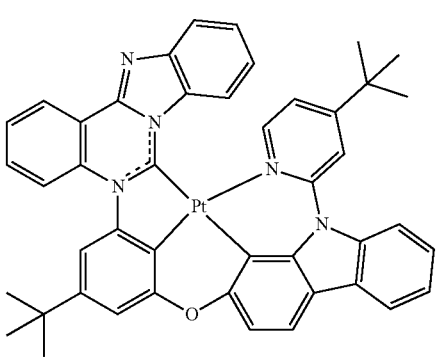
17
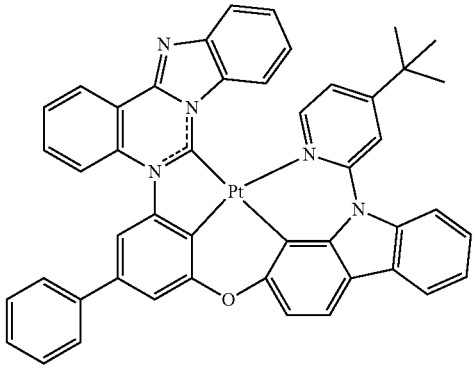
18
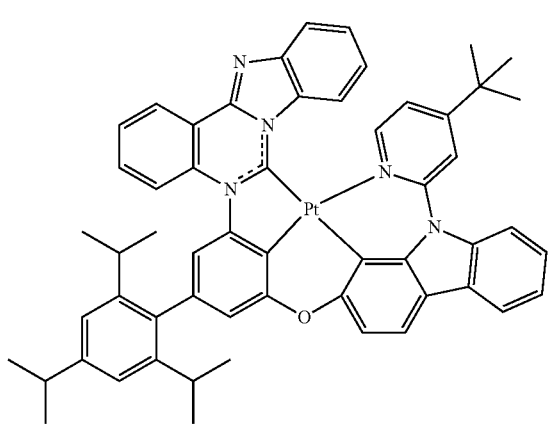
19
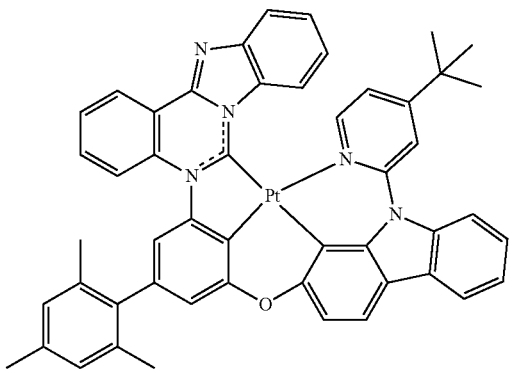

20
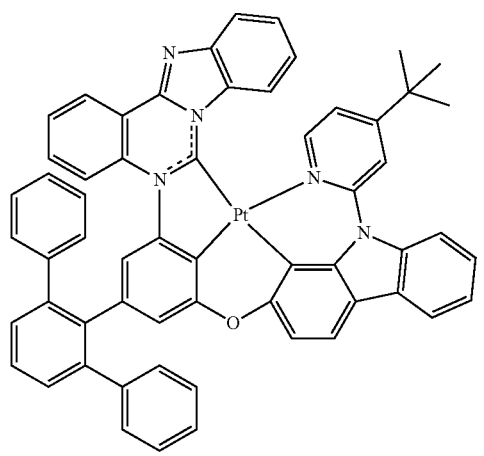
21
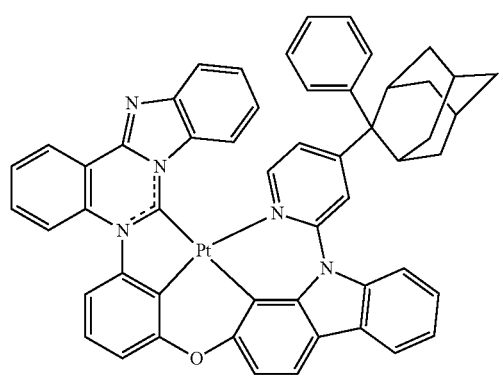
22
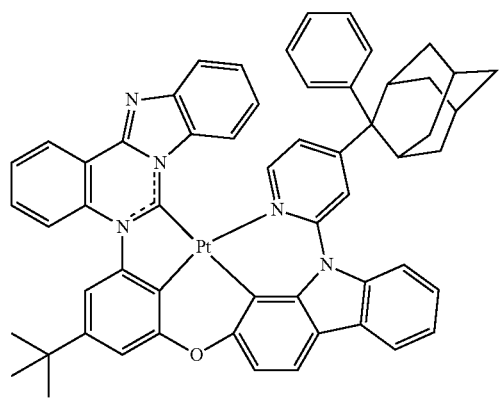
23
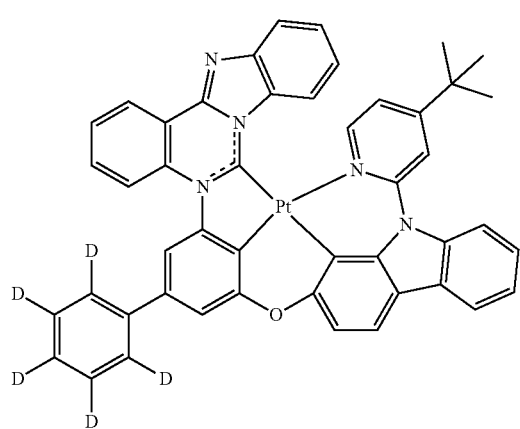
24
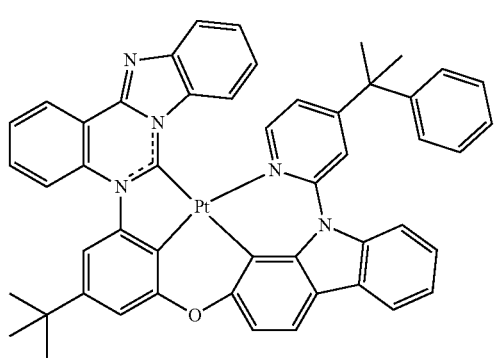
25
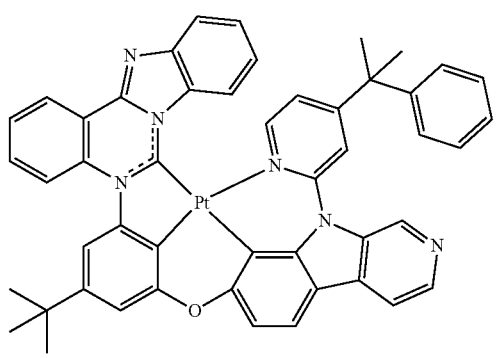
26
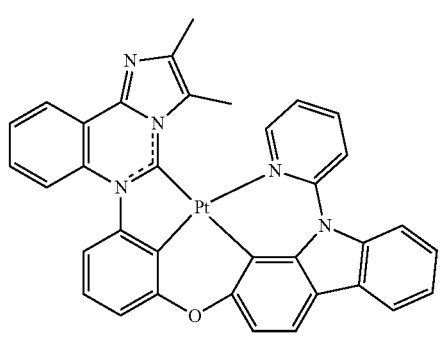
27
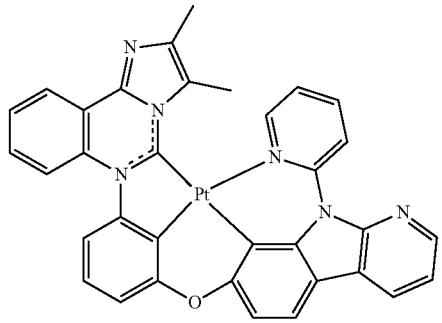

28
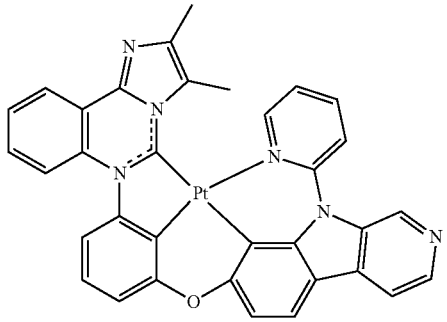
29
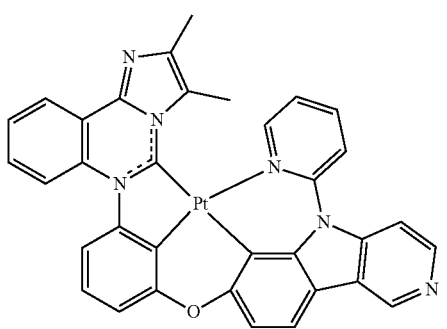
30
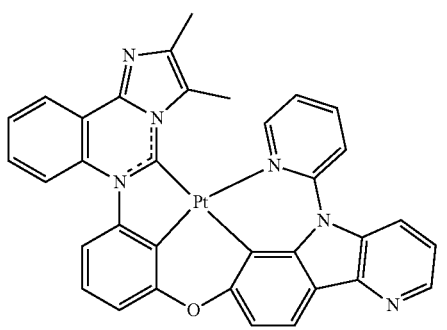
31
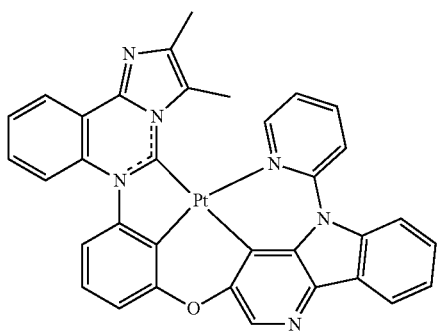
32
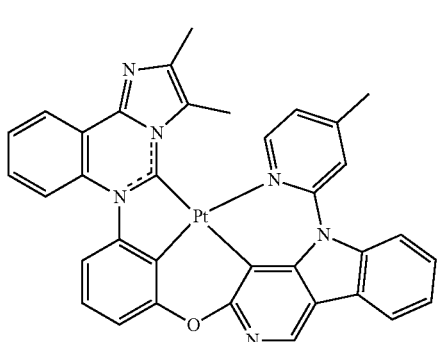
33
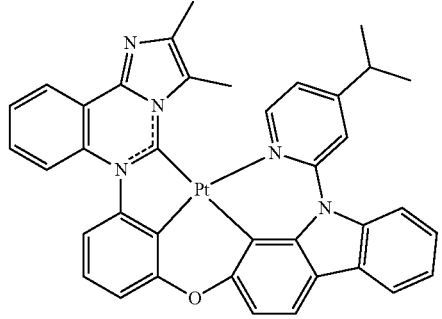
34
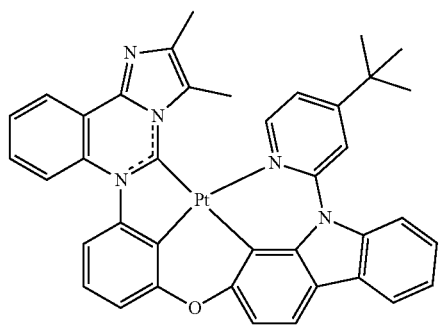
35
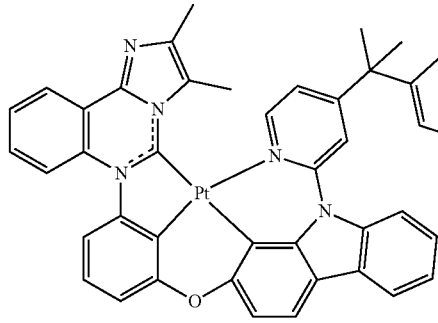
36
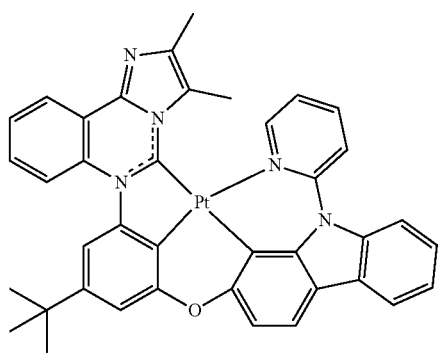

37
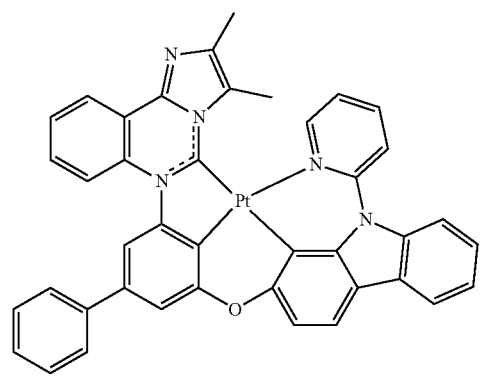
38
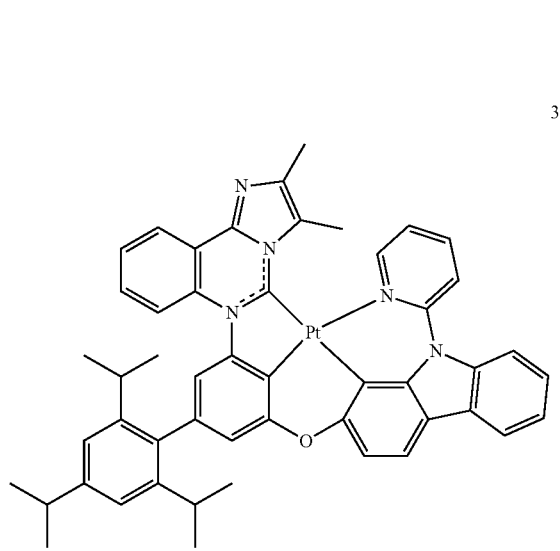
39
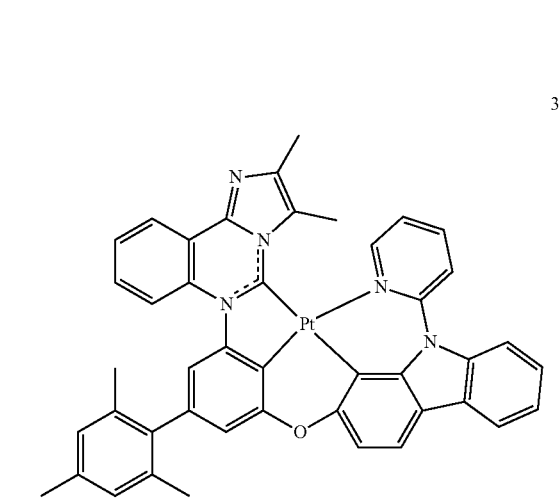
40
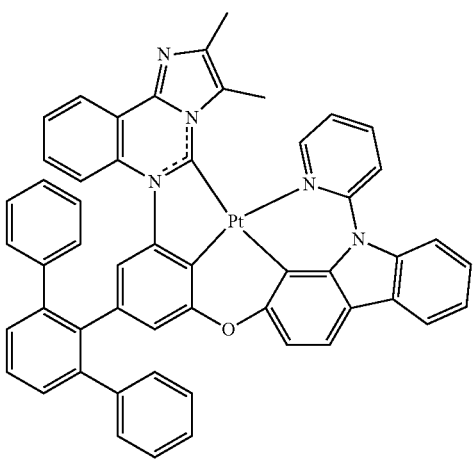
41
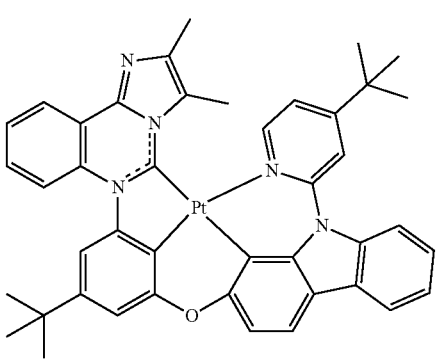
42
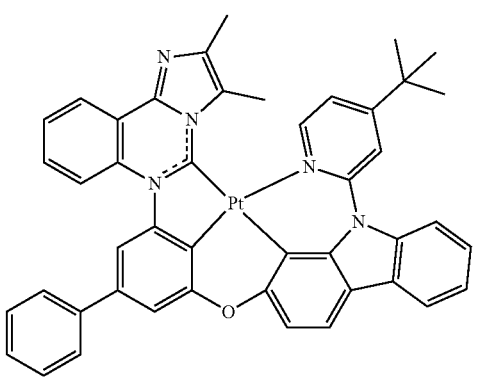
43
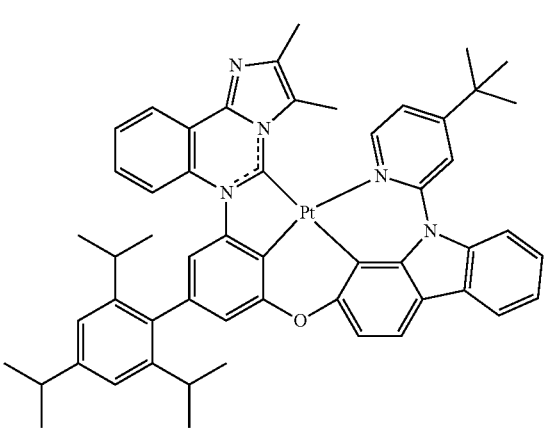

44
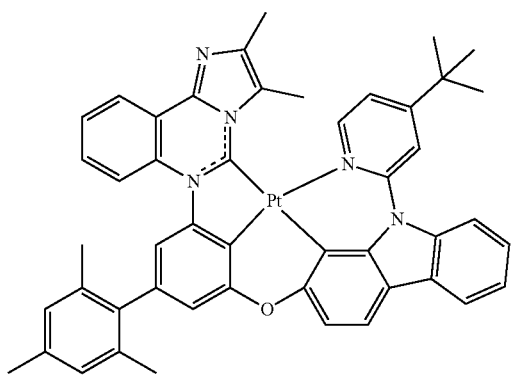
45
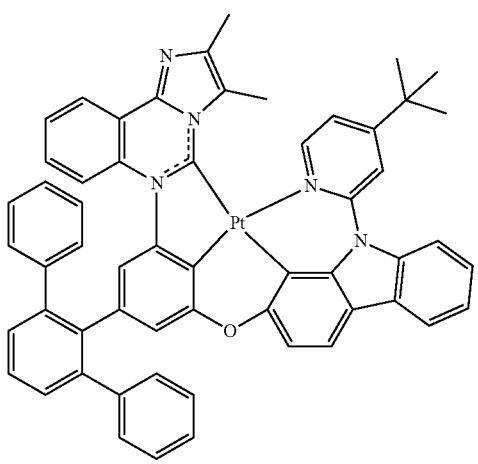
46
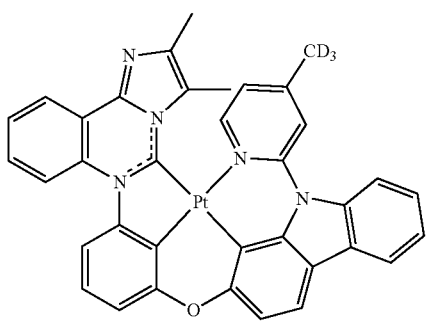
47
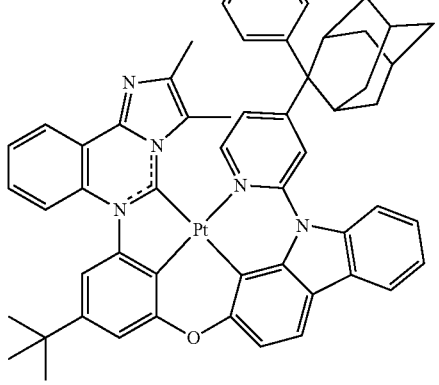
48
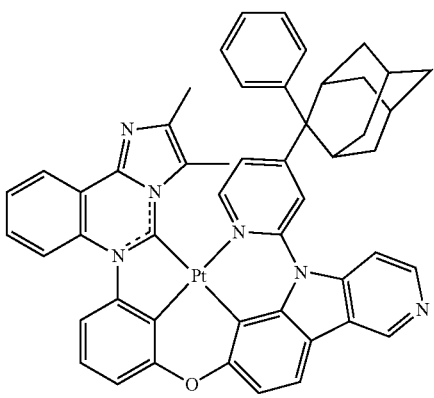
49
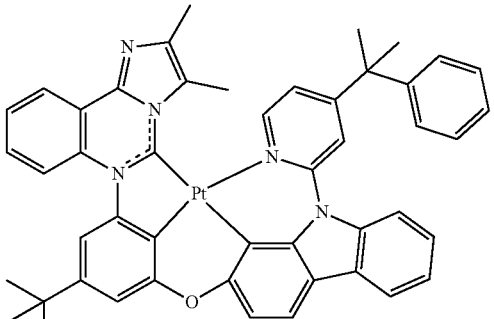
50
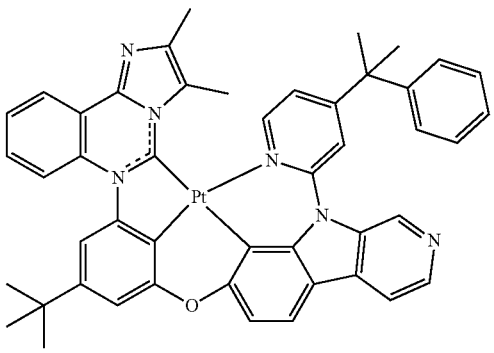
51
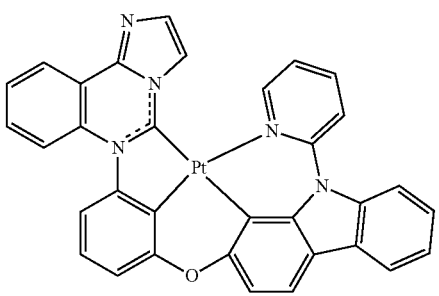

52
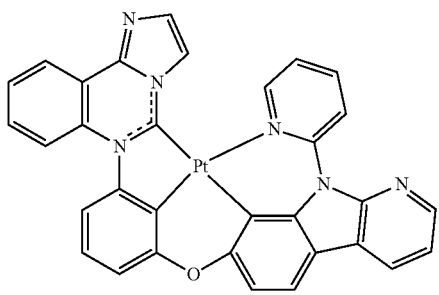
53
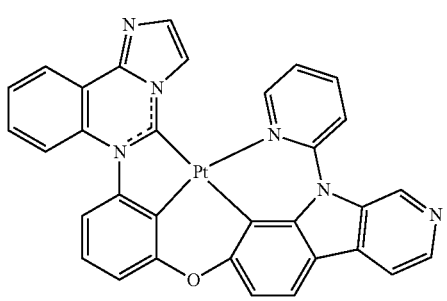
54
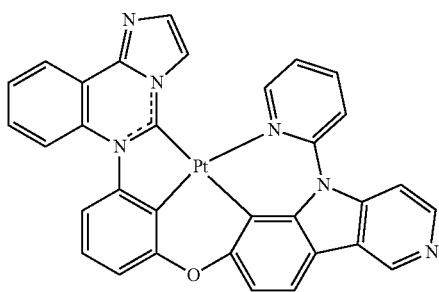
55
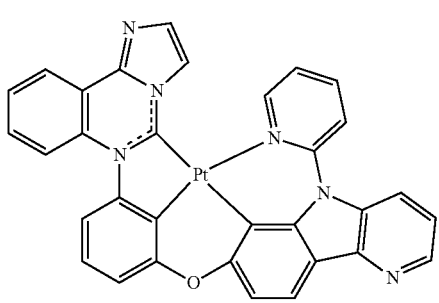
56
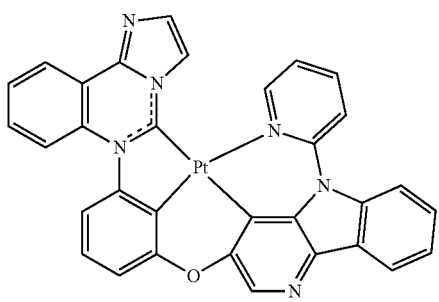
57
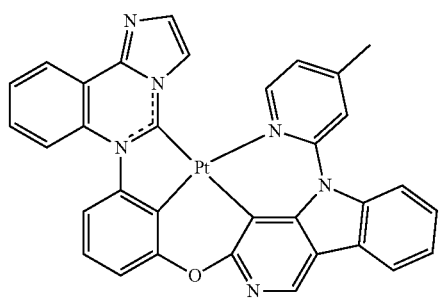
58
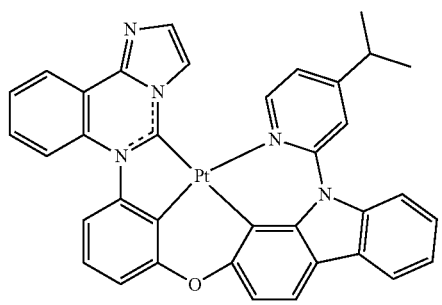
59
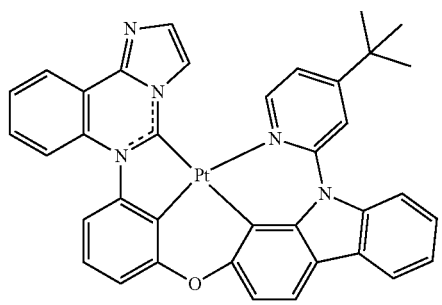
60
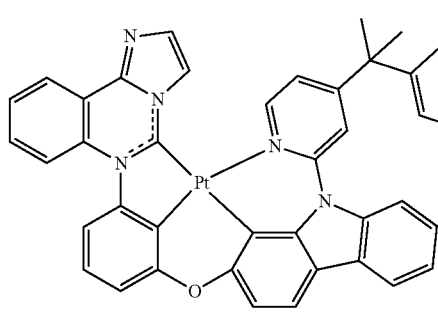
61
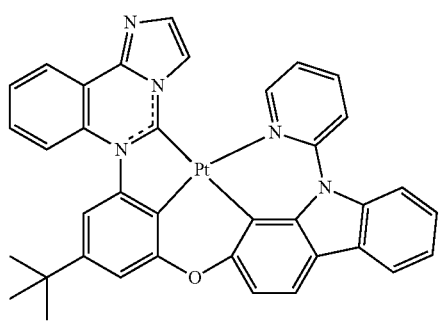

247
-continued
62
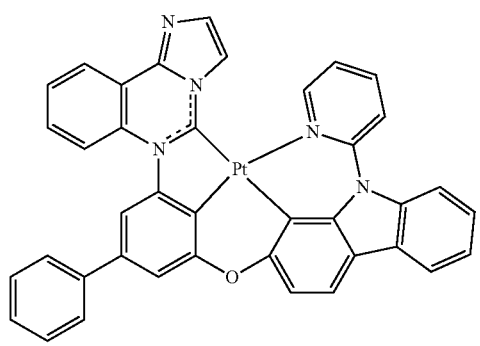
63
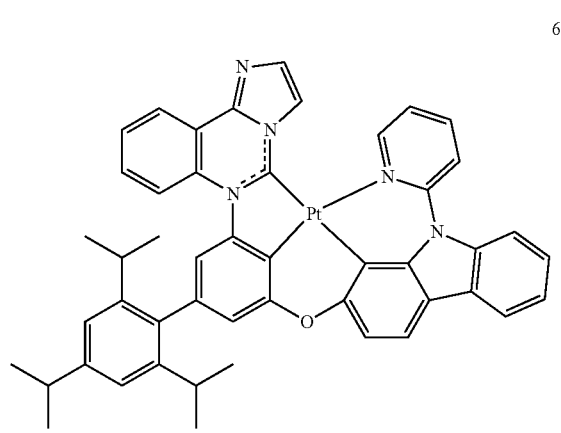
64
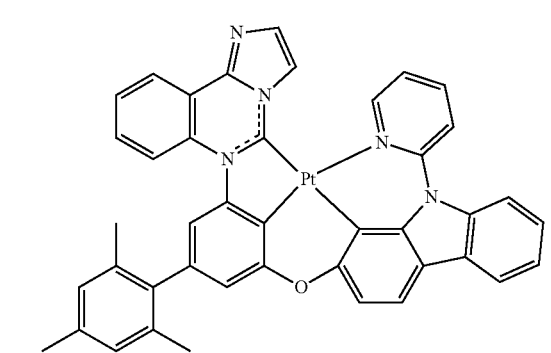
65
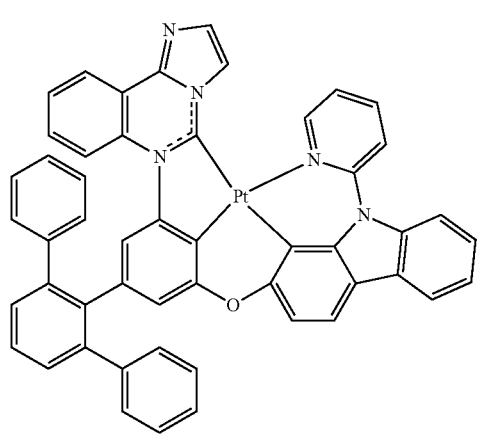
248
-continued
66
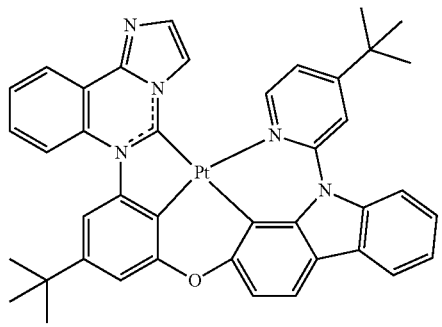
67
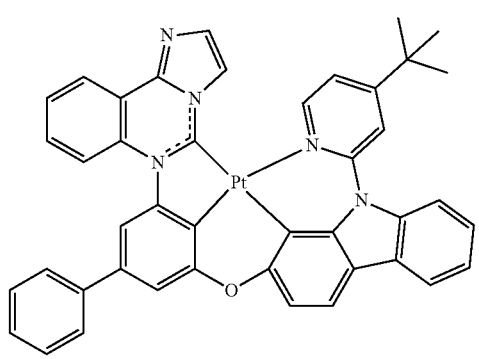
68
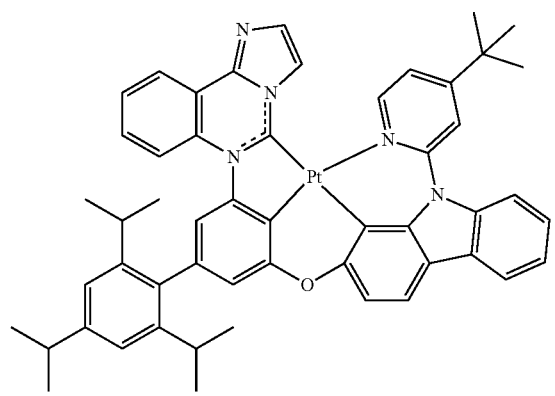
69
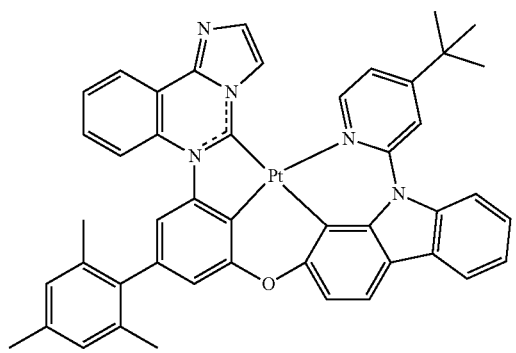

249
-continued
70
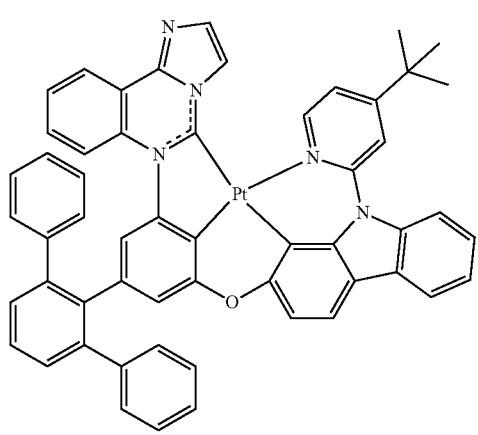
71
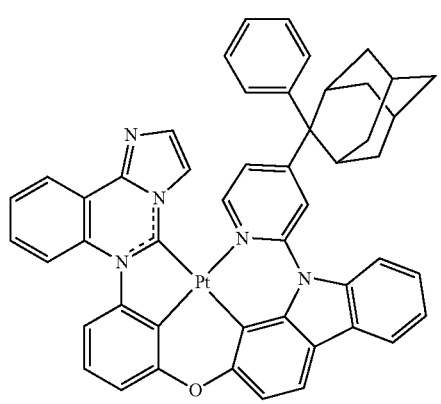
72
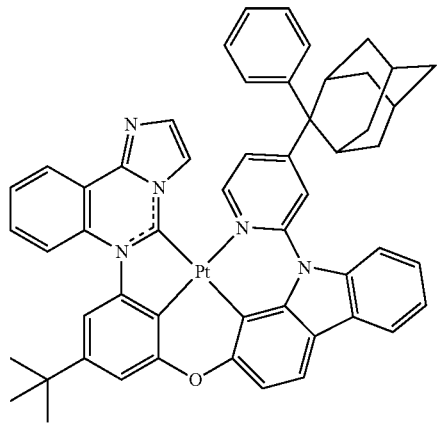
73
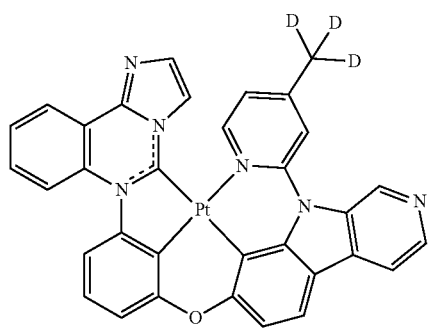
250
-continued
74
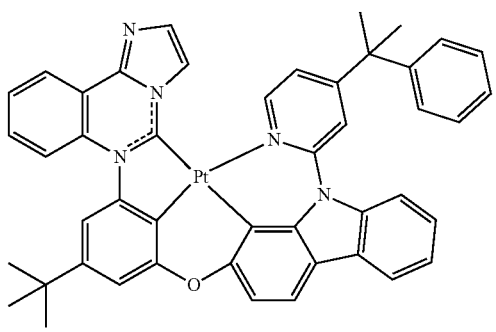
75
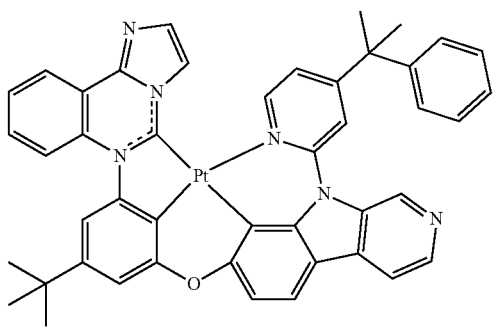
76
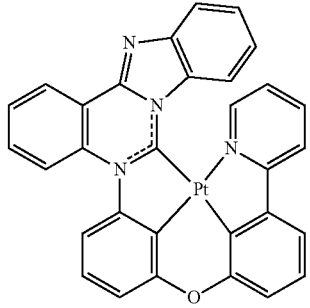
77
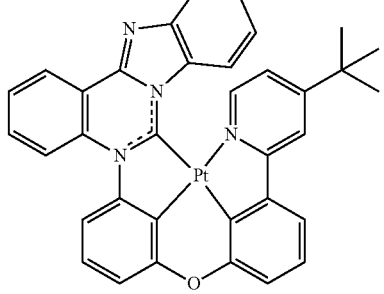
78
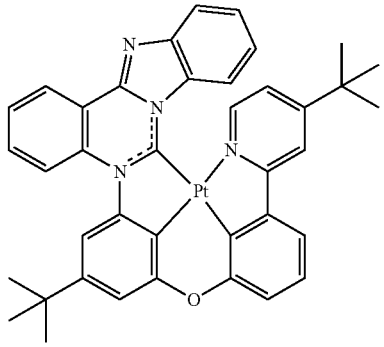

79
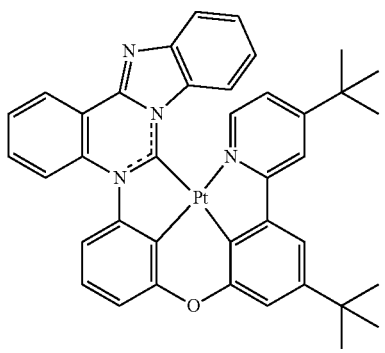
80
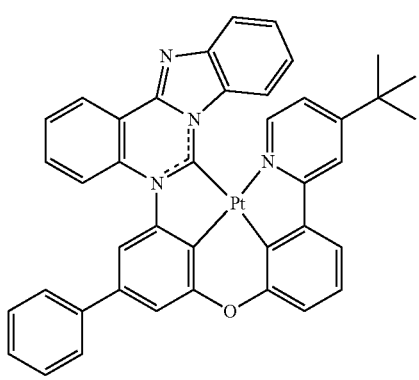
81
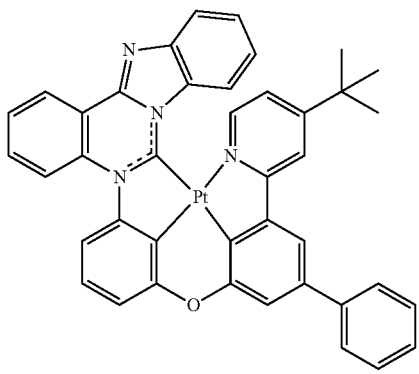
82
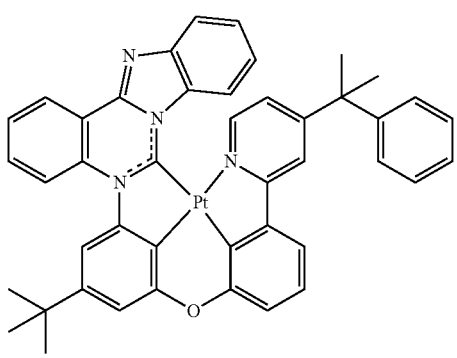
83
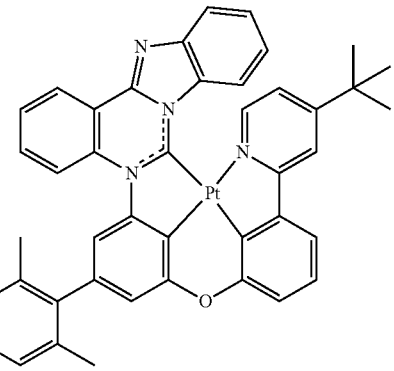
84
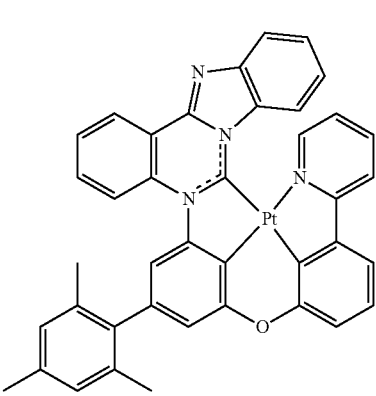
85
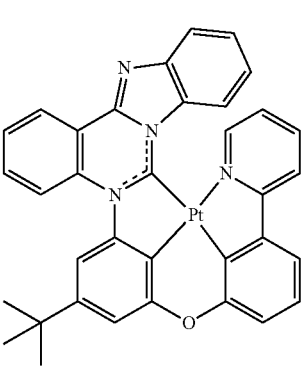
86
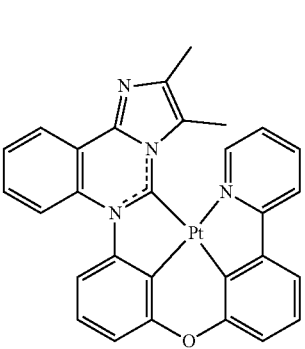

253
-continued
87
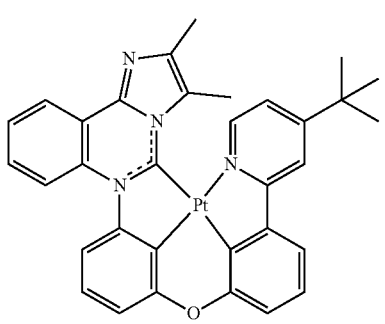
88
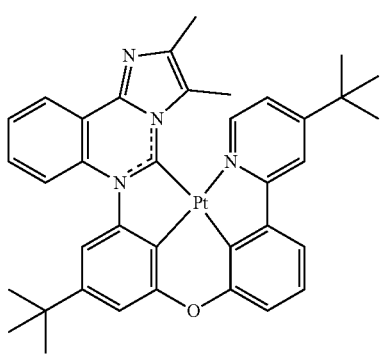
89
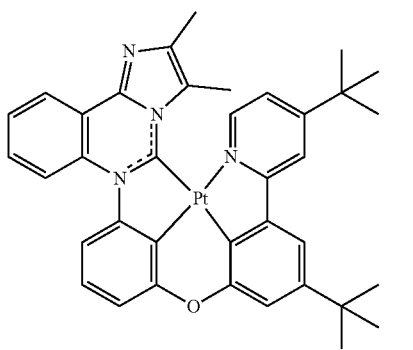
90
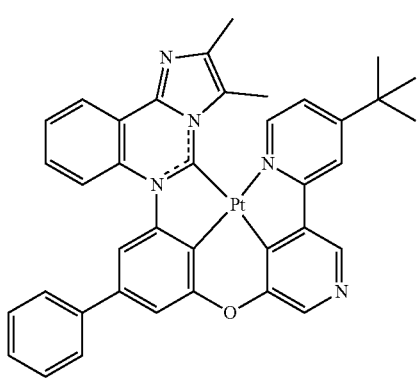
254
-continued
91
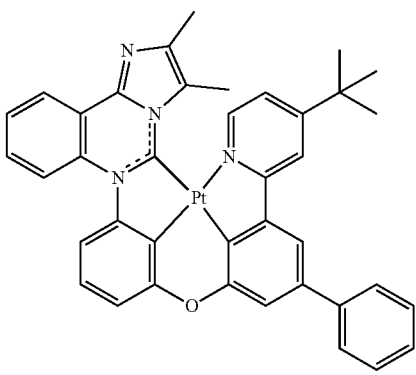
92
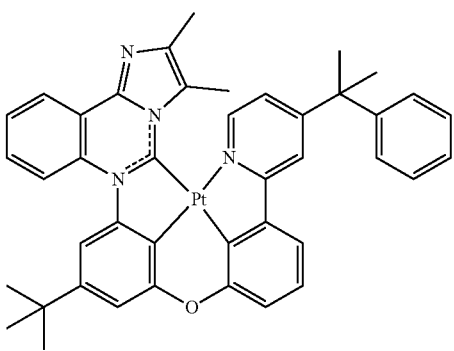
93
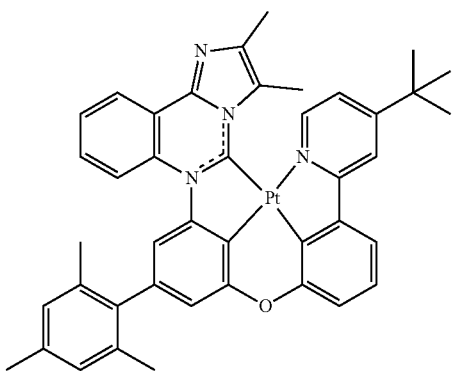
94
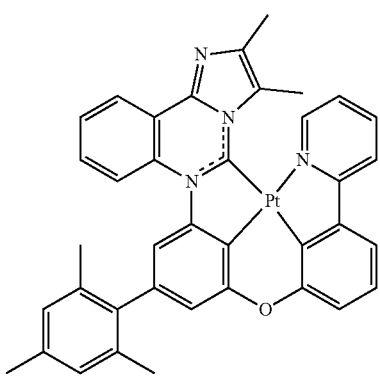

255
-continued
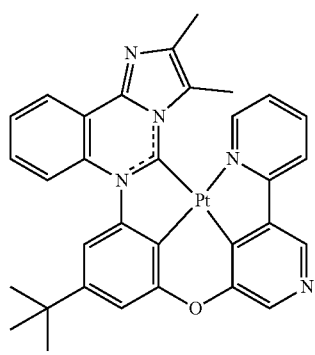
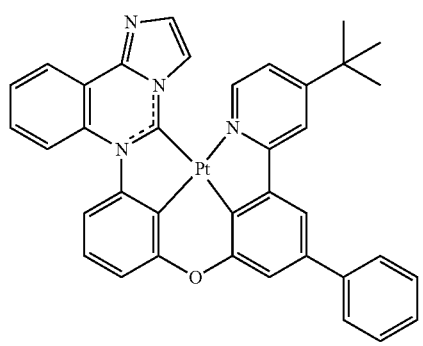
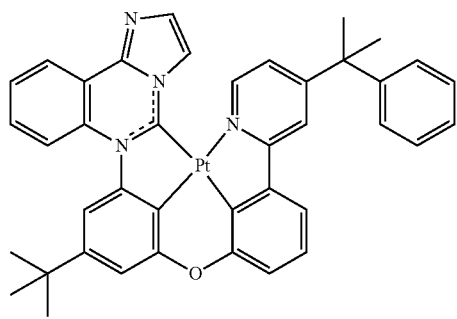
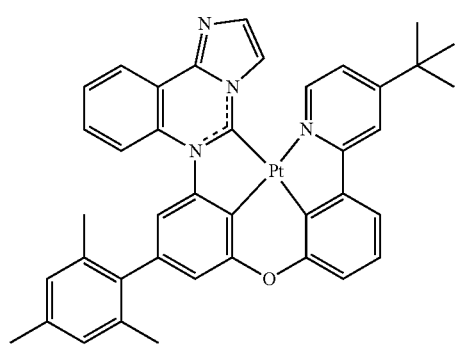
256
-continued
95
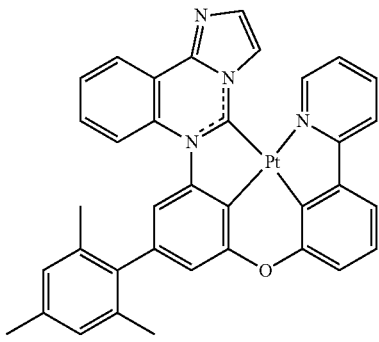
96
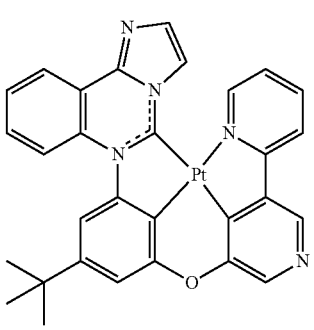
97
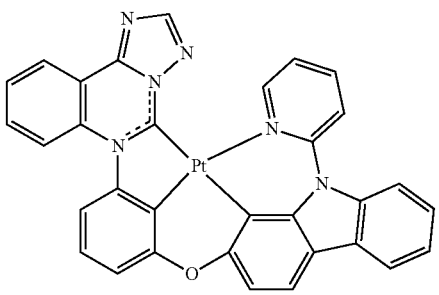
98
99
100
101
102

103
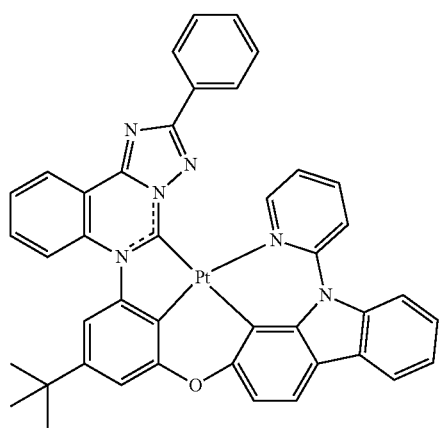
104
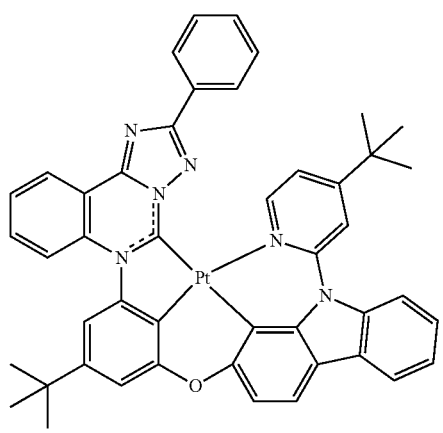
105
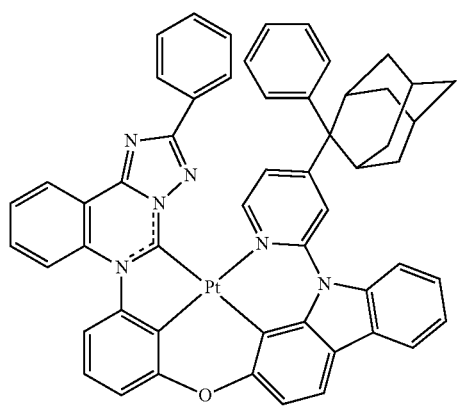
106
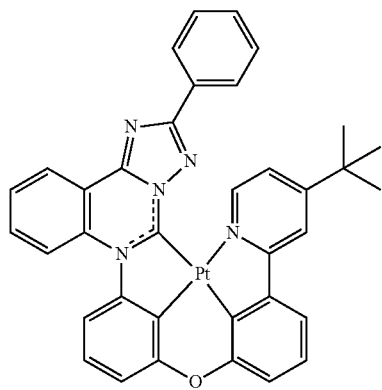
107
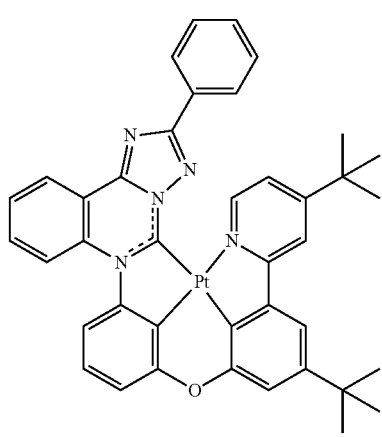
108
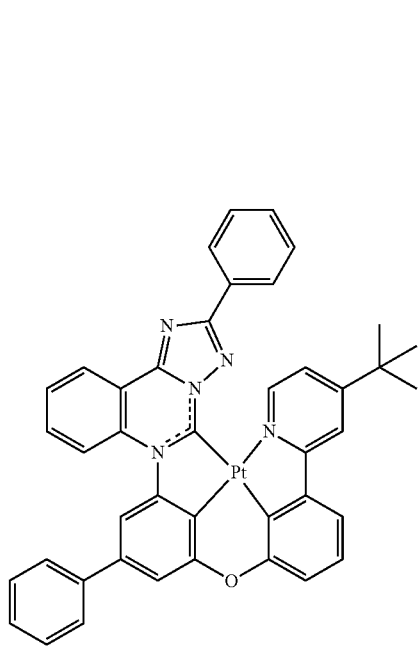
109
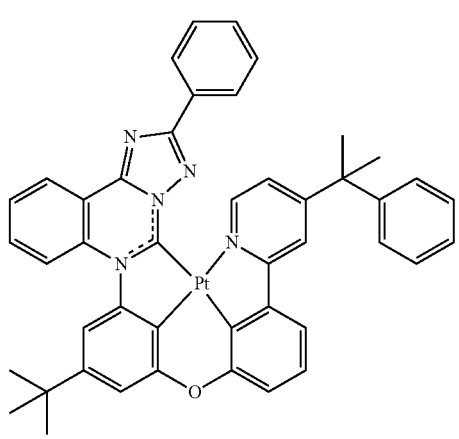

-continued
110
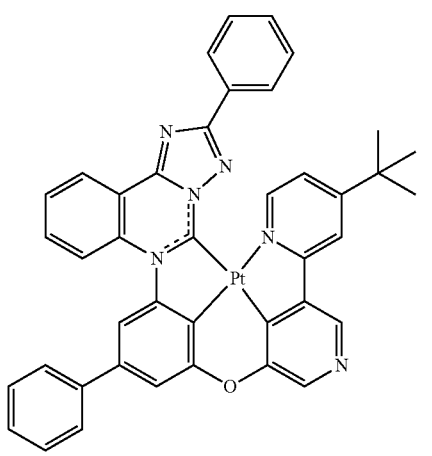
111
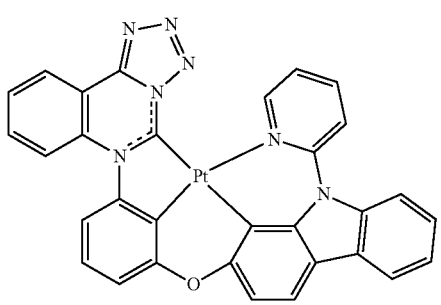
112
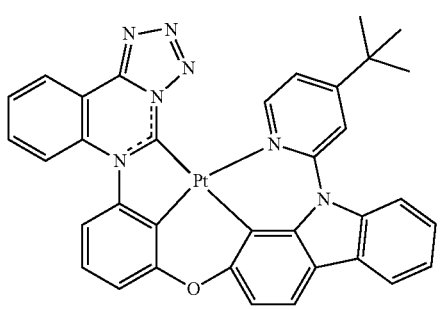
113
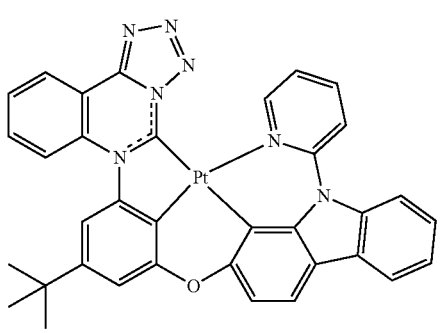
-continued
114
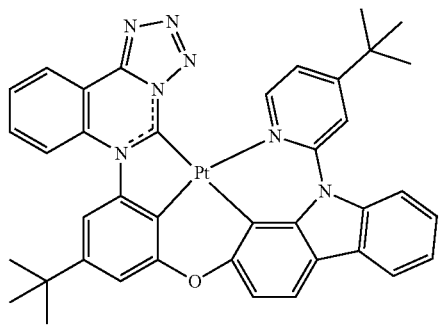
115
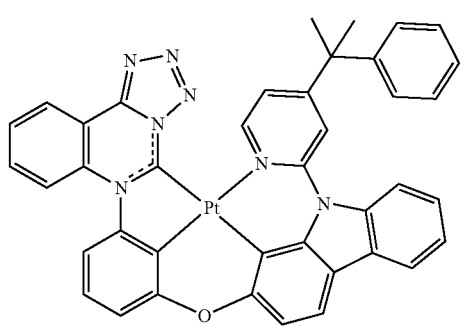
116
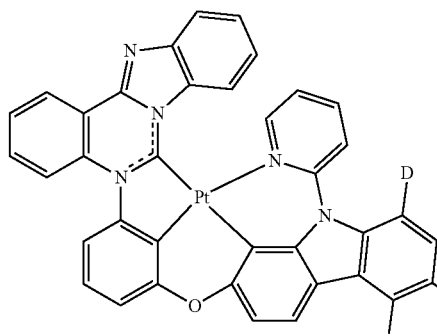
117
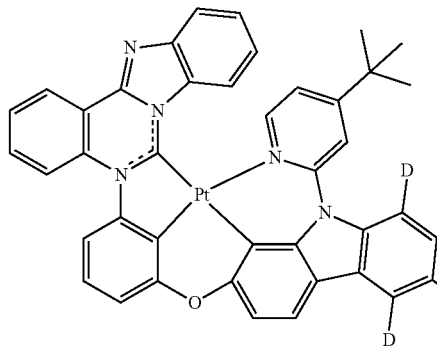

118
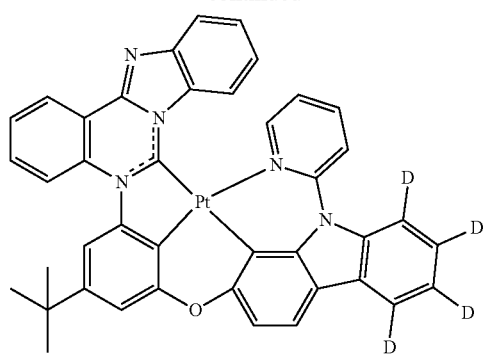
119
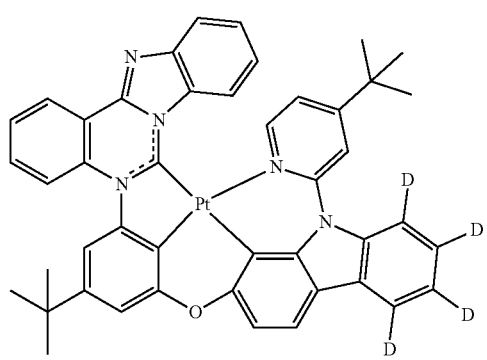
120
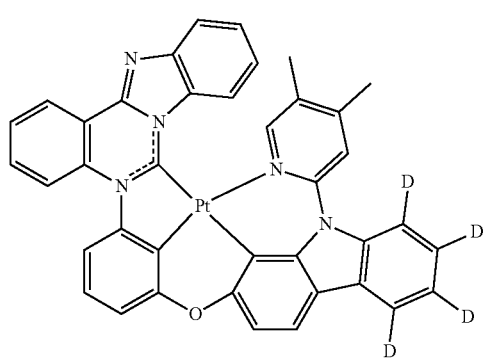
121
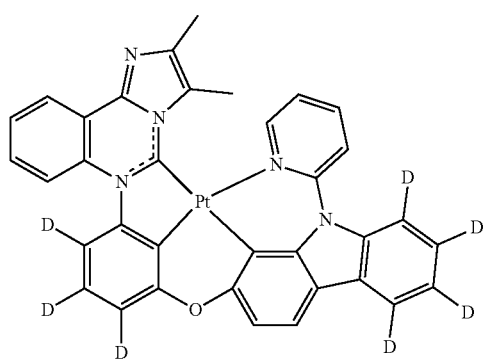
122
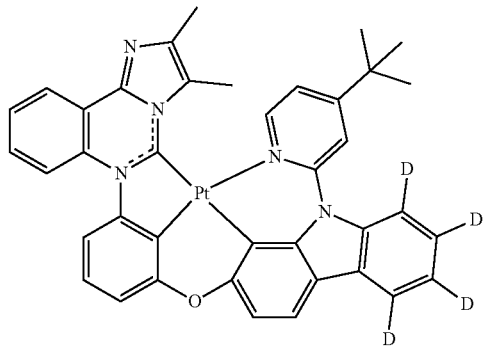
123
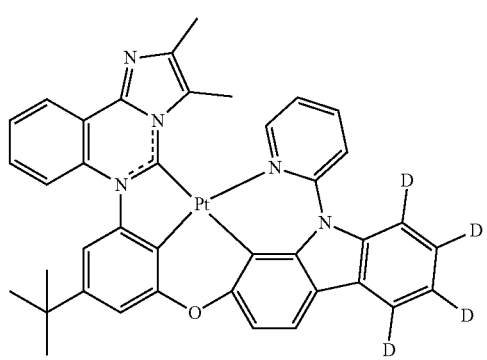
124
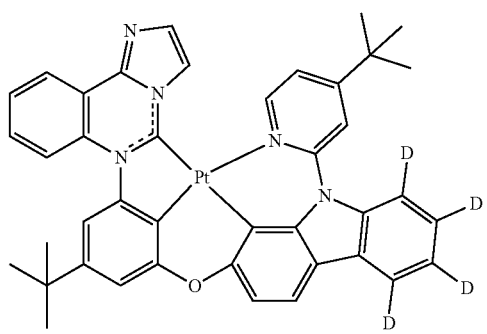
125
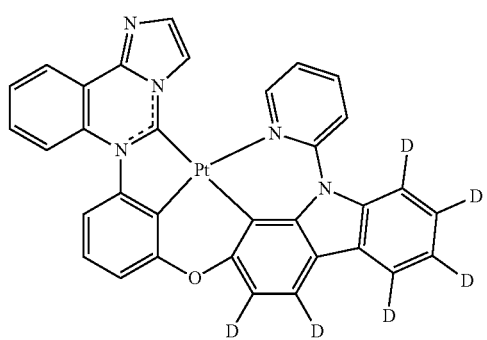

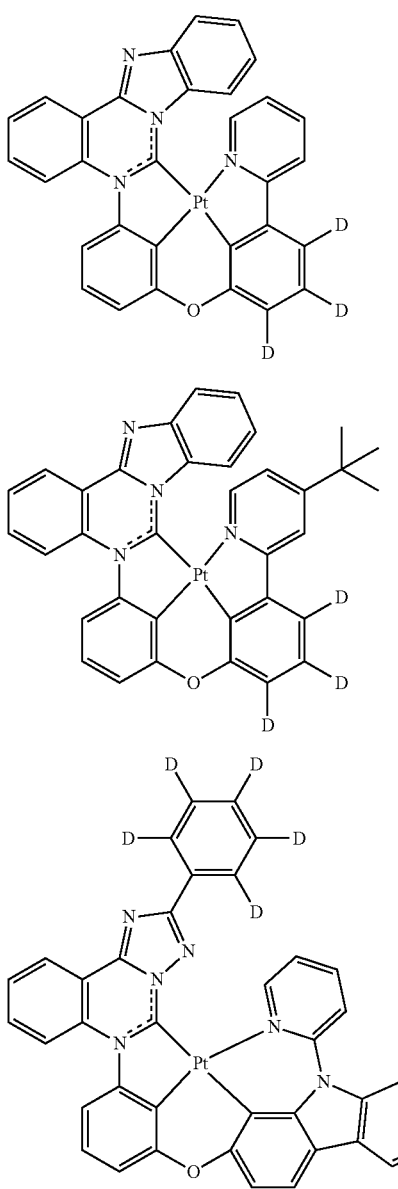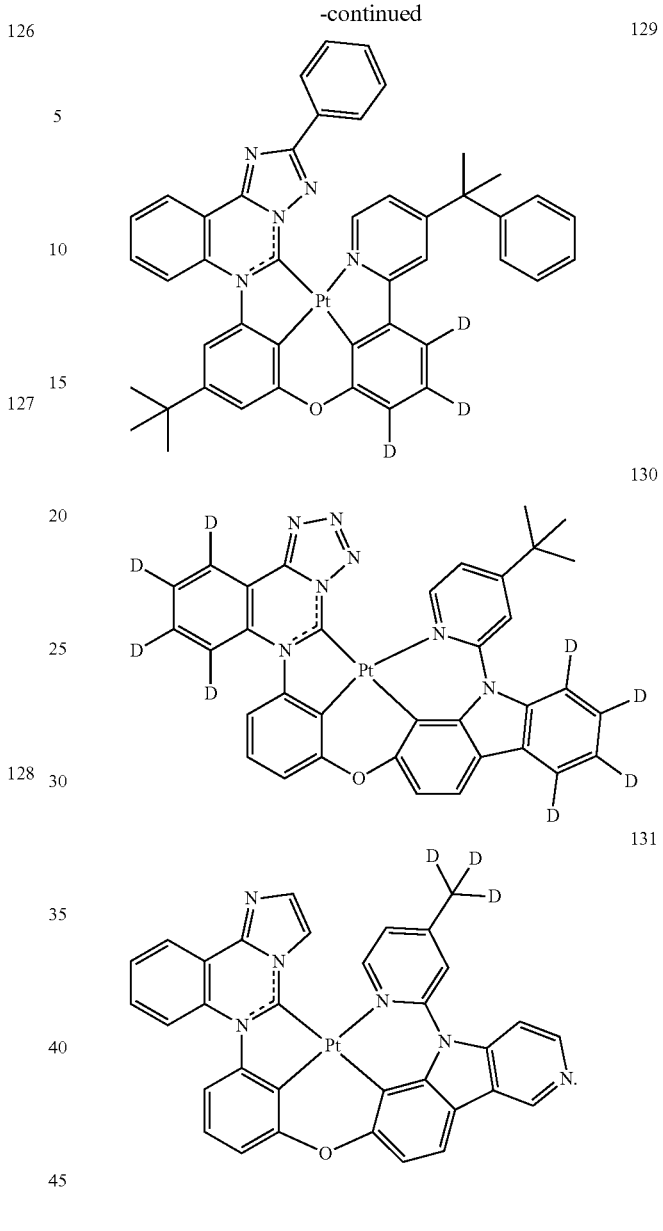
* * * * *